United States Patent
Higginbottom

Patent Number: 6,118,724
Date of Patent: Sep. 12, 2000

[54] MEMORY CONTROLLER ARCHITECTURE

[75] Inventor: Raymond Paul Higginbottom, New South Wales, Australia

[73] Assignees: Canon Kabushiki Kaisha; Canon Information Systems Research Australia, Pty. Ltd., both of Tokyo, Japan

[21] Appl. No.: 09/025,726

[22] Filed: Feb. 18, 1998

[30] Foreign Application Priority Data

Apr. 30, 1997 [AU] Australia ................................ PO6479

[51] Int. Cl.$^7$ .......................................................... G11C 8/00
[52] U.S. Cl. ............................... 365/230.05; 365/189.02; 365/221; 365/230.02
[58] Field of Search ............................ 365/221, 189.02, 365/230.02, 230.05

[56] References Cited

U.S. PATENT DOCUMENTS

| | | | |
|---|---|---|---|
| Re. 31,736 | 11/1984 | Mueller et al. | 364/900 |
| Re. 32,493 | 9/1987 | Matsumoto et al. | 364/200 |
| Re. 34,850 | 2/1995 | Murakami et al. | 395/800 |
| 3,883,847 | 5/1975 | Frank | 340/146.1 R |
| 3,971,927 | 7/1976 | Speiser et al. | 235/186 |
| 4,296,476 | 10/1981 | Mayer et al. | 364/900 |
| 4,330,833 | 5/1982 | Pratt et al. | 364/515 |
| 4,385,363 | 5/1983 | Widergren et al. | 364/725 |
| 4,460,958 | 7/1984 | Christopher et al. | 364/200 |
| 4,475,174 | 10/1984 | Kanayama | 364/900 |
| 4,535,320 | 8/1985 | Weaver | 340/347 |
| 4,550,368 | 10/1985 | Bechtolsheim | 364/200 |
| 4,587,610 | 5/1986 | Rodman | 364/200 |
| 4,622,545 | 11/1986 | Atkinson | 340/747 |
| 4,646,061 | 2/1987 | Bledsoe | 340/347 |
| 4,680,700 | 7/1987 | Hester et al. | 364/200 |
| 4,700,175 | 10/1987 | Bledsoe | 340/347 |
| 4,718,024 | 1/1988 | Guttag et al. | 364/518 |
| 4,718,091 | 1/1988 | Kobayashi et al. | 382/41 |
| 4,720,871 | 1/1988 | Chambers | 382/42 |

(List continued on next page.)

FOREIGN PATENT DOCUMENTS

| | | |
|---|---|---|
| 0086380 | 8/1983 | European Pat. Off. . |
| 0115179 | 8/1984 | European Pat. Off. . |
| 0150060 | 7/1985 | European Pat. Off. . |
| 0154340 | 9/1985 | European Pat. Off. . |
| 0154341 | 9/1985 | European Pat. Off. . |
| 0184547 | 6/1986 | European Pat. Off. . |
| 0205712 | 12/1986 | European Pat. Off. . |
| 0206892 | 12/1986 | European Pat. Off. . |
| 0272705 | 12/1986 | European Pat. Off. . |
| 0218287 | 4/1987 | European Pat. Off. . |

(List continued on next page.)

OTHER PUBLICATIONS

Arai et al., "A Fast DCT–SQ Scheme for Images," Trans. IEICE, vol. E 71, No. 11, Nov. 1988 pp. 1095–1097.

*Primary Examiner*—Son T. Dinh
*Attorney, Agent, or Firm*—Fitzpatrick, Cella, Harper & Scinto

[57] ABSTRACT

An apparatus for providing a number of ports with burst access to a DRAM array includes a memory array, a controller for controlling the memory array, a write device for writing to the memory array, a read device for reading from the memory array, a FIFO output buffer for temporarily storing data read from the memory array and/or a FIFO input buffer for temporarily storing data prior to writing to the memory array.

22 Claims, 135 Drawing Sheets

Microfiche Appendix Included
(3 Microfiche, 108 Pages)

U.S. PATENT DOCUMENTS

| Patent | Date | Inventor | Class |
|---|---|---|---|
| 4,733,376 | 3/1988 | Ogawa | 365/221 |
| 4,736,440 | 4/1988 | Chabert | 382/41 |
| 4,754,491 | 6/1988 | Mischler et al. | 382/41 |
| 4,779,223 | 10/1988 | Asai et al. | 364/900 |
| 4,780,761 | 10/1988 | Daly et al. | 358/133 |
| 4,791,598 | 12/1988 | Liou et al. | 364/725 |
| 4,797,850 | 1/1989 | Amitai | 364/900 |
| 4,813,056 | 3/1989 | Fedele | 375/27 |
| 4,823,286 | 4/1989 | Lumelsky et al. | 364/521 |
| 4,839,826 | 6/1989 | Urushibata | 364/518 |
| 4,853,696 | 8/1989 | Mukherjee | 341/65 |
| 4,907,182 | 3/1990 | Guiliano et al. | 364/728.01 |
| 4,920,426 | 4/1990 | Hatori et al. | 358/433 |
| 4,920,480 | 4/1990 | Murakami et al. | 364/200 |
| 4,935,821 | 6/1990 | Sano et al. | 358/427 |
| 4,937,774 | 6/1990 | Malinowski | 364/724 |
| 4,956,771 | 9/1990 | Neustaedter | 364/200 |
| 4,965,722 | 10/1990 | Tokuume | 364/200 |
| 4,975,976 | 12/1990 | Kimata et al. | 382/44 |
| 4,982,343 | 1/1991 | Hourvitz et al. | 364/521 |
| 4,983,958 | 1/1991 | Carrick | 340/799 |
| 4,991,112 | 2/1991 | Callemyn | 364/518 |
| 5,025,482 | 6/1991 | Murakami et al. | 382/56 |
| 5,029,122 | 7/1991 | Uetani | 364/725 |
| 5,051,840 | 9/1991 | Watanabe et al. | 358/433 |
| 5,053,985 | 10/1991 | Friedlander et al. | 364/725 |
| 5,060,242 | 10/1991 | Arbeiter | 375/122 |
| 5,109,333 | 4/1992 | Kubota et al. | 395/275 |
| 5,109,496 | 4/1992 | Beausoleil et al. | 395/400 |
| 5,125,042 | 6/1992 | Kerr et al. | 382/47 |
| 5,125,085 | 6/1992 | Phillips | 395/400 |
| 5,142,380 | 8/1992 | Sakagami et al. | 358/432 |
| 5,163,103 | 11/1992 | Uetani | 382/56 |
| 5,181,183 | 1/1993 | Miyazaki | 364/725 |
| 5,185,661 | 2/1993 | Ng | 358/75 |
| 5,185,694 | 2/1993 | Edenfield et al. | 395/425 |
| 5,185,856 | 2/1993 | Alcorn et al. | 395/130 |
| 5,195,050 | 3/1993 | Hsu et al. | 364/728.01 |
| 5,196,946 | 3/1993 | Balkanski et al. | 358/433 |
| 5,197,021 | 3/1993 | Cucchi et al. | 364/725 |
| 5,204,830 | 4/1993 | Wang et al. | 364/754 |
| 5,212,559 | 5/1993 | Gilbert et al. | 358/298 |
| 5,216,516 | 6/1993 | Tanaka et al. | 358/426 |
| 5,223,926 | 6/1993 | Stone et al. | 358/133 |
| 5,227,789 | 7/1993 | Barry et al. | 341/65 |
| 5,233,348 | 8/1993 | Pollmann et al. | 341/67 |
| 5,237,655 | 8/1993 | Statt et al. | 395/162 |
| 5,241,222 | 8/1993 | Small et al. | 307/449 |
| 5,243,414 | 9/1993 | Dalrymple et al. | 358/500 |
| 5,249,146 | 9/1993 | Uramoto et al. | 364/725 |
| 5,253,053 | 10/1993 | Chu et al. | 358/133 |
| 5,253,078 | 10/1993 | Balkanski et al. | 358/426 |
| 5,254,991 | 10/1993 | Ruetz et al. | 341/65 |
| 5,258,941 | 11/1993 | Newberger et al. | 364/725 |
| 5,262,968 | 11/1993 | Coffield | 364/604 |
| 5,265,049 | 11/1993 | Takasugi | 365/221 |
| 5,268,769 | 12/1993 | Tsuchiya et al. | 358/427 |
| 5,270,832 | 12/1993 | Balkanski et al. | 358/432 |
| 5,283,866 | 2/1994 | Kumagai | 395/164 |
| 5,299,027 | 3/1994 | Nakamura et al. | 358/403 |
| 5,303,058 | 4/1994 | Fukuda et al. | 358/261 |
| 5,303,349 | 4/1994 | Warriner et al. | 395/275 |
| 5,307,451 | 4/1994 | Clark | 395/127 |
| 5,313,577 | 5/1994 | Meinerth et al. | 395/166 |
| 5,317,717 | 5/1994 | Cutler et al. | 395/425 |
| 5,321,806 | 6/1994 | Meinerth et al. | 395/162 |
| 5,325,092 | 6/1994 | Allen et al. | 341/65 |
| 5,325,215 | 6/1994 | Shibata et al. | 358/479 |
| 5,333,297 | 7/1994 | Lemaire et al. | 395/500 |
| 5,337,319 | 8/1994 | Furukawa et al. | 371/11.1 |
| 5,341,318 | 8/1994 | Balkanski et al. | 364/725 |
| 5,349,348 | 9/1994 | Anderson et al. | 341/51 |
| 5,349,651 | 9/1994 | Hertherington et al. | 395/400 |
| 5,351,067 | 9/1994 | Lumelsky et al. | 345/191 |
| 5,379,394 | 1/1995 | Goto | 395/425 |
| 5,388,216 | 2/1995 | Oh | 395/275 |
| 5,392,038 | 2/1995 | Bhandari et al. | 341/67 |
| 5,394,515 | 2/1995 | Lentz et al. | 395/115 |
| 5,414,666 | 5/1995 | Kumagai et al. | 365/222 |
| 5,428,356 | 6/1995 | Ozaki | 341/67 |
| 5,436,734 | 7/1995 | Yamauchi et al. | 358/448 |
| 5,440,404 | 8/1995 | Okamoto | 358/432 |
| 5,446,854 | 8/1995 | Khalidi et al. | 395/401 |
| 5,450,557 | 9/1995 | Kopp et al. | 395/375 |
| 5,453,786 | 9/1995 | Trent | 348/384 |
| 5,467,088 | 11/1995 | Kinouchi et al. | 341/65 |
| 5,479,527 | 12/1995 | Chen | 382/232 |
| 5,481,487 | 1/1996 | Jang et al. | 364/725 |
| 5,483,475 | 1/1996 | Kao | 364/725 |
| 5,485,557 | 1/1996 | Sato et al. | 395/129 |
| 5,485,568 | 1/1996 | Venable et al. | 395/155 |
| 5,485,589 | 1/1996 | Kocis et al. | 395/421.03 |
| 5,502,804 | 3/1996 | Butterfield et al. | 395/147 |
| 5,502,824 | 3/1996 | Heil | 395/293 |
| 5,504,842 | 4/1996 | Gentile | 395/114 |
| 5,506,944 | 4/1996 | Gentile | 395/114 |
| 5,509,115 | 4/1996 | Butterfield et al. | 395/147 |
| 5,509,137 | 4/1996 | Itomitsu et al. | 395/495 |
| 5,513,335 | 4/1996 | McClure | 395/457 |
| 5,515,296 | 5/1996 | Agarwal | 364/514 |
| 5,524,075 | 6/1996 | Rousseau et al. | 382/302 |
| 5,528,238 | 6/1996 | Nickerson | 341/67 |
| 5,528,628 | 6/1996 | Park et al. | 375/240 |
| 5,528,764 | 6/1996 | Heil | 395/293 |
| 5,530,823 | 6/1996 | Tsuchiya et al. | 395/417 |
| 5,530,944 | 6/1996 | Stones | 395/494 |
| 5,535,291 | 7/1996 | Spencer et al. | 382/254 |
| 5,539,865 | 7/1996 | Gentile | 395/115 |
| 5,544,290 | 8/1996 | Gentile | 395/115 |
| 5,544,342 | 8/1996 | Dean | 395/446 |
| 5,557,733 | 9/1996 | Hicok et al. | 395/162 |
| 5,561,761 | 10/1996 | Hicok et al. | 395/183.06 |
| 5,561,772 | 10/1996 | Dornier et al. | 395/281 |
| 5,570,432 | 10/1996 | Kojima | 382/254 |
| 5,617,367 | 4/1997 | Holland et al. | 365/221 |
| 5,684,753 | 11/1997 | Hashimoto et al. | 365/221 |
| 5,841,722 | 11/1998 | Wilenz | 365/221 |

FOREIGN PATENT DOCUMENTS

| | | |
|---|---|---|
| 0274376 | 7/1988 | European Pat. Off. |
| 0275979 | 7/1988 | European Pat. Off. |
| 0286183 | 10/1988 | European Pat. Off. |
| 0311034 | 4/1989 | European Pat. Off. |
| 0335306 | 10/1989 | European Pat. Off. |
| 0335990 | 10/1989 | European Pat. Off. |
| 0343992 | 11/1989 | European Pat. Off. |
| 0348703 | 1/1990 | European Pat. Off. |
| 0360155 | 3/1990 | European Pat. Off. |
| 0380720 | 8/1990 | European Pat. Off. |
| 0383678 | 8/1990 | European Pat. Off. |
| 0472961 | 3/1992 | European Pat. Off. |
| 0482864 | 4/1992 | European Pat. Off. |
| 0486154 | 5/1992 | European Pat. Off. |
| 0506111 | 9/1992 | European Pat. Off. |
| 0523764 | 1/1993 | European Pat. Off. |
| 0535749 | 2/1993 | European Pat. Off. |
| 0535893 | 4/1993 | European Pat. Off. |
| 0588726 | 3/1994 | European Pat. Off. |
| 0589682 | 3/1994 | European Pat. Off. |
| 0593046 | 4/1994 | European Pat. Off. |
| 0600112 | 6/1994 | European Pat. Off. |
| 0612007 | 8/1994 | European Pat. Off. |

| | | | | | |
|---|---|---|---|---|---|
| 0623799 | 11/1994 | European Pat. Off. . | 0674266 | 9/1995 | European Pat. Off. . |
| 0626661 | 11/1994 | European Pat. Off. . | 0675632 | 10/1995 | European Pat. Off. . |
| 0655712 | 5/1995 | European Pat. Off. . | 0692913 | 1/1996 | European Pat. Off. . |
| 0655854 | 5/1995 | European Pat. Off. . | 0708563 | 4/1996 | European Pat. Off. . |
| 0660247 | 6/1995 | European Pat. Off. . | 0714166 | 5/1996 | European Pat. Off. . |

Format of the Data Word
Three operand instructions:
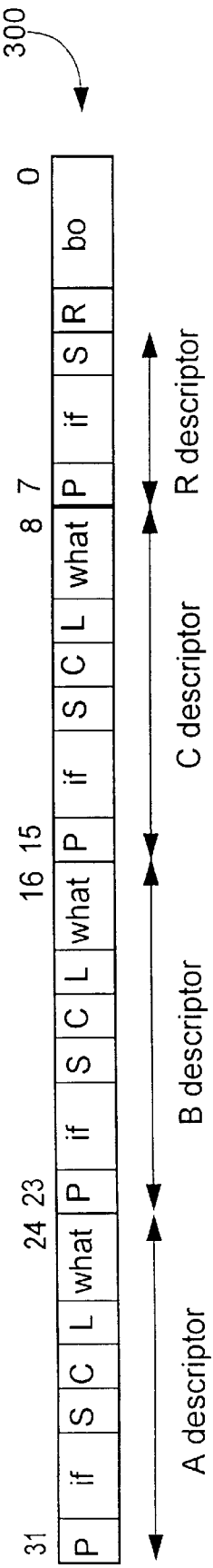
Two (or less) operand instructions:
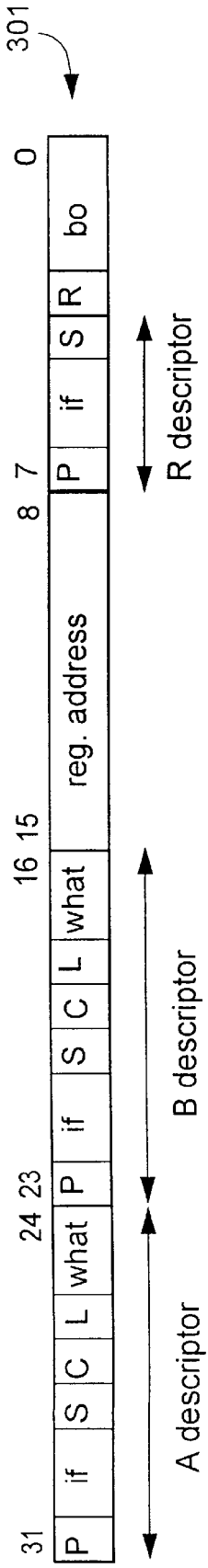
Fig. 12

Type A
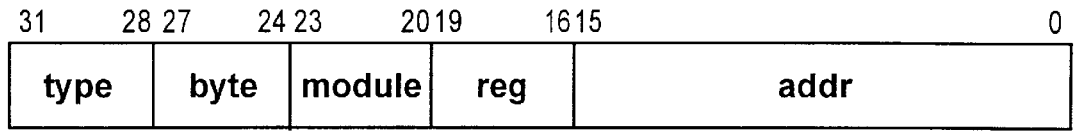
370
Type B
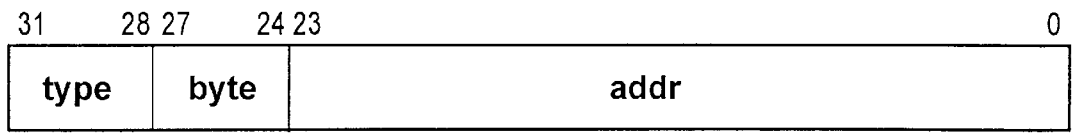
371
Type C
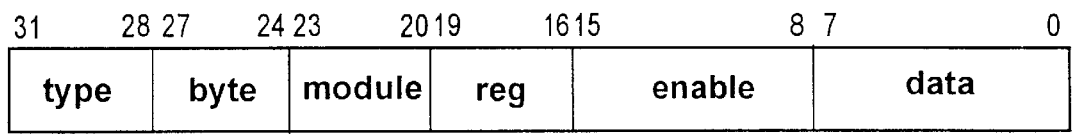
372
Fig. 21

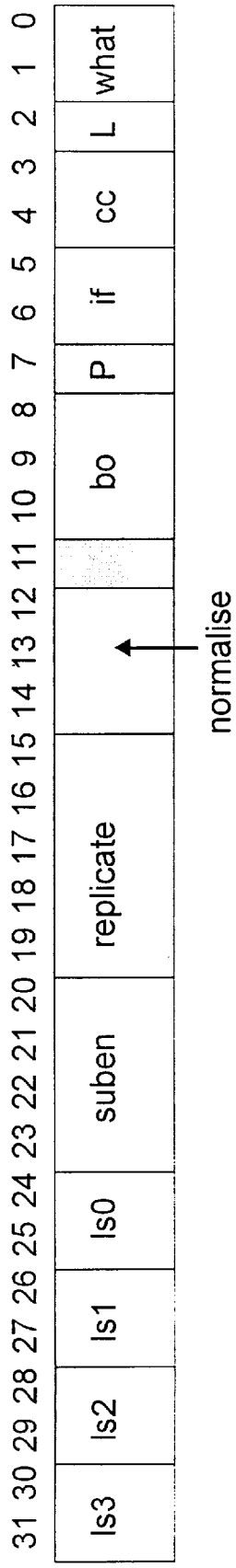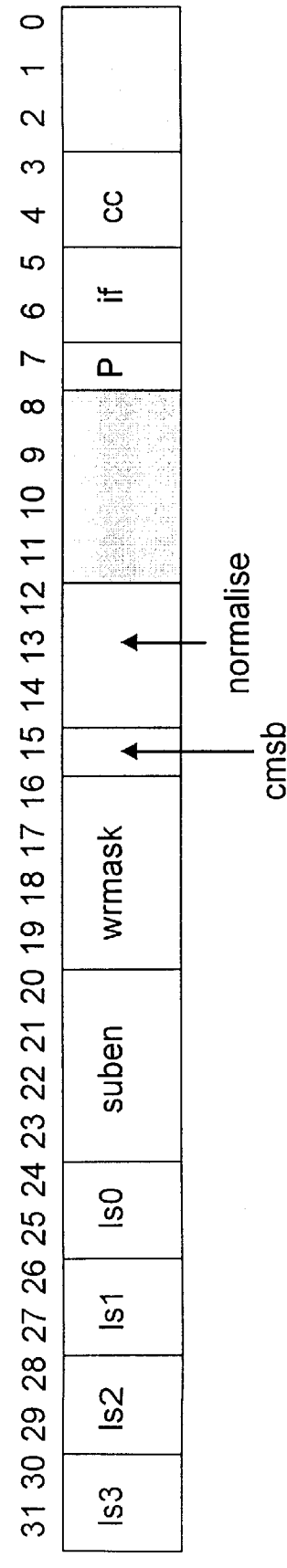
Fig. 48

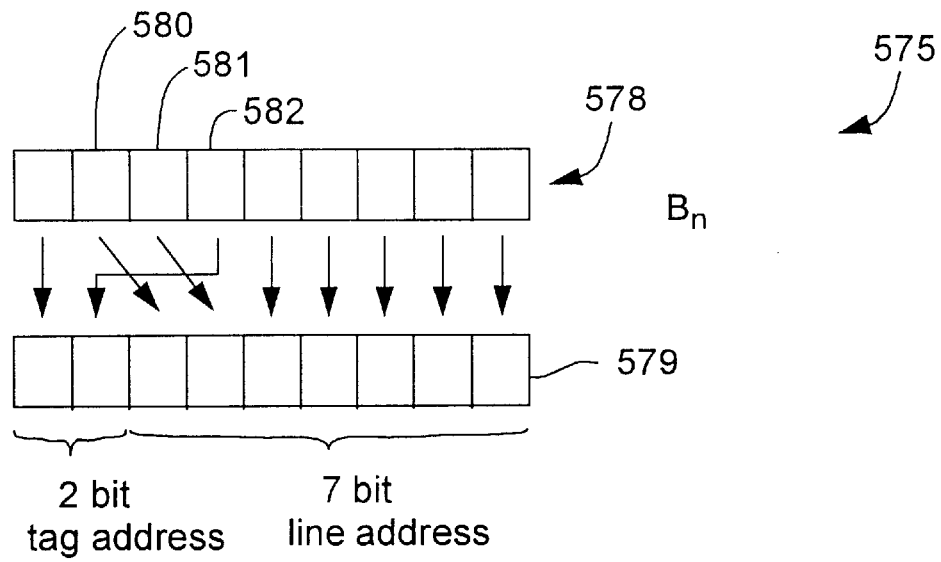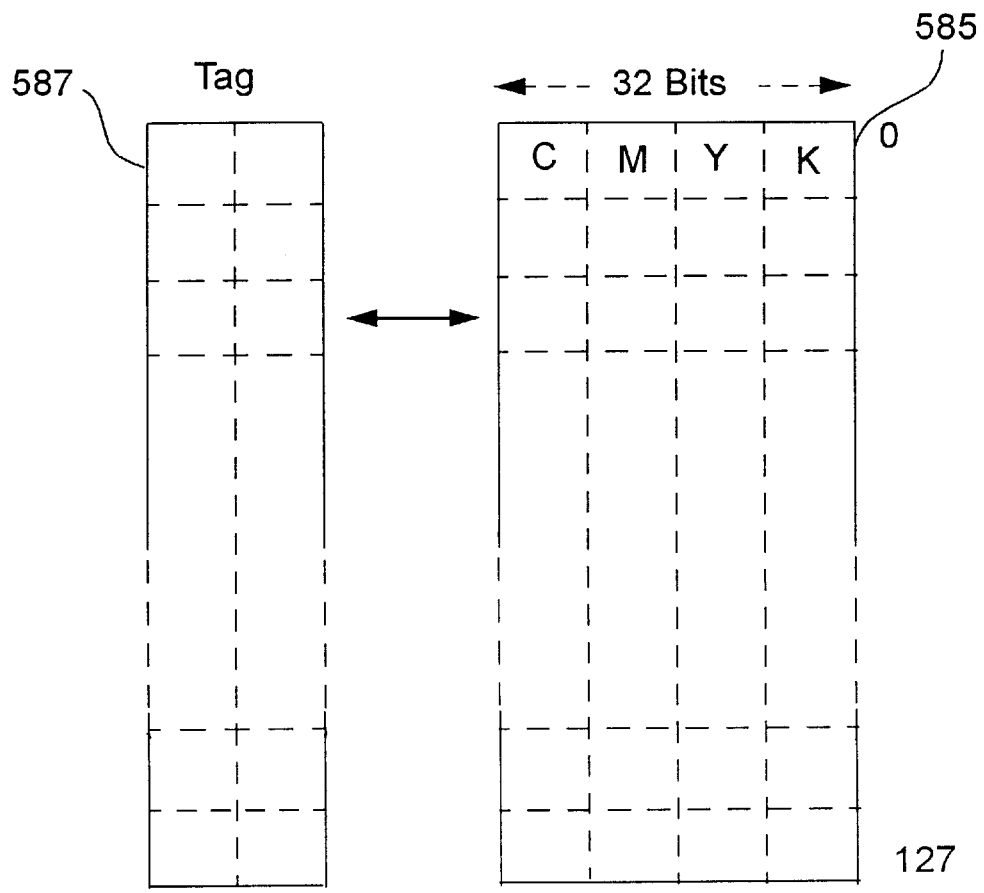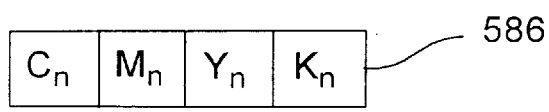
Fig. 63

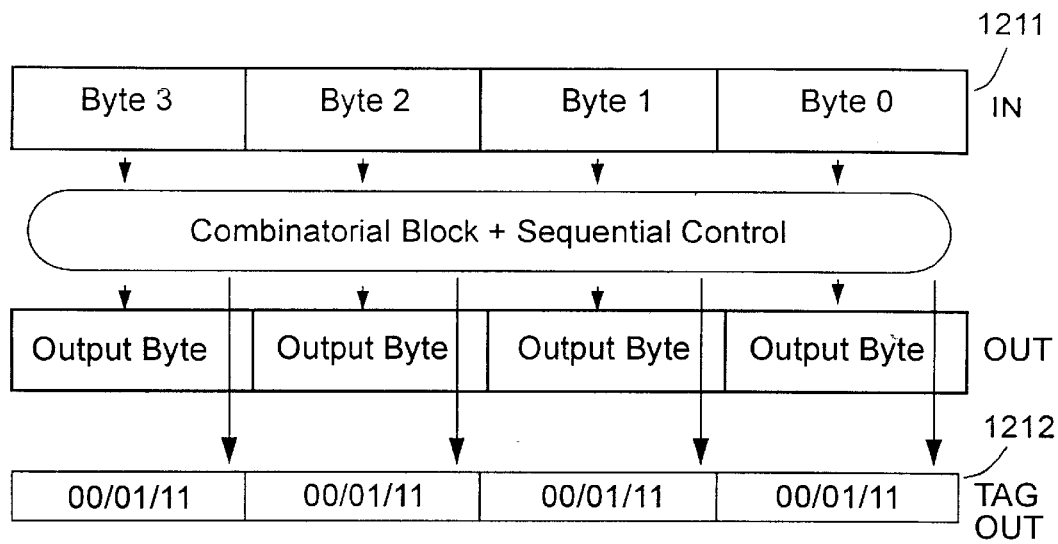

00 - Stripped Byte Invalid, 01-Valid, 11-Valid and following a marker

Examples of Output Data Produced for a Given Input    1213

| INPUT | CORRESPONDING OUTPUT | |
|---|---|---|
| bi - byte to be passed on<br>si - byte to be removed<br>mi - marker byte | bi - byte passed on<br>X - don't care byte | OUTPUT TAGS |
| b3 b2 b1 b0 | b3 b2 b1 b0 | 01 01 01 01 |
| b3 b2 b1 s0 | b3 b2 b1 X | 01 01 01 00 |
| b3 b2 s1 b0 | b3 b2 b0 X | 01 01 01 00 |
| b3 s2 b1 bo | b3 b1 b0 X | 01 01 01 00 |
| s3 b2 b1 b0 | b2 b1 b0 X | 01 01 01 00 |
| b3 b2 s1 s0 | b3 b2 X X | 01 01 00 00 |
| b3 s2 b1 s0 | b3 b1 X X | 01 01 00 00 |
| s3 b2 b1 s0 | b2 b1 X X | 01 01 00 00 |
| s3 b2 s1 b0 | b2 b0 X X | 01 01 00 00 |
| s3 s2 b1 b0 | b1 b0 X X | 01 01 00 00 |
| s3 s2 b1 s0 | b1 X X X | 01 00 00 00 |
| b3 m2 m1 b0 | b3 b0 X X | 01 11 00 00 |

Fig. 85

| | byte address offset from A operand | |
|---|---|---|
| bp | source image start co-ordinate: x integer part | 0x00 |
| | source image start co-ordinate: x fraction part | 0x04 |
| | source image start co-ordinate: y integer part | 0x08 |
| | source image start co-ordinate: y fraction part | 0x0c |
| | source image horizontal delta: x integer part | 0x10 |
| | source image horizontal delta: x fraction part | 0x14 |
| | source image horizontal delta: y integer part | 0x18 |
| | source image horizontal delta: y fraction part | 0x1c |
| | source image vertical delta: x integer part | 0x20 |
| | source image vertical delta: x fraction part | 0x24 |
| | source image vertical delta: y integer part | 0x28 |
| | source image vertical delta: y fraction part | 0x2c |
| rl | w0,0 | 0x30 |
| | w0,1 | |
| | ⋮ | |
| | wr,c | |

Fig. 94 byte address offset
from A operand

| 31 | 2423 | | 0 | |
|---|---|---|---|---|
| | bp | source image start co-ordinate: x integer part | | 0x00 |
| rl | | w0,0 | | 0x04 |
| | | w0,1 | | |
| | | ⋮ | | |
| | | wr,c | | |
| 31 | 2019 | | 0 | |

Fig. 95

Result(0) = aS1+bS2+cS3+dS5+eS6+fS7+gS9+hS10+iS11
Result(1) = aS2+bS3+cS4+dS6+eS7+fS8+gS10+hS11+iS12

Horizontal Interpolation by a factor of 2
Input Data stream
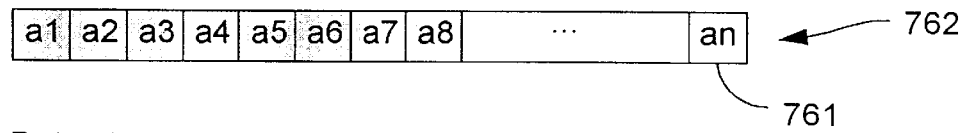
Output Data stream
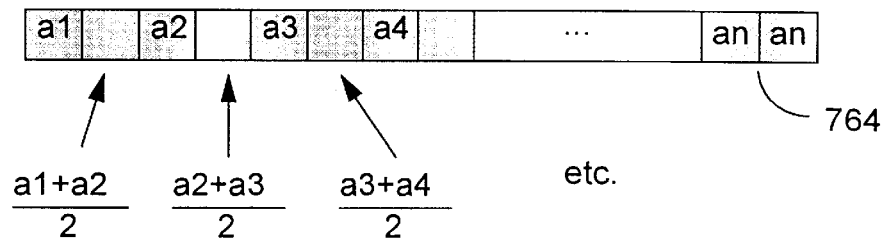
etc.
Fig. 102
Horizontal Interpolation by a factor of 4
Input Data stream
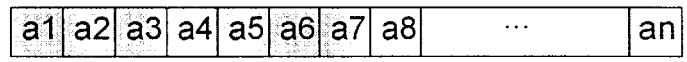
Output Data stream
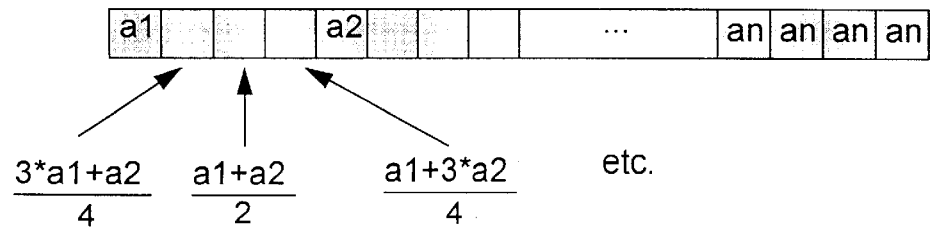
etc.
Fig. 103

Vertical Interpolation by a factor of 2 or 4
A Input Data stream
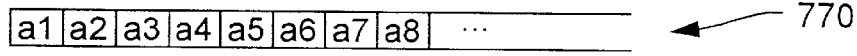 ← 770
B Input Data stream
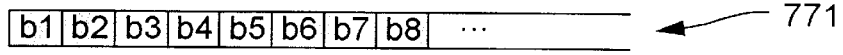 ← 771
Output Data stream (factor of 2)
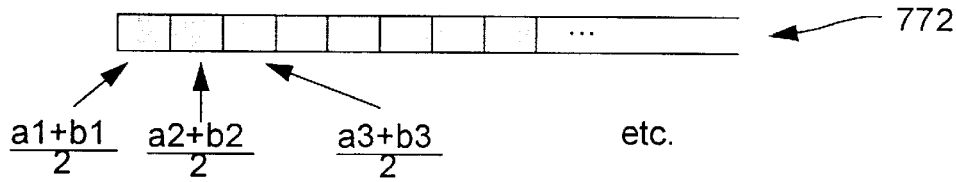 ← 772
$\frac{a1+b1}{2}$   $\frac{a2+b2}{2}$   $\frac{a3+b3}{2}$   etc.
Output Data stream (factor of 4)
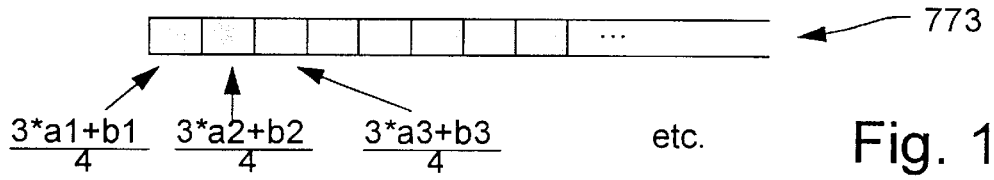 ← 773
$\frac{3*a1+b1}{4}$   $\frac{3*a2+b2}{4}$   $\frac{3*a3+b3}{4}$   etc.
Fig. 104
Residual Merging
A Input Data stream
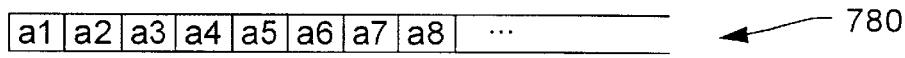 ← 780
B Input Data stream
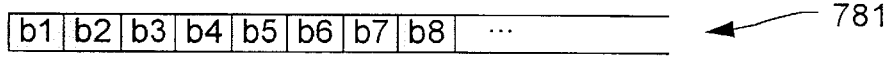 ← 781
Output Data stream
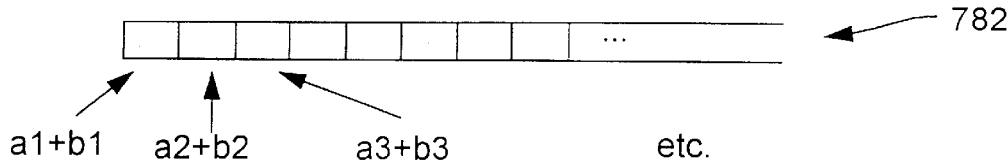 ← 782
a1+b1   a2+b2   a3+b3   etc.
Fig. 105

Instruction Word Encoding for PhotoCD Instructions

Instruction Word Encoding for Flow Control Instructions byte address offset
from A operand

| | 31 24 | 23 | 0 | |
|---|---|---|---|---|
| | | bp | source image start co-ordinate: x integer part | 0x00 |
| | | | source image start co-ordinate: x fraction part | 0x04 |
| | | | source image start co-ordinate: y integer part | 0x08 |
| | | | source image start co-ordinate: y fraction part | 0x0c |
| | | | source image horizontal delta: x integer part | 0x10 |
| | | | source image horizontal delta: x fraction part | 0x14 |
| | | | source image horizontal delta: y integer part | 0x18 |
| | | | source image horizontal delta: y fraction part | 0x1c |
| | | | source image vertical delta: x integer part | 0x20 |
| | | | source image vertical delta: x fraction part | 0x24 |
| | | | source image vertical delta: y integer part | 0x28 |
| | | | source image vertical delta: y fraction part | 0x2c |
| | rl | | w0,0 | 0x30 |
| | | | w0,1 | |
| | | | . . . | |
| | | | wr,c | |
| 31 | 20 19 | | | 0 | byte address offset
from A operand

| | 31 24 | 23 | 0 | |
|---|---|---|---|---|
| | | bp | source image start co-ordinate: x integer part | 0x00 |
| | rl | | w0,0 | 0x04 |
| | | | w0,1 | |
| | | | . . . | |
| | | | wr,c | |
| 31 | 20 19 | | | 0 |

Fig. 138

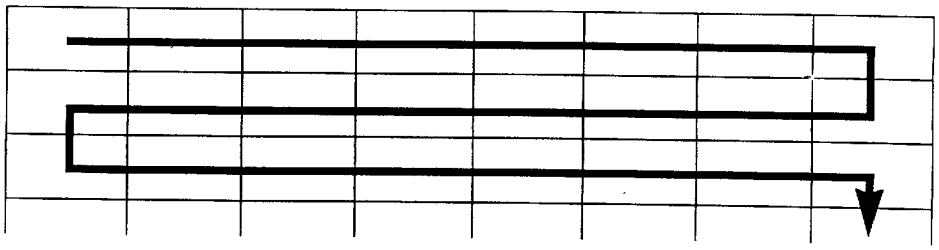
Image transformation
(assuming a 3X3 matrix)
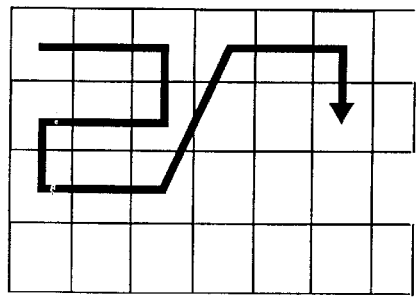
Convolution
(assuming a 3X3 matrix)
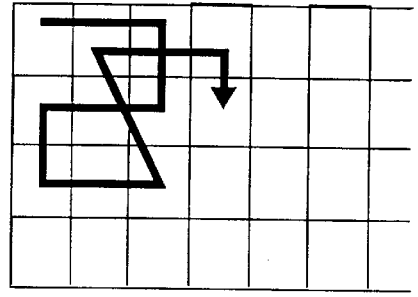
Fig. 139

```
IF (AREQ) THEN
   IF (BREQ & (A>B) + CREQ & (A>C) + DREQ & (A>D)) THEN
      GRANT A
IF (BREQ) THEN
   IF (AREQ & !(A>B) + CREQ & (B>C) + DREQ & (B>D)) THEN
      GRANT B
IF (CREQ) THEN
   IF (AREQ & !(A>C) + BREQ & !(B>C) + DREQ & (C>D)) THEN
      GRANT C
IF (DREQ) THEN
   IF (AREQ & !(A>D) + BREQ & !(B>D) + CREQ & !(C>D)) THEN
      GRANT D

IF (GRANT A) THEN {
   IF ((AU==BU) & (AL>BL)) THEN
      BL++
   IF ((AU==CU) & (AL>CL)) THEN
      CL++
   IF ((AU==DU) & (AL>DL)) THEN
      DL++
   AL = 0
}
ELSEIF (GRANT B) THEN {
   IF ((AU==BU) & !(AL>BL)) THEN
      AL++
   IF ((BU==CU) & (BL>CL)) THEN
      CL++
   IF ((BU==DU) & (BL>DL)) THEN
      DL++
   BL = 0
}
ELSEIF (GRANT C) THEN {
   IF ((AU==CU) & !(AL>CL)) THEN
      AL++
   IF ((BU==CU) & !(BL>CL)) THEN
      BL++
   IF ((CU==DU) & (CL>DL)) THEN
      DL++
   CL = 0
}
ELSEIF (GRANT D) THEN {
   IF ((AU==DU) & !(AL>DL)) THEN
      AL++
   IF ((BU==DU) & !(BL>DL)) THEN
      BL++
   IF ((CU==DU) & !(CL>DL)) THEN
      CL++
   DL = 0
}
```

Fig. 148

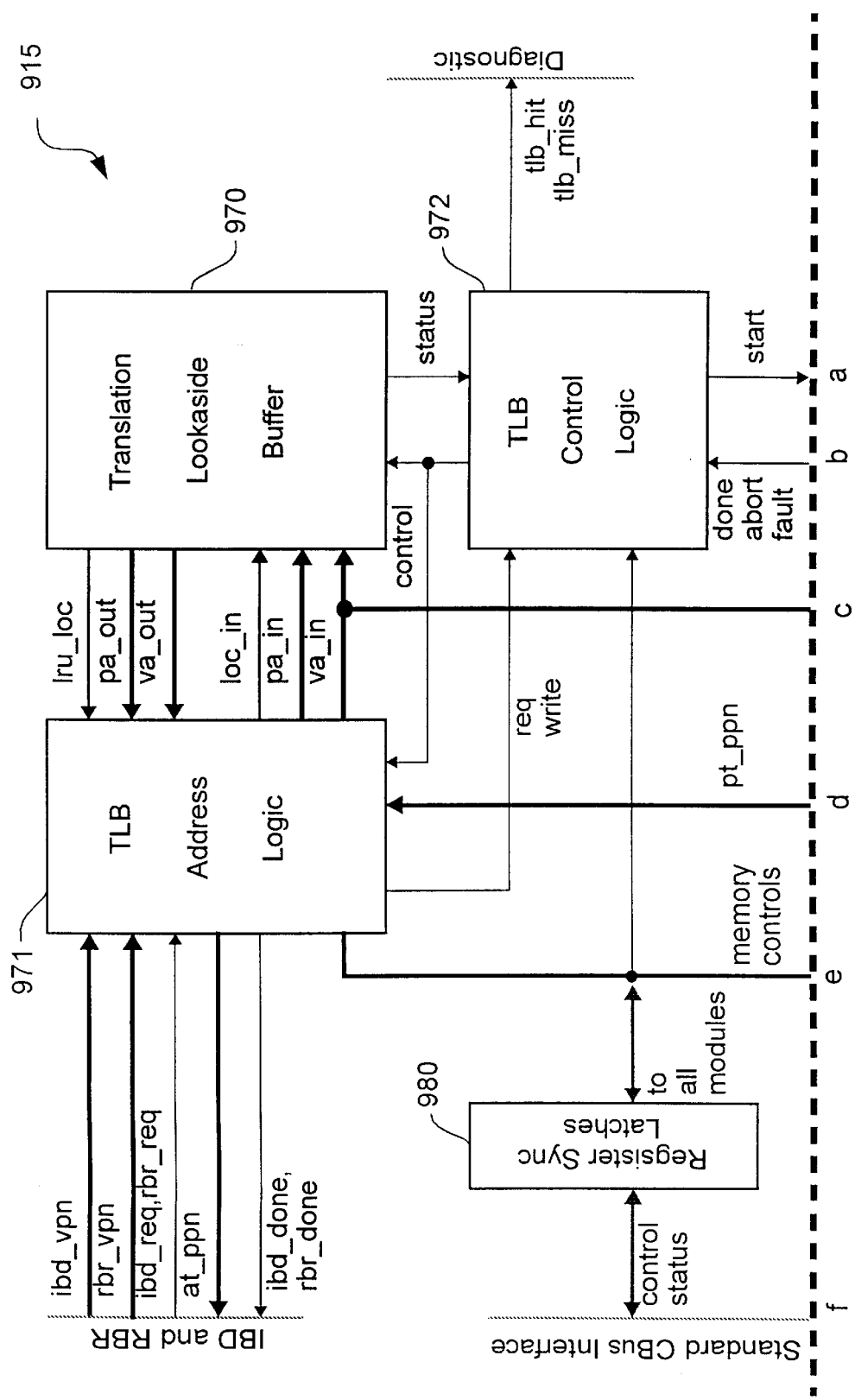

MEMORY CONTROLLER ARCHITECTURE

Microfiche Appendex: There are 3 microfiche in total, and 108 frames in total.

FIELD OF THE INVENTION

The present invention relates to an electronic circuit for providing a number of ports with burst access to an array of dynamic random access memory (DRAM). In particular, the present invention provides a circuit which improves memory bandwidth utilisation whilst reducing delays on the ports, and a dynamic memory controller allowing a number of ports access to a common array of dynamic memory while increasing DRAM bandwidth utilisation.

BACKGROUND OF THE INVENTION

One method for allowing a number of ports burst access to a common dynamic memory array is simply to arbitrate for access between the ports and then allow one of the ports access to the memory array on a one-on-one basis. This method has the disadvantage of preventing access to contents of the memory such that if any other port requires access, it will be forced to wait until the first port relinquishes access to the memory. This waiting amounts to idle time and can significantly reduce overall system performance.

Another method may be to implement the system described in the preceding paragraph, whilst allowing a second port to force the first port to abort or cut short its access to the memory array. However, this method may still result in reduced throughput and idle time where one or more of the ports requests access, but is denied.

It is an object of the invention to overcome or at least substantially ameliorate one or more of the disadvantages of the prior art.

SUMMARY OF THE INVENTION

According to one aspect of the invention there is provided a multi-port burst dynamic random access memory (DRAM) system including:

a memory array;

a controller for controlling the memory array;

a write port for writing data to the memory array;

a read port for reading data from the memory array; and either: a first-in-first-out (FIFO) output buffer disposed between the memory array and the read port to temporarily store data read from the memory array; or a first-in-first-out (FIFO) input buffer disposed between the memory array and the write port to temporarily store data prior to writing to the memory array.

Preferably, the multi-port burst DRAM system includes a plurality of read ports for reading data from the memory array, and a corresponding plurality of FIFO output buffers disposed between the memory array and the read ports to temporarily store data read from the memory array. Most preferably, the multi-port burst DRAM system also includes a plurality of write ports for writing data to the memory array, and a corresponding plurality of FIFO input buffers disposed between the memory array and the write ports to temporarily store data prior to writing to the memory array.

According to another aspect of the invention there is provided a method of improving access latency of a multi-port burst dynamic random access memory (DRAM) arrangement, the arrangement incorporating a memory array and a memory controller, the method including the steps of:

providing a write port for writing data to the memory array;

providing a read port for reading data from the memory array;

providing either: a first-in-first-out (FIFO) output buffer disposed between the memory array and the read port; or a first-in-first-out (FIFO) input buffer disposed between the memory array and the write port;

temporarily storing data from in the FIFO output buffer or the FIFO input buffer.

In the following detailed description, the reader's attention is directed, in particular, to FIG. 2 and any one or more of FIGS. 146 to 149, and their associated description, without intending to detract from the disclosure of the remainder of the description.

TABLE OF CONTENTS 1.0 Brief Description of the Drawings
2.0 List of Tables
3.0 Description of the Preferred and Other Embodiments
    3.1    General Arrangement of Plural Stream Architecture
    3.2    Host/Co-processor Queuing
    3.3    Register Description of Co-processor
    3.4    Format of Plural Streams
    3.5    Determine Current Active Stream
    3.6    Fetch Instruction of Current Active Stream
    3.7    Decode and Execute Instruction
    3.8    Update Registers of Instruction Controller
    3.9    Semantics of the Register Access Semaphore
    3.10    Instruction Controller
    3.11    Description of a Modules Local Register File
    3.12    Register Read/Write Handling
    3.13    Memory Area Read/Write Handling
    3.14    CBus Structure
    3.15    Co-processor Data Types and Data Manipulation
    3.16    Data Normalization Circuit
    3.17    Image Processing Operations of Accelerator Card
        3.17.1    Compositing
        3.17.2    Color Space Conversion Instructions
            a. Single Output General Color Space (SOGCS) Conversion Mode
            b. Multiple Output General Color Space Mode
        3.17.3    JPEG Coding/Decoding
            a. Encoding
            b. Decoding
        3.17.4    Table Indexing
        3.17.5    Data Coding Instructions
        3.17.6    A Fast DCT Apparatus
        3.17.7    Huffman Decoder
        3.17.8    Image Transformation Instructions
        3.17.9    Convolution Instructions
        3.17.10    Matrix Multiplication
        3.17.11    Halftoning
        3.17.12    Hierarchial Image Format Decompression
        3.17.13    Memory Copy Instructions
            a. General purpose data movement instructions
            b. Local DMA instructions
        3.17.14    Flow Control Instructions
    3.18    Modules of the Accelerator Card
        3.18.1    Pixel Organizer
        3.18.2    MUV Buffer
        3.18.3    Result Organizer
        3.18.4    Operand Organizers B and C
        3.18.5    Main Data Path Unit
        3.18.6    Data Cache Controller and Cache
            a. Normal Cache Mode
            b. The Single Output General Color Space Conversion Mode
            c. Multiple Output General Color Space Conversion Mode
            d. JPEG Encoding Mode
            e. Slow JPEG Decoding Mode
            f. Matrix Multiplication Mode
            g. Disabled Mode -continued

TABLE OF CONTENTS h. Invalidate Mode
 3.18.7 Input Interface Switch
 3.18.8 Local Memory Controller
 3.18.9 Miscellaneous Module
 3.18.10 External Interface Controller
 3.18.11 Peripheral Interface Controller
APPENDIX A - Microprogramming
APPENDIX B - Register tables

1.0. BRIEF DESCRIPTION OF THE DRAWINGS

Notwithstanding any other forms which may fall within the scope of the present invention, preferred forms of the invention will now be described, by way of example only, with reference to the accompanying drawings:

FIG. 12 illustrates the data word fields of a standard instruction;

FIG. 21 illustrates the format of control bus transactions as utilized in the co-processor;

FIG. 48 illustrates various fields utilized by internal registers to determine what data transformations should be carried out;

FIG. 63 illustrates the process of address re-mapping for the cache when utilized during the process of multiple color space conversion;

Figure 81:
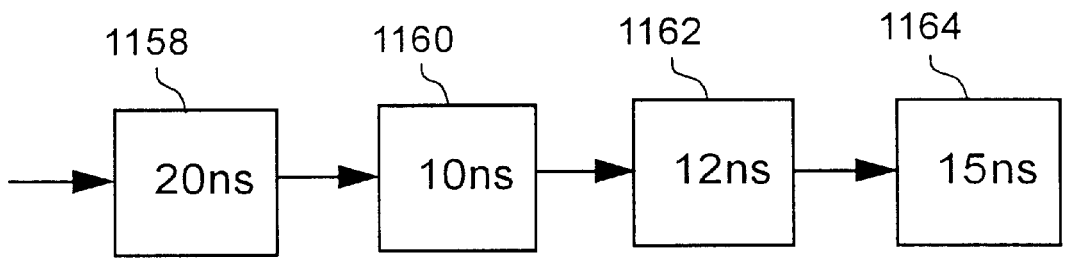
FIG. 81 illustrates an arithmetic data path of the DCT apparatus of FIG. 79.
Figure 82:
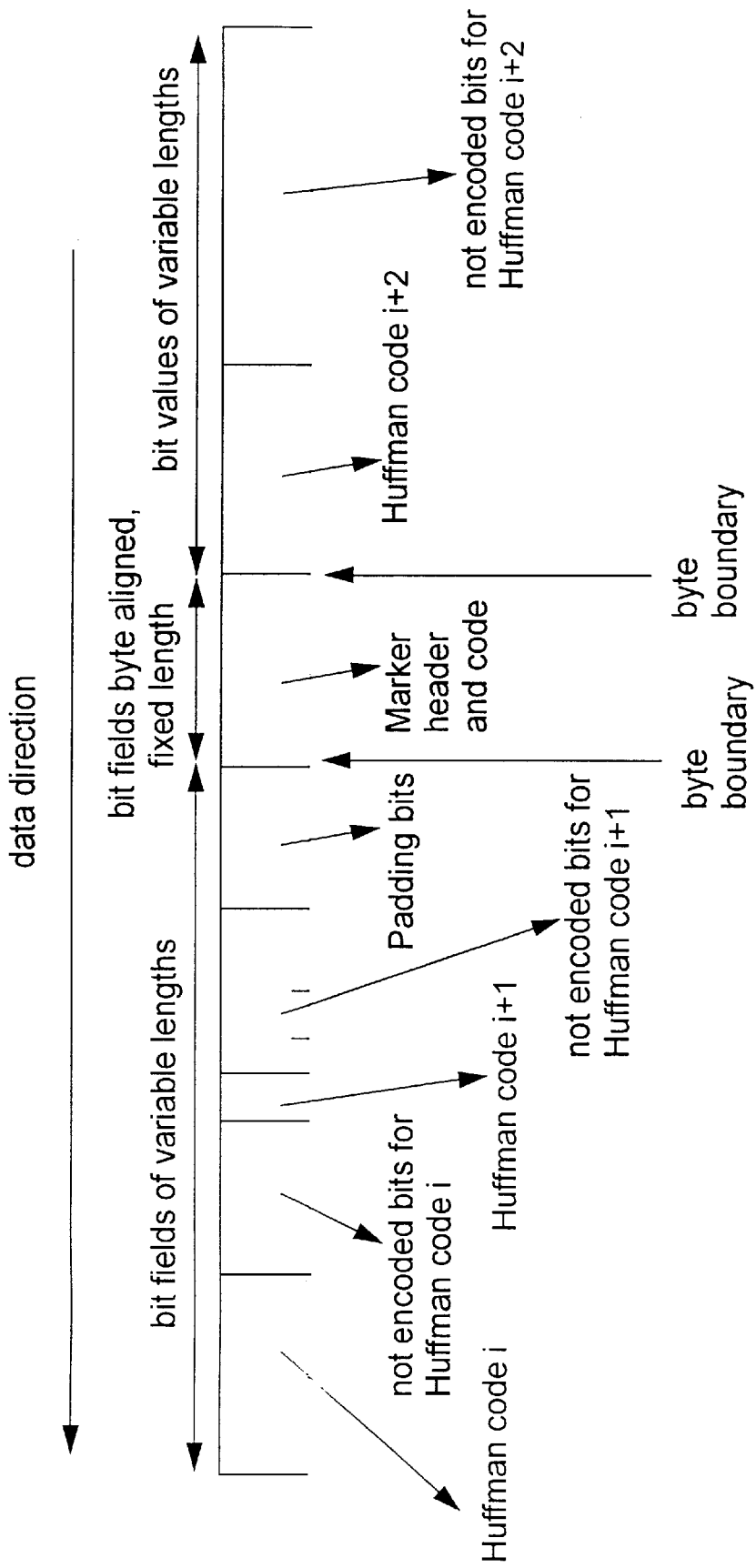
Figure 83A:
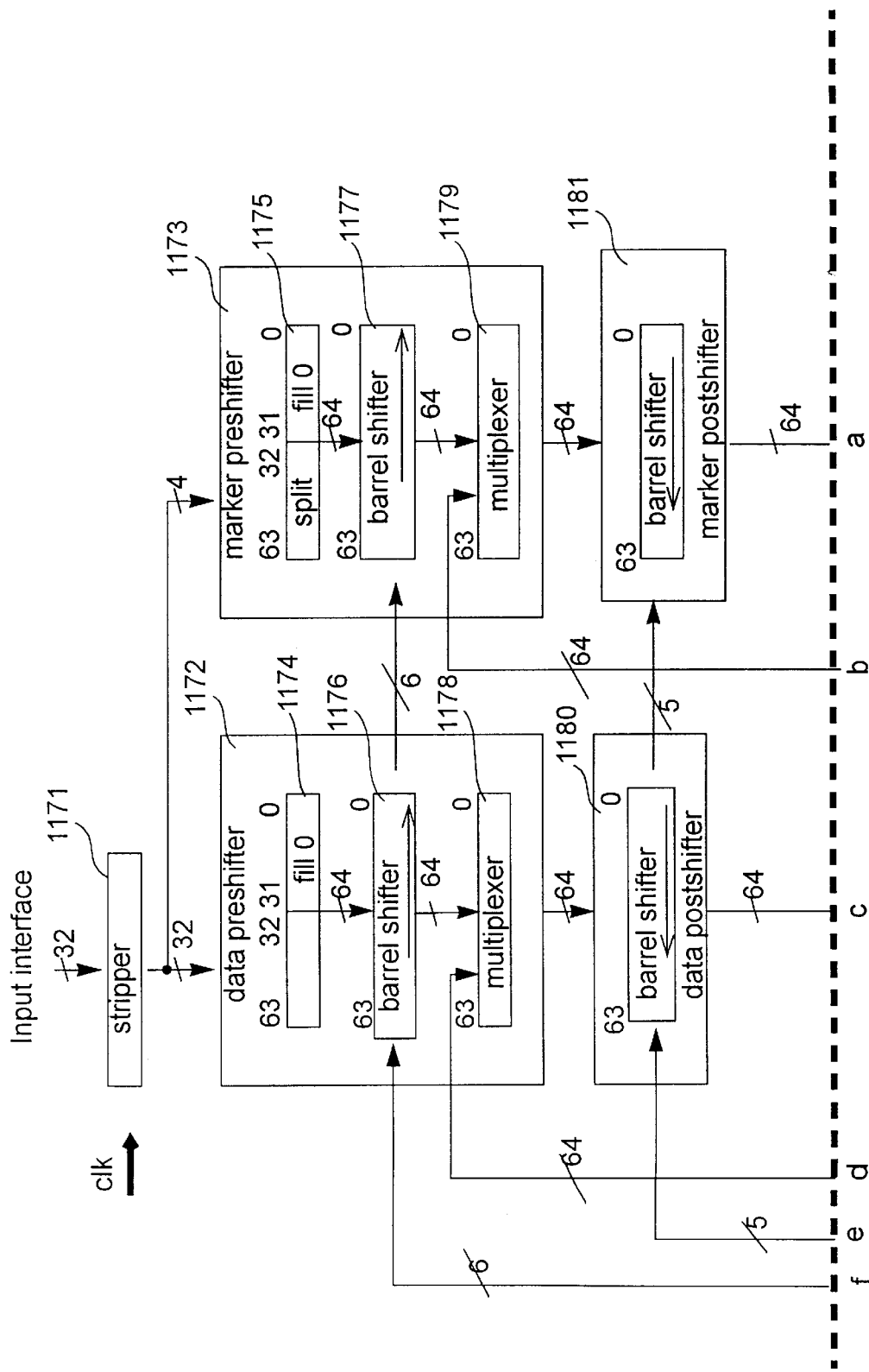
Figure 83B:
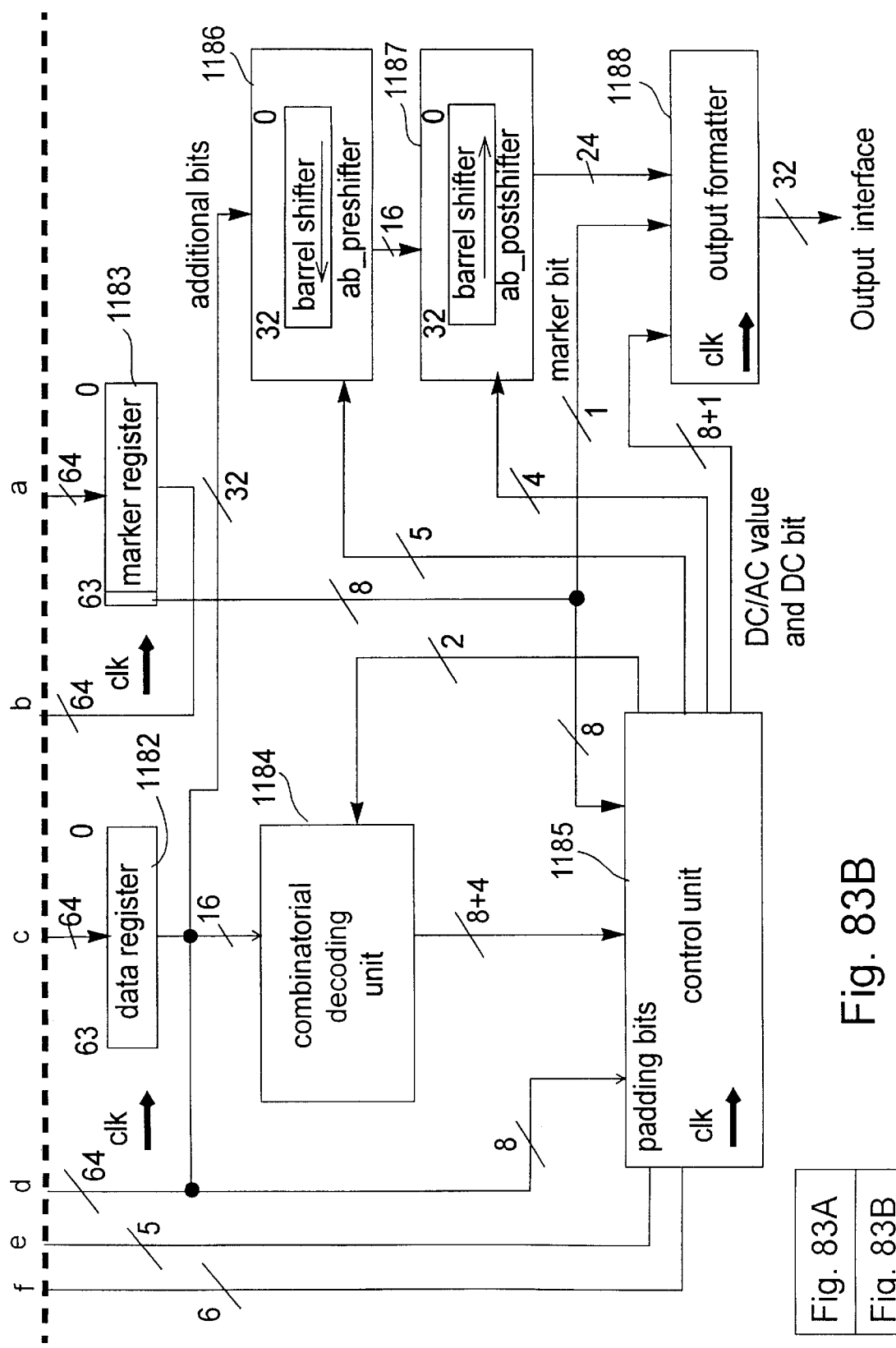
Figure 84:
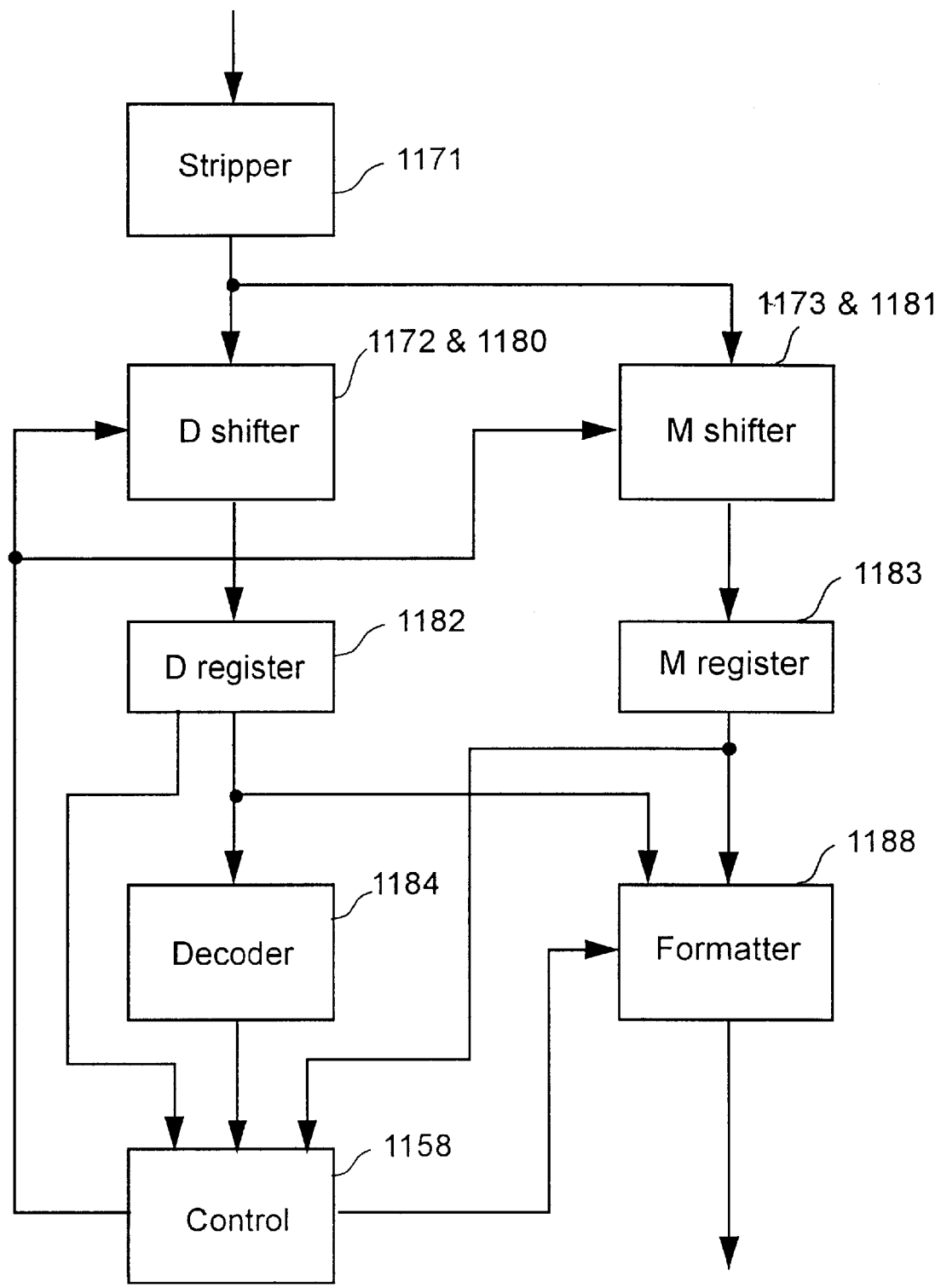
Figure 86A:
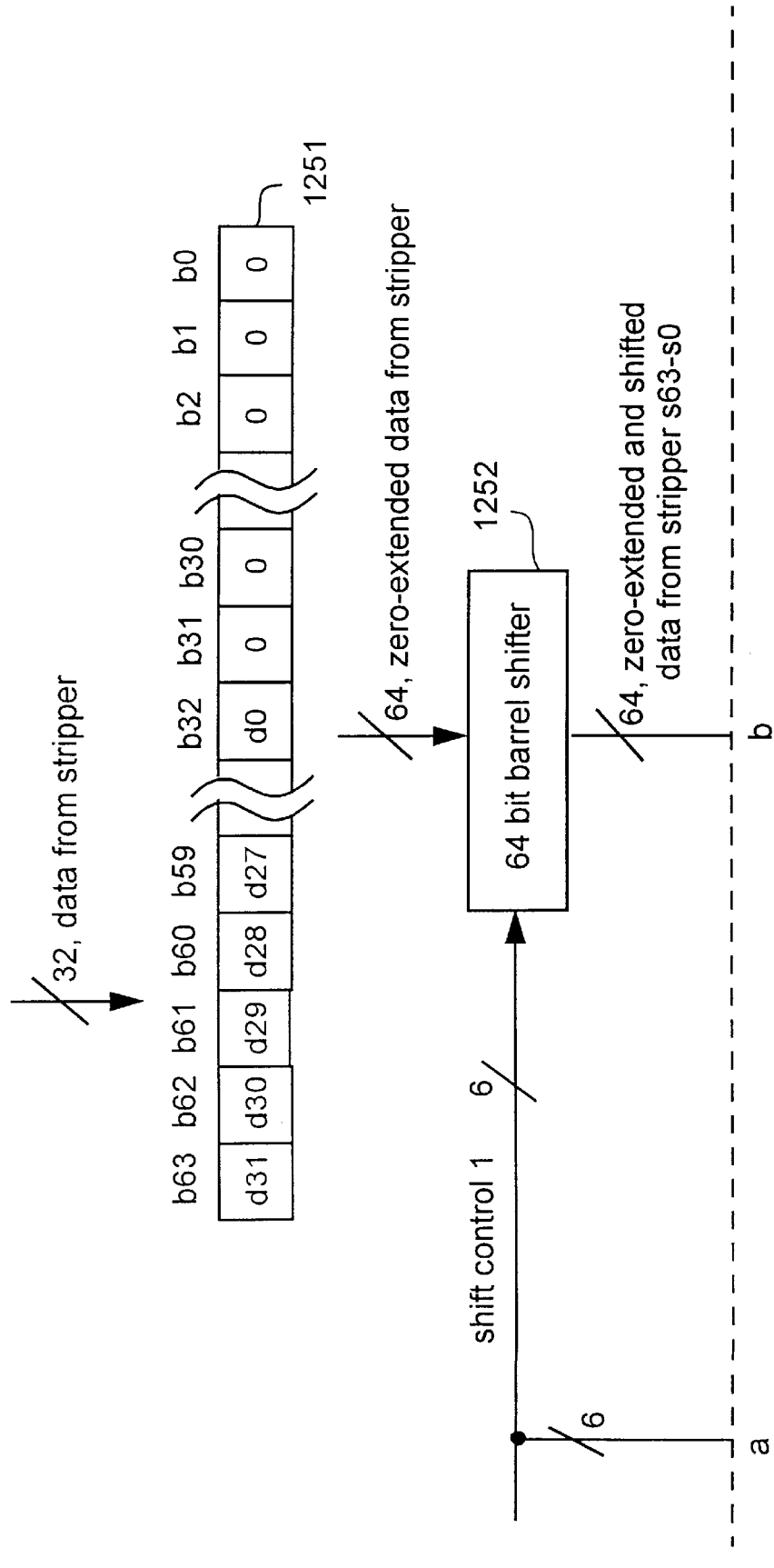
Figure 86B:
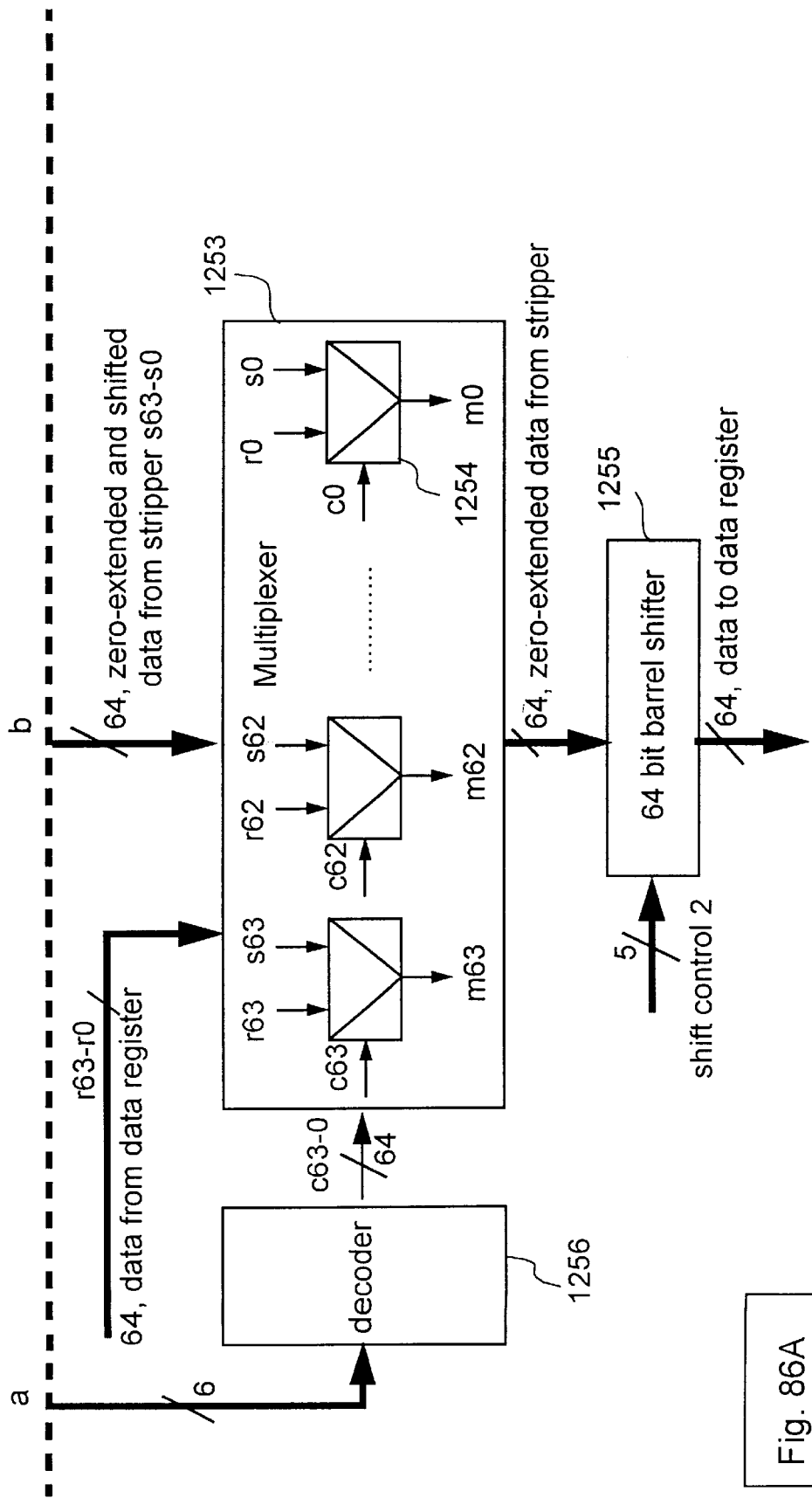
Figure 87A:
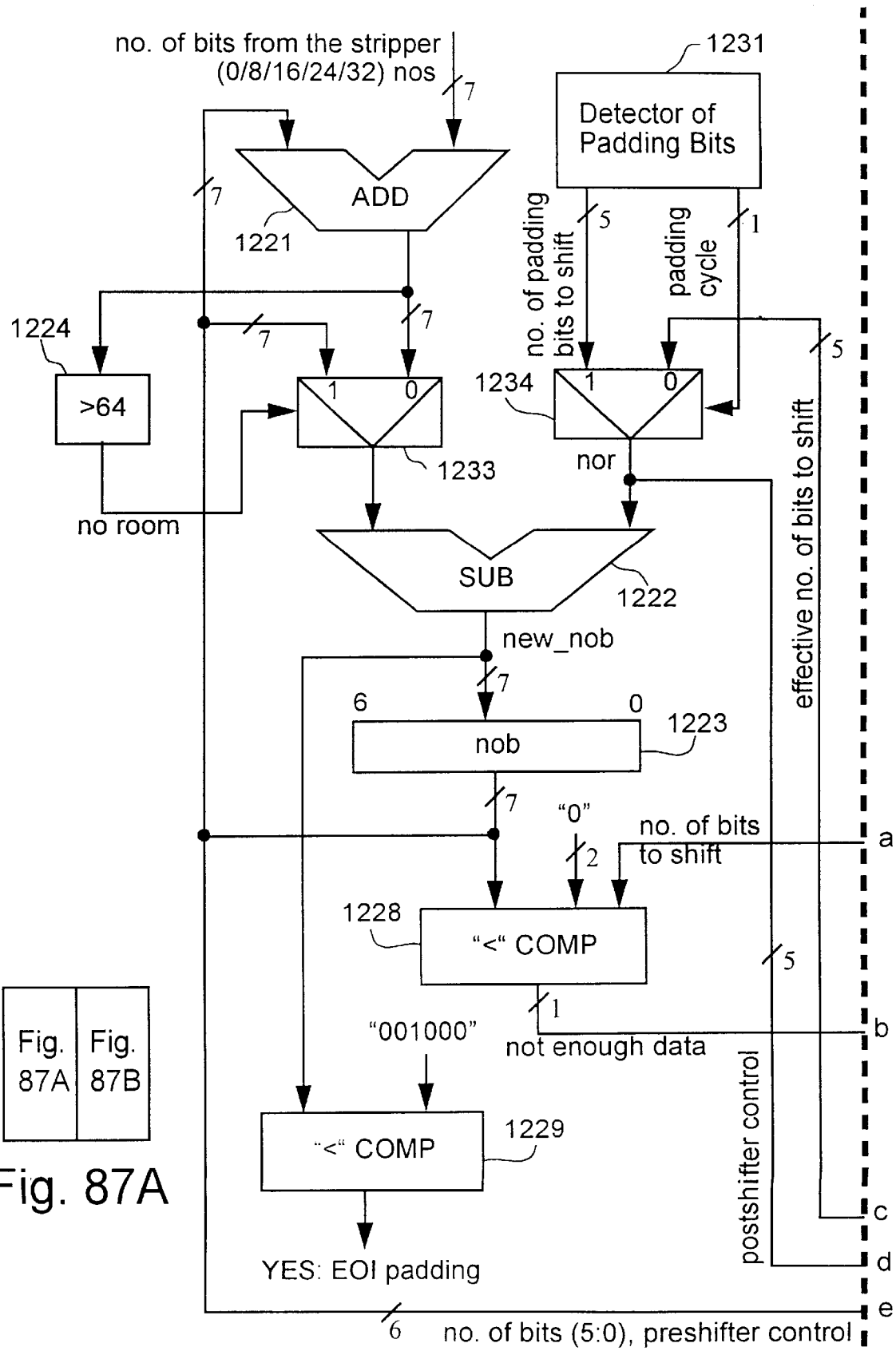
Figure 87B:
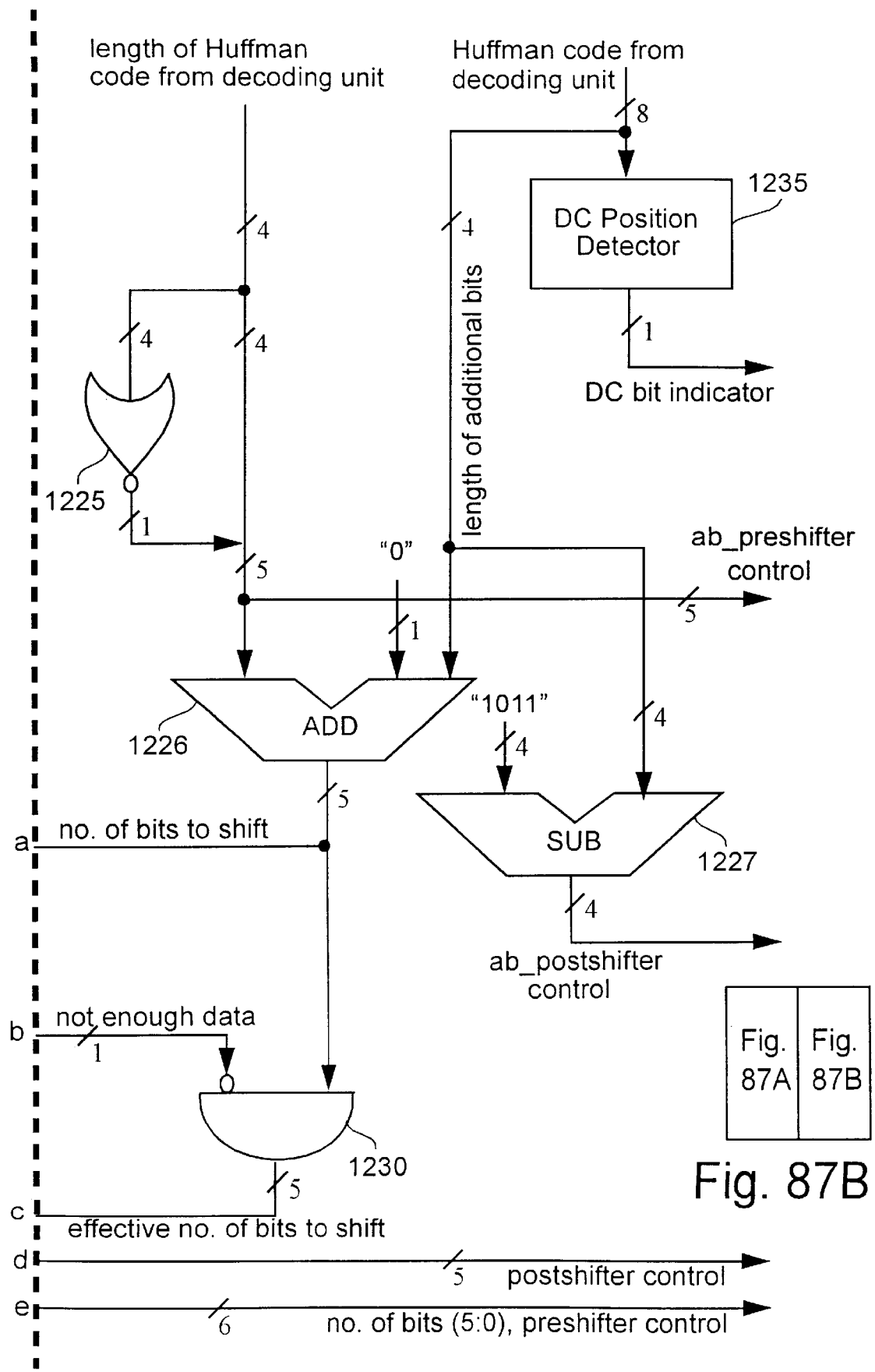
Figure 88A:
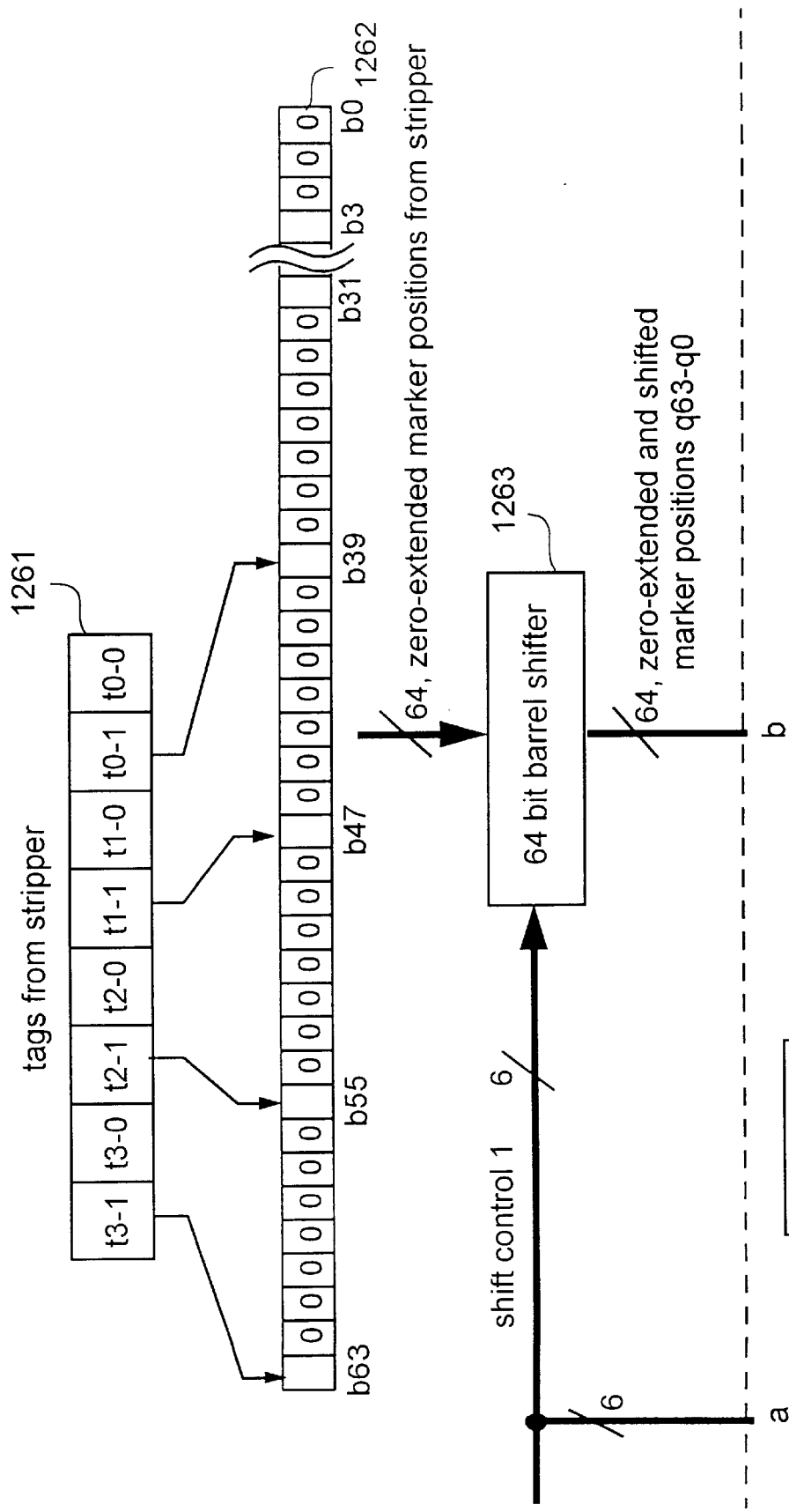
Figure 88B:
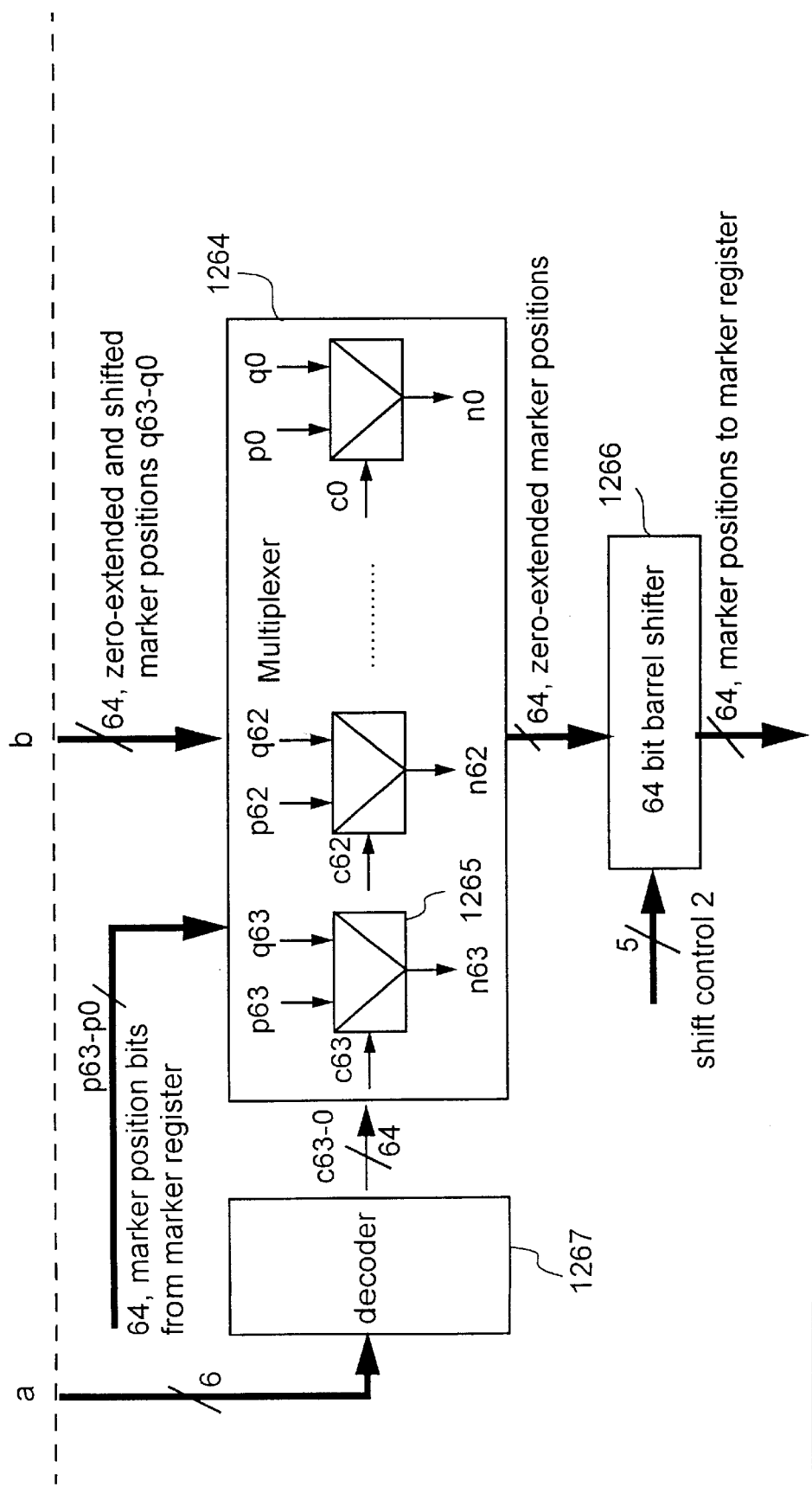
Figure 89:
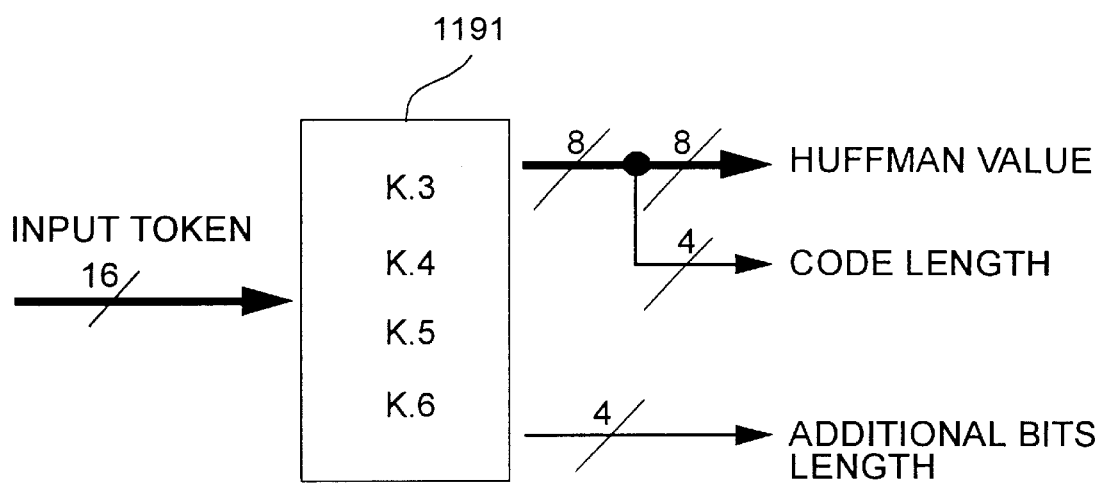
Figure 90:
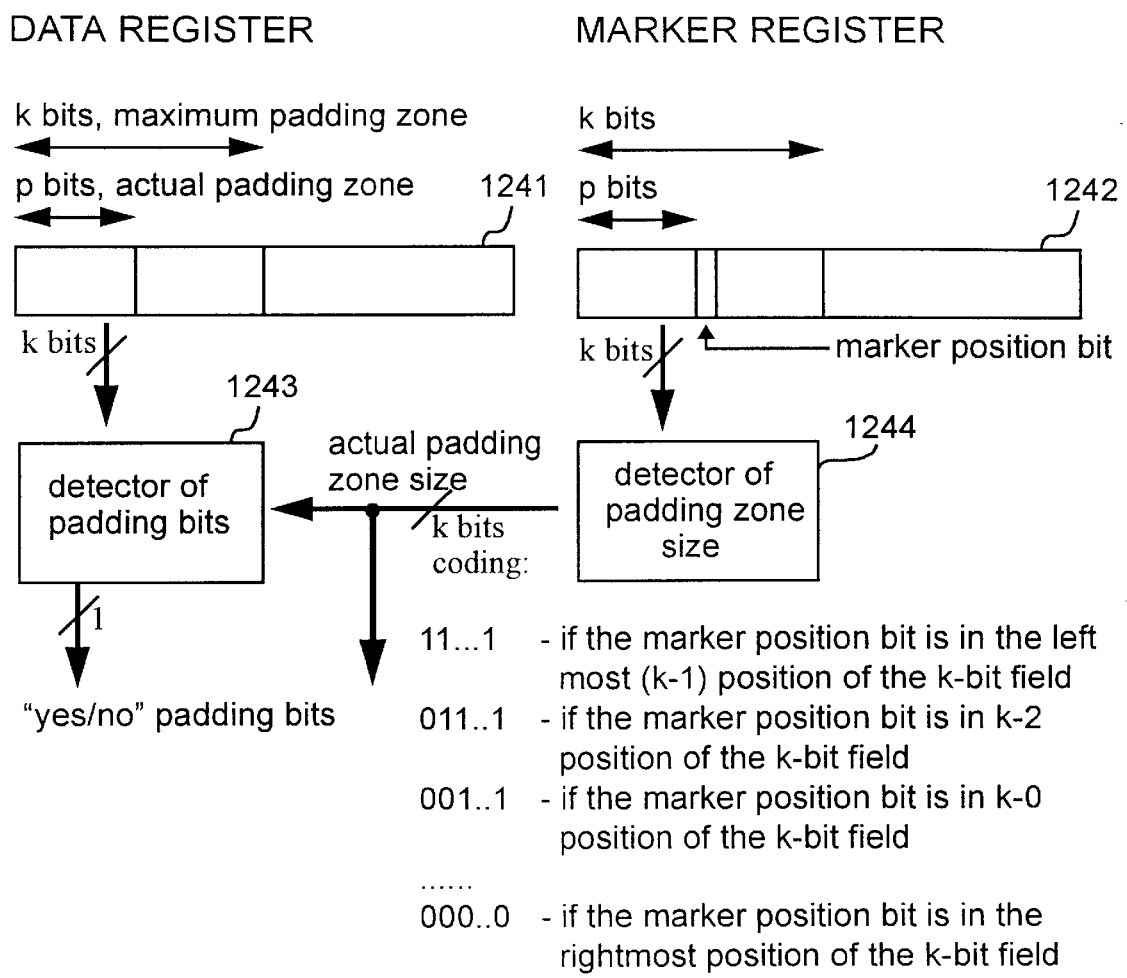
Figure 91:
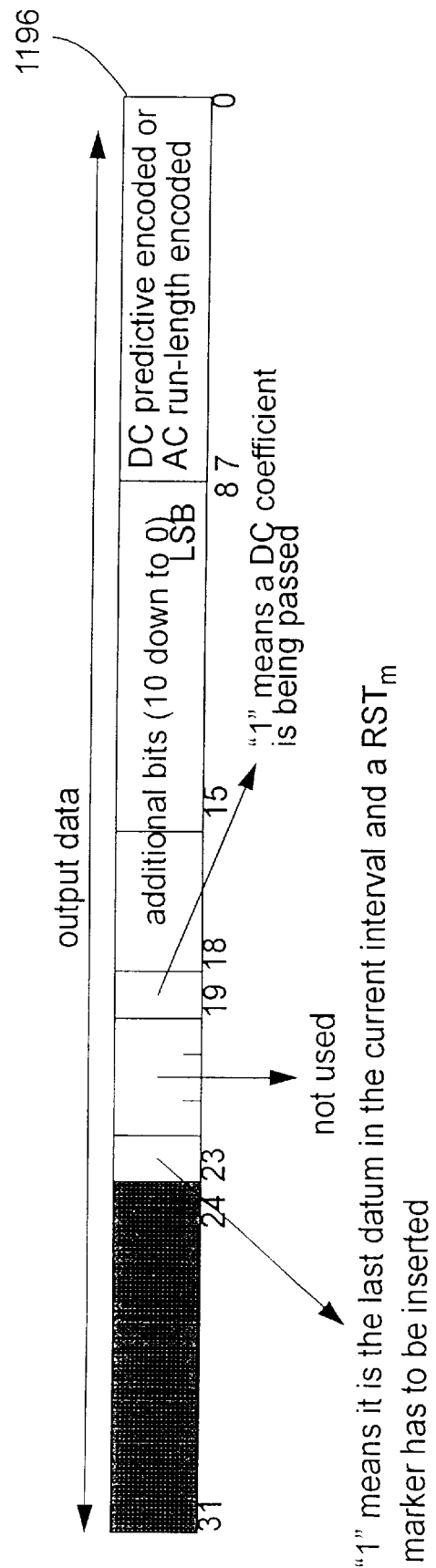
Figure 92:
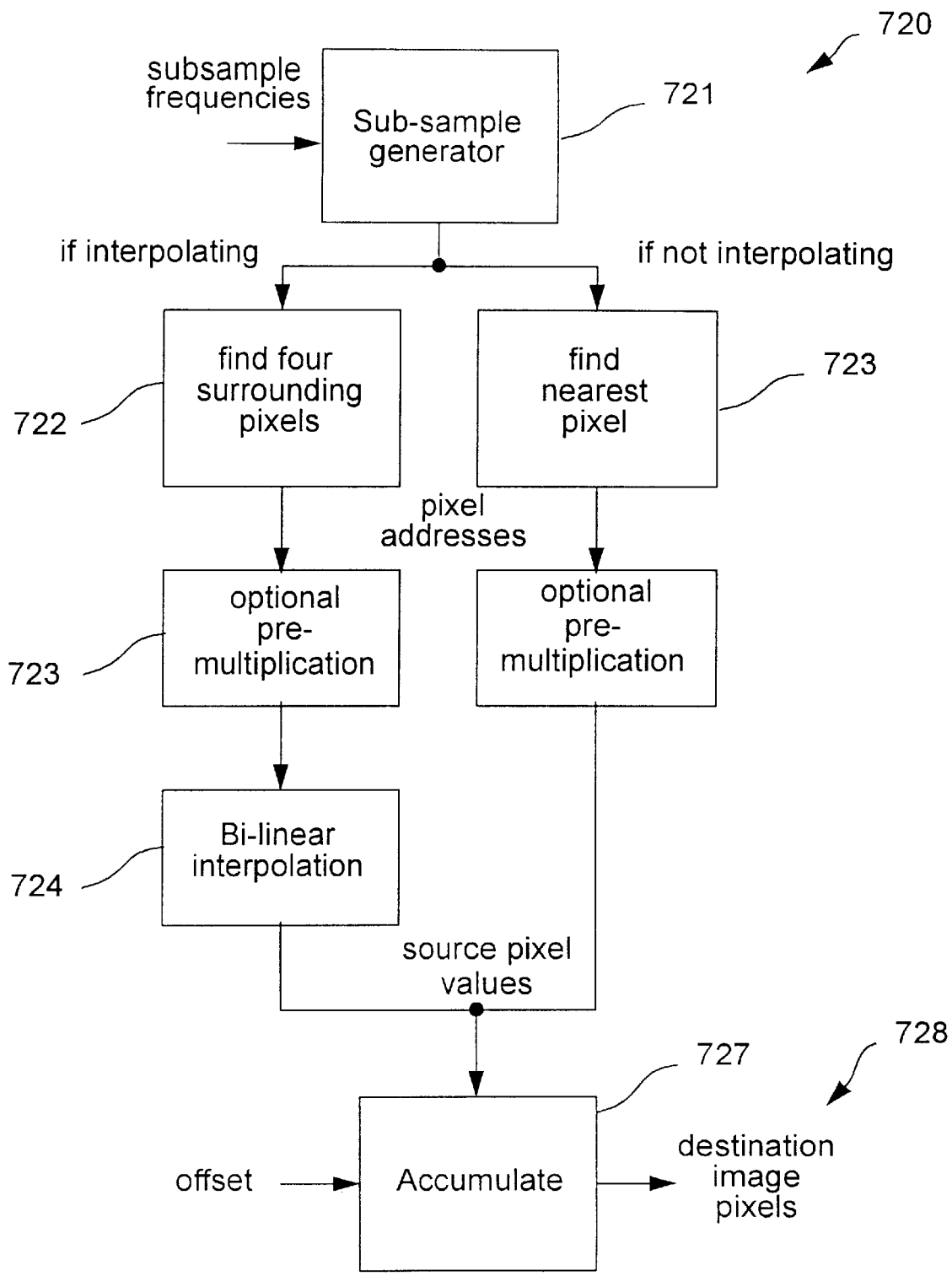
Figure 93:
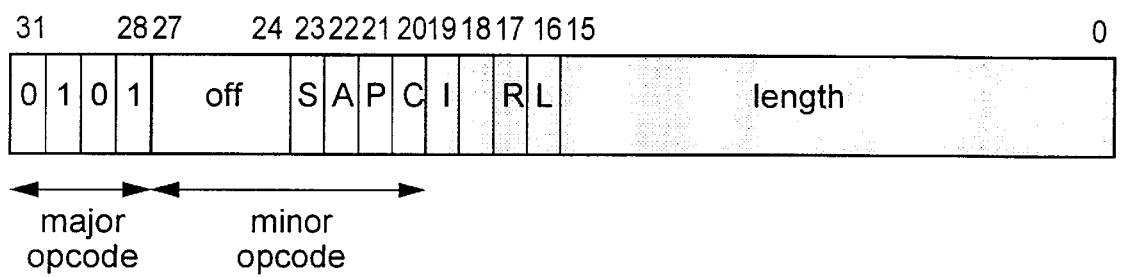
Figure 96:
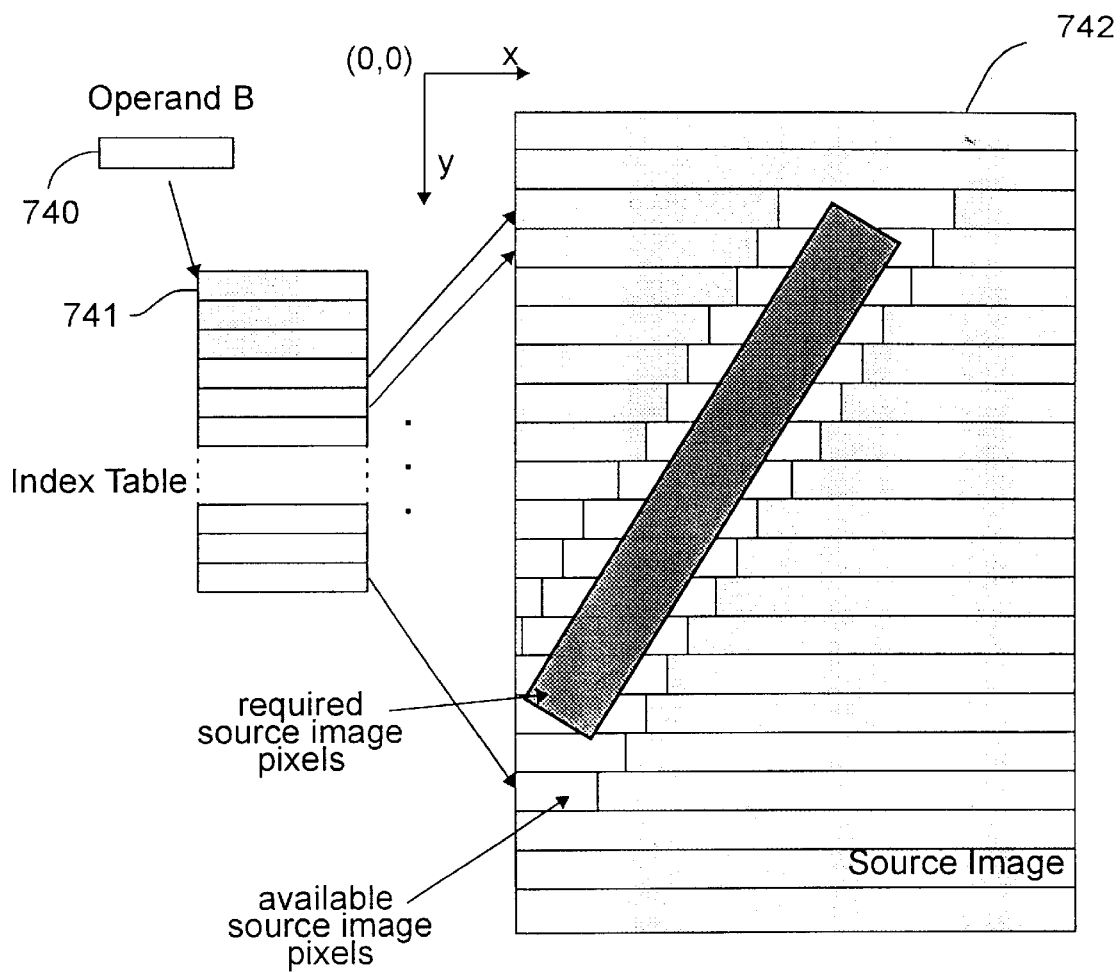
Figure 97:
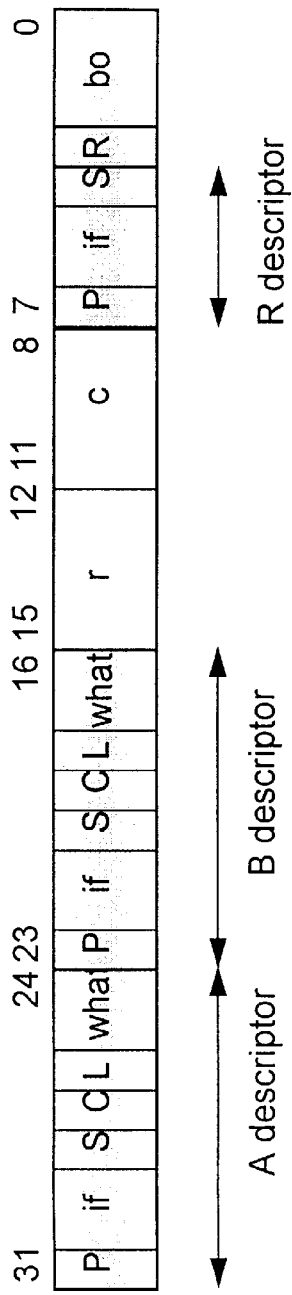
Figure 98:
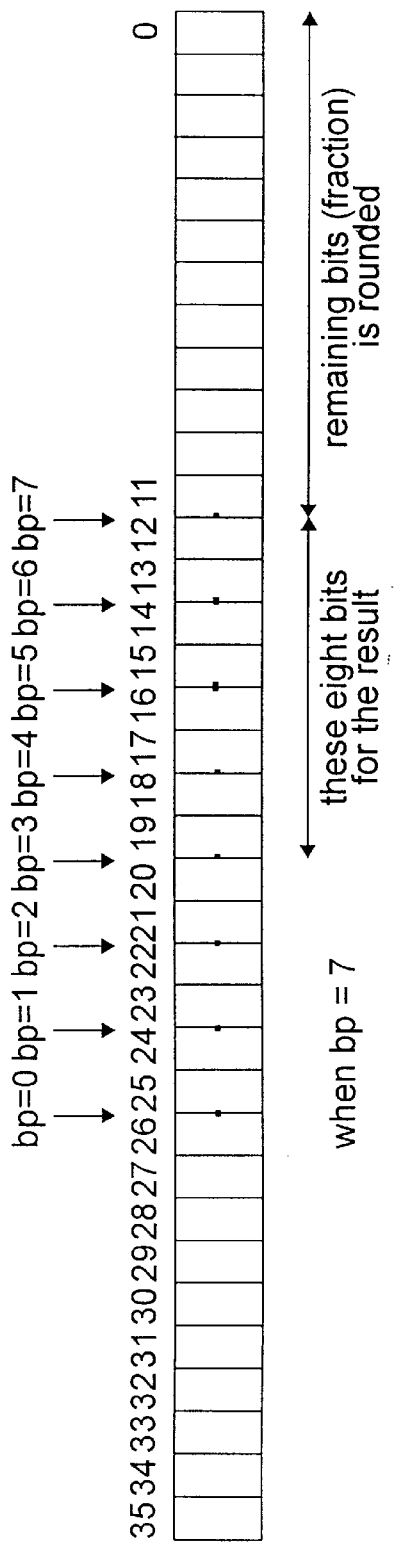
Figure 99:
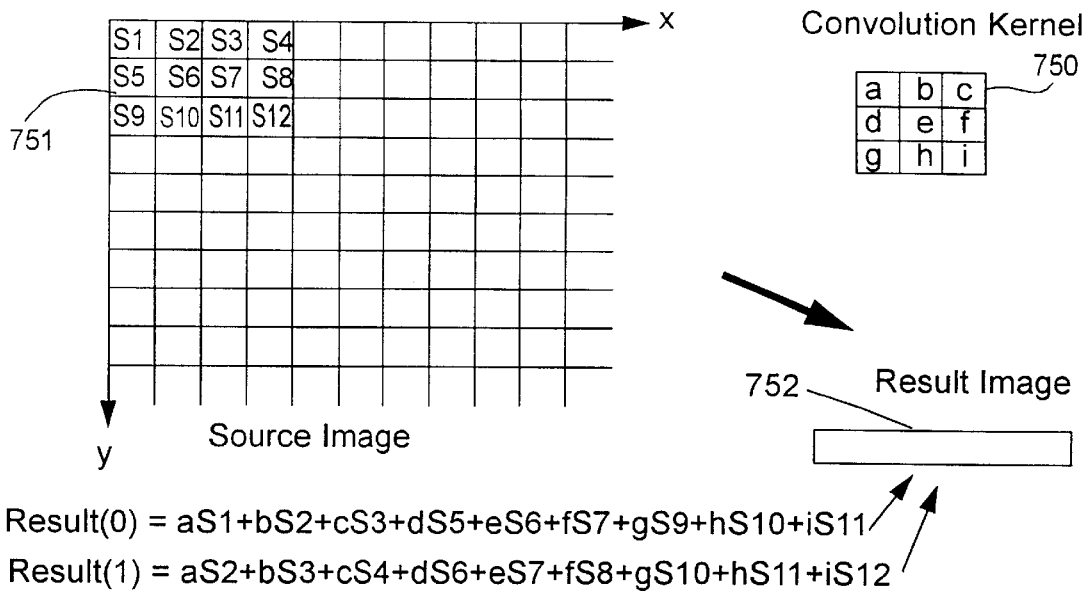
Figure 100:
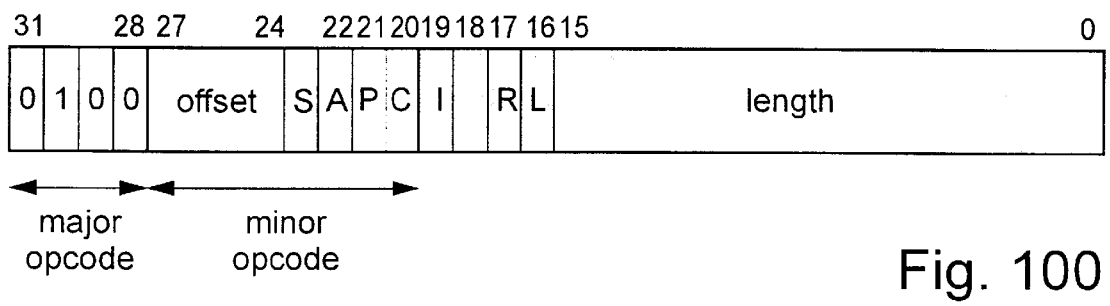
Figure 101:
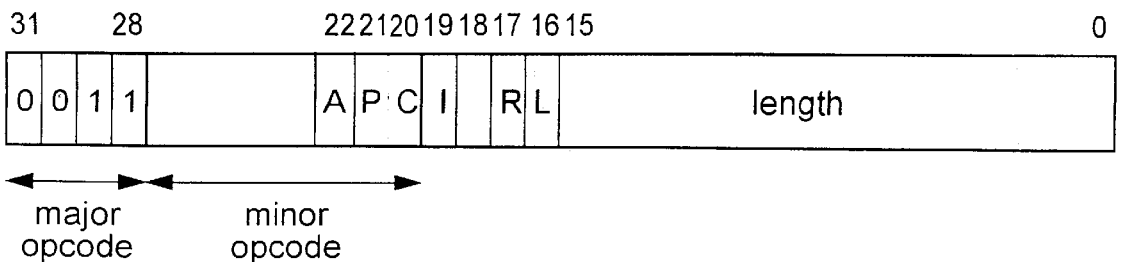
Figure 106:
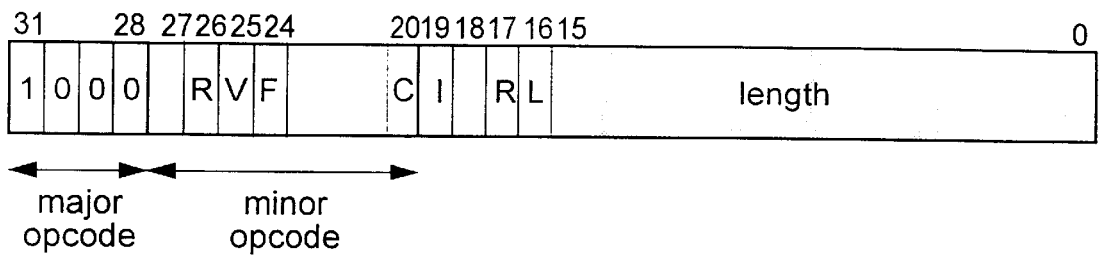
Figure 107:
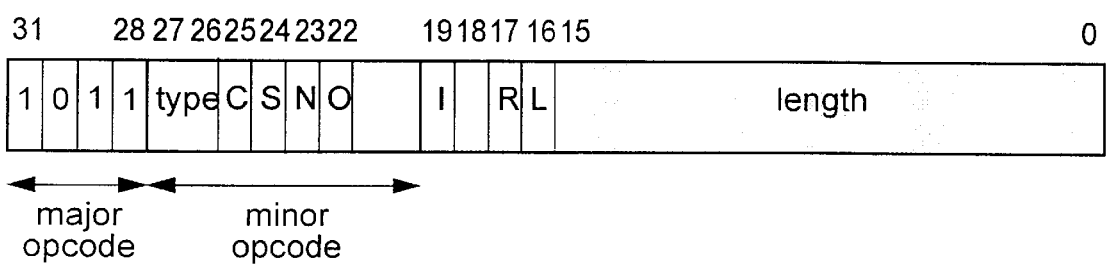
Figure 108:
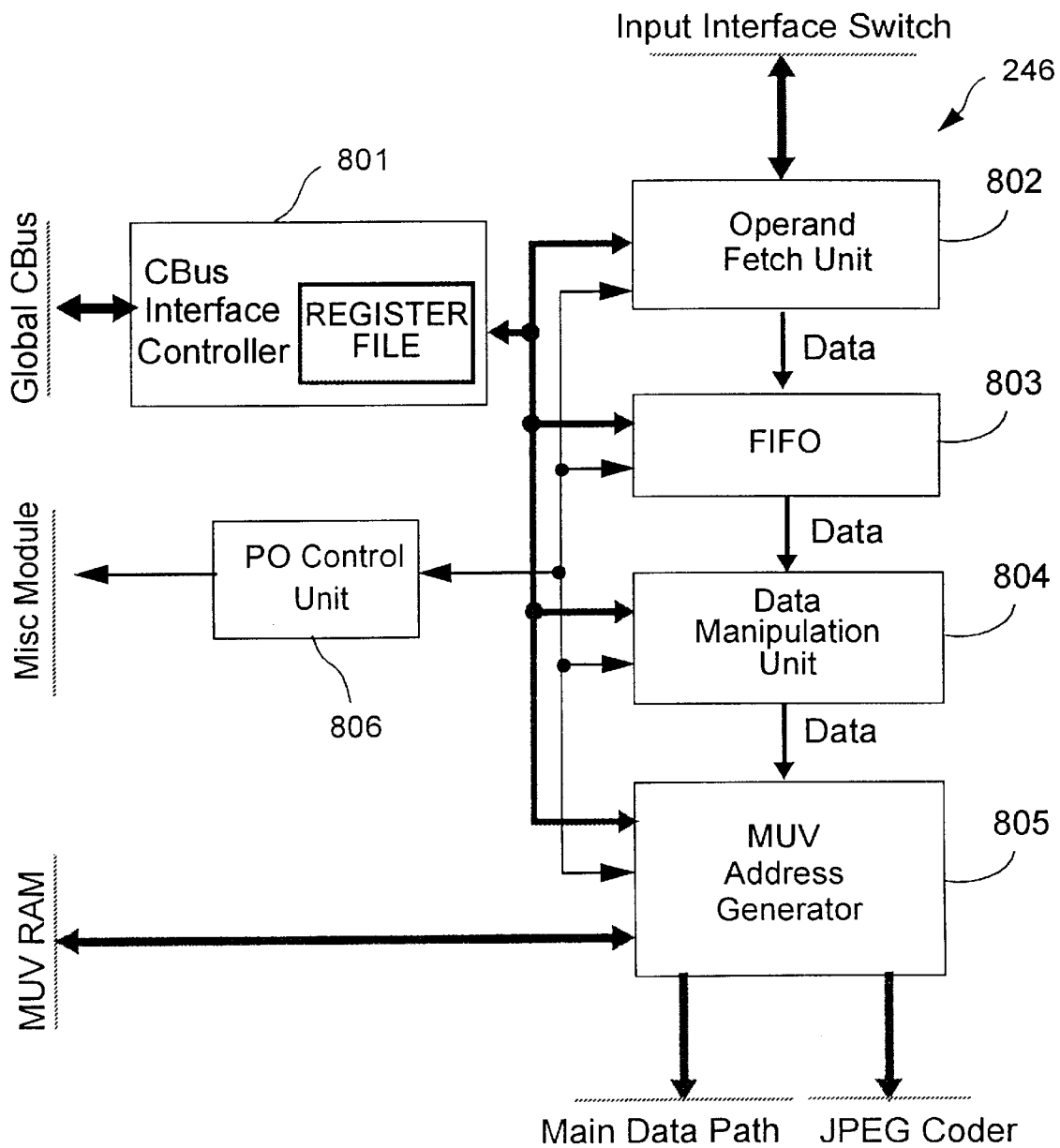
Figure 109:
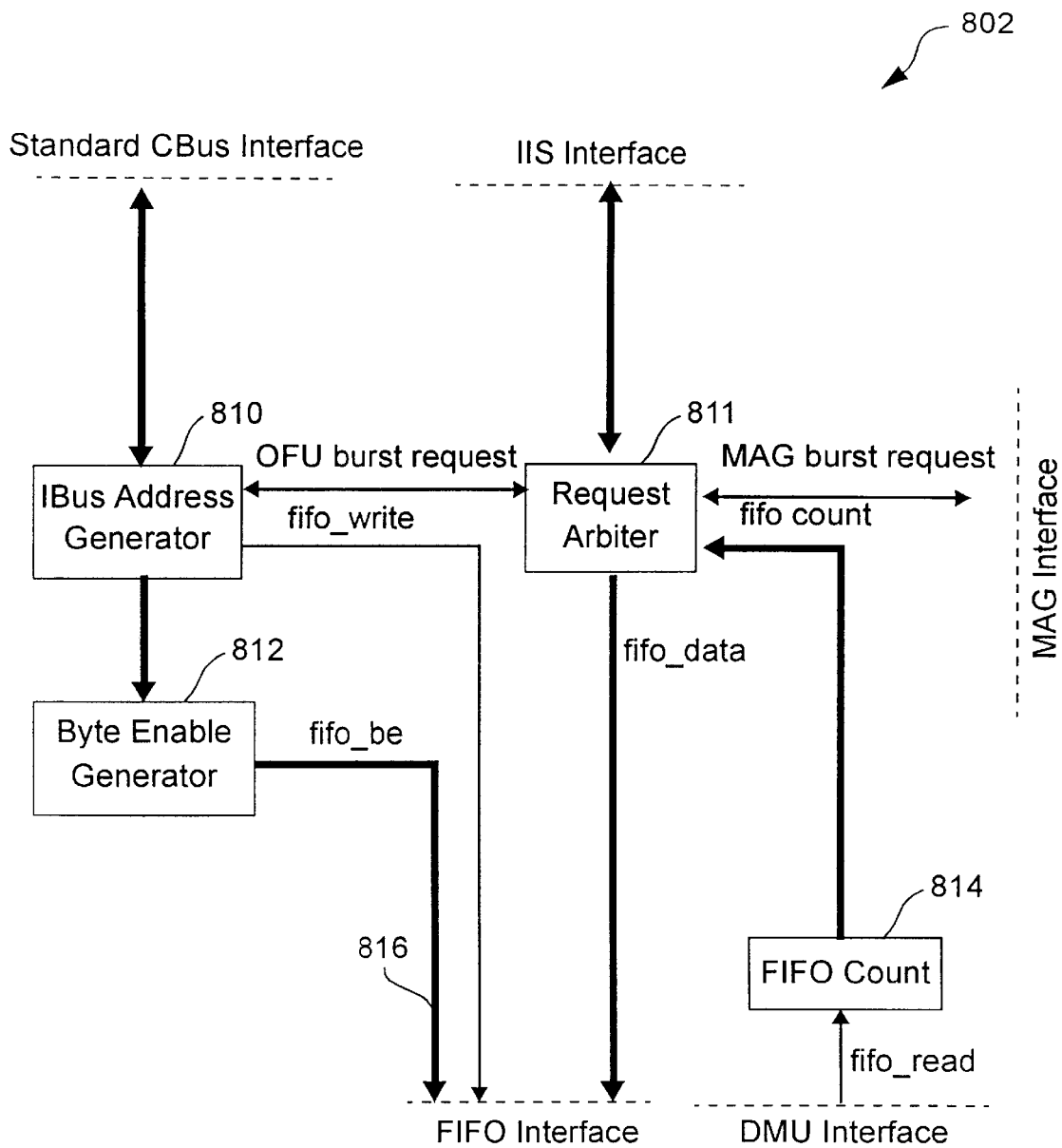
Figure 115:
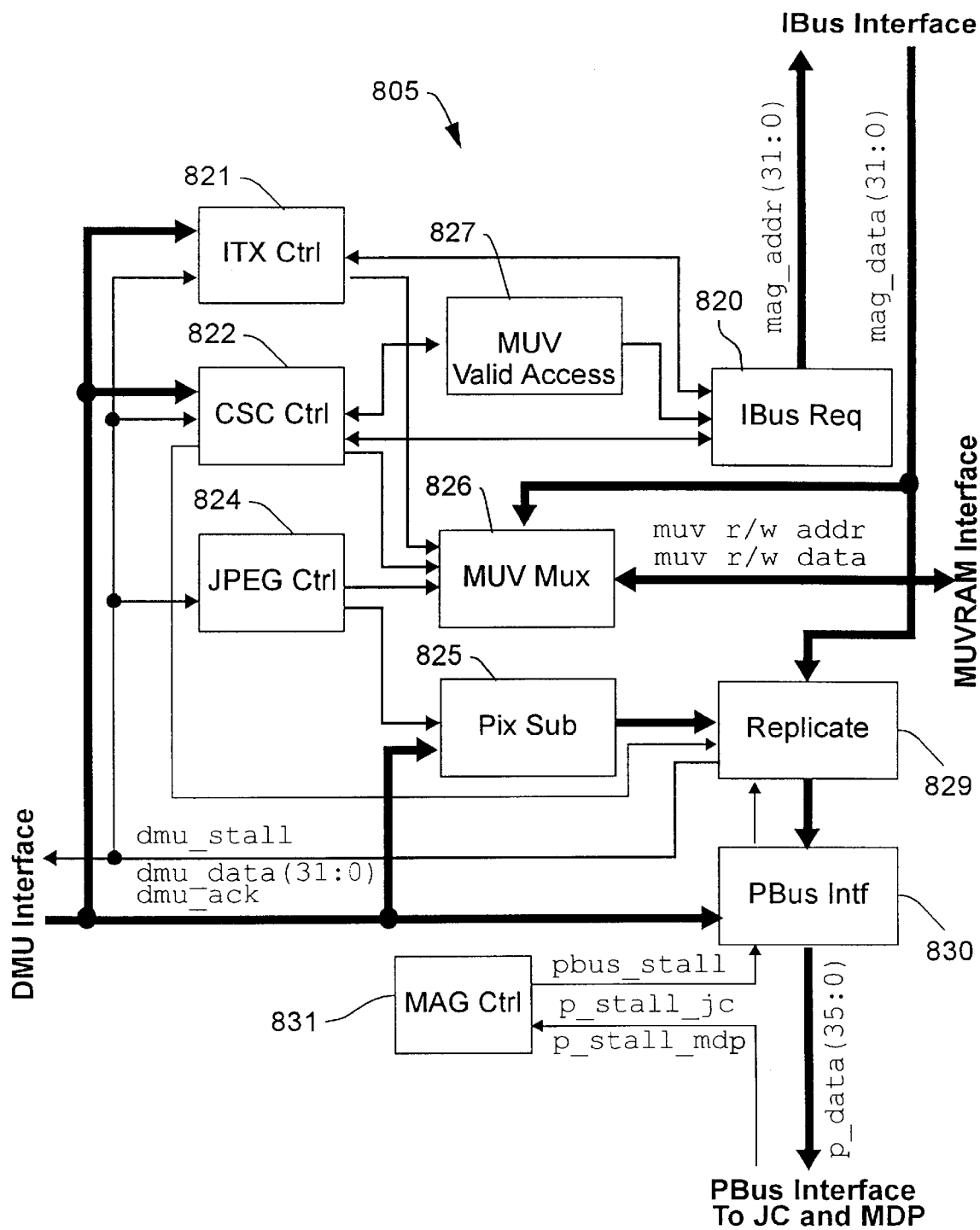
Figure 116:
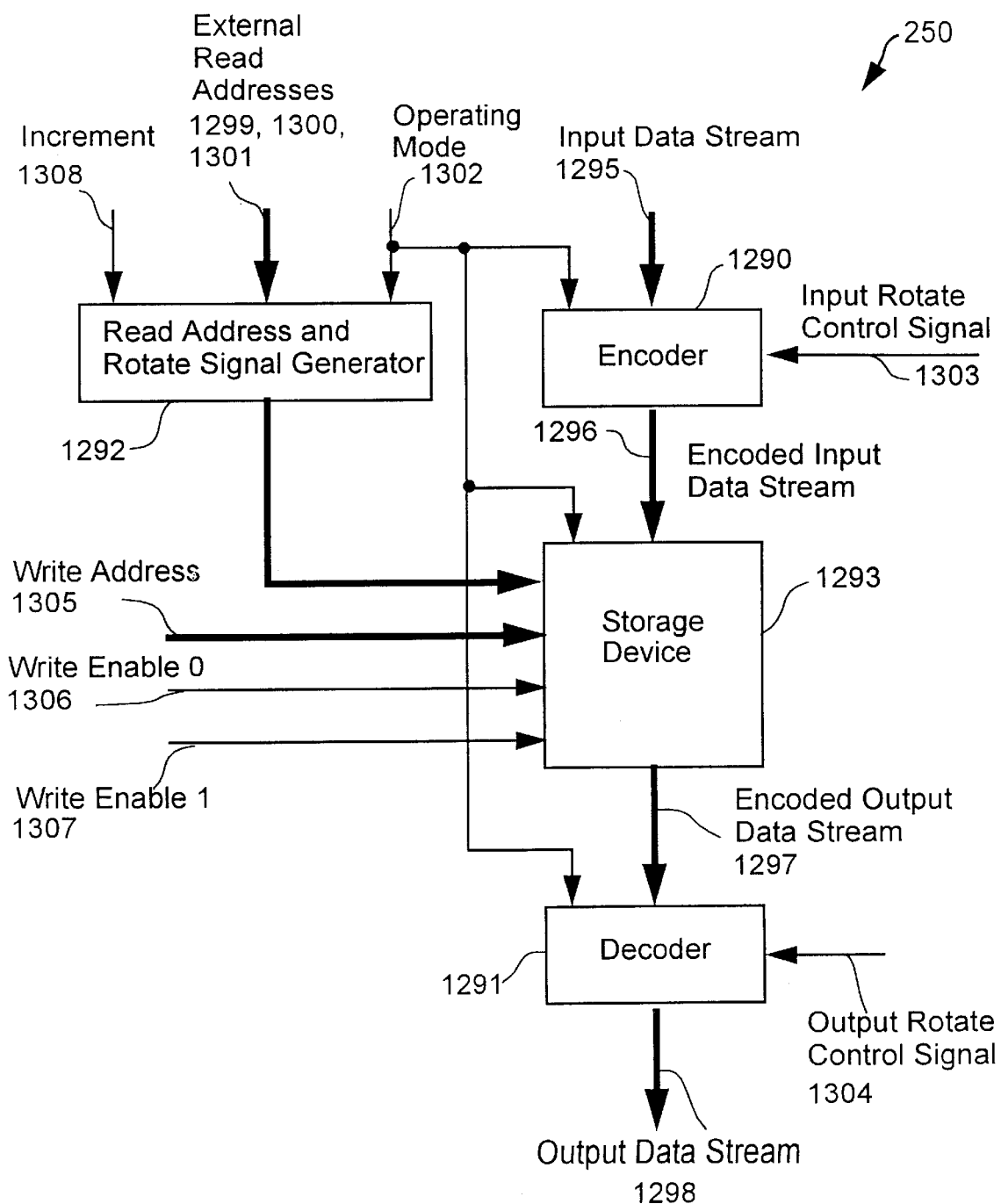
Figure 117:
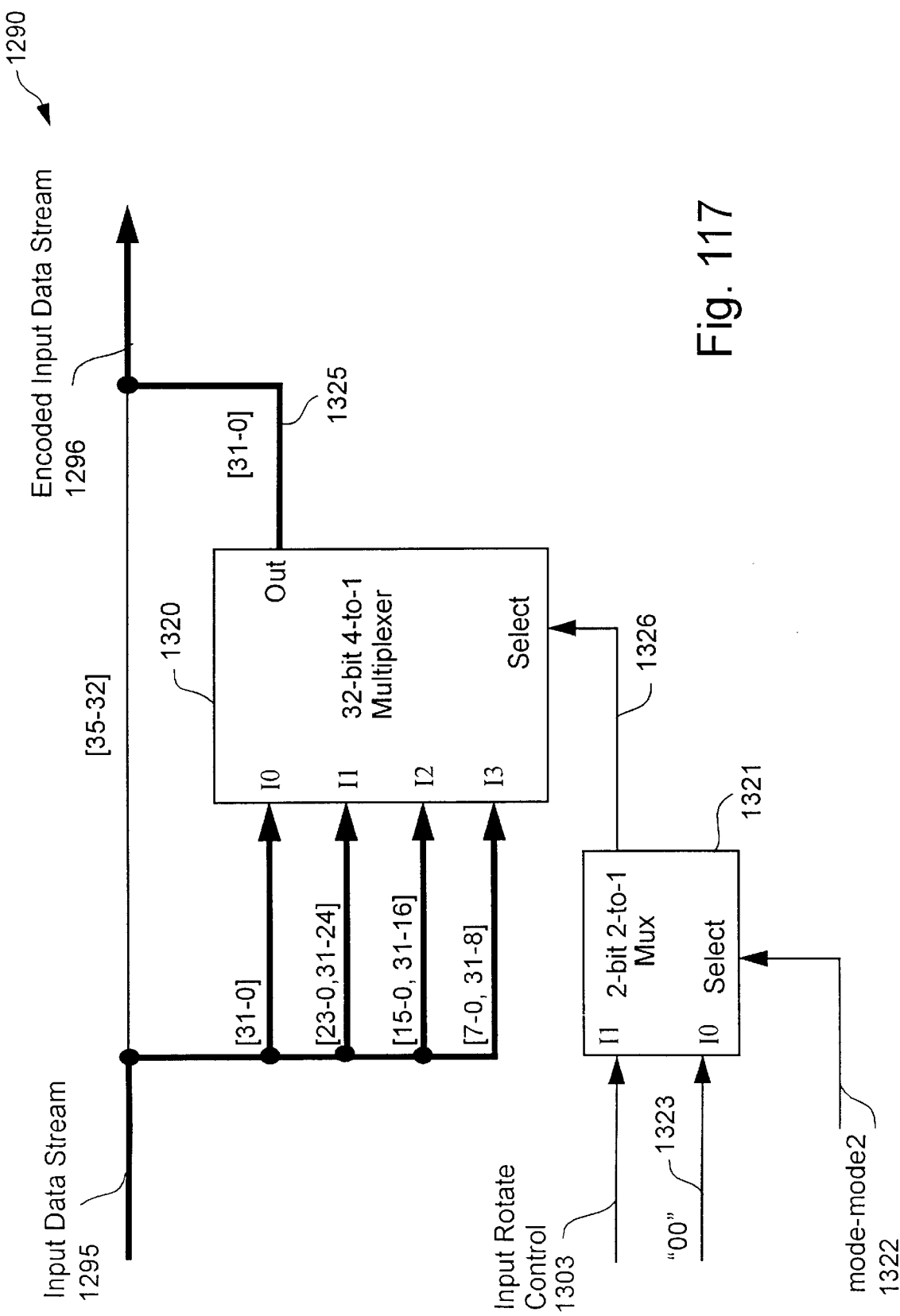
Figure 118:
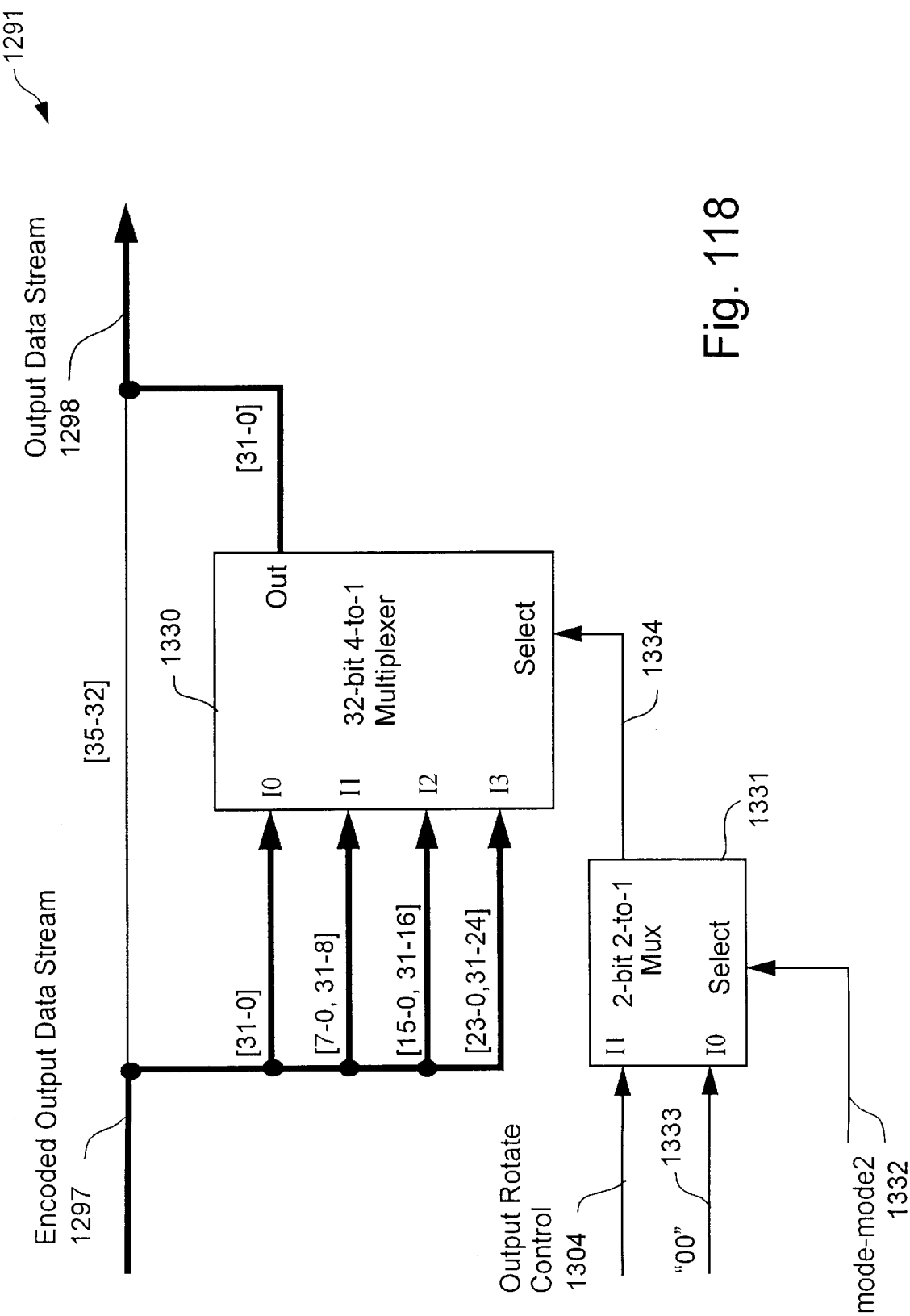
Figure 119:
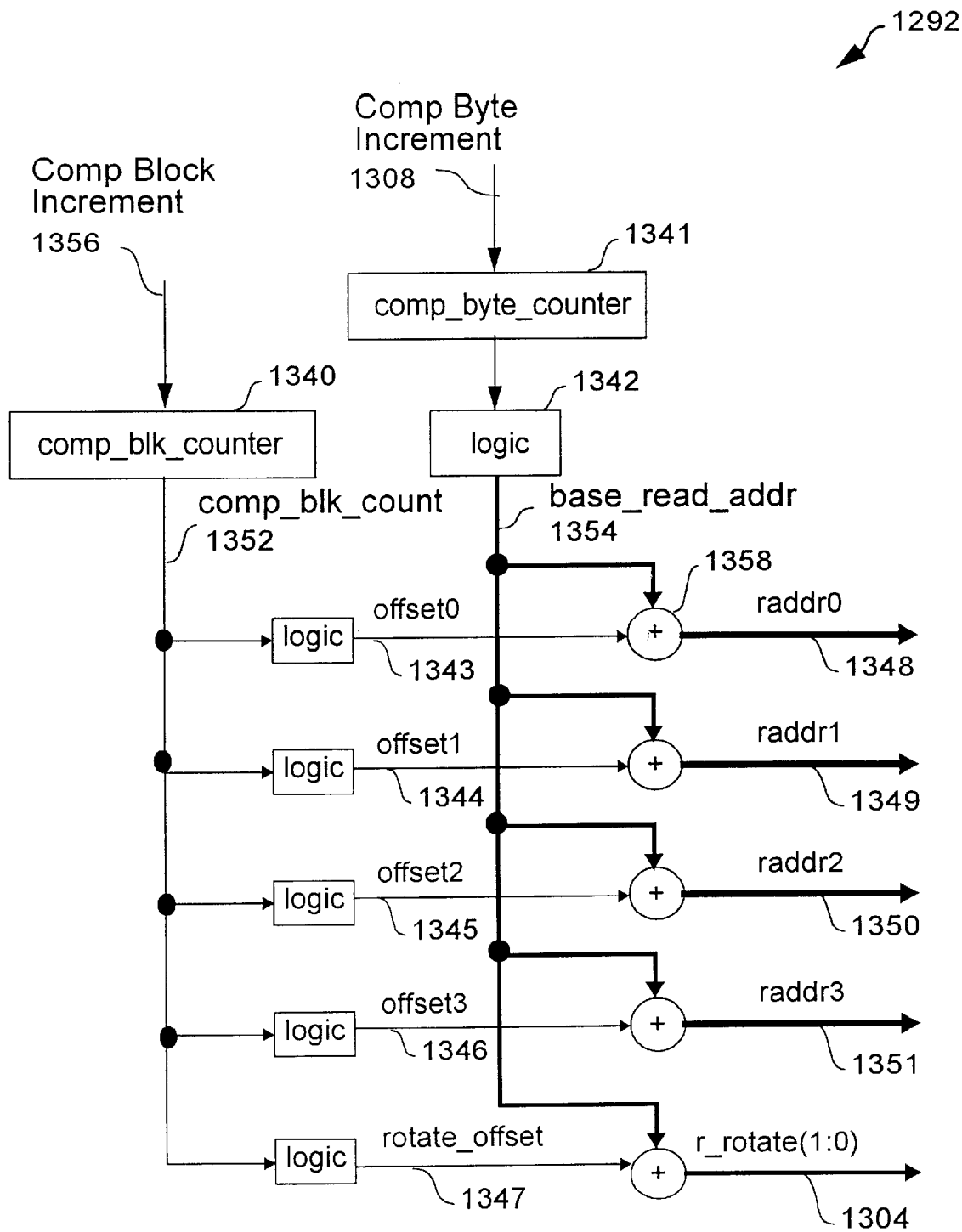
Figure 120:
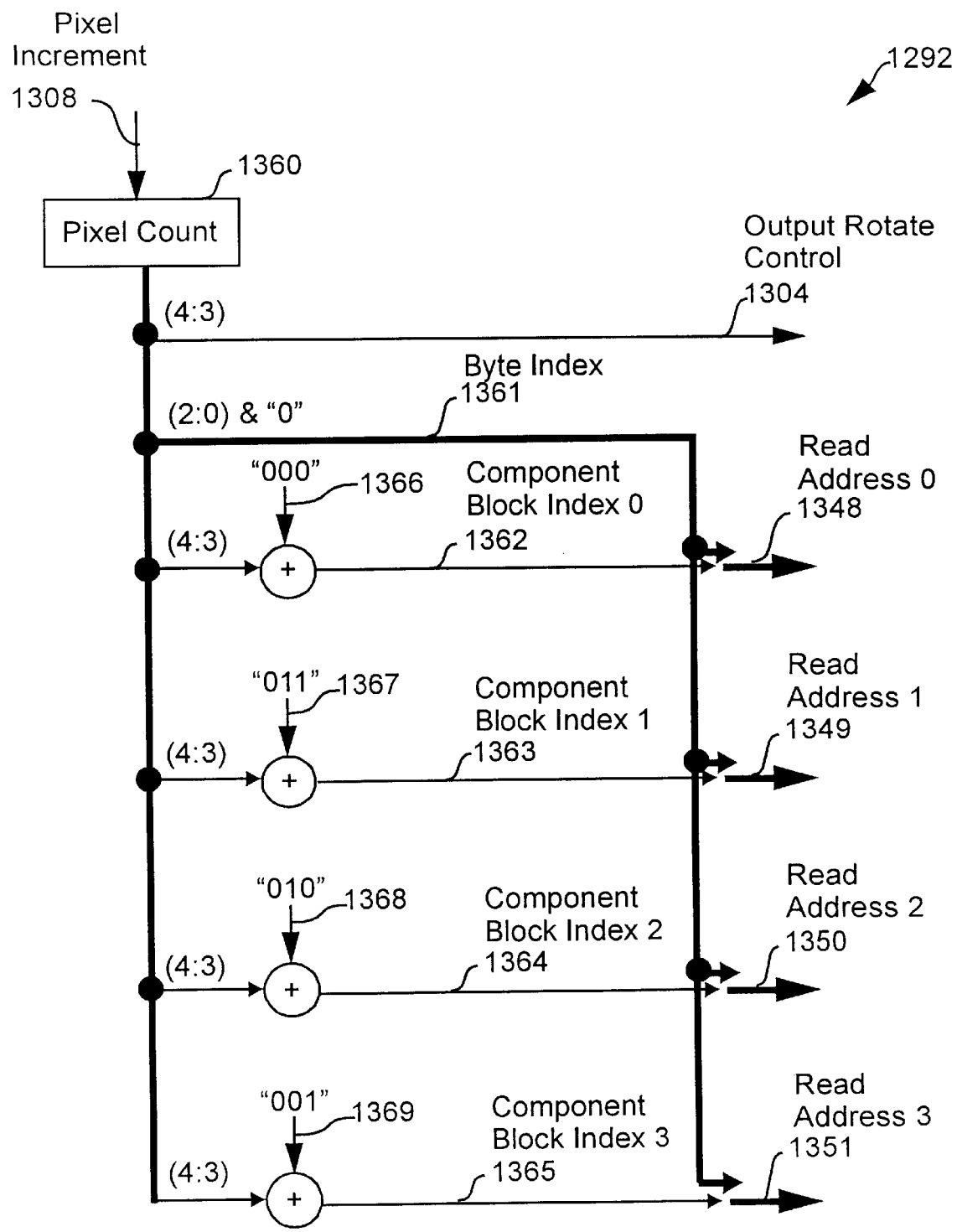
Figure 121:
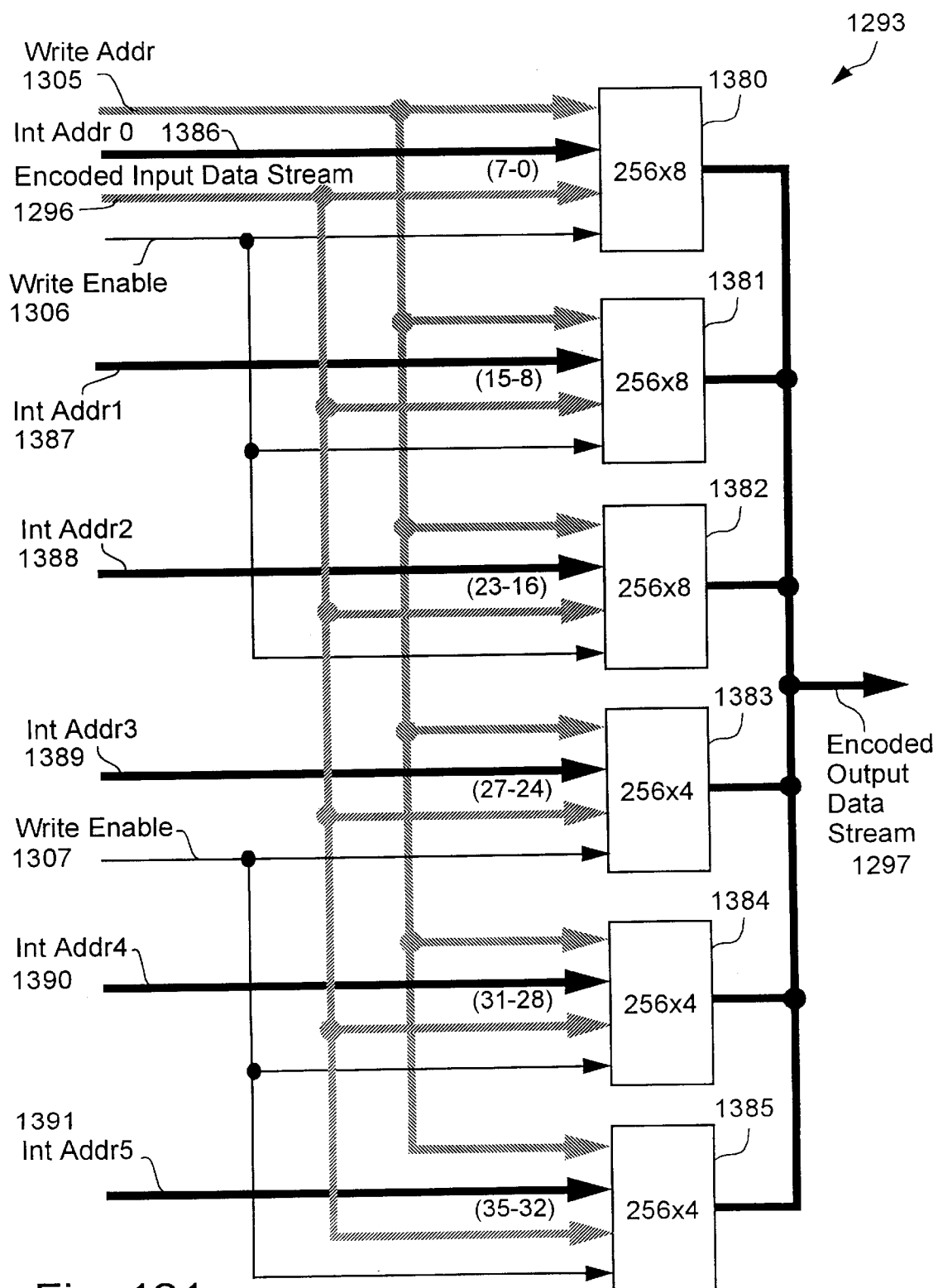
Figure 122:
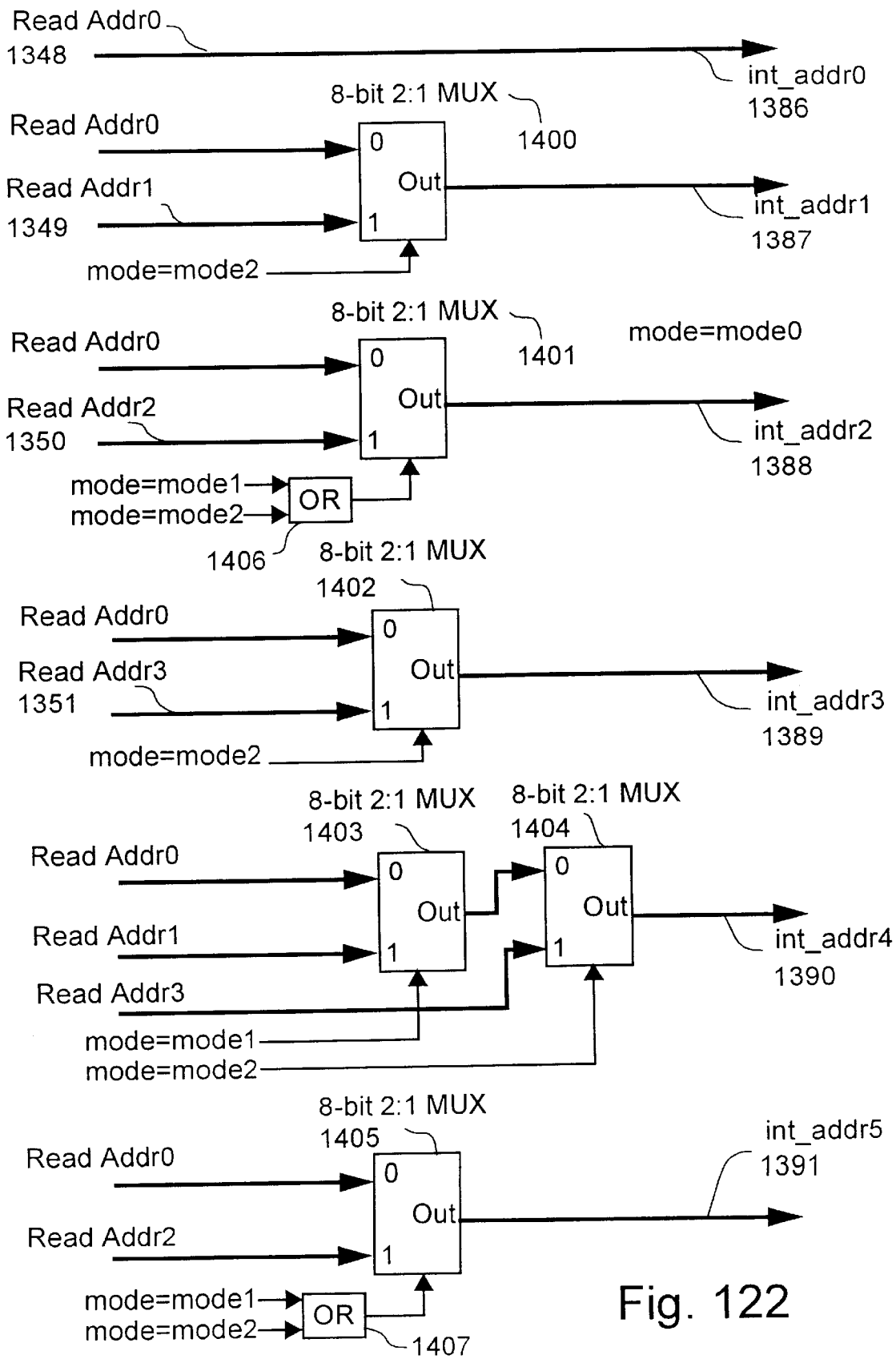
Figure 123:
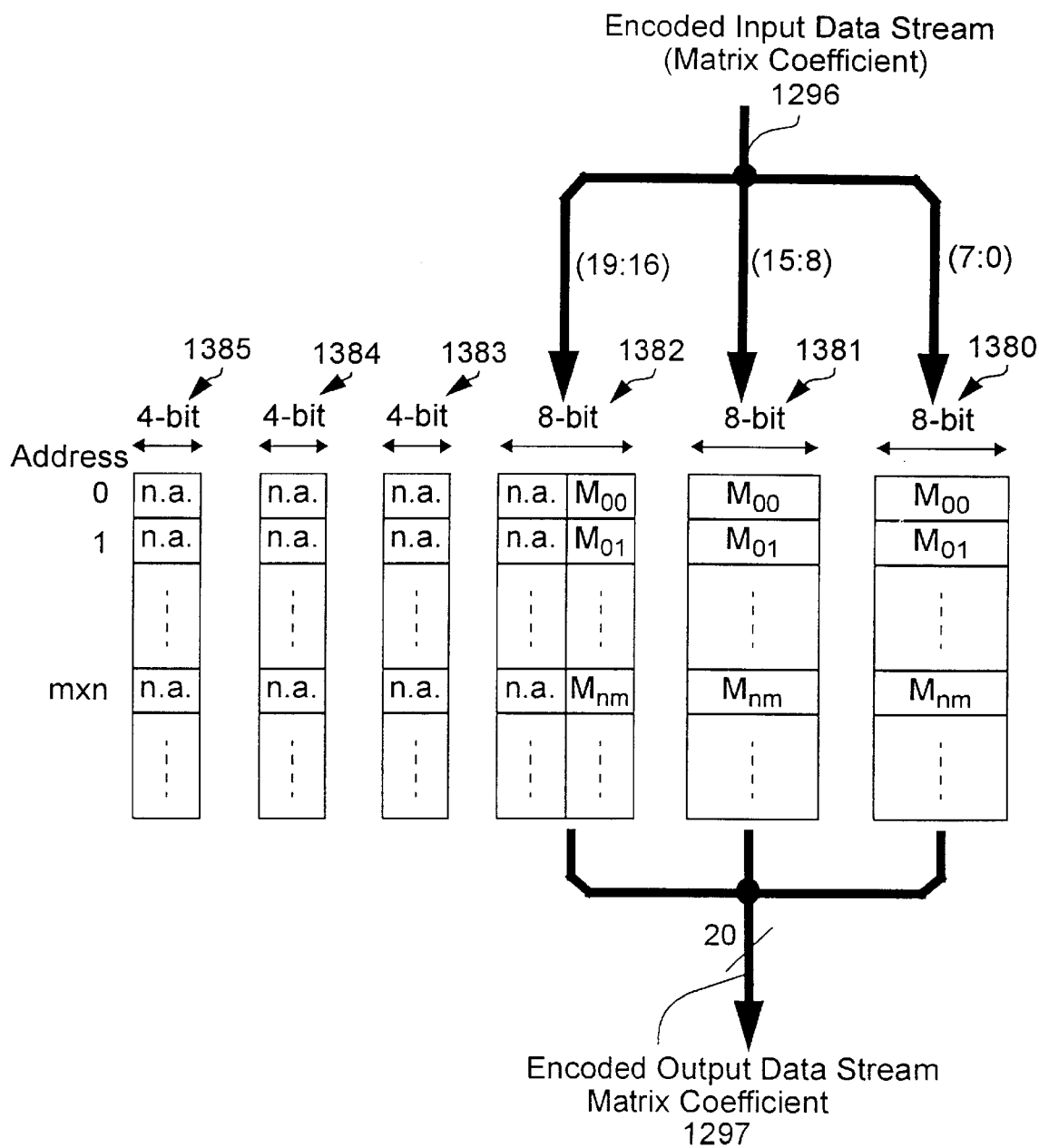
Figure 124:
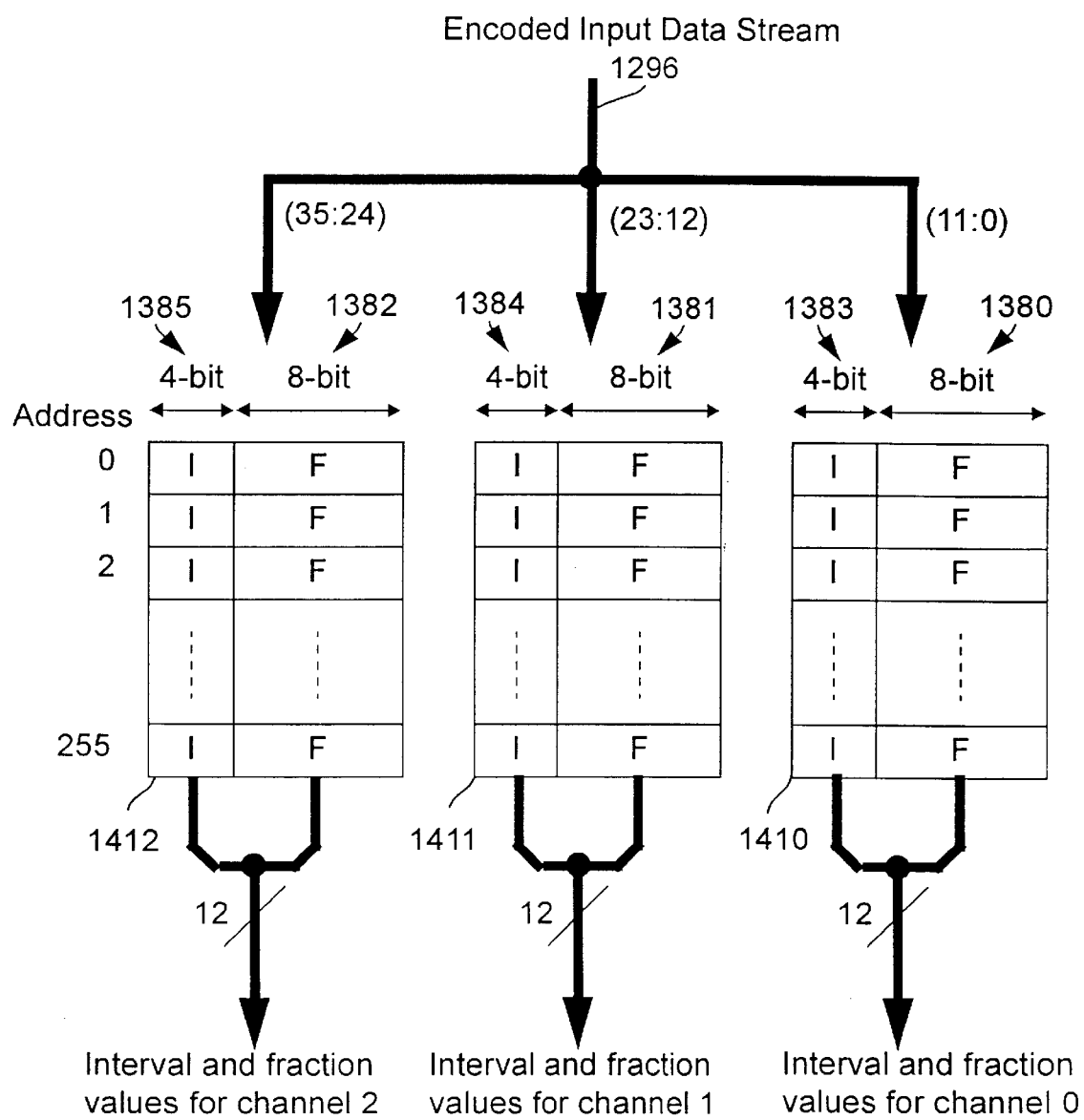
Figure 125:
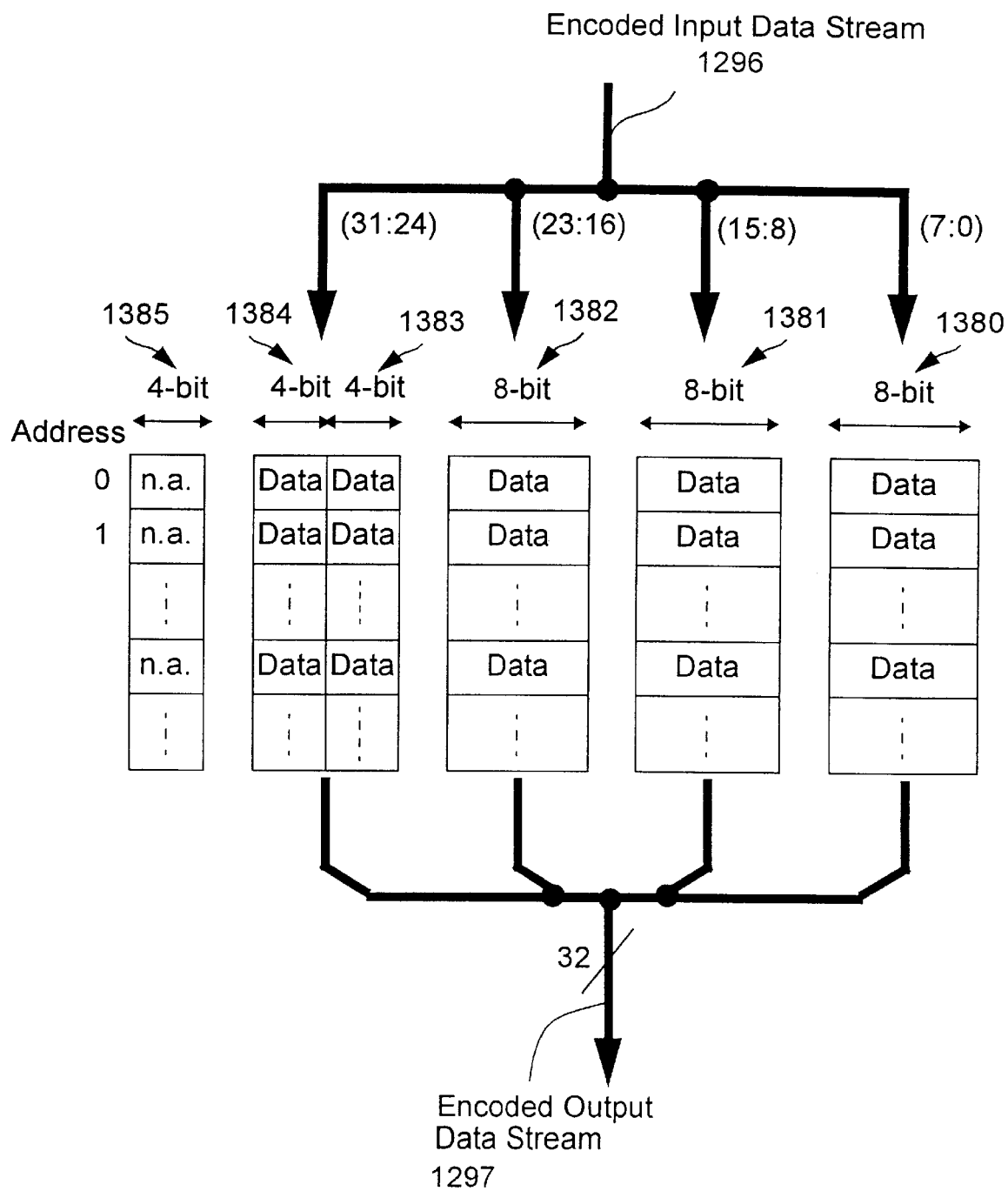
Figure 126:
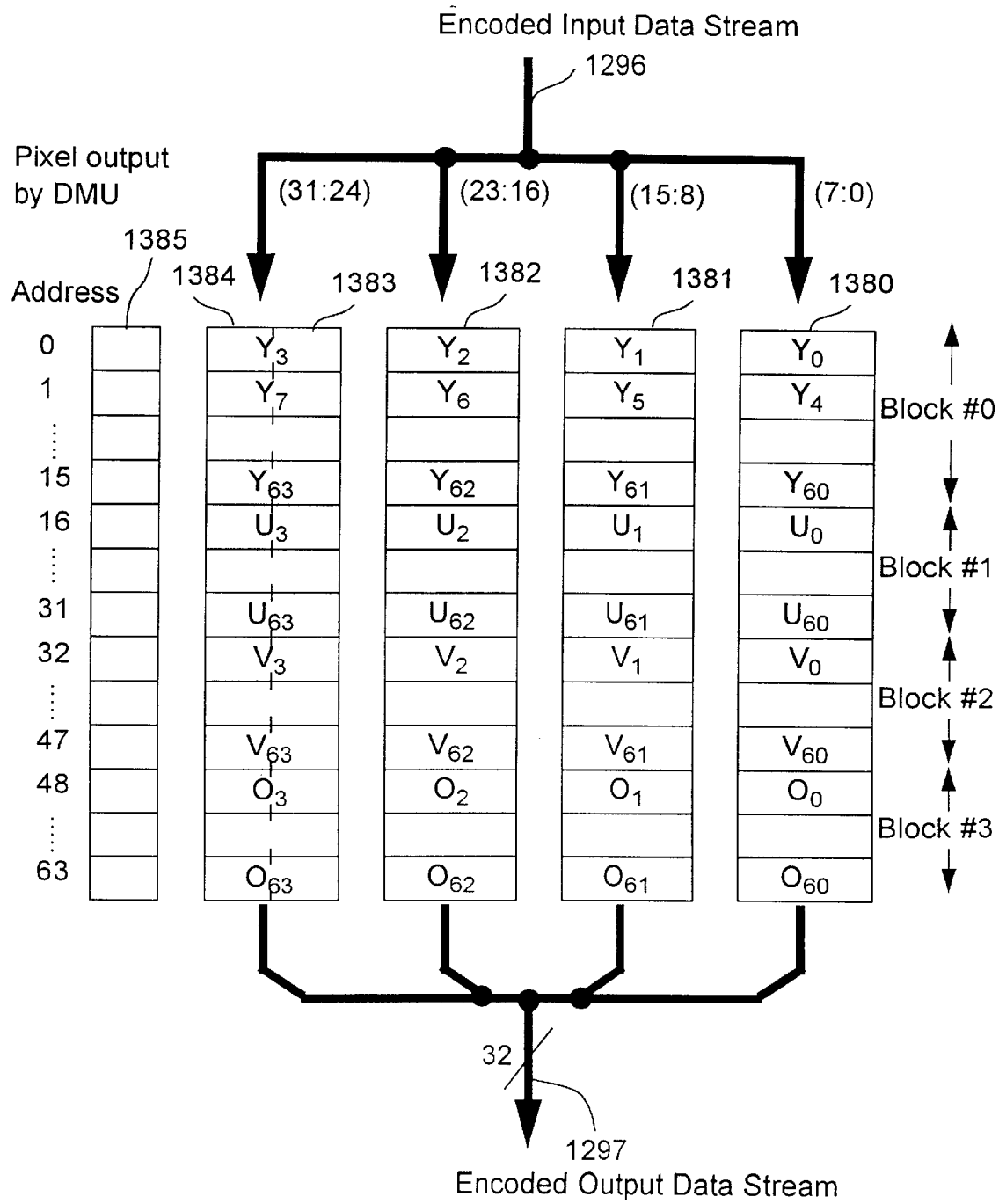
Figure 127:
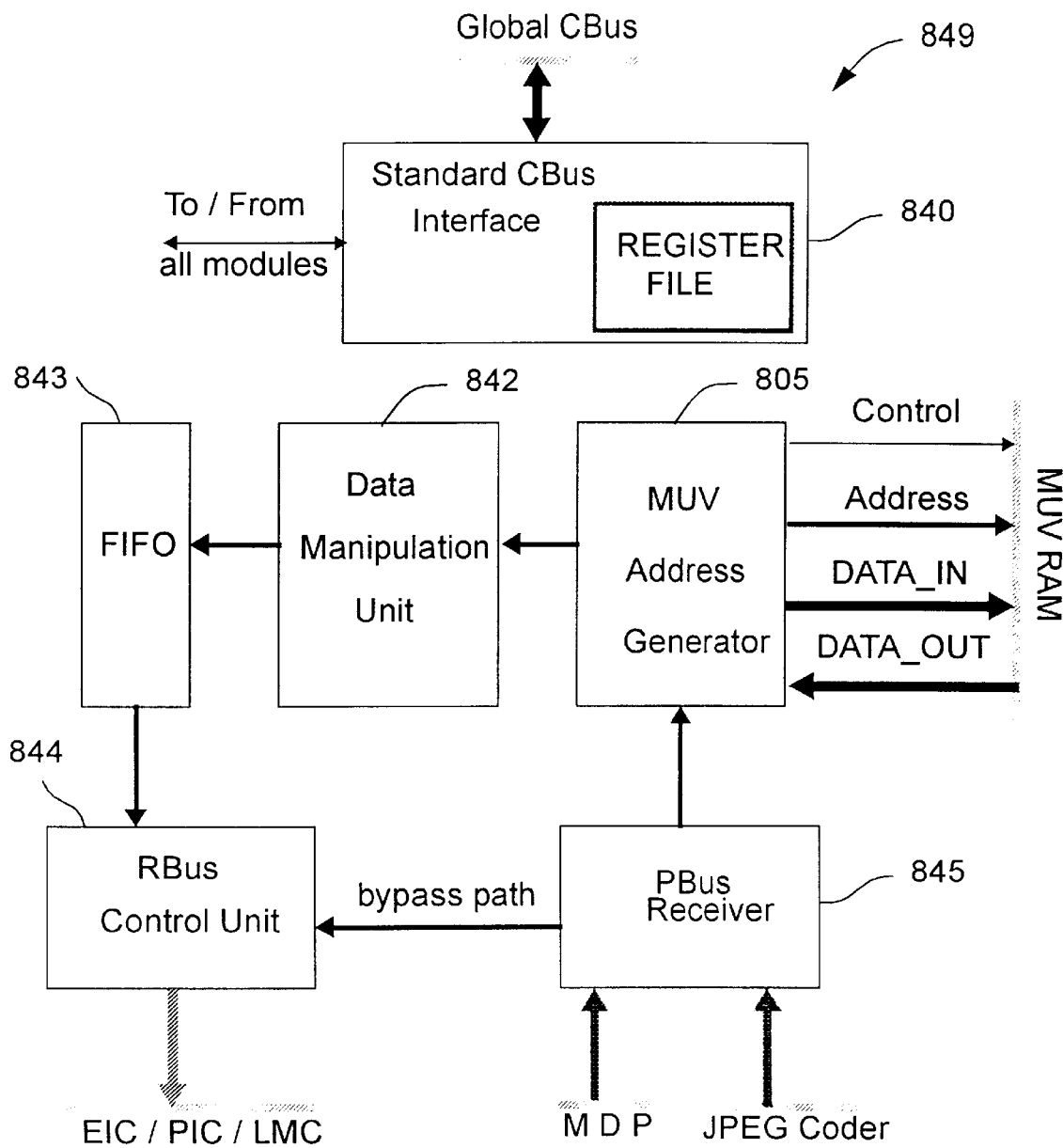
Figure 128:
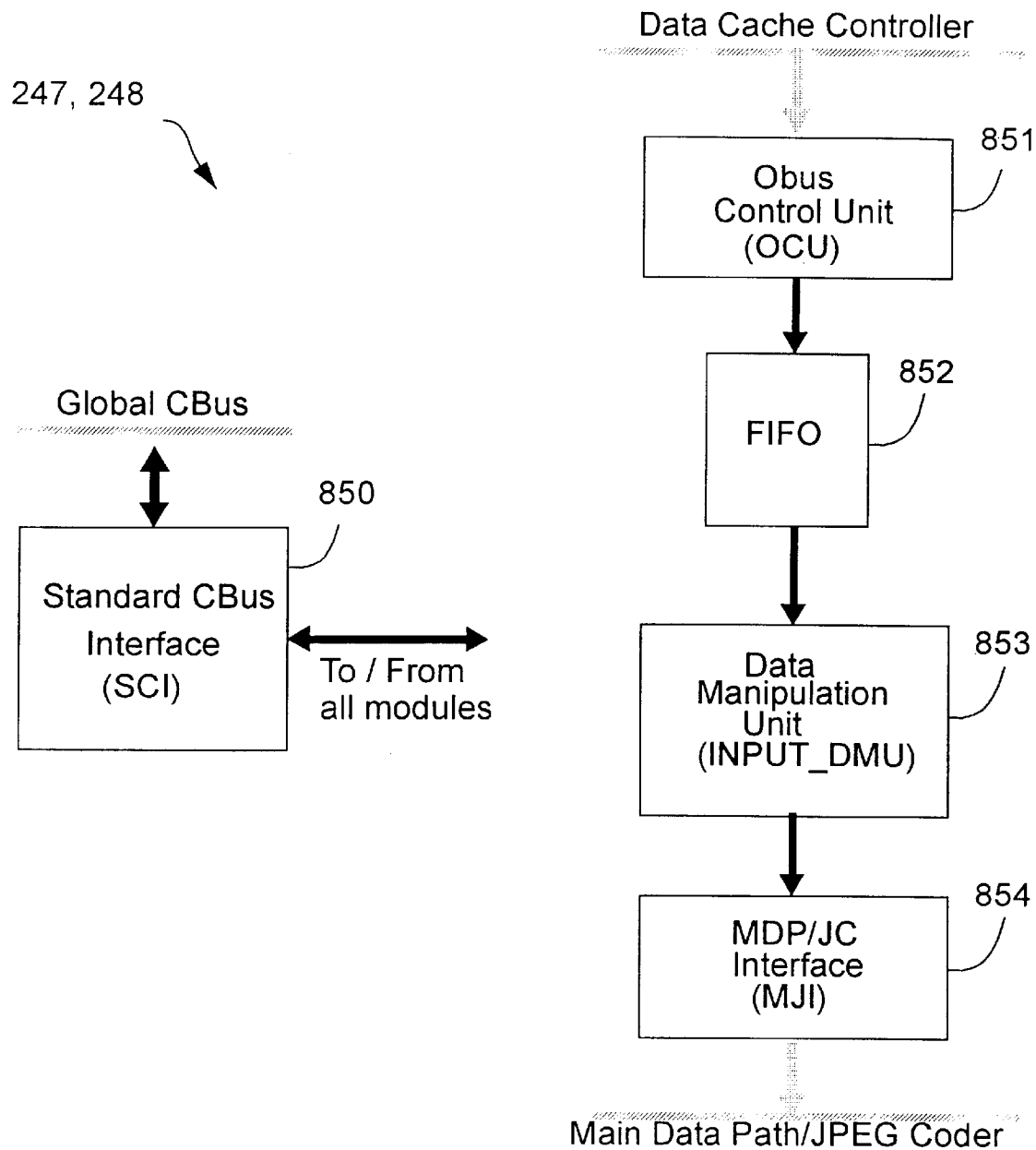
Figure 129:
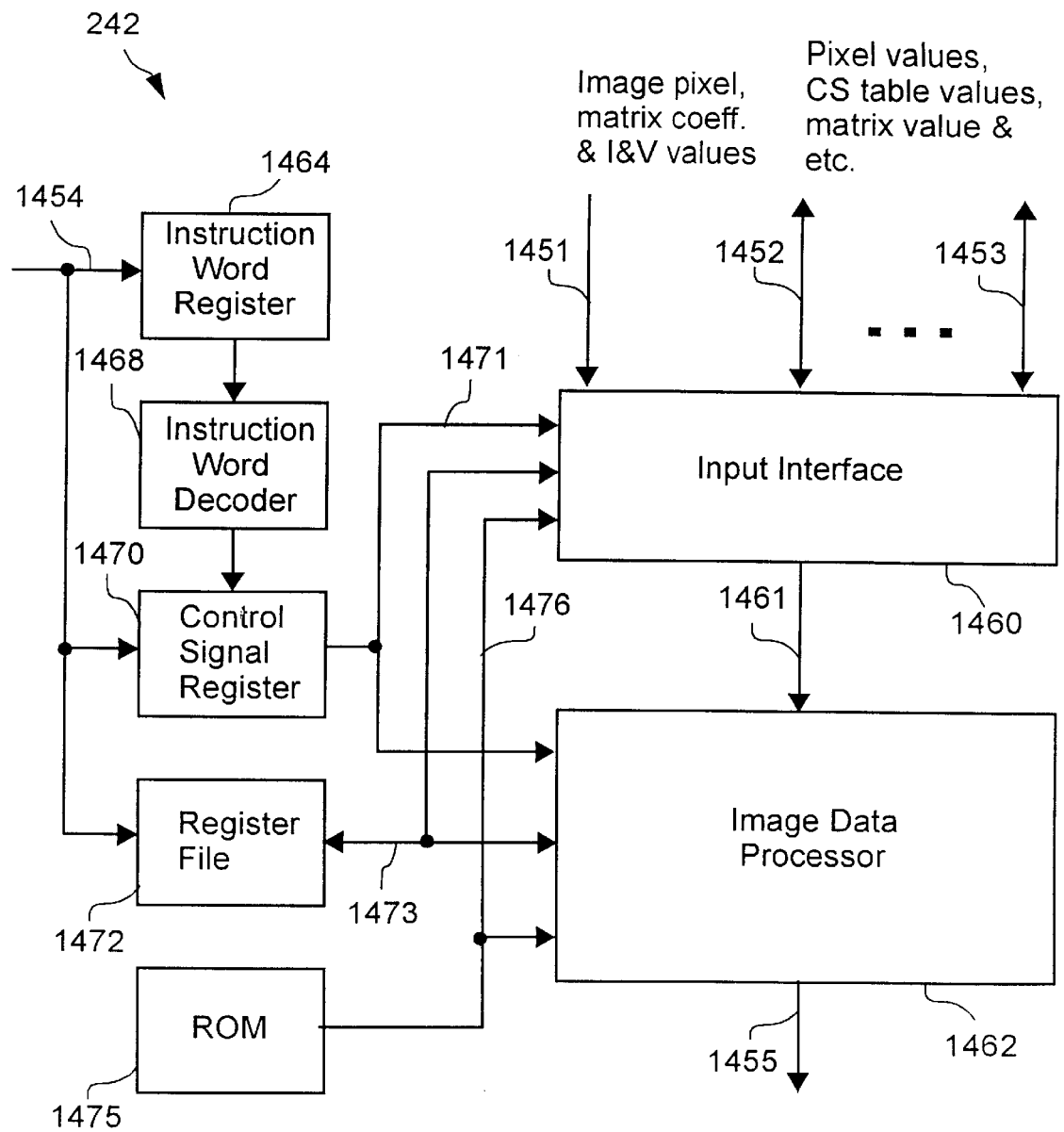
Figure 130:
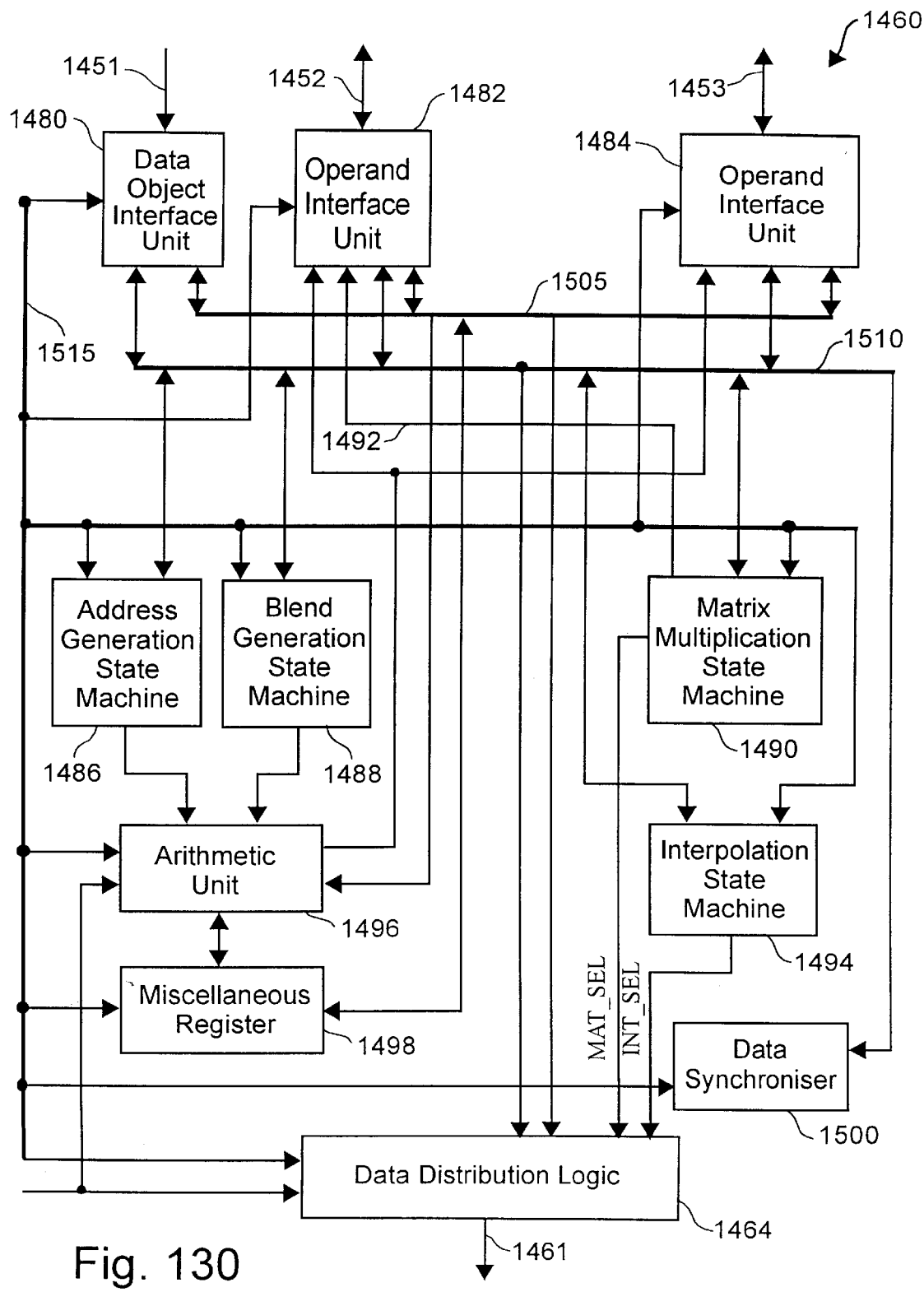
Figure 131:
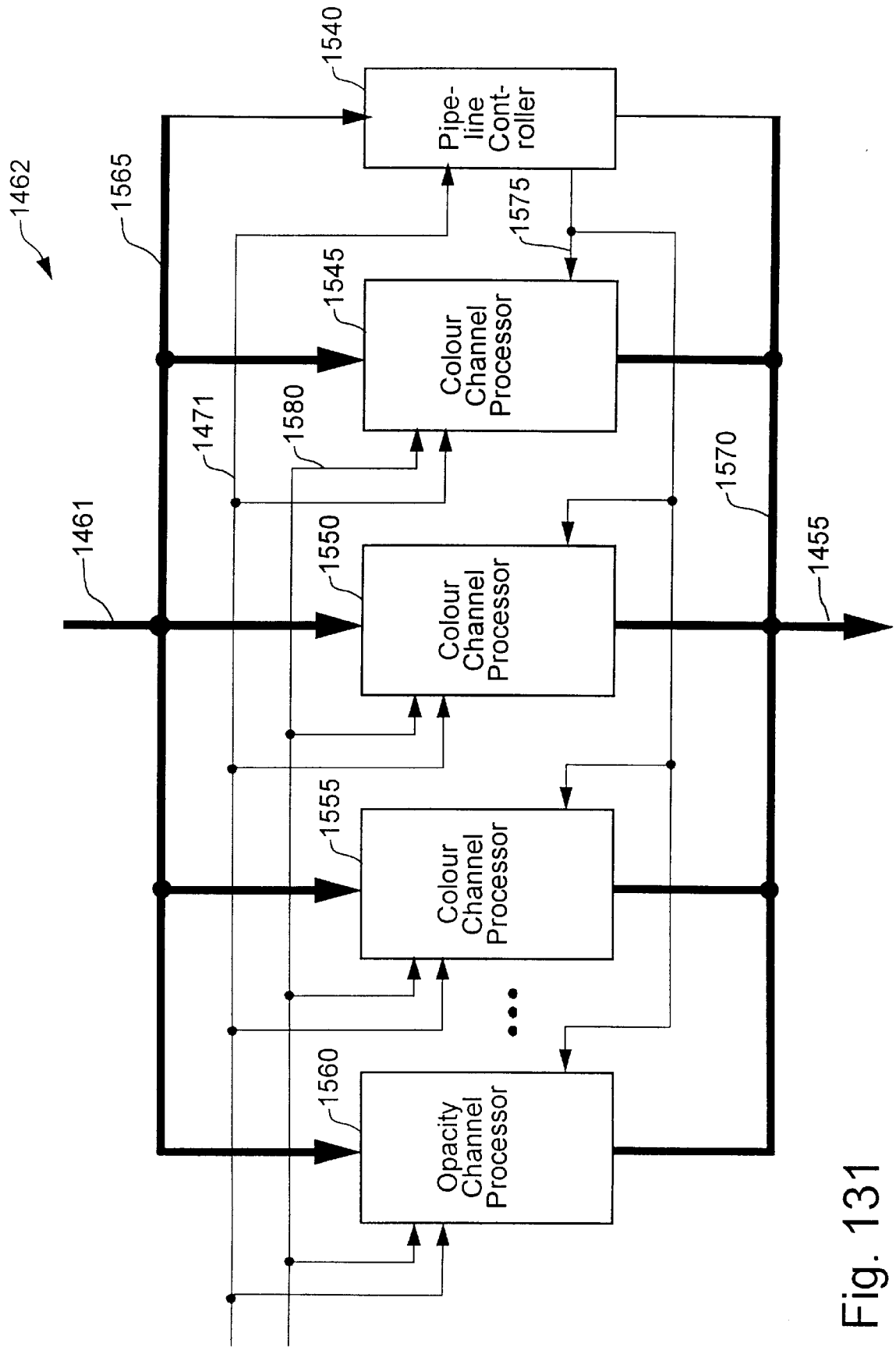
Figure 132:
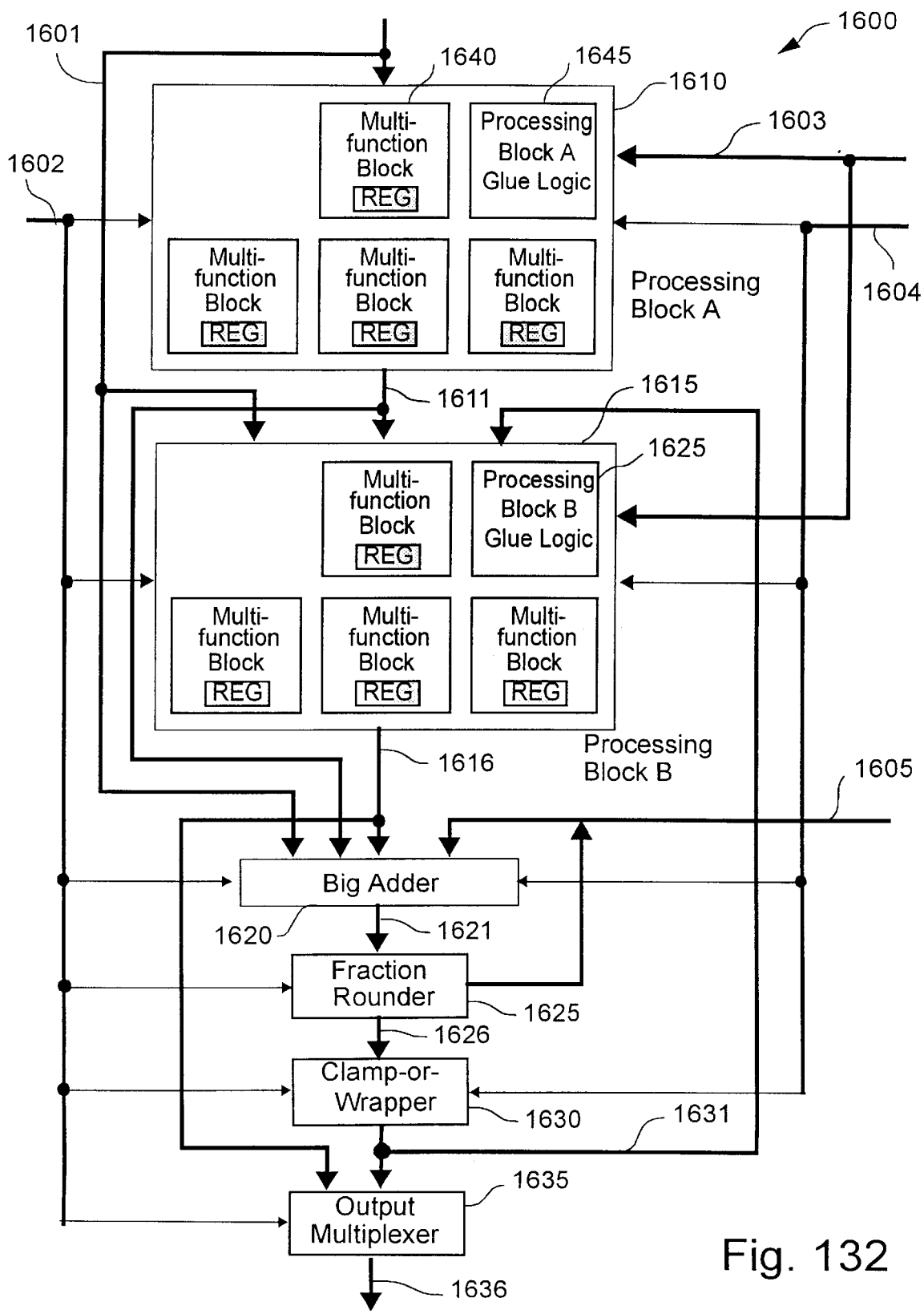
Figure 133:
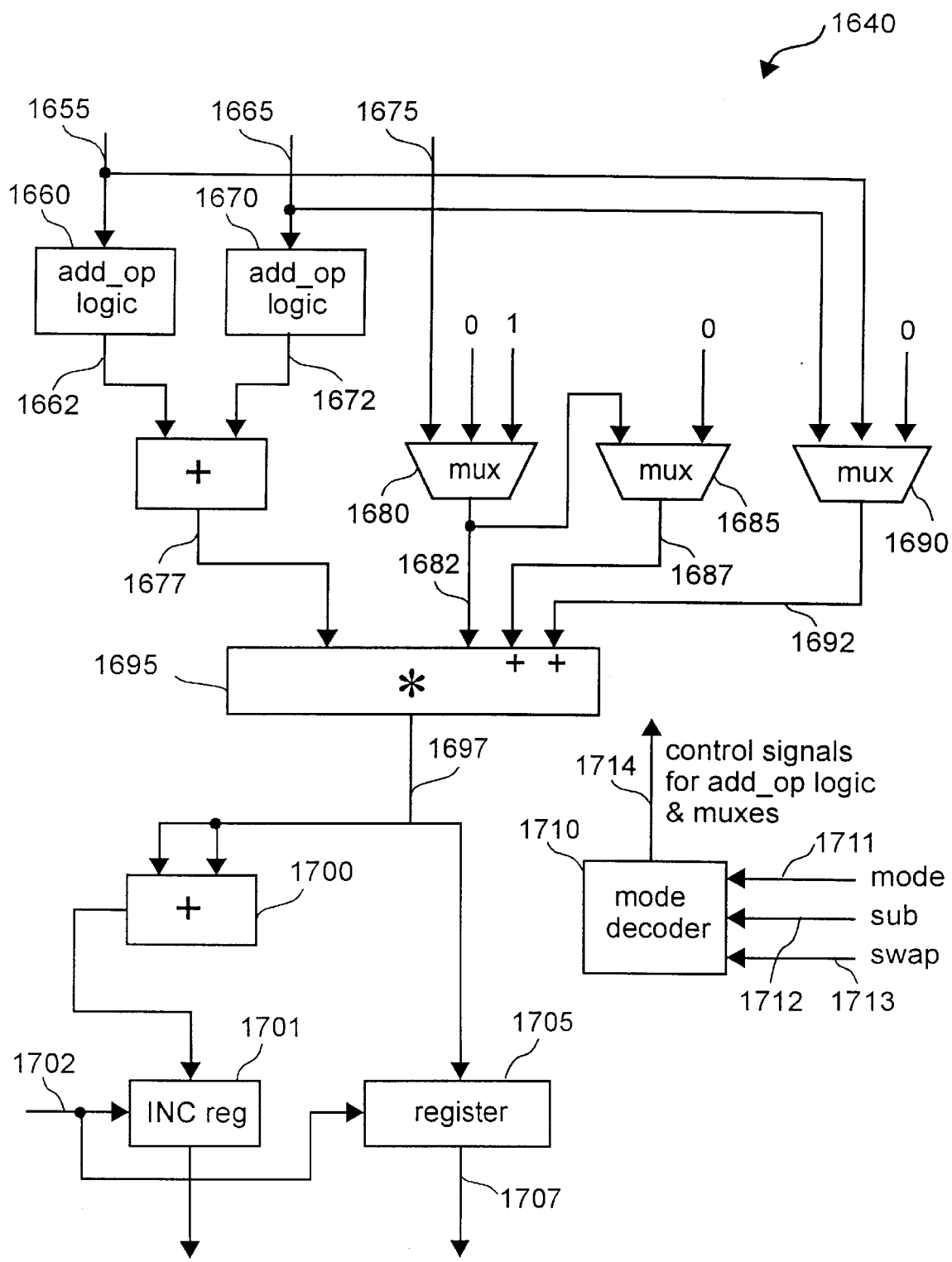
Figure 134:
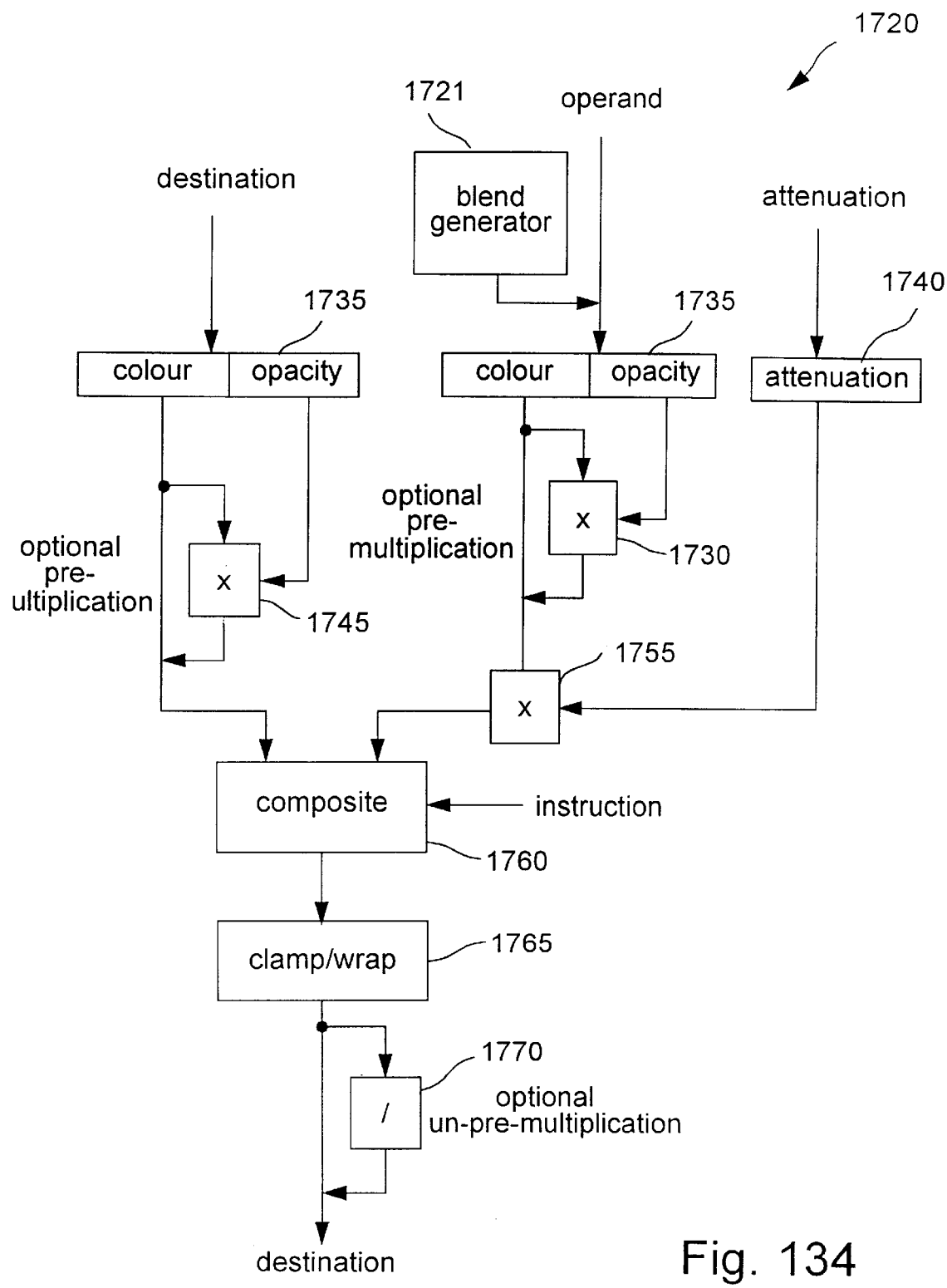
Figure 135:
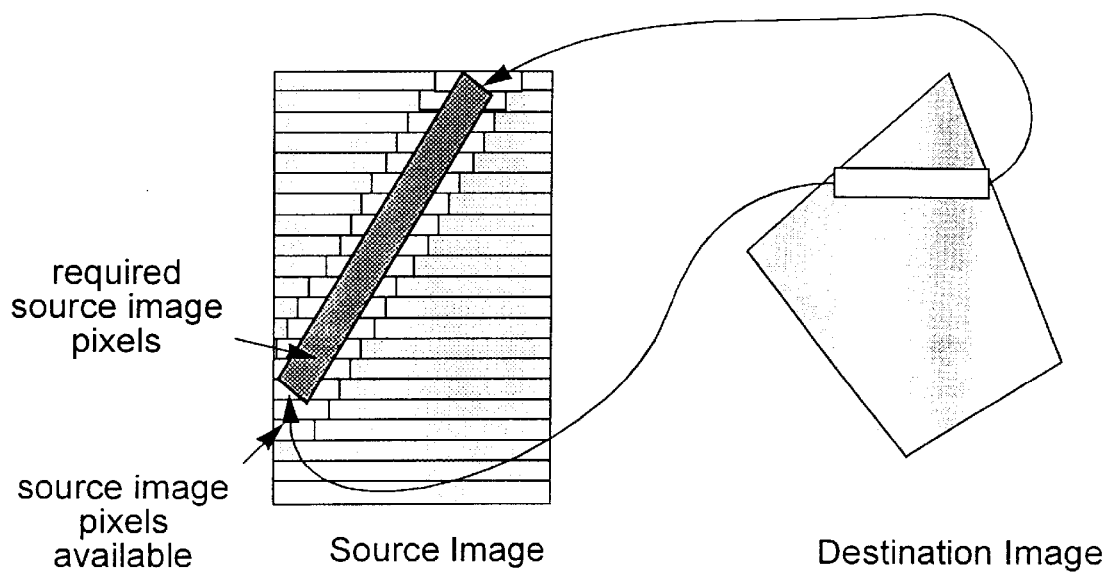
Figure 136:
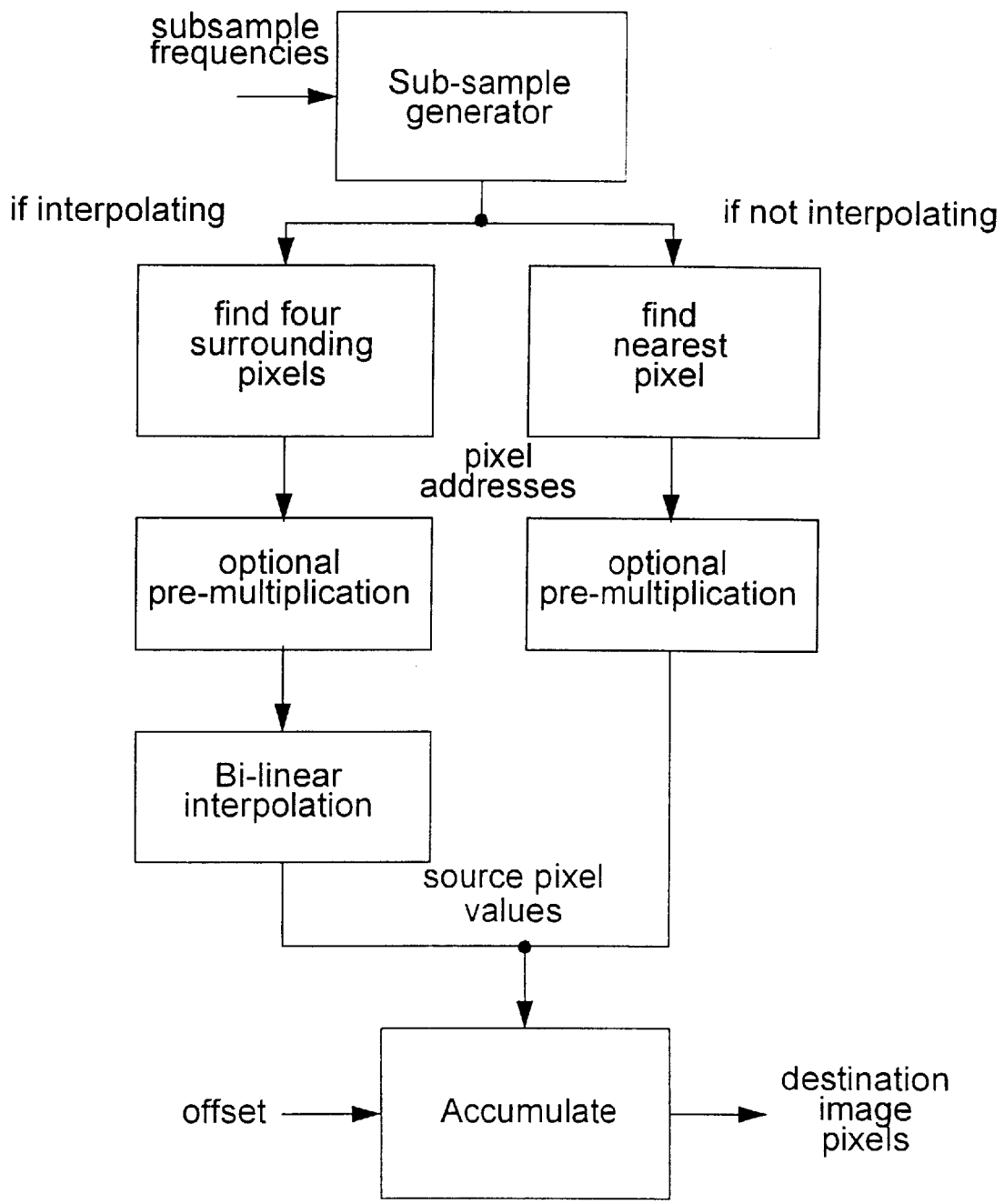
Figure 137:
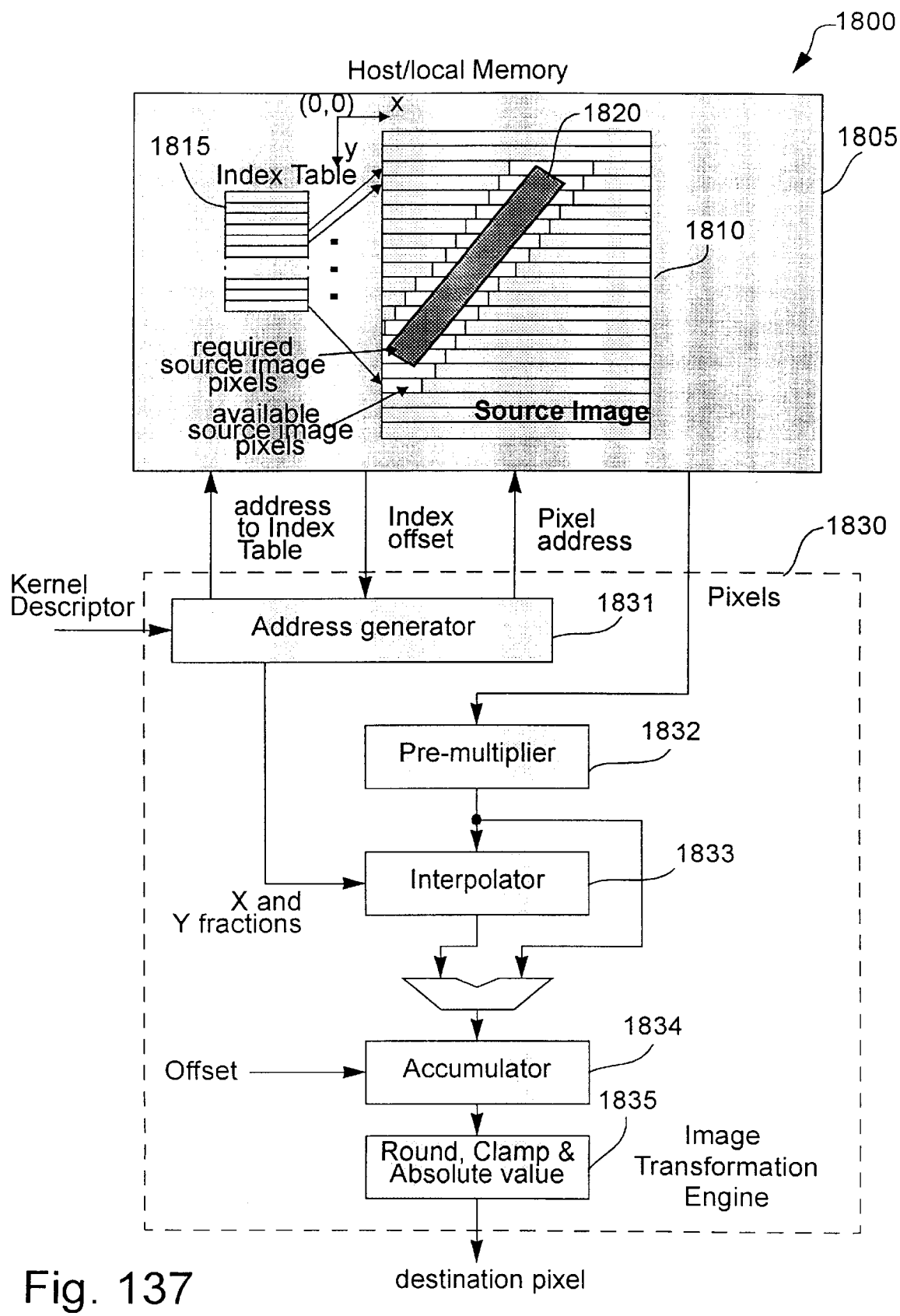
Figure 140:
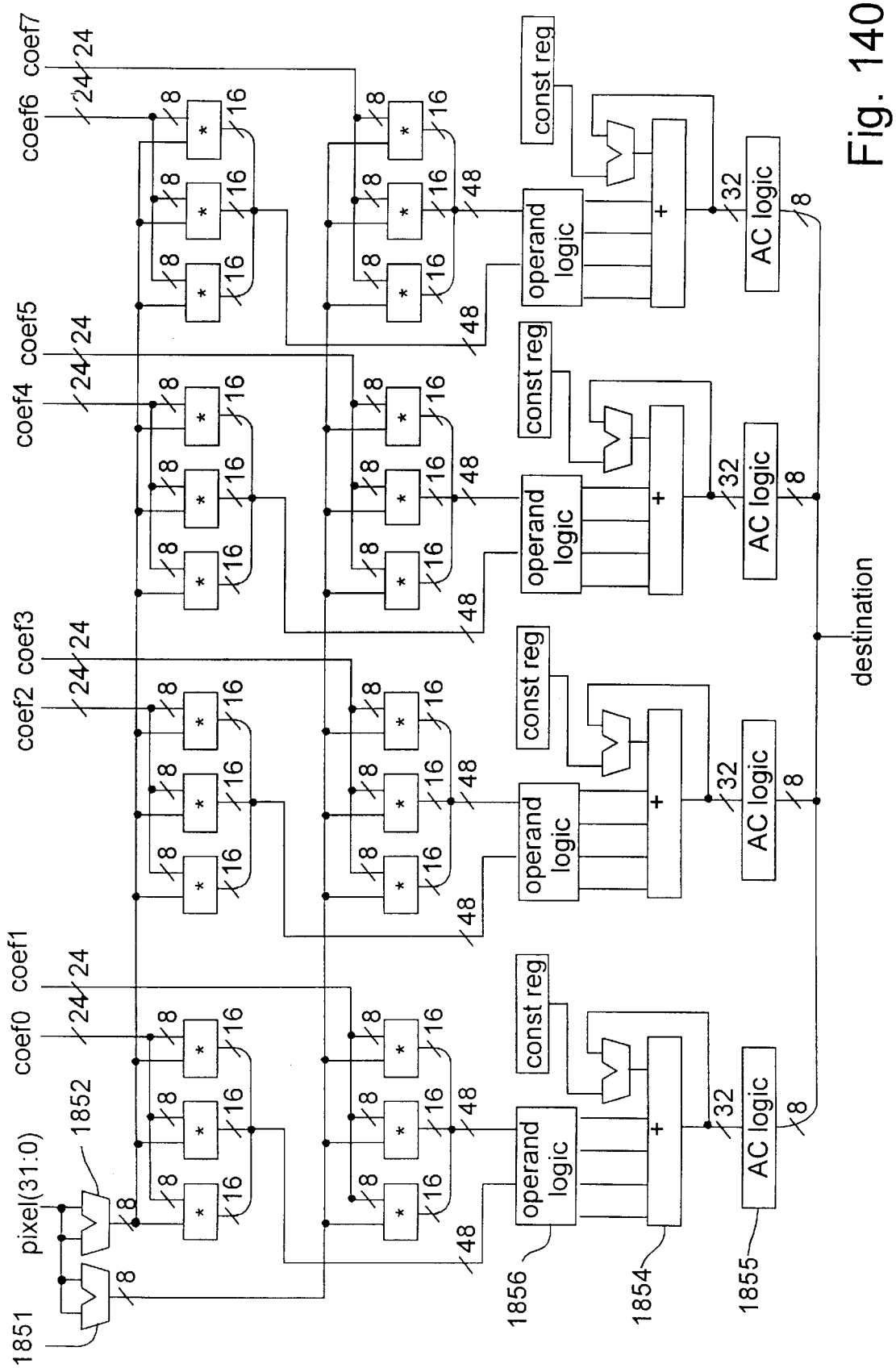
Figure 141:
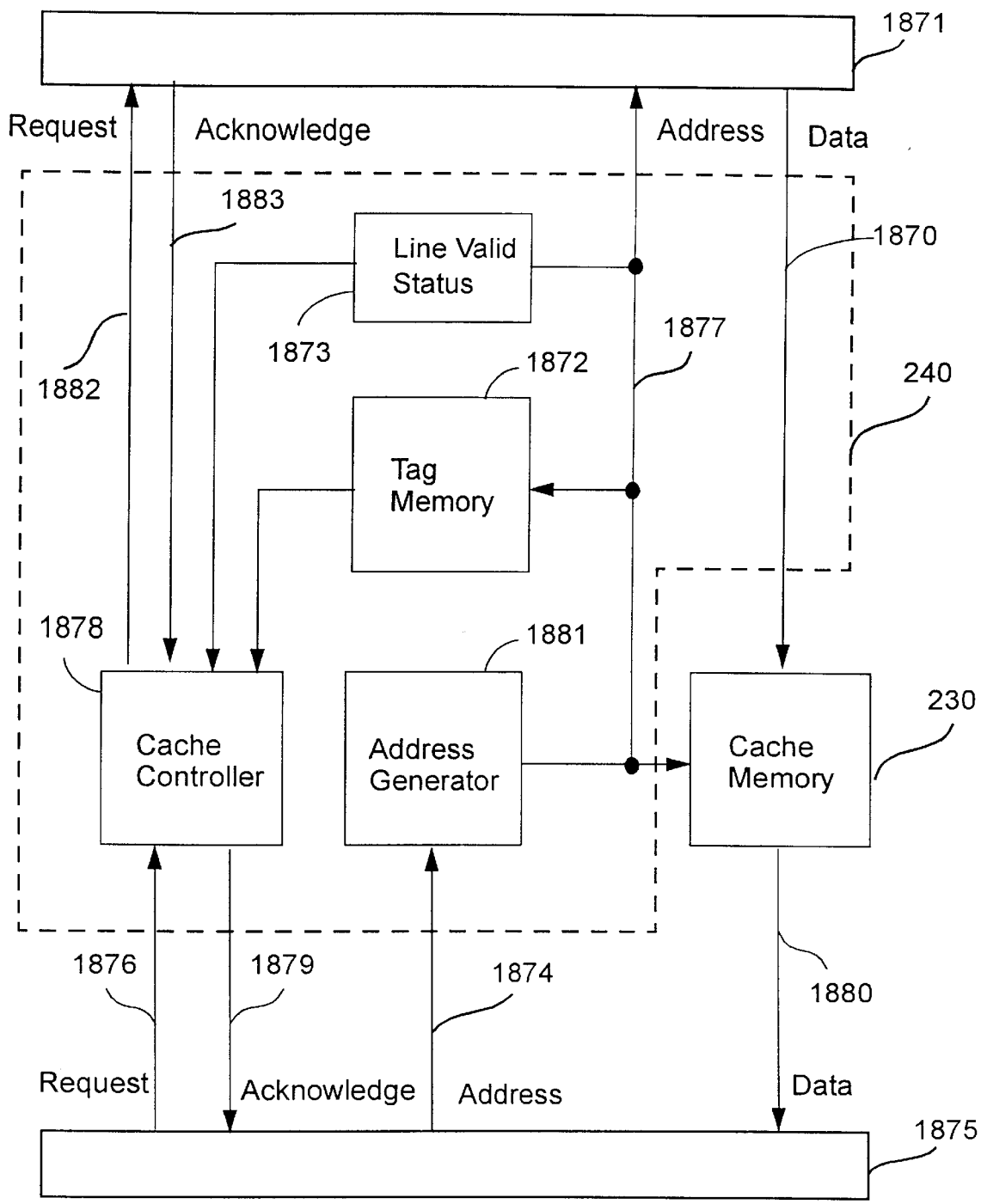
Figure 142:
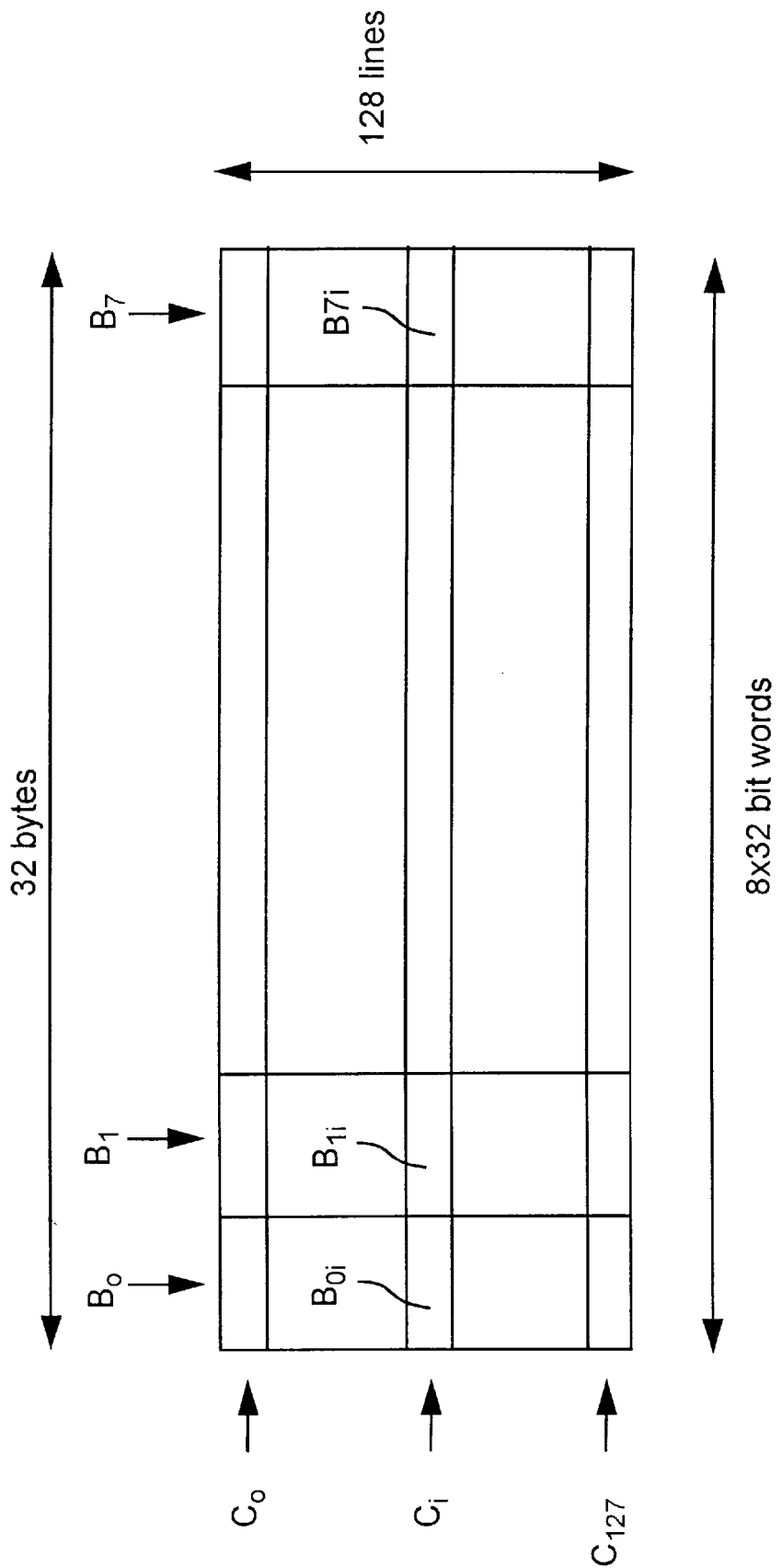
Figure 143:
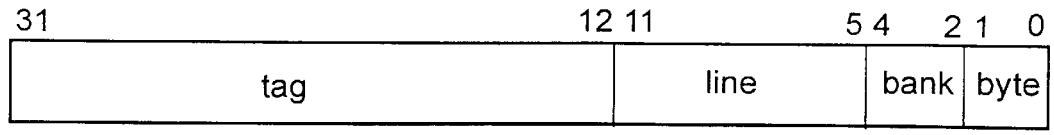
Figure 145:
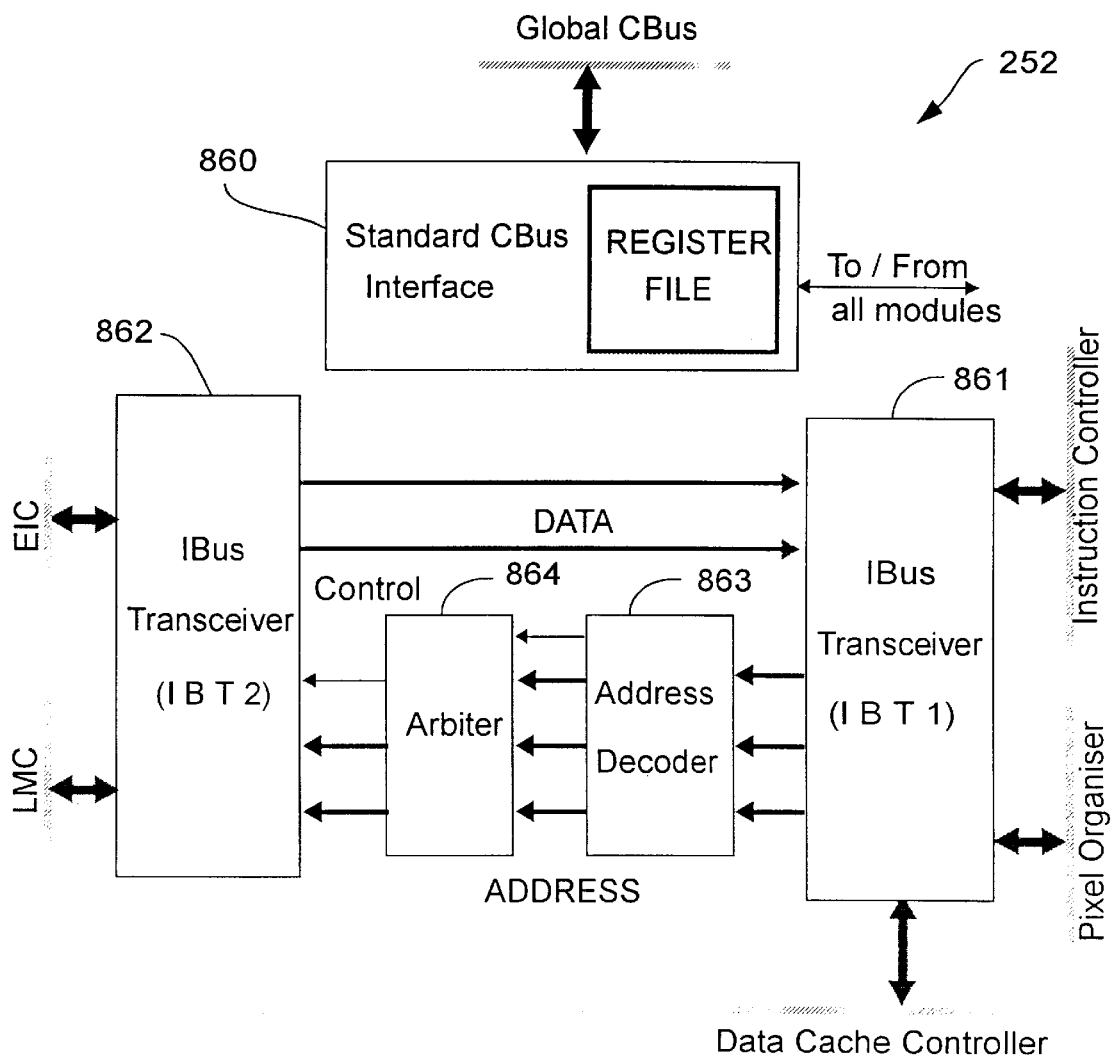
Figure 144A:
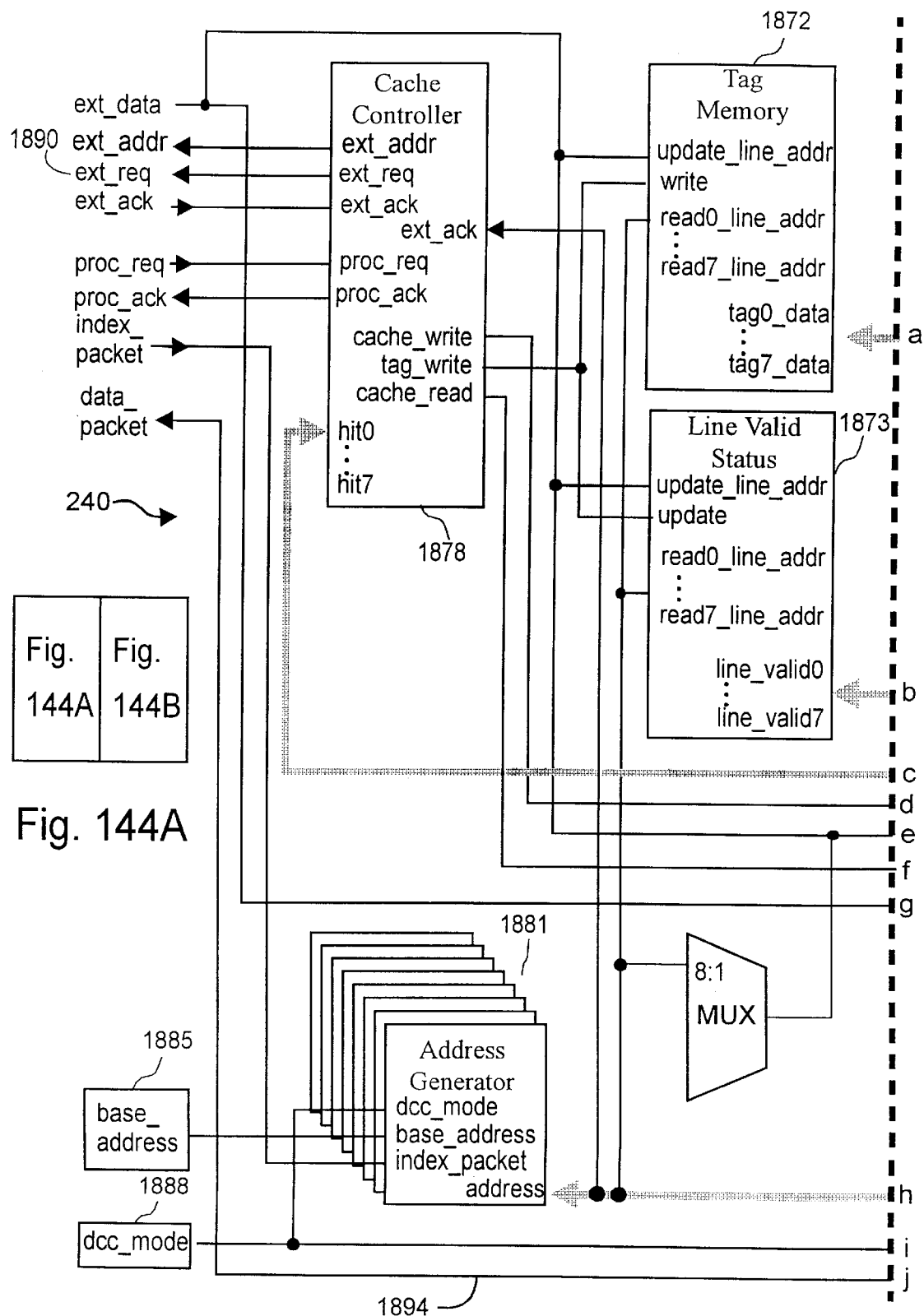
Figure 144B:
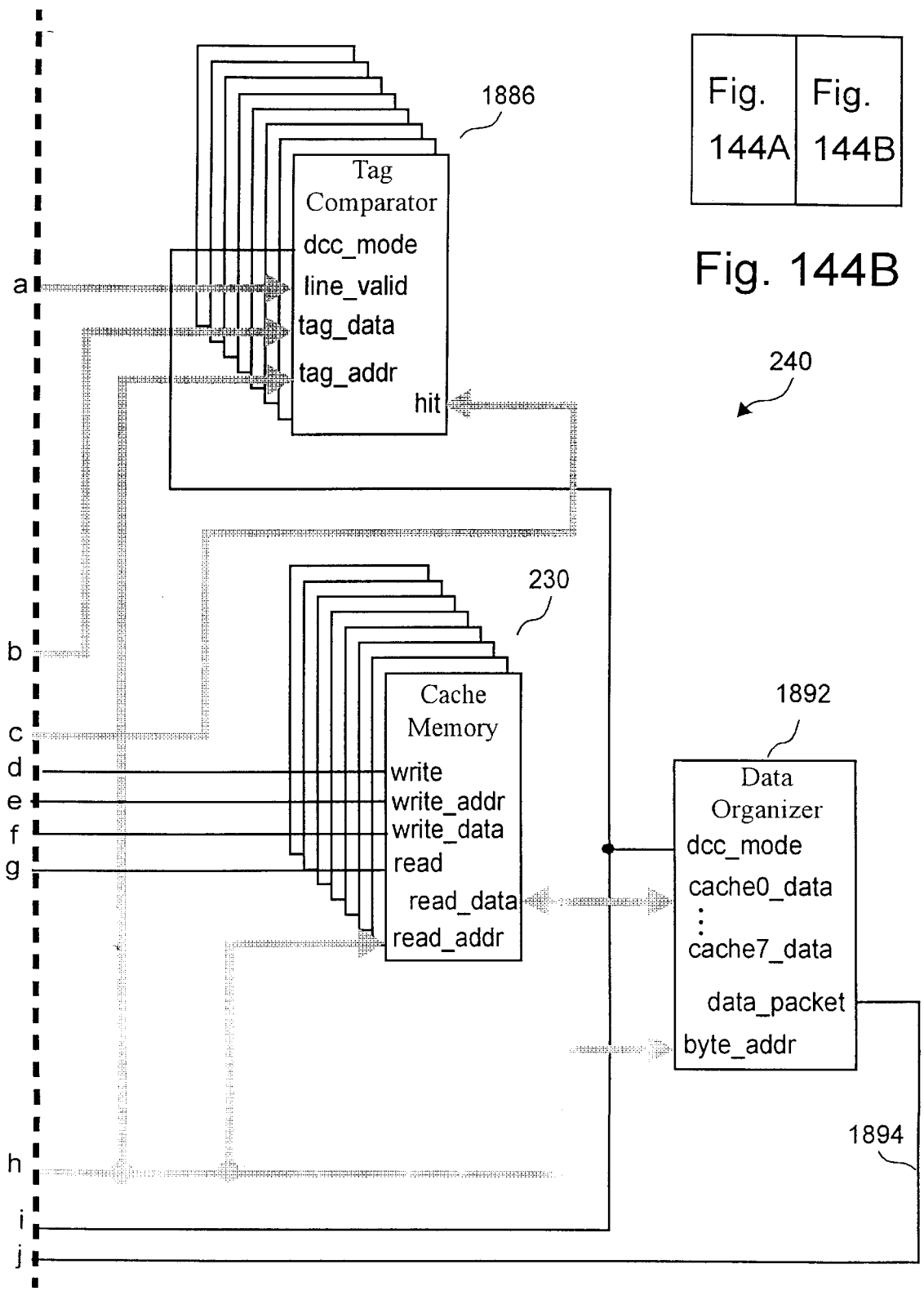
Figure 146:
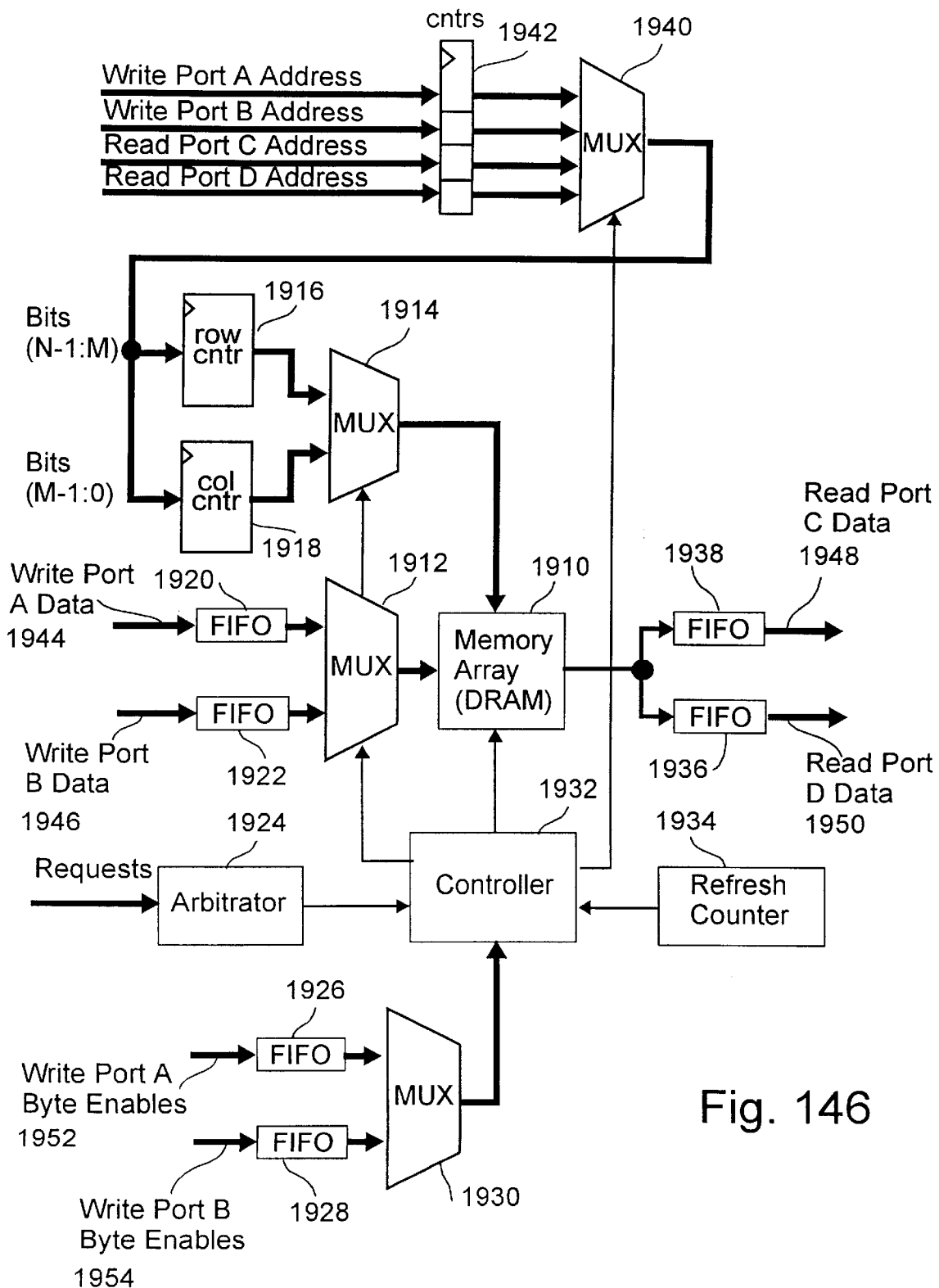
Figure 147:
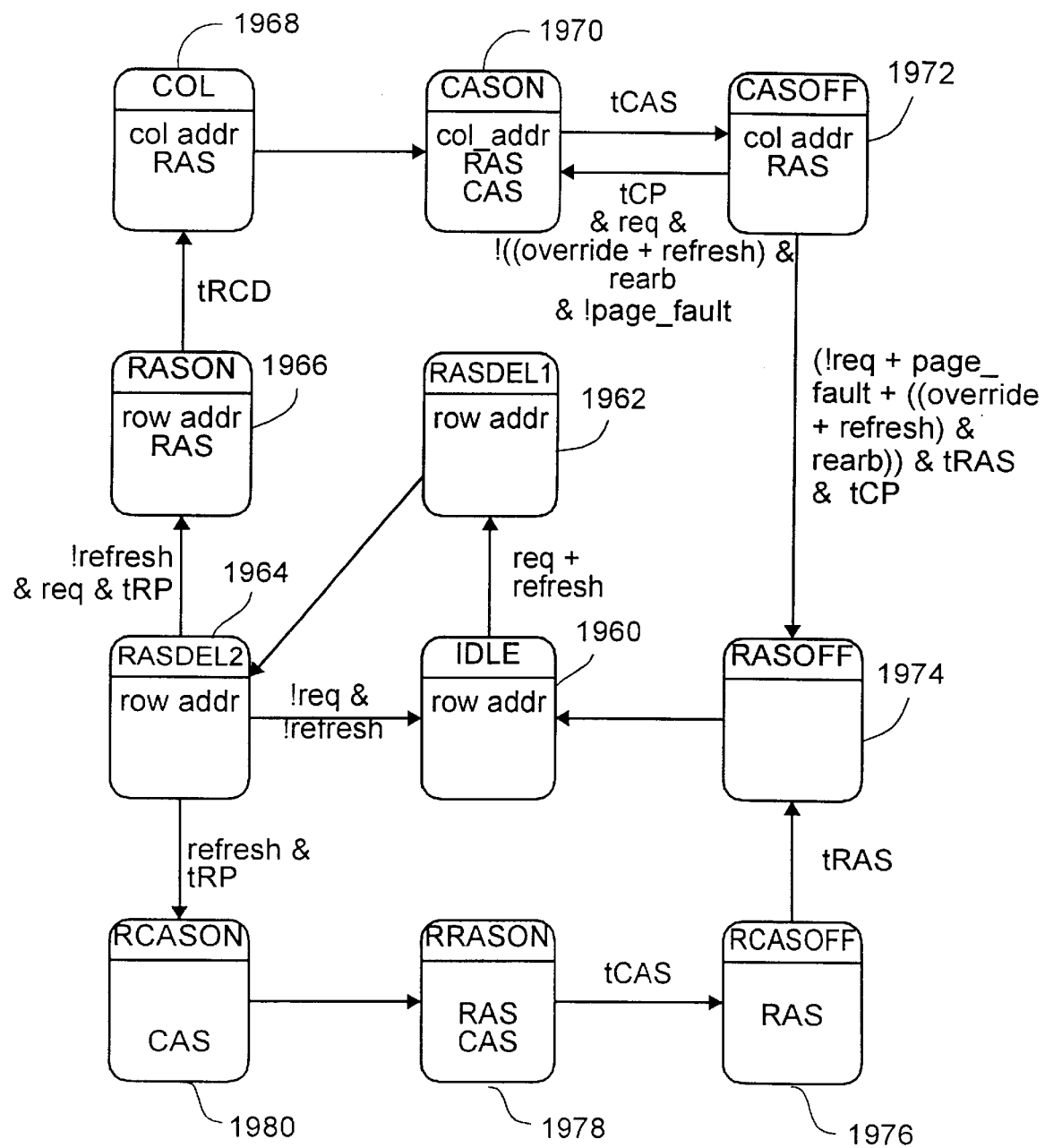
Figure 149:
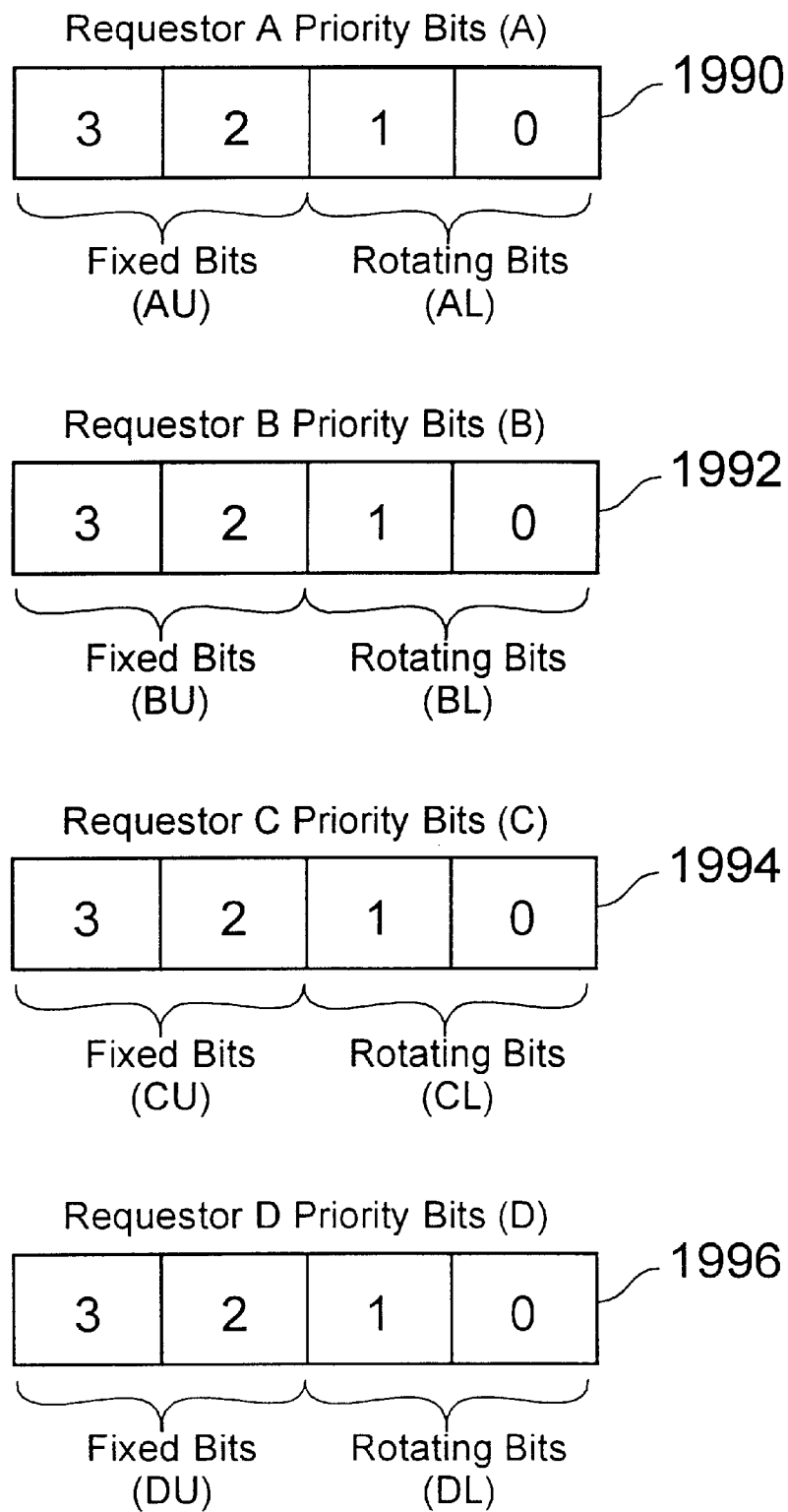

FIG. 82 presents a representational stream of Huffman-encoded data units interleaved with not encoded bit fields, both byte aligned and not, as in JPEG format;

FIG. 83 illustrates the overall architecture of a Huffman decoder of JPEG data of FIG. 84 in more detail;

FIG. 84 illustrates the overall architecture of the Huffman decoder of JPEG data;

FIG. 85 illustrates data processing in the stripper block which removes byte aligned not encoded bit fields from the input data. Examples of the coding of tags corresponding to the data outputted by the stripper are also shown;

FIG. 86 shows the organization and the data flow in the data preshifter;

FIG. 87 shows control logic for the decoder of FIG. 81;

FIG. 88 shows the organization and the data flow in the marker preshifter;

FIG. 89 shows a block diagram of a combinatorial unit decoding Huffman encoded values in JPEG context;

FIG. 90 illustrates the concept of a padding zone and a block diagram of the decoder of padding bits;

FIG. 91 shows an example of a format of data outputted by the decoder, the format being used in the co-processor;

FIG. 92 illustrates methodology utilized in image transformation instructions;

FIG. 93 illustrates the instruction word format for image transformation instructions;

FIGS. 94 and 95 illustrate the format of an image transformation kernal as utilized in the co-processor;

FIG. 96 illustrates the process of utilising an index table for image transformations as utilized in the co-processor;

FIG. 97 illustrates the data field format for instructions utilising transformations and convolutions;

FIG. 98 illustrates the process of interpretation of the bp field of instruction words;

FIG. 99 illustrates the process of convolution as utilized in the co-processor;

FIG. 100 illustrates the instruction word format for convolution instructions as utilized in the co-processor;

FIG. 101 illustrates the instruction word format for matrix multiplication as utilized in the co-processor;

FIGS. 102–105 illustrates the process utilized for hierarchial image manipulation as utilized in the co-processor;

FIG. 106 illustrates the instruction word coding for hierarchial image instructions;

FIG. 107 illustrates the instruction word coding for flow control instructions as illustrated in the co-processor;

FIG. 108 illustrates the pixel organizer in more detail;

FIG. 109 illustrates the operand fetch unit of the pixel organizer in more detail;

FIGS. 110–114 illustrate various storage formats as utilized by the co-processor;

FIG. 115 illustrates the MUV address generator of the pixel organizer of the co-processor in more detail;

FIG. 116 is a block diagram of a multiple value (MUV) buffer utilized in the co-processor;

FIG. 117 illustrates a structure of the encoder of FIG. 116;

FIG. 118 illustrates a structure of the decoder of FIG. 116;

FIG. 119 illustrates a structure of an address generator of FIG. 116 for generating read addresses when in JPEG mode (pixel decomposition);

FIG. 120 illustrates a structure of an address generator of FIG. 116 for generating read addresses when in JPEG mode (pixel reconstruction);

FIG. 121 illustrates an organization of memory modules comprising the storage device of FIG. 116;

FIG. 122 illustrates a structure of a circuit that multiplexes read addresses to memory modules;

FIG. 123 illustrates a representation of how lookup table entries are stored in the buffer operating in a single lookup table mode;

FIG. 124 illustrates a representation of how lookup table entries are stored in the buffer operating in a multiple lookup table mode;

FIG. 125 illustrates a representation of how pixels are stored in the buffer operating in JPEG mode (pixel decomposition);

FIG. 126 illustrate a representation of how single color data blocks are retrieved from the buffer operating in JPEG mode (pixel reconstruction);

FIG. 127 illustrates the structure of the result organizer of the co-processor in more detail;

FIG. 128 illustrates the structure of the operand organizers of the co-processor in more detail;

FIG. 129 is a block diagram of a computer architecture for the main data path unit utilized in the co-processor;

FIG. 130 is a block diagram of a input interface for accepting, storing and rearranging input data objects for further processing;

FIG. 131 is a block diagram of a image data processor for performing arithmetic operations on incoming data objects;

FIG. 132 is a block diagram of a color channel processor for performing arithmetic operations on one channel of the incoming data objects;

FIG. 133 is a block diagram of a multifunction block in a color channel processor;

FIG. 134 illustrates a block diagram for compositing operations;

FIG. 135 shows an inverse transform of the scanline;

FIG. 136 shows a block diagram of the steps required to calculate the value for a designation pixel;

FIG. 137 illustrates a block diagram of the image transformation engine;

FIG. 138 illustrates the two formats of kernel descriptions;

FIG. 139 shows the definition and interpretation of a bp field;

FIG. 140 shows a block diagram of multiplier-adders that perform matrix multiplication;

FIG. 141 illustrates the control, address and data flow of the cache and cache controller of the co-processor;

FIG. 142 illustrates the memory organization of the cache;

FIG. 143 illustrates the address format for the cache controller of the co-processor;

FIG. 144 is a block diagram of a multifunction block in a color channel processor;

FIG. 145 illustrates the input interface switch of the co-processor in more FIG. 144 illustrates, a block diagram of the cache and cache controller;

FIG. 146 illustrates a four-port dynamic local memory controller of the co-processor showing the main address and data paths;

FIG. 147 illustrates a state machine diagram for the controller of FIG. 146;

FIG. 148 is a pseudo code listing detailing the function of the arbitrator of FIG. 146;

FIG. 149 depicts the structure of the requester priority bits and the terminology used in FIG. 146.

Figure 2:
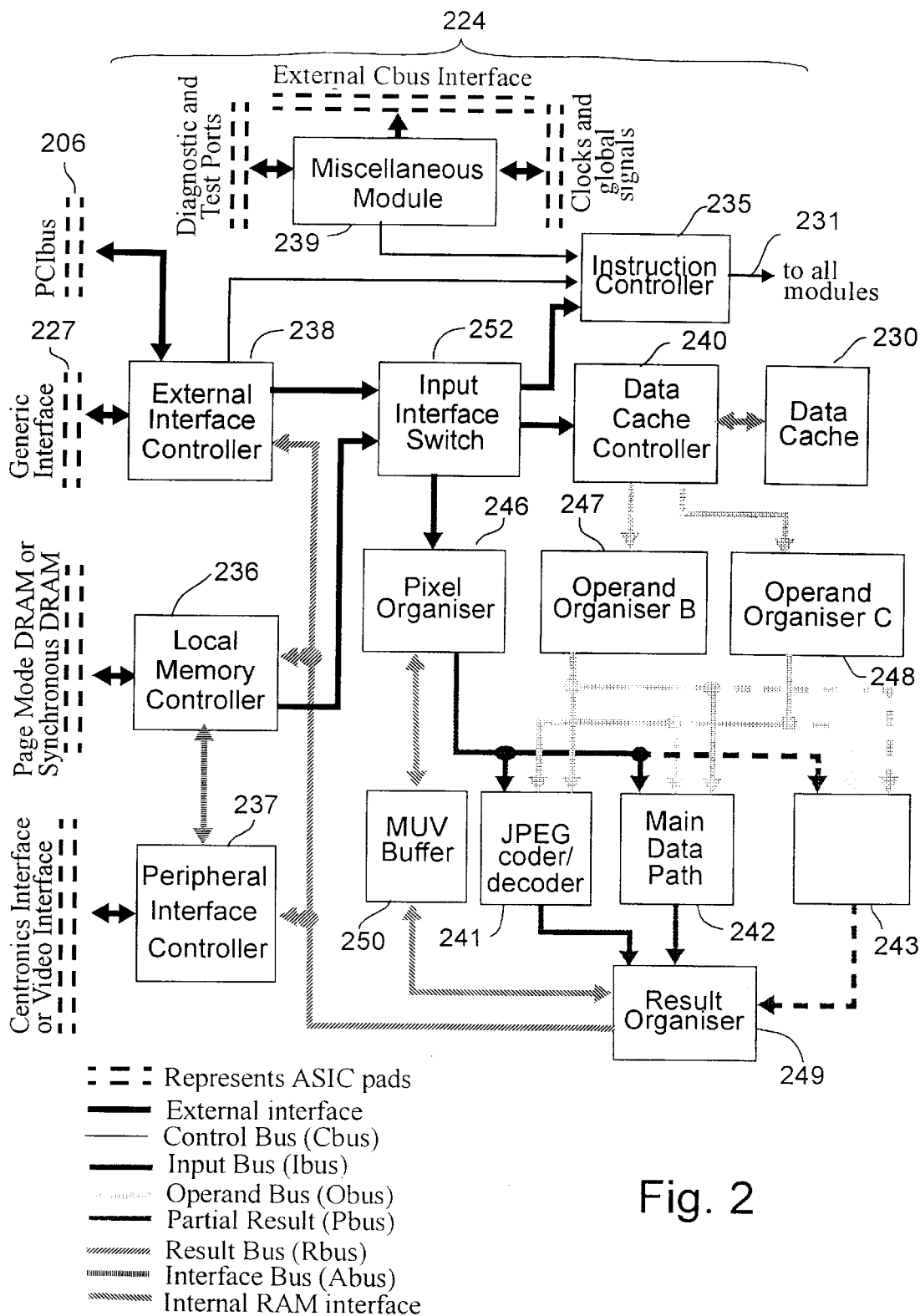
FIG. 2 illustrates the raster image co-processor of FIG. 1 in further detail.
Figure 150:
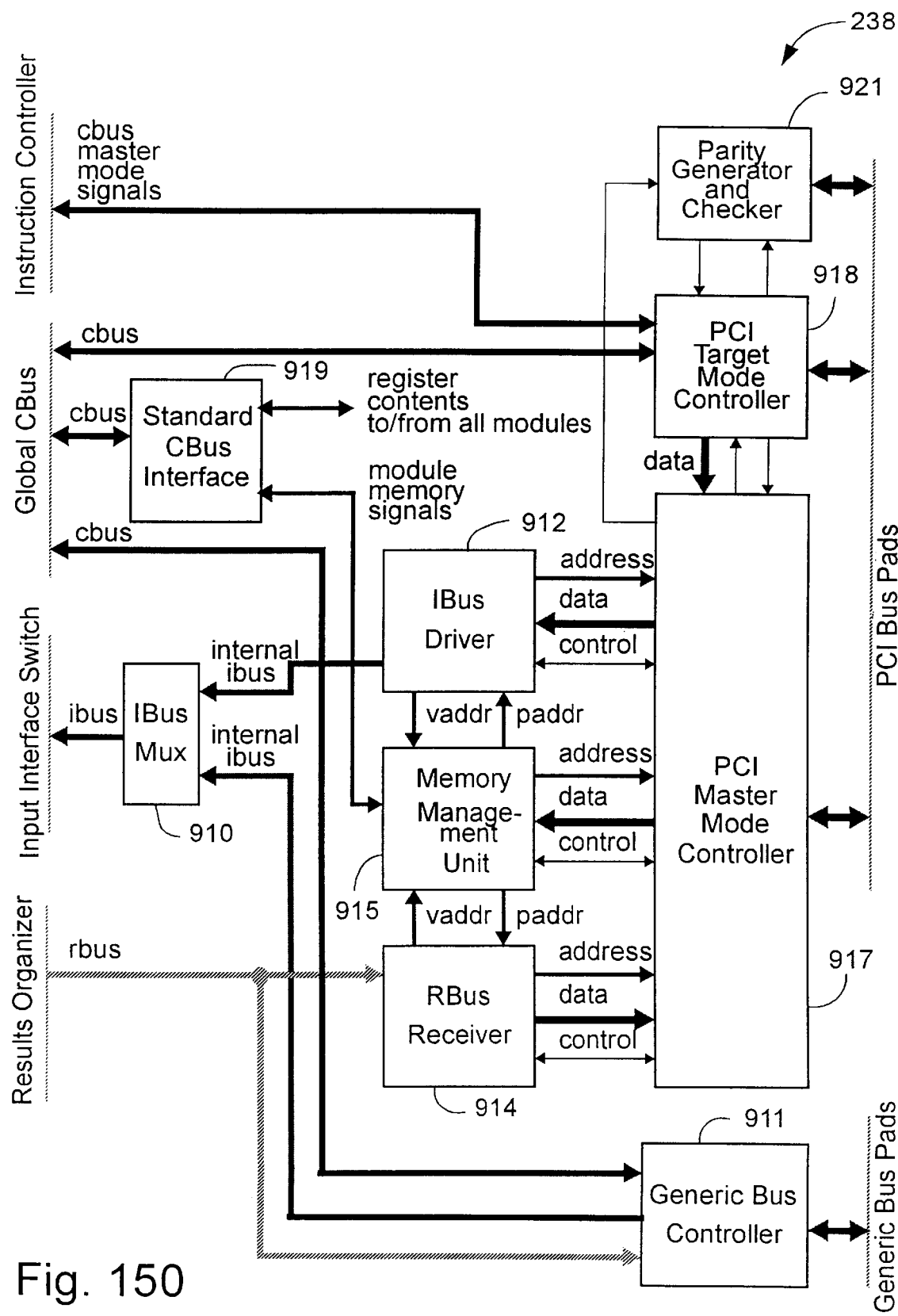
Figure 155A:
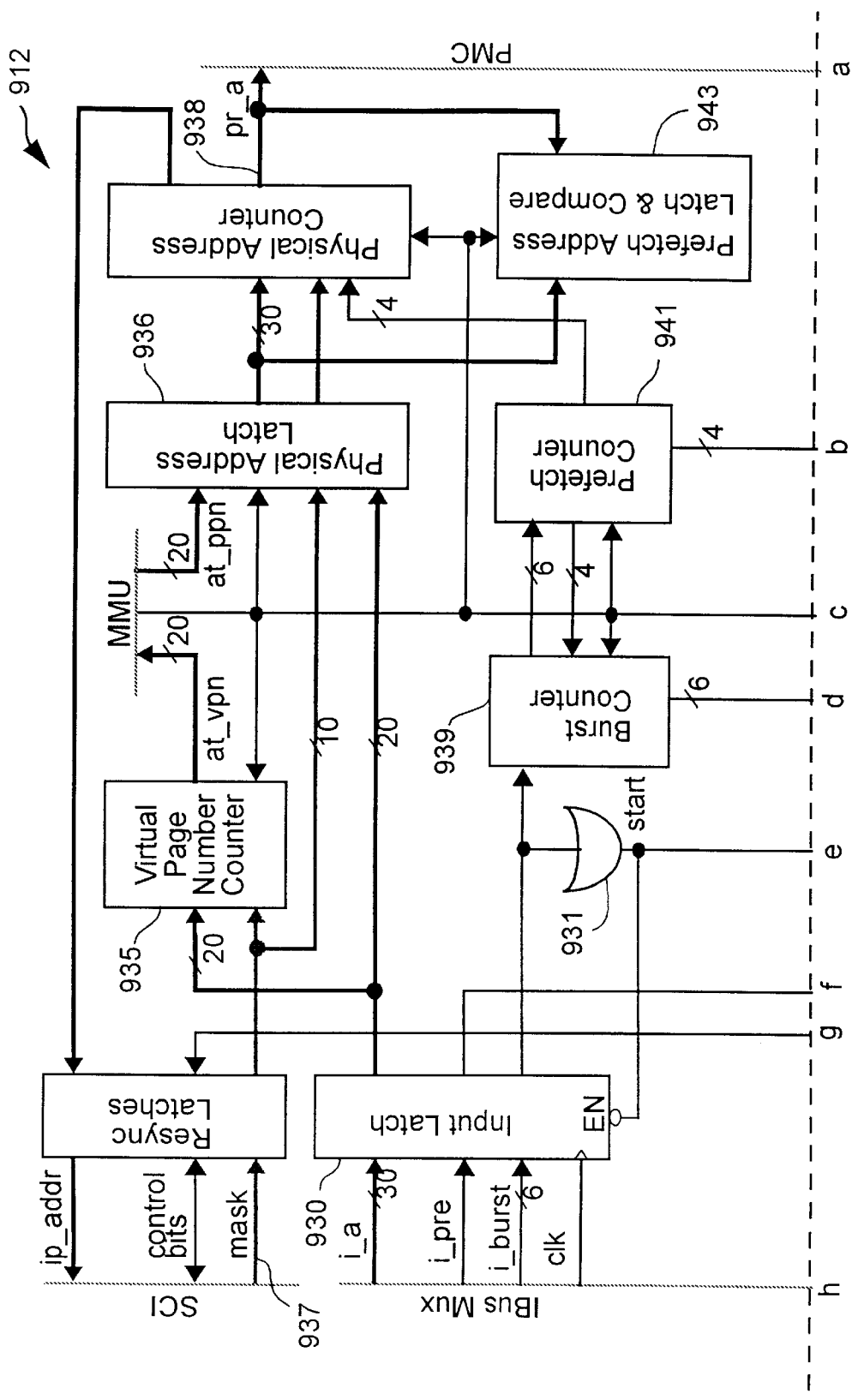
Figure 155B:
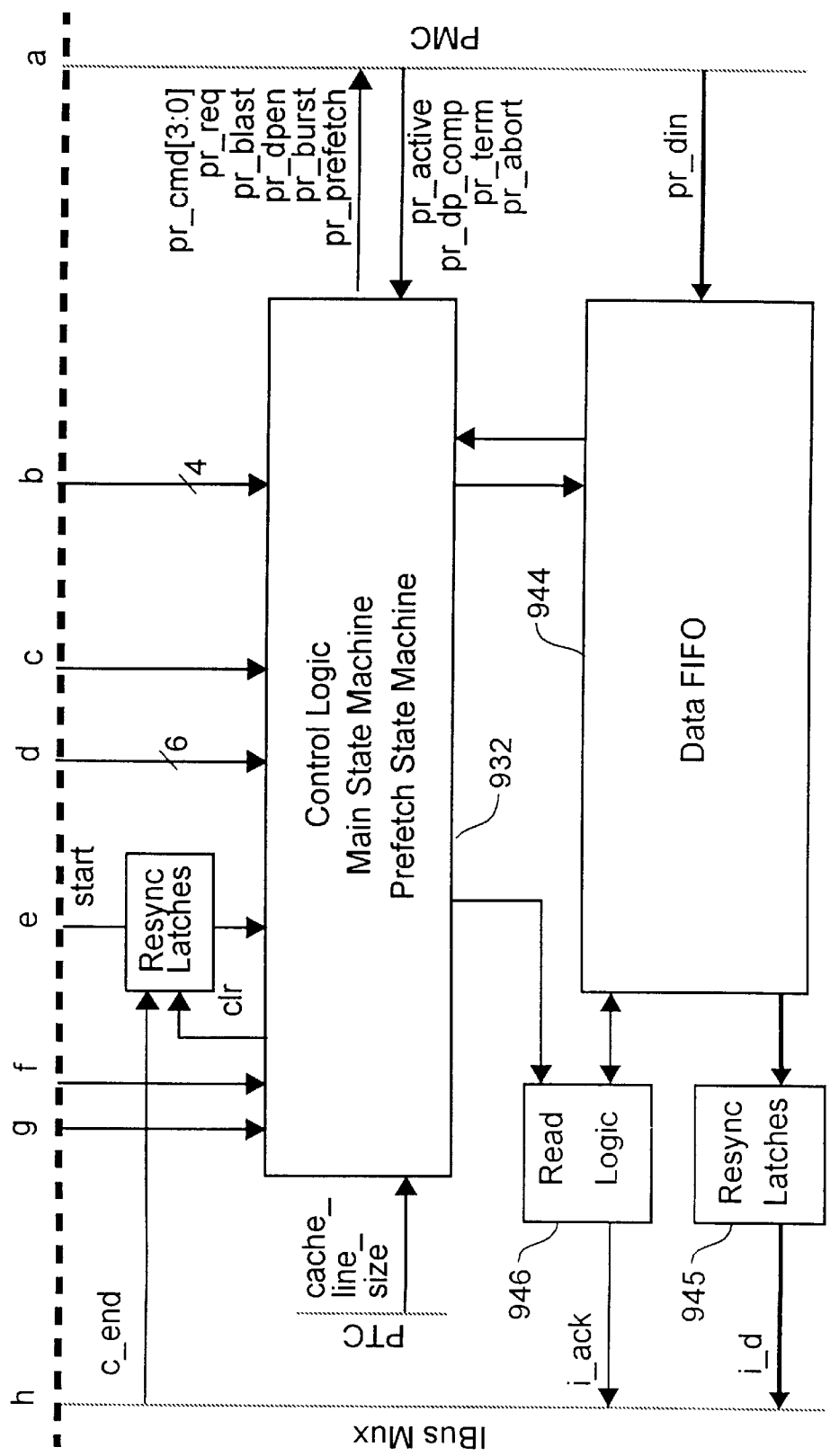
Figure 156A:
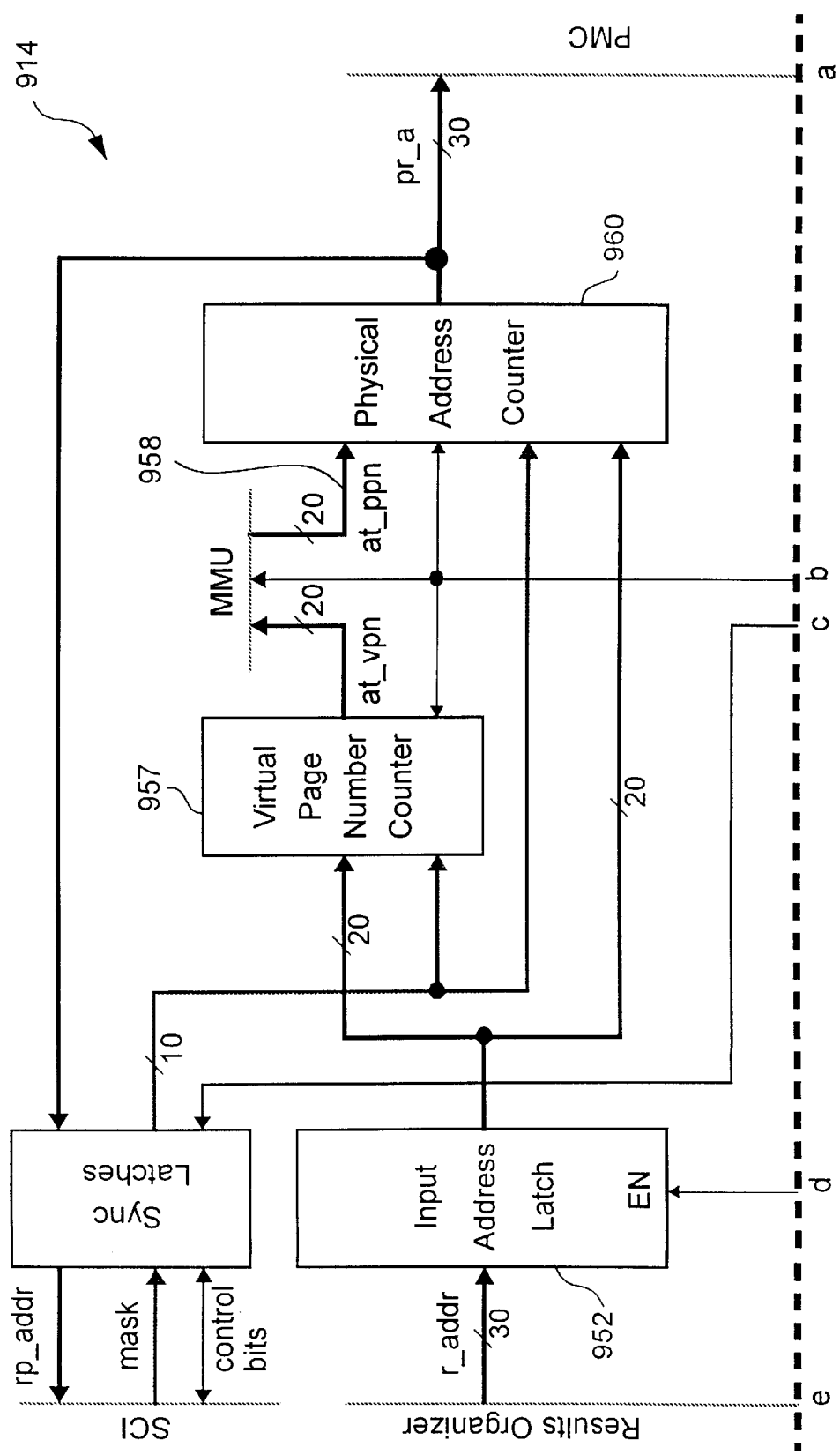
Figure 156B:
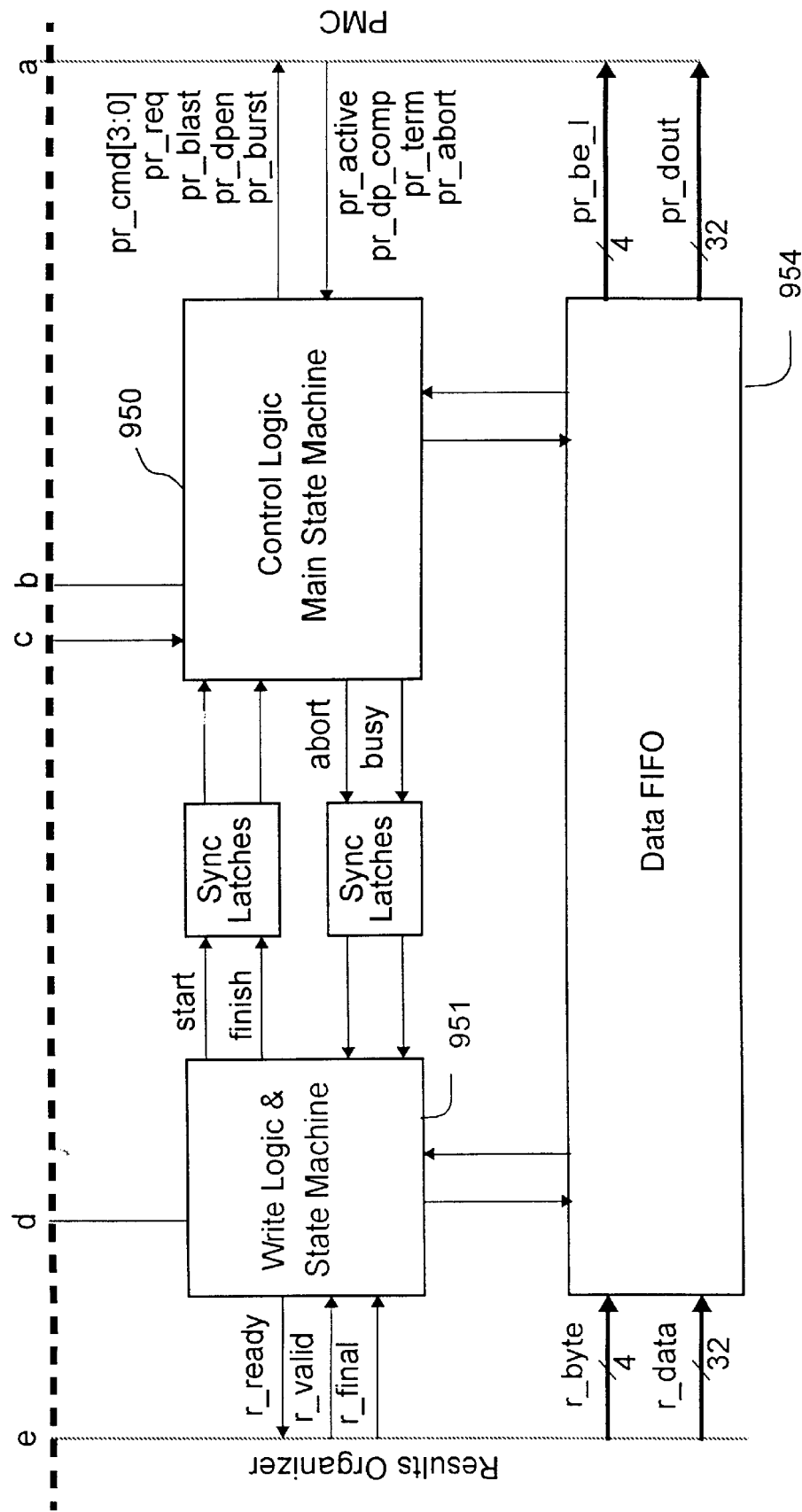
Figure 157B:
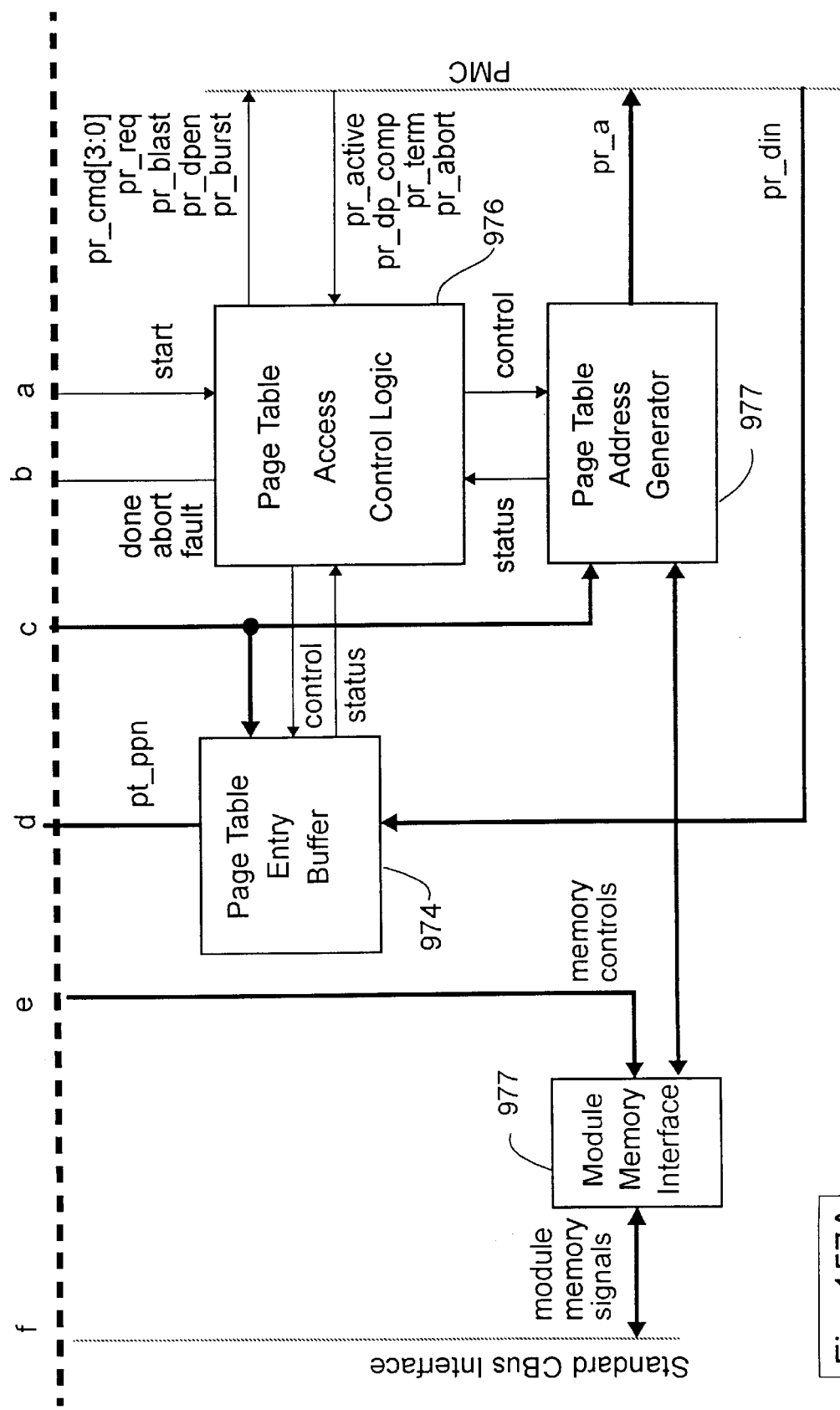
Figure 158:
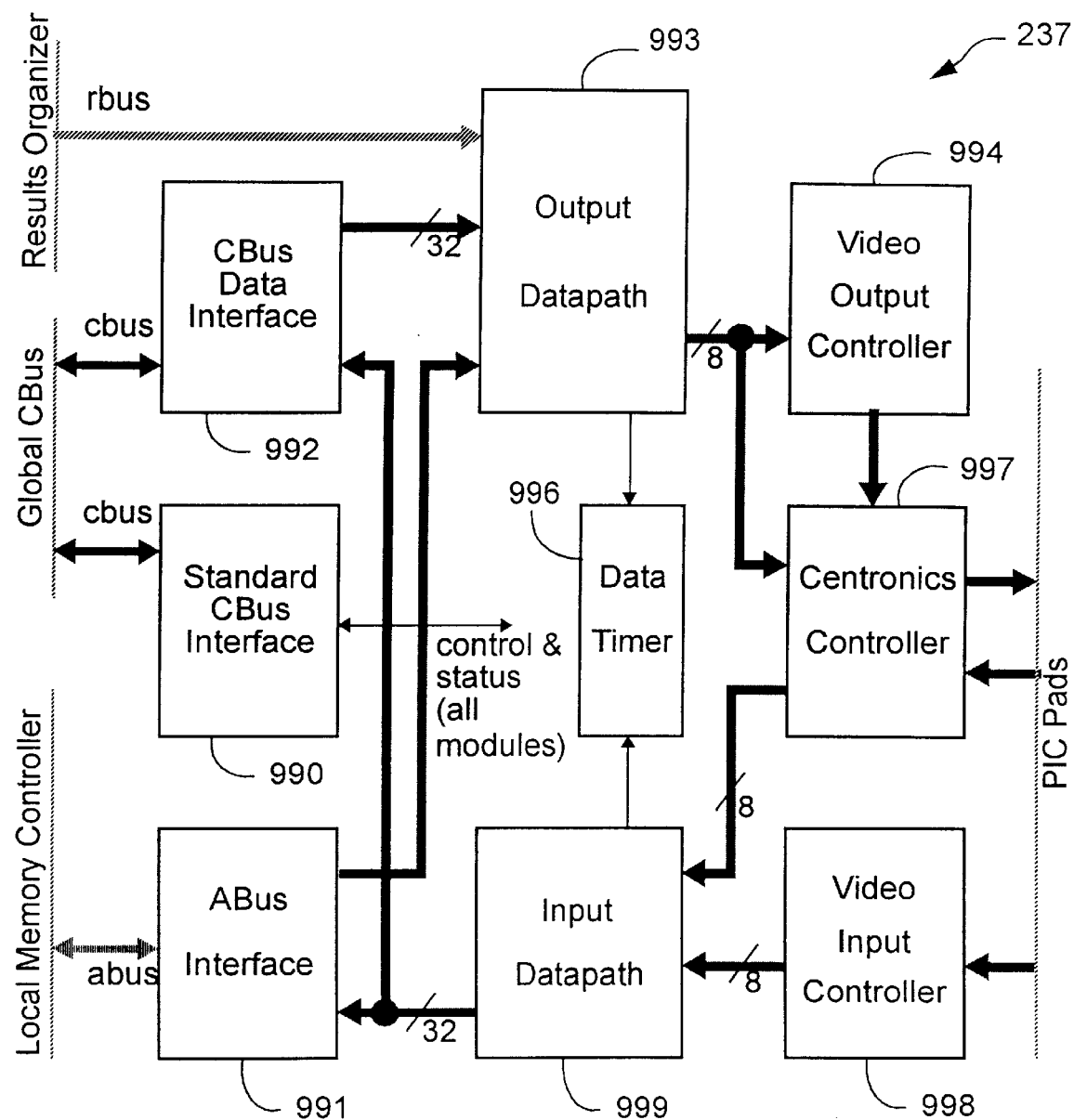

FIG. 150 illustrates the external interface controller of the co-processor in more detail;

FIGS. 151–154 illustrate the process of virtual to/from physical address mapping as utilized by the co-processor;

FIG. 155 illustrates the IBus receiver unit of FIG. 150 in more detail;

FIG. 156 illustrates the RBus receiver unit of FIG. 2 in more detail;

FIG. 157 illustrates the memory management unit of FIG. 150 in more detail;

FIG. 158 illustrates the peripheral interface controller of FIG. 2 in more detail.

2.0 LIST OF TABLES

Table 1: Register Description
Table 2: Opcode Description
Table 3: Operand Types
Table 4: Operand Descriptors
Table 5: Module Setup Order
Table 6: CBus Signal Definition
Table 7: CBus Transaction Types
Table 8: Data Manipulation Register Format
Table 9: Expected Data Types
Table 10: Symbol Explanation
Table 11: Compositing Operations
Table 12: Address Composition for SOGCS Mode
Table 12A: Instruction Encoding for Color Space Conversion
Table 13: Minor Opcode Encoding for Color Conversion Instructions
Table 14: Huffman and Quantization Tables as stored in Data Cache
Table 15: Fetch Address
Table 16: Tables Used by the Huffman Encoder
Table 17: Bank Address for Huffman and Quantization Tables
Table 18: Instruction Word—Minor Opcode Fields
Table 19: Instruction Word—Minor Opcode Fields
Table 20: Instruction Operand and Results Word
Table 21: Instruction Word
Table 22: Instruction Operand and Results Word
Table 23: Instruction Word
Table 24: Instruction Operand and Results Word
Table 25: Instruction Word—Minor Opcode Fields
Table 26: Instruction Word—Minor Opcode Fields
Table 27: Fraction Table

3.0 DESCRIPTION OF THE PREFERRED AND OTHER EMBODIMENTS

In the preferred embodiment, a substantial advantage is gained in hardware rasterization by means of utilization of two independent instruction streams by a hardware accelerator. Hence, while the first instruction stream can be preparing a current page for printing, a subsequent instruction stream can be preparing the next page for printing. A high utilization of hardware resources is available especially where the hardware accelerator is able to work at a speed substantially faster than the speed of the output device.

The preferred embodiment describes an arrangement utilising two instruction streams. However, arrangements having further instruction streams can be provided where the hardware trade-offs dictate that substantial advantages can be obtained through the utilization of further streams.

The utilization of two streams allows the hardware resources of the raster image co-processor to be kept fully engaged in preparing subsequent pages or bands, strips, etc., depending on the output printing device while a present page, band, etc is being forwarded to a print device.

3.1 General Arrangement of Plural Stream Architecture

Figure 1:
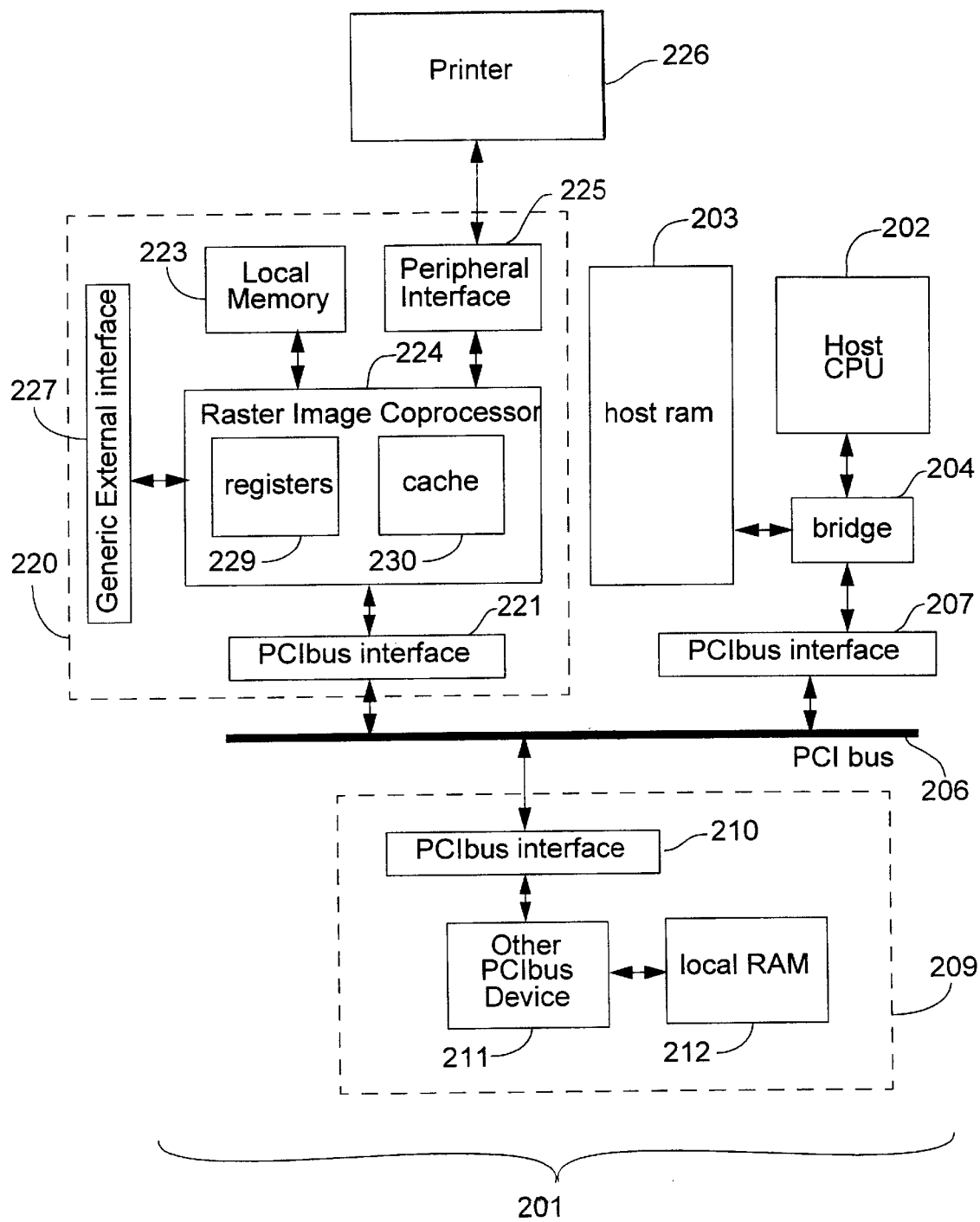
FIG. 1 illustrates the operation of a raster image co-processor within a host computer environment.

In FIG. 1 there is schematically illustrated a computer hardware arrangement 201 which constitutes the preferred embodiment. The arrangement 201 includes a standard host computer system which takes the form of a host CPU 202 interconnected to its own memory store (RAM) 203 via a bridge 204. The host computer system provides all the normal facilities of a computer system including operating systems programs, applications, display of information, etc. The host computer system is connected to a standard PCI bus 206 via a PCI bus interface 207. The PCI standard is a well known industry standard and most computer systems sold today, particularly those running Microsoft Windows (trade mark) operating systems, normally come equipped with a PCI bus 206. The PCI bus 206 allows the arrangement 201 to be expanded by means of the addition of one or more PCI cards, eg. 209, each of which contain a further PCI bus interface 210 and other devices 211 and local memory 212 for utilization in the arrangement 201.

In the preferred embodiment, there is provided a raster image accelerator card 220 to assist in the speeding up of graphical operations expressed in a page description language. The raster image accelerator card 220 (also having a PCI bus interface 221) is designed to operate in a loosely coupled, shared memory manner with the host CPU 202 in the same manner as other PCI cards 209. It is possible to add further image accelerator cards 220 to the host computer system as required. The raster image accelerator card is designed to accelerate those operations that form the bulk of the execution complexity in raster image processing operations. These can include:

| | |
|---|---|
| (a) | Composition |
| (b) | Generalized Color Space Conversion |
| (c) | JPEG compression and decompression |
| (d) | Huffman, run length and predictive coding and decoding |
| (e) | Hierarchial image (Trade Mark) decompression |
| (f) | Generalized affine image transformations |
| (g) | Small kernel convolutions |
| (h) | Matrix multiplication |
| (i) | Halftoning |
| (j) | Bulk arithmetic and memory copy operations |

The raster image accelerator card 220 further includes its own local memory 223 connected to a raster image co-processor 224 which operates the raster image accelerator card 220 generally under instruction from the host CPU 202. The co-processor 224 is preferably constructed as an Application Specific Integrated Circuit (ASIC) chip. The raster image co-processor 224 includes the ability to control at least one printer device 226 as required via a peripheral interface 225. The image accelerator card 220 may also control any input/output device including scanners. Additionally, there is provided on the accelerator card 220 a generic external interface 227 connected with the raster image co-processor 224 for its monitoring and testing.

In operation, the host CPU 202 sends, via PCI bus 206, a series of instructions and data for the creation of images by the raster image co-processor 224. The data can be stored in the local memory 223 in addition to a cache 230 in the raster image co-processor 224 or in registers 229 also located in the co-processor 224.

Turning now to FIG. 2, there is illustrated, in more detail, the raster image co-processor 224. The co-processor 224 is responsible for the acceleration of the aforementioned operations and consists of a number of components generally under the control of an instruction controller 235. Turning first to the co-processor's communication with the outside world, there is provided a local memory controller 236 for communications with the local memory 223 of FIG. 1. A peripheral interface controller 237 is also provided for the communication with printer devices utilising, standard formats such as the Centronics interface standard format or other video interface formats. The peripheral interface controller 237 is interconnected with the local memory controller 236. Both the local memory controller 236 and the external interface controller 238 are connected with an input interface switch 252 which is in turn connected to the instruction controller 235. The input interface switch 252 is also connected to a pixel organizer 246 and a data cache controller 240. The input interface switch 252 is provided for switching data from the external interface controller 238 and local memory controller 236 to the instruction controller 235, the data cache controller 240 and the pixel organizer 246 as required.

For communications with the PCI bus 206 of FIG. 1 the external interface controller 238 is provided in the raster image co-processor 224 and is connected to the instruction controller 235. There is also provided a miscellaneous module 239 which is also connected to the instruction controller 235 and which deals with interactions with the co-processor 224 for purposes of test diagnostics and the provision of clocking and global signals.

The data cache 230 operates under the control of the data cache controller 240 with which it is interconnected. The data cache 230 is utilized in various ways, primarily to store recently used values that are likely to be subsequently utilized by the co-processor 224. The aforementioned acceleration operations are carried out on plural streams of data primarily by a JPEG coder/decoder 241 and a main data path unit 242. The units 241, 242 are connected in parallel arrangement to all of the pixel organizer 246 and two operand organizers 247, 248. The processed streams from units 241, 242 are forwarded to a results organizer 249 for processing and reformatting where required. Often, it is desirable to store intermediate results close at hand. To this end, in addition to the data cache 230, a multi-used value buffer 250 is provided, interconnected between the pixel organizer 246 and the result organizer 249, for the storage of intermediate data. The result organizer 249 outputs to the external interface controller 238, the local memory controller 236 and the peripheral interface controller 237 as required.

As indicated by broken lines in FIG. 2, a further (third) data path unit 243 can, if required be connected "in parallel" with the two other data paths in the form of JPEG coder/decoder 241 and the main data path unit 242. The extension to 4 or more data paths is achieved in the same way. Although the paths are "parallel" connected. They do not operate in parallel. Instead only one path at a time operates.

The overall ASIC design of FIG. 2 has been developed in the following manner. Firstly, in printing pages it is necessary that there not be even small or transient artifacts. This is because whilst in video signal creation for example, such small errors if present may not be apparent to the human eye (and hence be unobservable), in printing any small artefact appears permanently on the printed page and can sometimes be glaringly obvious. Further, any delay in the signal reaching the printer can be equally disastrous resulting in white, unprinted areas on a page as the page continues to move through the printer. It is therefore necessary to provide results of very high quality, very quickly and this is best achieved by a hardware rather than a software solution.

Secondly, if one lists all the various operational steps (algorithms) required to be carried out for the printing process and provides an equivalent item of hardware for each step, the total amount of hardware becomes enormous and prohibitively expensive. Also the speed at which the hardware can operate is substantially limited by the rate at which the data necessary for, and produced by, the calculations can be fetched and despatched respectively. That is, there is a speed limitation produced by the limited bandwidth of the interfaces.

However, overall ASIC design is based upon a surprising realization that if the enormous amount of hardware is represented schematically then various parts of the total hardware required can be identified as being (a) duplicated and (b) not operating all the time. This is particularly the case in respect of the overhead involved in presenting the data prior to its calculation.

Therefore various steps were taken to reach the desired state of reducing the amount of hardware whilst keeping all parts of the hardware as active as possible. The first step was the realization that in image manipulation often repetitive calculations of the same basic type were required to be carried out. Thus if the data were streamed in some way, a calculating unit could be configured to carry out a specific type of calculation, a long stream of data processed and then the calculating unit could be reconfigured for the next type of calculation step required. If the data streams were reasonably long, then the time required for reconfiguration would be negligible compared to the total calculation time and thus throughput would be enhanced.

In addition, the provision of plural data processing paths means that in the event that one path is being reconfigured whilst the other path is being used, then there is substantially no loss of calculating time due to the necessary reconfiguration. This applies where the main data path unit 242 carries out a more general calculation and the other data path(s) carry out more specialized calculation such as JPEC coding and decoding as in unit 241 or, if additional unit 243 is provided, it can provide entropy and/or Huffman coding/decoding.

Furthers whilst the calculations were proceeding, the fetching and presenting of data to the calculating unit can be proceeding. This process can be further speeded up, and hardware resources better utilized, if the various types of data are standardized or normalized in some way. Thus the total overhead involved in fetching and despatching data can be reduced.

Importantly, as noted previously, the co-processor 224 operates under the control of host CPU 202 (FIG. 1). In this respect. the instruction controller 235 is responsible for the overall control of the co-processor 224. The instruction controller 235 operates the co-processor 224 by means of utilising a control bus 231, hereinafter known as the CBus. The CBus 231 is connected to each of the modules 236–250 inclusive to set registers (231 of FIG. 1) within each module so as to achieve overall operation of the co-processor 224. In order not to overly complicate FIG. 2, the interconnection of the control bus 231 to each of the modules 236–250 is omitted from FIG. 2

Figure 3:
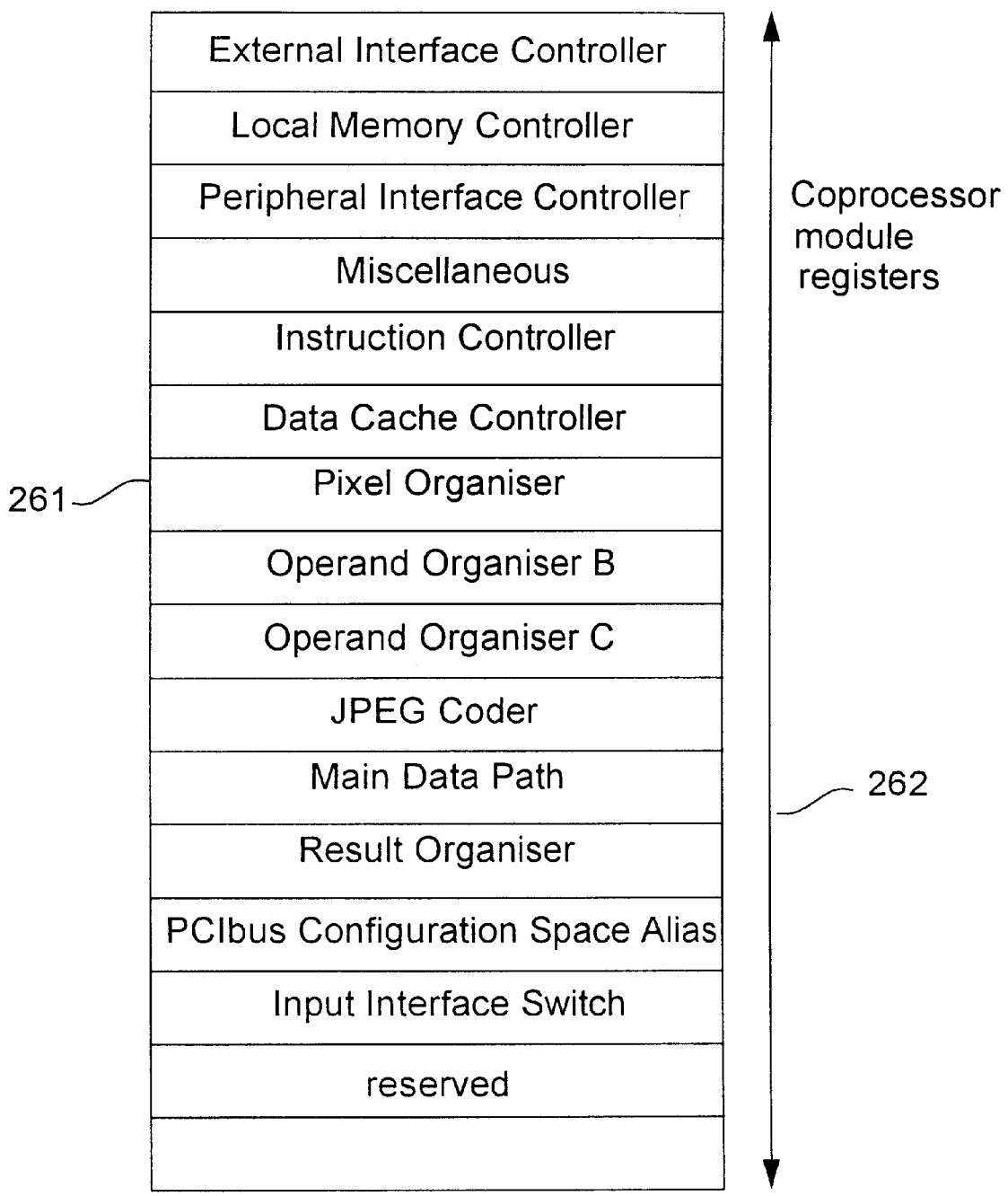
FIG. 3 illustrates the memory map of the raster image co-processor.

Turning now to FIG. 3, there is illustrated a schematic layout 260 of the available module registers. The layout 260 includes registers 261 dedicated to the overall control of the co-processor 224 and its instruction controller 235. The co-processor modules 236–250 include similar registers 262.

3.2 Host/Co-processor Queuing

With the above architecture in mind, it is clear that there is a need to adequately provide for cooperation between the host processor 202 and the image co-processor 224. However, the solution to this problem is general and not restricted to the specific above described architecture and therefore will be described hereafter with reference to a more general computing hardware environment.

Modern computer systems typically require some method of memory management to provide for dynamic memory allocation. In the case of a system with one or more co-processors, some method is necessary to synchronize between the dynamic allocation of memory and the use of that memory by a co-processor.

Typically a computer hardware configuration has both a CPU and a specialized co-processor, each sharing a bank of memory. In such a system, the CPU is the only entity in the system capable of allocating memory dynamically. Once allocated by the CPU for use by the co-processor, this memory can be used freely by the co-processor until it is no longer required, at which point it is available to be freed by the CPU. This implies that some form of synchronization is necessary between the CPU and the co-processor in order to ensure that the memory is released only after the co-processor is finished using it. There are several possible solutions to this problem but each has undesirable performance implications.

The use of statically allocated memory avoids the need for synchronization, but prevents the system from adjusting its memory resource usage dynamically. Similarly, having the CPU block and wait until the co-processor has finished performing each operation is possible, but this substantially reduces parallelism and hence reduces overall system performance. The use of interrupts to indicate completion of operations by the co-processor is also possible but imposes significant processing overhead if co-processor throughput is very high.

In addition to the need for high performance, such a system also has to deal with dynamic memory shortages gracefully. Most computer systems allow a wide range of memory size configurations. It is important that those systems with large amounts of memory available make full use of their available resources to maximize performance. Similarly those systems with minimal memory size configurations should still perform adequately to be useable and, at the very least, should degrade gracefully in the face of a memory shortage.

To overcome these problems, a synchronization mechanism is necessary which will maximize system performance while also allowing co-processor memory usage to adjust dynamically to both the capacity of the system and the complexity of the operation being performed.

Figure 4:
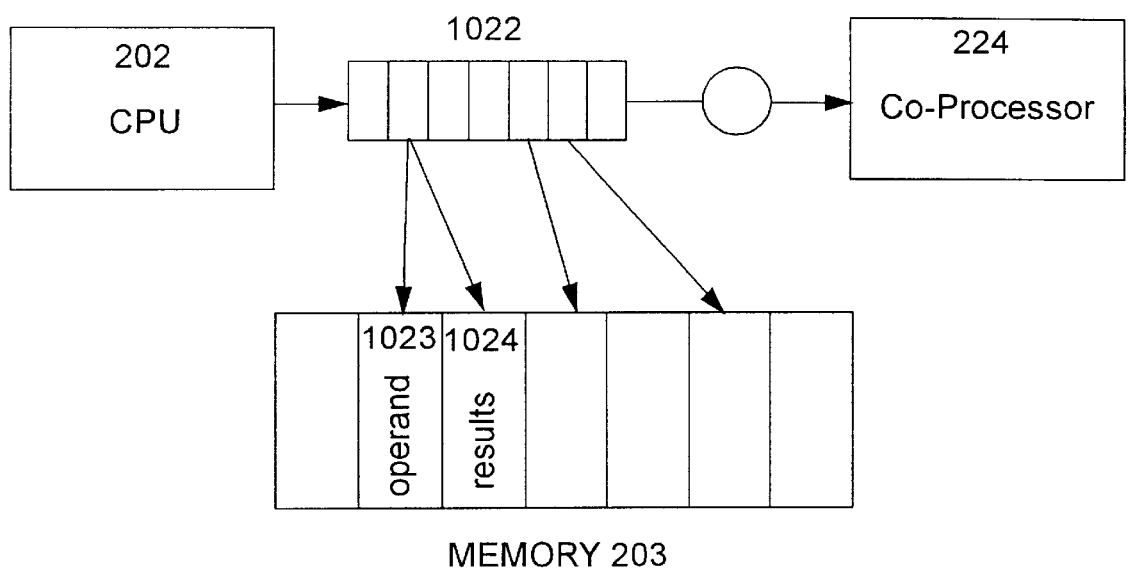
FIG. 4 shows the relationship between a CPU, instruction queue, instruction operands and results in shared memory, and a co-processor.

In general, the preferred arrangement for synchronising the (host) CPU and the co-processor is illustrated in FIG. 4 where the reference numerals used are those already utilized in the previous description of FIG. 1.

Thus in FIG. 108, the CPU 202 is responsible for all memory management in the system. It allocates memory 203 both for its own uses, and for use by the co-processor 224. The co-processor 224 has its own graphics-specific instruction set, and is capable of executing instructions 1022 from the memory 203 which is shared with the host processor 202. Each of these instructions can also write results 1024 back to the shared memory 203, and can read operands 1023 from the memory 203 as well. The amount of memory 203 required to store operands 1023 and results 1024 of co-processor instructions varies according to the complexity and type of the particular operation.

The CPU 202 is also responsible for generating the instructions 1022 executed by the co-processor 224. To maximize the degree of parallelism between the CPU 202 and the co-processor 224, instructions generated by the CPU 202 are queued as indicated at 1022 for execution by the co-processor 224. Each instruction in the queue 1022 can reference operands 1023 and results 1024 in the shared memory 203, which has been allocated by the host CPU 202 for use by the co-processor 224.

Figure 5:
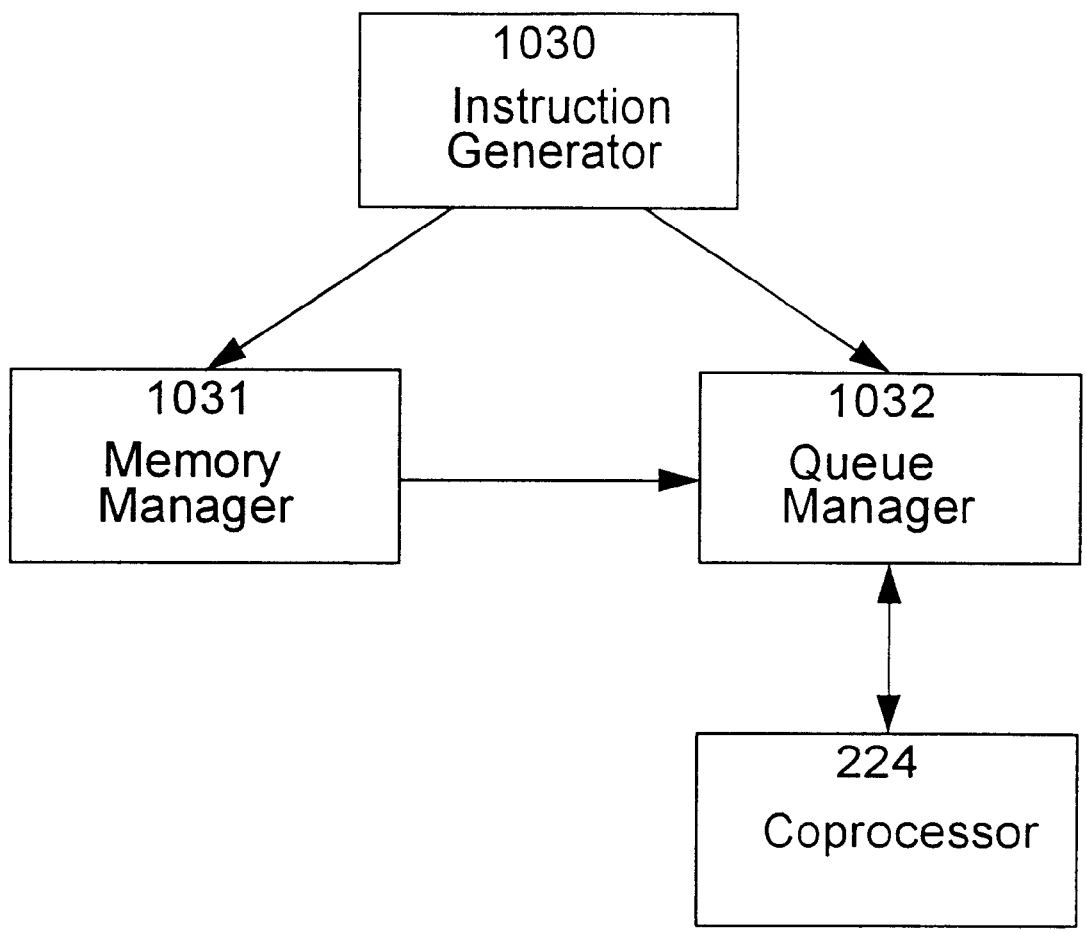
FIG. 5 shows the relationship between an instruction generator, memory manager, queue manager and co-processor.

The method utilizes an interconnected instruction generator 1030, memory manager 1031 and queue manager 1032, as shown in FIG. 5. All these modules execute in a single process on the host CPU 202.

Instructions for execution by the co-processor 224 are generated by the instruction generator 1030, which uses the services of the memory manager 1031 to allocate space for the operands 1023 and results 1024 of the instructions being generated. The instruction generator 1030 also uses the services of the queue manager 1032 to queue the instructions for execution by the co-processor 224.

Once each instruction has been executed by the co-processor 224, the CPU 202 can free the memory which was allocated by the memory manager 1031 for use by the operands of that instruction. The result of one instruction can also become an operand for a subsequent instruction, after which its memory can also be freed by the CPU. Rather than fielding an interrupt, and freeing such memory as soon as the co-processor 224 has finished with it, the system frees the resources needed by each instruction via a cleanup function which runs at some stage after the co-processor 224 has completed the instruction. The exact time at which these cleanups occur depends on the interaction between the memory manager 1031 and the queue manager 1032, and allows the system to adapt dynamically according to the amount of system memory available and the amount of memory required by each co-processor instruction.

Figure 6:
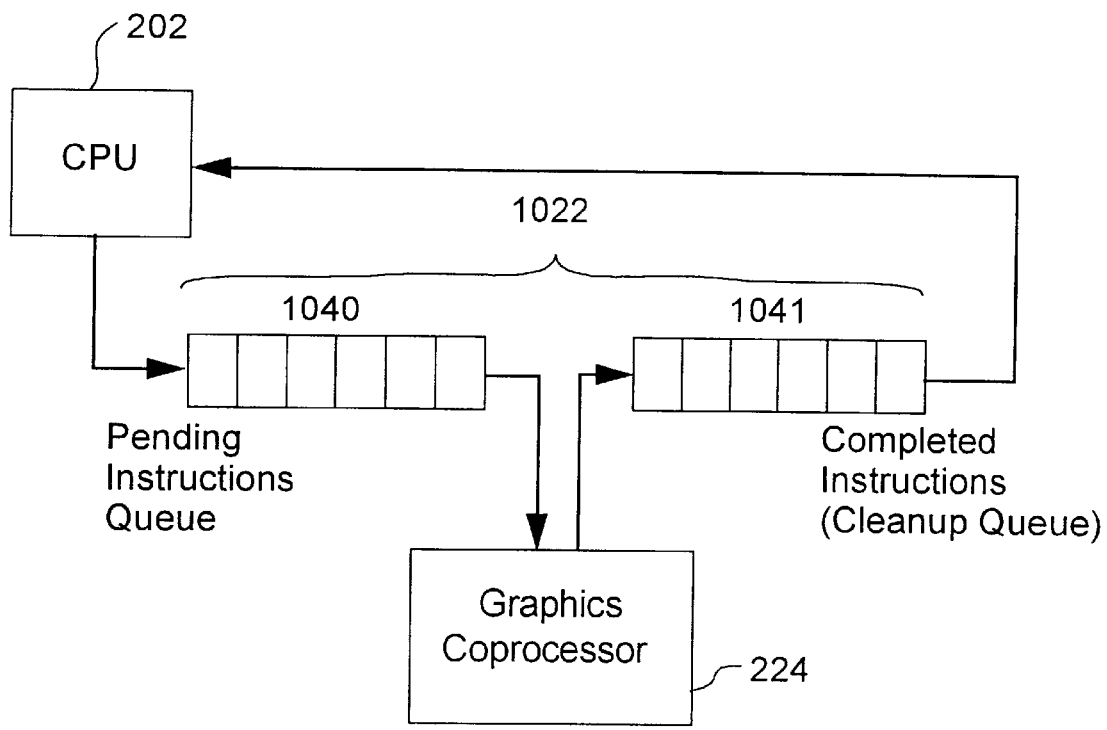
FIG. 6 shows the operation of the graphics co-processor reading instructions for execution from the pending instruction queue and placing them on the completed instruction queue.

FIG. 6 schematically illustrates the implementation of the co-processor instruction queue 1022. Instructions are inserted into a pending instruction queue 1040 by the host CPU 202, and are read by the co-processor 224 for execution. After execution by the co-processor 224, the instructions remain on a cleanup queue 1041, so that the CPU 202 can release the resources that the instructions required after the co-processor 224 has finished executing them.

The instruction queue 1022 itself can be implemented as a fixed or dynamically sized circular buffer. The instruction queue 1022 decouples the generation of instructions by the CPU 202 from their execution by the co-processor 224.

Operand and result memory for each instruction is allocated by the memory manager 1031 (FIG. 5) in response to requests from the instruction generator 1030 during instruction generation. It is the allocation of this memory for newly generated instructions which triggers the interaction between the memory manager 1031 and the queue manager 1032 described below, and allows the system to adapt automatically to the amount of memory available and the complexity of the instructions involved.

The instruction queue manager 1032 is capable of waiting for the co-processor 224 to complete the execution of any given instruction which has been generated by the instruction generator 1030. However, by providing a sufficiently large instruction queue 1022 and sufficient memory 203 for allocation by the memory manager 1031, it becomes possible to avoid having to wait for the co-processor 224 at all, or at least until the very end of the entire instruction sequence, which can be several minutes on a very large job. However, peak memory usage can easily exceed the memory available. and at this point the interaction between the queue manager 1032 and the memory manager 1031 comes into play.

The instruction queue manager 1032 can be instructed at any time to "cleanup" the completed instructions by releasing the memory that was dynamically allocated for them. If the memory manager 1031 detects that available memory is either running low or is exhausted, its first recourse is to instruct the queue manager 1032 to perform such a cleanup in an attempt to release some memory which is no longer in use by the co-processor 224. This can allow the memory manager 1031 to satisfy a request from the instruction generator 1030 for memory required by a newly generated instruction. without the CPU 202 needing to wait for, or synchronize with, the co-processor 224.

If such a request made by the memory manager 1031 for the queue manager 1032 to cleanup completed instructions does not release adequate memory to satisfy the instruction generator's new request, the memory manager 1031 can request that the queue manager 1032 wait for a fraction, say half, of the outstanding instructions on the pending instruction queue 1040 to complete. This will cause the CPU 202 processing to block until some of the co-processor 224 instructions have been completed, at which point their operands can be freed, which can release sufficient memory to satisfy the request. Waiting for only a fraction of the outstanding instructions ensures that the co-processor 224 is kept busy by maintaining at least some instructions in its pending instruction queue 1040. In many cases the cleanup from the fraction of the pending instruction queue 1040 that the CPU 202 waits for, releases sufficient memory for the memory manager 1031 to satisfy the request from the instruction generator 1030.

In the unlikely event that waiting for the co-processor 224 to complete execution of, say, half of the pending instructions does not release sufficient memory to satisfy the request, then the final recourse of the memory manager 1031 is to wait until all pending co-processor instructions have completed. This should release sufficient resources to satisfy the request of the instruction generator 1030, except in the case of extremely large and complex jobs which exceed the system's present memory capacity altogether.

By the above described interaction between the memory manager 1031 and the queue manager 1032, the system effectively tunes itself to maximize throughput for the given amount of memory 203 available to the system. More memory results in less need for synchronization and hence greater throughput. Less memory requires the CPU 202 to wait more often for the co-processor 224 to finish using the scarce memory 203, thereby yielding a system which still functions with minimal memory available, but at a lower performance.

The steps taken by the memory manager 1031 when attempting to satisfy a request from the instruction generator 1030 are summarized below. Each step is tried in sequence, after which the memory manager 1031 checks to see if sufficient memory 203 has been made available to satisfy the request. If so, it stops because the request can be satisfied; otherwize it proceeds to the next step in a more aggressive attempt to satisfy the request:

1. Attempt to satisfy the request with the memory 203 already available.
2. Cleanup all completed instructions.
3. Wait for a fraction of the pending instructions.
4. Wait for all the remaining pending instructions.

Other options can also be used in the attempt to satisfy the request, such as waiting for different fractions (such as one-third or two-thirds) of the pending instructions, or waiting for specific instructions which are known to be using large amounts of memory.

Figure 7:
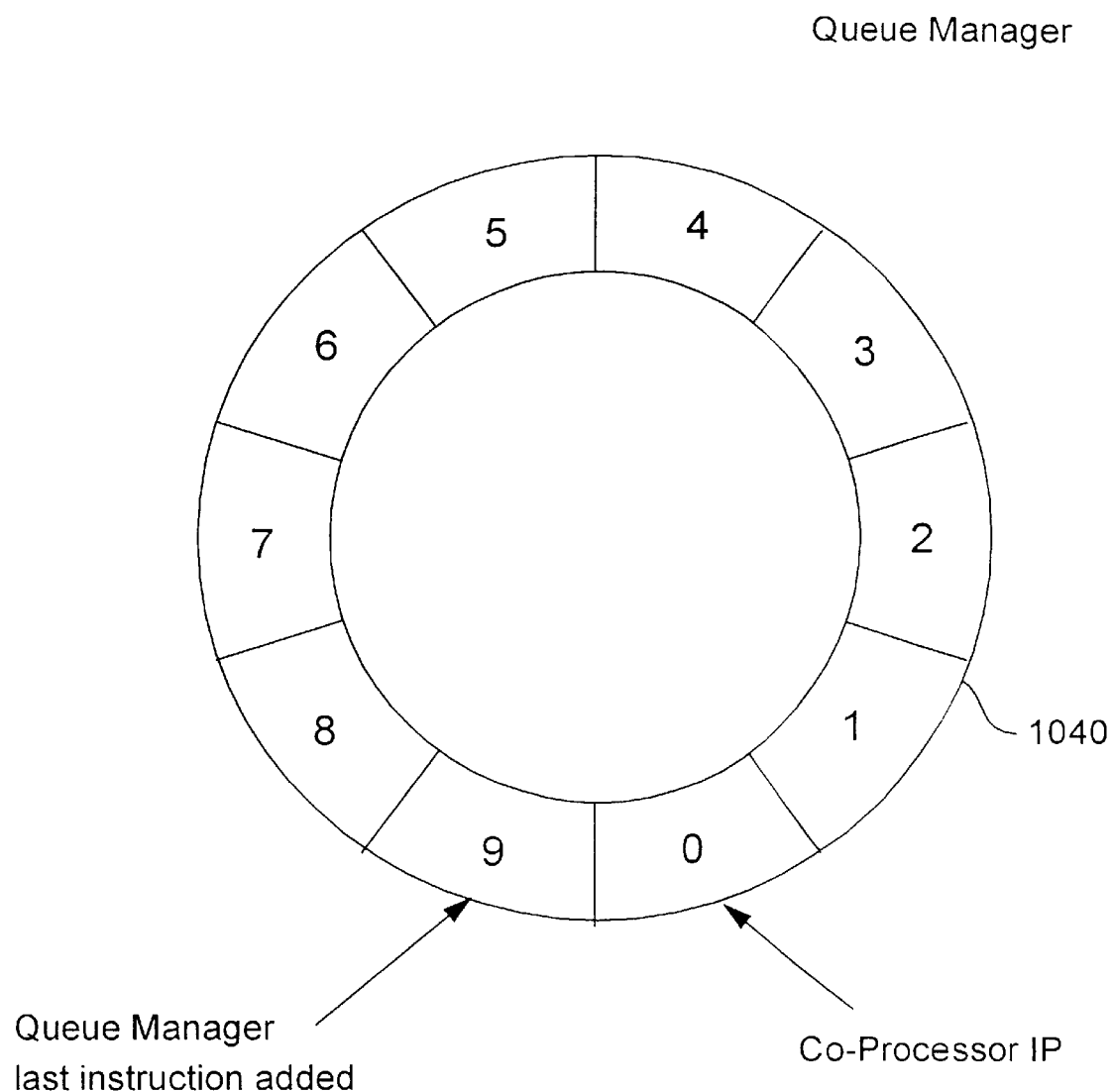
FIG. 7 shows a fixed length circular buffer implementation of the instruction queue, indicating the need to wait when the buffer fills.

Turning now to FIG. 7, in addition to the interaction between the memory manager 1031 and the queue manager 1032, the queue manager 1032 can also initiate a synchronization with the co-processor 224 in the case where space in a fixed-length instruction queue buffer 1050 is exhausted. Such a situation is depicted in FIG. 7. In FIG. 7 the pending instructions queue 1040 is ten instructions in length. The latest instruction to be added to the queue 1040 has the highest occupied number. Thus where space is exhausted the latest instruction is located at position 9. The next instruction to be input to the co-processor 224 is waiting at position zero.

In such a case of exhausted space, the queue manager 1032 will also wait for, say, half the pending instructions to be completed by the co-processor 224. This delay normally allows sufficient space in the instruction queue 1040 to be freed for new instructions to be inserted by the queue manager 1032.

The method used by the queue manager 1032 when scheduling new instructions is as follows:

1. Test to see if sufficient space is available in the instruction queue 1040.
2. If sufficient space is not available, wait for the co-processor to complete some predetermined number or fraction of instructions.
3. Add the new instructions to the queue.

The method used by the queue manager 1032 when asked to wait for a given instruction is as follows:

1. Wait until the co-processor 224 indicates that the instruction is complete.
2. While there are instructions completed which are not yet cleaned up, clean up the next completed instruction in the queue.

The method used by the instruction generator 1030 when issuing new instructions is as follows:

1. Request sufficient memory for the instruction operands 1023 from the memory manger 1031.
2. Generate the instructions to be submitted.
3. Submit the co-processor instructions to the queue manager 1032 for execution.

The following is an example of pseudo code of the above decision making processes.

```
MEMORY MANAGER
   ALLOCATE_MEMORY
   BEGIN
      IF sufficient memory is NOT available to satisfy request
```

-continued

```
        THEN
            Clean up all completed instructions.
        ENDIF
    IF sufficient memory is still NOT available to satisfy request
    THEN
        CALL WAIT_FOR_INSTRUCTION for half the pending
            instructions.
    ENDIF
    IF sufficient memory is still NOT available to satisfy request
    THEN
        RETURN with an error.
    ENDIF
    RETURN the allocated memory
    END
QUEUE MANAGER
    SCHEDULE_INSTRUCTION
    BEGIN
        IF sufficient space is NOT available in the instruction queue
        THEN
            WAIT for the co-processor to complete some predetermined
                number of instructions.
        ENDIF
        Add the new instructions to the queue.
    END
    WAIT_FOR_INSTRUCTION(i)
    BEGIN
        WAIT until the co-processor indicates that instruction i is
            complete.
        WHILE there are instructions completed which are not yet
            cleaned up
        DO
            IF the next completed instruction has a cleanup function
            THEN
                CALL the cleanup function
            ENDIF
            REMOVE the completed instruction from the queue
        DONE
    END
INSTRUCTION GENERATOR
    GENERATE_INSTRUCTIONS
    BEGIN
        CALL ALLOCATE_MEMORY to allocate sufficient memory
            for the instructions operands from the memory manager.
        GENERATE the instructions to be submitted.
        CALL SCHEDULE_INSTRUCTION submit the co-processor
            instructions to the queue manager for execution.
    END
```

3.3 Register Description of Co-processor

As explained above in relation to FIGS. 1 and 3, the co-processor 224 maintains various registers 261 for the execution of each instruction stream.

Referring to each of the modules of FIG. 2, Table 1 sets out the name, type and description of each of the registers utilized by the co-processor 224 while Appendix B sets out the structure of each field of each register.

TABLE 1

| NAME | TYPE | Register Description DESCRIPTION |
|---|---|---|
| | | External Interface Controller Registers |
| eic_cfg | Config2 | Configuration |
| eic_stat | Status | Status |
| eic_err_int | Interrupt | Error and Interrupt Status |
| eic_err_int_en | Config2 | Error and Interrupt Enable |
| eic_test | Config2 | Test modes |
| eic_gen_pob | Config2 | Generic bus programmable output bits |
| eic_high_addr | Config1 | Dual address cycle offset |
| eic_wtlb_v | Control2 | Virtual address and operation bits for TLB Invalidate/Write |
| eic_wtlb_p | Config2 | Physical address and control bits for TLB Write |
| eic_mmu_v | Status | Most recent MMU virtual address translated, and current LRU location. |
| eic_mmu_v | Status | Most recent page table physical address fetched by MMU. |
| eic_ip_addr | Status | Physical address for most recent IBus access to the PCI Bus. |
| eic_rp_addr | Status | Physical address for most recent RBus access to the PCI Bus. |
| eic_ig_addr | Status | Address for most recent IBus access to the Generic Bus. |
| eic_rg_data | Status | Address for most recent RBus access to the Generic Bus. |
| | | Local Memory Controller Registers |
| lmi_cfg | Control2 | General configuration register |
| lmi_sts | Status | General status register |
| lmi_err_int | Interrupt | Error and interrupt status register |
| lmi_err_int_en | Control2 | Error and interrupt enable register |
| lmi_dcfg | Control2 | DRAM configuration register |
| lmi mode | Control2 | SDRAM mode register |
| | | Peripheral Interface Controller Registers |
| pic_cfg | Config2 | Configuration |
| pic_stat | Status | Status |
| pic_err_int | Interrupt | Interrupt/Error Status |
| pic_err_int_en | Config2 | Interrupt/Error Enable |
| pic_abus_cfg | Control2 | Configuration and control for ABus |
| pic_abus_addr | Config1 | Start address for ABus transfer |
| pic_cent_cfg | Control2 | Configuration and control for Centronics |
| pic_cent_dir | Config2 | Centronics pin direct control register |
| pic_reverse_cfg | Control2 | Configuration and control for reverse (input) data transfers |
| pic_timer0 | Config1 | Initial data timer value |
| pic_timer1 | Config1 | Subsequent data timer value |
| | | Miscellaneous Module Registers |
| mm_cfg | Config2 | Configuration Register |
| mm_stat | Status | Status Register |
| mm_err_int | Interrupt | Error and Interrupt Register |
| mm_err_int_en | Config2 | Error and Interrupt Masks |
| mm_gefg | Config2 | Global Configuration Register |
| mm_diag | Config | Diagnostic Configuration Register |
| mm_grst | Config | Global Reset Register |
| mm_gerr | Config2 | Global Error Register |
| mm_gexp | Config2 | Global Exception Register |
| mm_gint | Config2 | Global Interrupt Register |
| mm_active | Status | Global Active signals |
| | | Instruction Controller Registers |
| ic_cfg | Config2 | Configuration Register |
| ic_stat | Status/ Interrupt | Status Register |
| ic_err_int | Interrupt | Error and Interrupt Register (write to clear error and interrupt) |
| ic_err_int_en | Config2 | Error and Interrupt Enable Register |
| ic_ipa | Control1 | A stream Instruction Pointer |
| ic_tda | Config1 | A stream Todo Register |
| ic_fna | Control1 | A stream Finished Register |
| ic_inta | Config1 | A stream Interrupt Register |
| ic_loa | Status | A stream Last Overlapped Instruction Sequence number |
| ic_ipb | Control1 | B stream Instruction Pointer |
| ic_tdb | Config1 | B stream Todo Register |
| ic_fnb | Control1 | B stream Finished Register |
| ic_intb | Config1 | B stream Interrupt Register |
| ic_lob | Status | B stream Last Overlapped Instruction Sequence number |
| ic_sema | Status | A stream Semaphore |
| ic_semb | Status | B stream Semaphore |
| | | Data Cache Controller Registers |
| dcc_cfg1 | Config2 | DCC configuration 1 register |
| dcc_stat | Status | state machine status bits |
| dcc_err_int | Status | DCC error status register |
| dcc_err_int_en | Control1 | DCC error interrupt enable bits |
| dcc_cfg2 | Control2 | DCC configuration 2 register |

TABLE 1-continued

| NAME | TYPE | Register Description DESCRIPTION |
|---|---|---|
| dcc_addr | Config1 | Base address register for special address modes. |
| dcc_lv0 | Control1 | "valid" bit status for lines 0 to 31 |
| dcc_lv1 | Control1 | "valid" bit status for lines 32 to 63 |
| dcc_lv2 | Control1 | "valid" bit status for lines 64 to 95 |
| dcc_lv3 | Control1 | "valid" bit status for lines 96 to 127 |
| dcc_raddrb | Status | Operand Organizer B request address |
| dcc_raddrc | Status | Operand Organizer C request address |
| dcc_test | Control1 | DCC test register |
| *Pixel Organizer Registers* | | |
| po_cfg | Config2 | Configuration Register |
| po_stat | Status | Status Register |
| po_err_int | Interrupt | Error/Interrupt Status Register |
| po_err_int_en | Config2 | Error/Interrupt Enable Register |
| po_dmr | Config2 | Data Manipulation Register |
| po_subst | Config2 | Substitution Value Register |
| po_cdp | Status | Current Data Pointer |
| po_len | Control1 | Length Register |
| po_said | Control1 | Start Address or Immediate Data |
| po_idr | Control2 | Image Dimensions Register |
| po_muv_valid | Control2 | MUV valid bits |
| po_muv | Config1 | Base address of MUV RAM |
| *Operand Organizer B Registers* | | |
| oob_cfg | Config2 | Configuration Register |
| oob_stat | Status | Status Register |
| oob_err_int | Interrupt | Error/Interrupt Register |
| oob_err_int_en | Config2 | Error/Interrupt Enable Register |
| oob_dmr | Config2 | Data Manipulation Register |
| oob_subst | Config2 | Substitution Value Register |
| oob_cdp | Status | Current Data Pointer |
| oob_len | Control1 | Input Length Register |
| oob_said | Control1 | Operand Start Address |
| oob_tile | Control1 | Tiling length/offset Register |
| *Operand Organizer C Registers* | | |
| ooc_cfg | Config2 | Configuration Register |
| ooc_stat | Status | Status Register |
| ooc_err_int | Interrupt | Error/Interrupt Register |
| ooc_err_int en | Config2 | Error/Interrupt Enable Register |
| ooc_dmr | Config2 | Data Manipulation Register |
| ooc_subst | Config2 | Substitution Value Register |
| ooc_cdp | Status | Current Data Pointer |
| ooc_len | Control1 | Input Length Register |
| ooc_said | Control1 | Operand Start Address |
| ooc_tile | Control1 | Tiling length/offset Register |
| *JPEG Coder Register* | | |
| jc_cfg | Config2 | configuration |
| jc_stat | Status | status |
| jc_err_int | Interrupt | error and interrupt status register |
| jc_err_int_en | Config2 | error and interrupt enable register |
| jc_rsi | Config1 | restart interval |
| jc_decode | Control2 | decode of current instruction |
| jc_res | Control1 | residual value |
| jc_table_sel | Control2 | table selection from decoded instruction |
| *Main Data Path Register* | | |
| mdp_cfg | Config2 | configuration |
| mdp_stat | Status | status |
| mdp_err_int | Interrupt | error/interrupt |
| mdp_err_int_en | Config2 | error/interrupt enable |
| mdp_test | Config2 | test modes |
| mdp_op1 | Control2 | current operation 1 |
| mdp_op2 | Control2 | current operation 2 |
| mdp_por | Control1 | offset for plus operator |
| mdp_bi | Control1 | blend start/offset to index table entry |
| mdp_bm | Control1 | blend end or number of rows and columns in matrix, binary places, and number of levels in halftoning |
| mdp_len | Control1 | Length of blend to produce |
| *Result Organizer Register* | | |
| ro_cfg | Config2 | Configuration Register |
| ro_stat | Status | Status Register |
| ro_err_int | Interrupt | Error/Interrupt Register |
| ro_err_int_en | Config2 | Error/Interrupt Enable Register |
| ro_dmr | Config2 | Data Manipulation Register |
| ro_subst | Config1 | Substitution Value Register |
| ro_cdp | Status | Current Data Pointer |
| ro_len | Status | Output Length Register |
| ro_sa | Config1 | Start Address |
| ro_idr | Config1 | Image Dimensions Register |
| ro_vbase | Config1 | co-processor Virtual Base Address |
| ro_cut | Config1 | Output Cut Register |
| ro_lmt | Config1 | Output Length Limit |
| *PCIBus Configuration Space alias* | | |
| pci_external_cfg | Status | A read only copy of PCI configuration space registers 0x0 to 0xD and 0xF. 32-bit field downloaded at reset from an external serial ROM. Has no influence on coprocessor operation. |
| *Input Interface Switch Registers* | | |
| iis_cfg | Config2 | Configuration Register |
| iis_stat | Status | Status Register |
| iis_err_int | Interrupt | Interrupt/Error Status Register |
| iis_err_int_en | Config2 | Interrupt/Error Enable Register |
| iis_ic_addr | Status | Input address from IC |
| iis_doc_addr | Status | Input address from DCC |
| iis_po_addr | Status | Input address from PO |
| iis_burst | Status | Burst Length from PO, DCC & IC |
| iis_base_addr | Config1 | Base address of co-processor memory object in host memory map. |
| iis_test | Config1 | Test mode register |

The more notable ones of these registers include:

(a) Instruction Pointer Registers (ic_ipa and ic_ipb). This pair of registers each contains the virtual address of the currently executing instruction. Instructions are fetched from ascending virtual addresses and executed. Jump instruction can be used to transfer control across non-contiguous virtual addresses. Associated with each instruction is a 32 bit sequence number which increments by one per instruction. The sequence numbers are used by both the co-processor 224 and by the host CPU 202 to synchronize instruction generation and execution.

(b) Finished Registers (ic_fna and ic_fnb). This pair of registers each contains a sequence number counting completed instructions.

(c) Todo Register (ic_tda and ic_tdb). This pair of registers each contains a sequence number counting queued instructions.

(d) Interrupt Register (ic_inta and ic_intb). This pair of registers each contains a sequence number at which to interrupt.

(e) Interrupt Status Registers (ic_stat.a_primed and ic_stat.b_primed). This pair of registers each contains a primed bit which is a flag enabling the interrupt following a match of the Interrupt and Finished Registers. This bit appears alongside other interrupt enable bits and other status/configuration information in the Interrupt Status (ic_stat) register.

(f) Register Access Semaphores (ic_sema and ic_semb). The host CPU 202 must obtain this semaphore before attempting register accesses to the co-processor 224 that requires atomicity, ie. more than one register write. Any register accesses not requiring atomicity can be performed at any time. A side effect of the host CPU 202 obtaining this semaphore is that co-processor execution pauses once the currently executing instruction has completed. The Register Access Semaphore is implemented as one bit of the configuration/status register of the co-processor 224. These registers are stored in the Instruction Controllers own register area. As noted previously, each sub-module of the co-processor has its own set of configuration and status registers. These registers are set in the course of regular instruction execution. All of these registers appear in the register map and many are modified implicitly as part of instruction execution. These are all visible to the host via the register map.

3.4 Format of Plural Streams

As noted previously, the co-processor 224, in order to maximize the utilization of its resources and to provide for rapid output on any external peripheral device, executes one of two independent instruction streams. Typically, one instruction stream is associated with a current output page required by an output device in a timely manner, while the second instruction stream utilizes the modules of the co-processor 224 when the other instruction stream is dormant. Clearly, the overriding imperatives are to provide the required output data in a timely manner whilst simultaneously attempting to maximize the use of resources for the preparation of subsequent pages, bands, etc. The co-processor 224 is therefore designed to execute two completely independent but identically implemented instruction streams (hereafter termed A and B). The instructions are preferably generated by software running on the host CPU 202 (FIG. 1) and forwarded to the raster image acceleration card 220 for execution by the co-processor 224. One of the instruction streams (stream A) operates at a higher priority than the other instruction stream (stream B) during normal operation. The stream or queue of instructions is written into a buffer or list of buffers within the host RAM 203 (FIG. 1) by the host CPU 202. The buffers are allocated at start-up time and locked into the physical memory of the host 203 for the duration of the application. Each instruction is preferably stored in the virtual memory environment of the host RAM 203 and the raster image co-processor 224 utilizes a virtual to physical address translation scheme to determine a corresponding physical address with the in-host RAM 203 for the location of a next instruction. These instructions may alternatively be stored in the co-processors 224 local memory.

Figure 8:
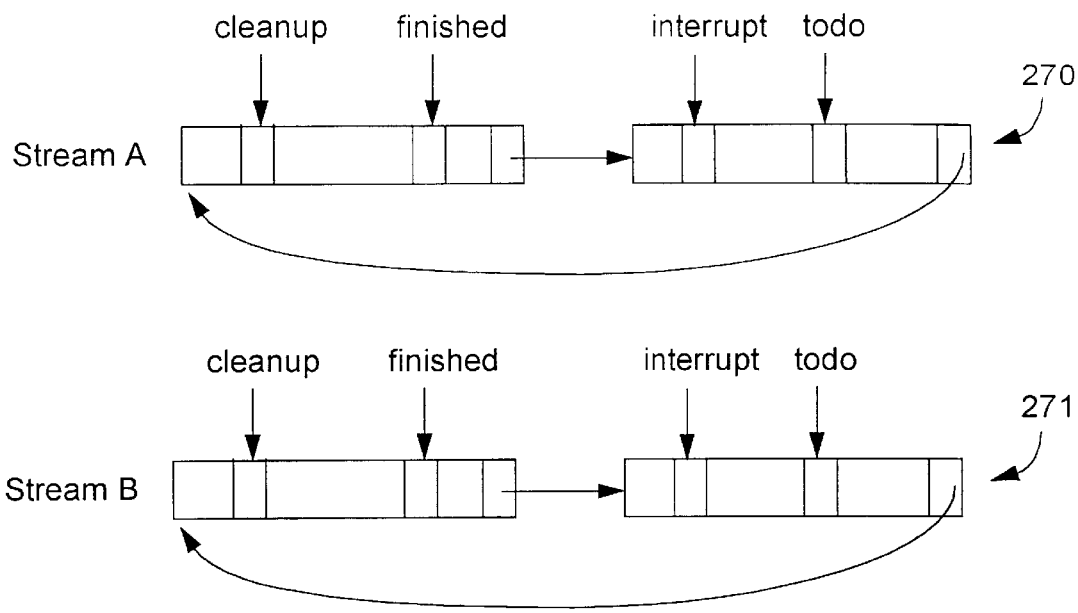
FIG. 8 illustrates to instruction execution streams as utilized by the co-processor.

Turning now to FIG. 8, there is illustrated the format of two instruction streams A and B 270, 271 which are stored within the host RAM 203. The format of each of the streams A and B is substantially identical.

Briefly, the execution model for the co-processor 224 consists of:

Two virtual streams of instructions, the A stream and the B stream.

In general only one instruction is executed at a time.

Either stream can have priority, or priority can be by way of "round robin".

Either stream can be "locked" in. ie. guaranteed to be executed regardless of stream priorities or availability of instructions on the other stream.

Either stream can be empty.

Either stream can be disabled.

Either stream can contain instructions that can be "overlapped", ie. execution of the instruction can be overlapped with that of the following instruction if the following instruction is not also "overlapped".

Each instruction has a "unique" 32 bit incrementing sequence number.

Each instruction can be coded to cause an interrupt, and/or a pause in instruction execution.

Instructions can be speculatively prefetched to minimize the impact of external interface latency.

The instruction controller 235 is responsible for implementing the co-processor's instruction execution model maintaining overall executive control of the co-processor 224 and fetching instructions from the host RAM 203 when required. On a per instruction basis, the instruction controller 235 carries out the instruction decoding and configures the various registers within the modules via CBus 231 to force the corresponding modules to carry-out that instruction.

Figure 9:
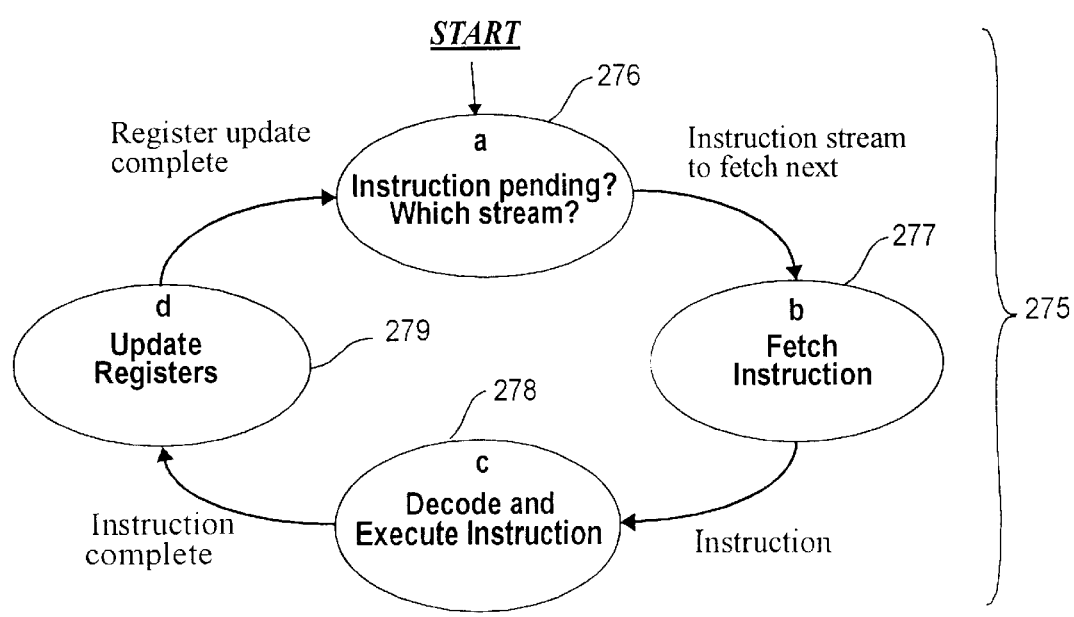
FIG. 9 illustrates an instruction execution flow chart.

Turning now to FIG. 9, there is illustrated a simplified form of the instruction execution cycle carried out by the instructions controller 235. The instruction execution cycle consists of four main stages 276–279. The first stage 276 is to determine if an instruction is pending on any instruction stream. If this is the case, an instruction is fetched 277, decoded and executed 278 by means of updating registers 279.

3.5 Determine Current Active Stream

In implementing the first stage 276, there are two steps which must be taken:

1. Determine whether an instruction is pending; and
2. Decide which stream of instructions should be fetched next.

In determining whether instructions are pending the following possible conditions must be examined:

1. whether the instruction controller is enabled;
2. whether the instruction controller is paused due to an internal error or interrupt;
3. whether there is any external error condition pending;
4. whether either of the A or B streams are locked;
5. whether either stream sequence numbering is enabled; and
6. whether either stream contains a pending instruction.

The following pseudo code describes the algorithm for determining whether an instruction is pending in accordance with the above rules. This algorithm can be hardware implemented via a state transition machine within the instruction controller 235 in known manner:

```
if not error and enabled and not bypassed and not self test mode
    if A stream locked and not paused
            if A stream enabled and (A stream
sequencing disabled or instruction on A stream)
                    instruction pending
                else
                    no instruction pending
            end if
    else
        if B stream locked and not paused
                if B stream enabled and (B stream
sequencing disabled or instruction on B stream)
                    instruction pending
                else
                    no instruction pending
                end if
        else      /* no stream is locked */
                if (A stream enabled and not paused and (A
stream sequencing disabled or instruction on A stream))
                    or (B stream enabled and not paused and
(B stream sequencing disabled or instruction on B stream))
                    instruction pending
                else
                    no instruction pending
                end if
        end if
    else        /* interface controller not enabled */
        no instruction pending
    end if
```

If no instruction is found pending, then the instruction controller 235 will "spin" or idle until a pending instruction is found.

To determine which stream is "active", and which stream is executed next, the following possible conditions are examined:

1. whether either stream is locked;
2. what priority is given to the A and B streams and what the last instruction stream was;
3. whether either stream is enabled; and
4. whether either stream contains a pending instruction.

The following pseudo code implemented by the instruction controller describes how to determine the next active instruction stream:

```
if A stream locked
    next stream is A
else if B stream locked
    next stream is B
else       /* no stream is locked */
    if (A stream enabled and (A stream sequencing disabled or
instruction on A stream)) and not (B stream enabled and (B
stream sequencing disabled or instruction on B stream))
        next stream is A
    else if (B stream enabled and (B stream sequencing disabled or
instruction on B stream)) and not (A stream enabled and (A stream
sequencing disabled or instruction on A stream))
        next stream is B
    else   /* both stream have instruction */
        if pri = 0 /* A high, B low */
            next stream is A
        else if pri = 1 /* A low, B high */
            next stream is B
        else if pri = 2 or 3 /* round robin */
            if last stream is A
                next stream is B
            else
                next stream is A
            end if
        end if
    end if
end if
```

As the conditions can be constantly changing, all conditions must be determined together atomically.

3.6 Fetch Instruction of Current Active Stream

After the next active instruction stream is determined, the Instruction Controller 235 fetches the instruction using the address in the corresponding instruction pointer register (ic_ipa or ic_ipb). However, the Instruction Controller 235 does not fetch an instruction if a valid instruction already exists in a prefetch buffer stored within the instruction controller 235.

A valid instruction is in the prefetch buffer if:

1. the prefetch buffer is valid; and
2. the instruction in the prefetch buffer is from the same stream as the currently active stream.

The validity of the contents of the prefetch buffer is indicated by a prefetch bit in the ic_stat register, which is set on a successful instruction prefetch. Any external write to any of the registers of the instruction controller 235 causes the contents of the prefetch buffer to be invalidated.

3.7 Decode and Execute Instruction

Once an instruction has been fetched and accepted the instruction controller 235 decodes it and configures the registers 229 of the co-processor 224 to execute the instruction.

The instruction format utilized by the raster image co-processor 224 differs from traditional processor instruction sets in that the instruction generation must be carried out instruction by instruction by the host CPU 202 and as such is a direct overhead for the host. Further, the instructions should be as small as possible as they must be stored in host RAM 203 and transferred over the PCI bus 206 of FIG. 1 to the co-processor 224. Preferably, the co-processor 224 can be set up for operation with only one instruction. As much flexibility as possible should be maintained by the instruction set to maximize the scope of any future changes. Further, preferably any instruction executed by the co-processor 224 applies to a long stream of operand data to thereby achieve best performance. The co-processor 224 employs an instruction decoding philosophy designed to facilitate simple and fast decoding for "typical instructions" yet still enable the host system to apply a finer control over the operation of the co-processor 224 for "atypical" operations.

Figure 10:
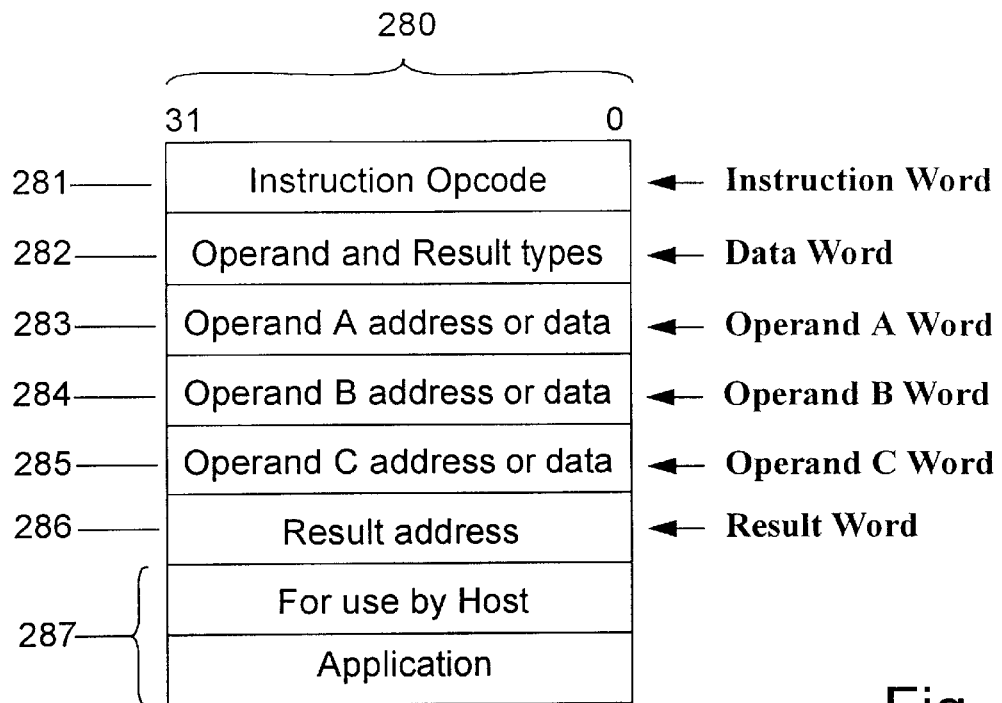
FIG. 10 illustrates the standard instruction word format utilized by the co-processor.

Turning now to FIG. 10, there is illustrated the format of a single instruction 280 which comprises eight words each of 32 bits. Each instruction includes an instruction word or opcode 281, and an operand or result type data word 282 setting out the format of the operands. The addresses 283–285 of three operands A, B and C are also provided, in addition to a result address 286. Further, an area 287 is provided for use by the host CPU 202 for storing information relevant to the instruction.

Figure 11:
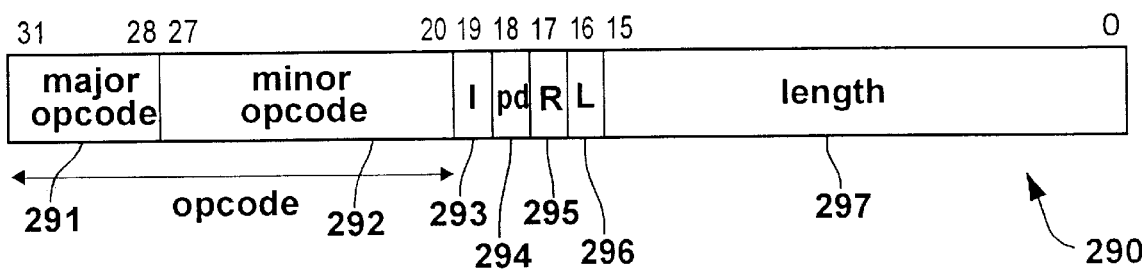
FIG. 11 illustrates the instruction word fields of a standard instruction.

The structure 290 of an instruction opcode 281 of an instruction is illustrated in FIG. 11. The instruction opcode is 32 bits long and includes a major opcode 291, a minor opcode 292, an interrupt (I) bit 293, a partial decode (Pd) bit 294, a register length (R) bit 295, a lock (L) bit 296 and a length 297. A description of the fields in the instruction word 290 is as provided by the following table.

TABLE 2

| Field | Opcode Description |
|---|---|
|  | Description |
| major opcode [3 . . . 0] | Instruction category |
|  | 0: Reserved |
|  | 1: General Colour Space Conversion |
|  | 2: JPEG Compression and Decompression |
|  | 3: Matrix Multiplication |
|  | 4: Image Convolutions |
|  | 5: Image Transformations |
|  | 6: Data Coding |
|  | 7: Halftone |
|  | 8: Hierarchial image decompression |
|  | 9: Memory Copy |
|  | 10: Internal Register and Memory Access |
|  | 11: Instruction Flow Control |
|  | 12: Compositing |
|  | 13: Compositing |
|  | 14: Reserved |
|  | 15: Reserved |
| minor opcode [7 . . . 0] | Instruction detail. The coding of this field is dependent on the major opcode. |
| I | 1 = Interrupt and pause when completed, |
|  | 0 = Don't interrupt and pause when completed |
| pd | Partial Decode |
|  | 1 = use the "partial decode" mechanism. |
|  | 0 = Don't use the "partial decode" mechanism |
| R | 1 = length of instruction is specified by the Pixel Organizer's input length register (po_len) |
|  | 0 = length of instruction is specified by the opcode length field. |
| L | 1 = this instruction stream (A or B) is "locked" for the next instruction. |
|  | 0 = this instruction stream (A or B) is not "locked" in for the next instruction. |
| length [15 . . . 0] | number of data items to read or generate |

By way of discussion of the various fields of an opcode, by setting the I-bit field 293, the instruction can be coded such that instruction execution sets an interrupt and pause on completion of that instruction. This interrupt is called an "instruction completed interrupt". The partial decode bit 294 provides for a partial decode mechanism such that when the bit is set and also enabled in the ic_cfg register, the various modules can be micro coded prior to the execution of the instruction in a manner which will be explained in more detail hereinafter. The lock bit 296 can be utilized for operations which require more than one instruction to set up. This can involve setting various registers prior to an instruction and provides the ability to "lock" in the current instruction stream for the next instruction. When the L-bit 296 is set, once an instruction is completed, the next instruction is fetched from the same stream. The length field 297 has a natural definition for each instruction and is defined in terms of the number of "input data items" or the number of "output data items" as required. The length field 297 is only 16 bits long. For instructions operating on a stream of input data items greater than 64,000 items the R-bit 295 can be set, in which case the input length is taken from a po_len register within the pixel organizer 246 of FIG. 2. This register is set immediately before such an instruction.

Returning to FIG. 10, the number of operands 283–286 required for a given instruction varies somewhat depending on the type of instruction utilized. The following table sets out the number of operands and length definition for each instruction type:

TABLE 3

Operand Types

| Instruction Class | Length defined by | | # of operands |
|---|---|---|---|
| Compositing | input | pixels | 3 |
| General Color Space Conversion | input | pixels | 2 |
| JPEG decompression/compression | input | bytes | 2 |
| other decompression/compression | input | bytes | 2 |
| Image Transformations and Convolutions | output | bytes | 2 |
| Matrix Multiplication | input | pixels | 2 |
| Halftoning | input | pixels, bytes | 2 |
| Memory Copying | input | pixels, bytes | 1 |
| Hierarchial Image Decompression | input | pixels, bytes | 1 or 2 |
| Flow Control | fixed | fixed | 2 |
| Internal Access Instructions | fixed | fixed | 4 |

Turning now to FIG. 12, there is illustrated, firstly, the data word format 300 of the data word or operand descriptor 282 of FIG. 10 for three operand instructions and, secondly, the data word format 301 for two operand instructions. The details of the encoding of the operand descriptors are provided in the following table:

TABLE 4

Operand Descriptors

| Field | Description |
|---|---|
| what | 0 = instruction specific mode:<br>This indicates that the remaining fields of the descriptor will be interpreted in line with the major opcode. Instruction specific modes supported are:<br>major opcode = 0–11: Reserved<br>major opcode = 12–13: (Compositing): Implies that Operand C is a bitmap attenuation. The occ_dmr register will be set appropriately, with the cc = 1 and normalize = 0 major opcode = 14–15: Reserved<br>1 = sequential addressing<br>2 = tile addressing<br>3 = constant data |
| L | 0 = not long: immediate data<br>1 = long: pointer to data |

TABLE 4-continued

Operand Descriptors

| Field | Description |
|---|---|
| if | internal format:<br>0 = pixels<br>1 = unpacked bytes<br>2 = packed bytes<br>3 = other |
| S | 0 = set up Data Manipulation Register as appropriate for this operand<br>1 = use the Data Manipulation Register as is |
| C | 0 = not cacheable<br>1 = cacheable<br>Note: In general a performance gain will be achieved if an operand is specified as cacheable. Even operands displaying low levels of referencing locality (such as sequential data) still benefit from being cached - as it allows data to be burst transferred to the host processor and is more efficient. |
| P | external format:<br>0 = unpacked bytes<br>1 = packed stream |
| bo[2:0] | bit offset. Specifies the offset within a byte of the start of bitwize data. |
| R | 0 = Operand C does not describe a register to set.<br>1 = Operand C describes a register to set.<br>This bit is only relevant for instructions with less than three operands. |

With reference to the above table, it should be noted that, firstly, in respect of the constant data addressing mode, the co-processor 224 is set up to fetch, or otherwize calculate, one internal data item, and use this item for the length of the instruction for that operand. In the tile addressing mode, the co-processor 224 is set up to cycle through a small set of data producing a "tiling effect". When the L-bit of an operand descriptor is zero then the data is immediate, ie. the data items appear literally in the operand word.

Returning again to FIG. 10, each of the operand and result words 283–286 contains either the value of the operand itself or a 32-bit virtual address to the start of the operand or result where data is to be found or stored.

The instruction controller 235 of FIG. 2 proceeds to decode the instruction in two stages. It first checks to see whether the major opcode of the instruction is valid, raising an error if the major opcode 291 (FIG. 11) is invalid. Next, the instruction is executed by the instruction controller 235 by means of setting the various registers via CBus 231 to reflect the operation specified by the instruction. Some instructions can require no registers to be set.

The registers for each module can be classified into types based on their behavior. Firstly, there is the status register type which is "read only" by other modules and "read/write" by the module including the register. Next, a first type of configuration register, hereinafter called "config1", is "read/write" externally by the modules and "read only" by the module including the resister. These registers are normally used for holding larger type configuration information, such as address values. A second type of configuration register, herein known as "config2", is readable and writable by any module but is read only by the module including the register. This type of register is utilized where bit by bit addressing of the register is required.

A number of control type registers are provided. A first type, hereinafter known as "control1" registers, is readable and writable by all modules (including the module which includes the register). The control1 registers are utilized for holdine large control information such as address values. Analogously, there is further provided a second type of control register, hereinafter known as "control2", which can be set on a bit by bit basis.

A final type of register known as an interrupt register has bits within the resister which are settable to 1 by the module including the register and resettable to zero externally by writing a "1" to the bit that has been set. This type of register is utilized for dealing with the interrupts/errors flagged by each of the modules.

Each of the modules of the co-processor 224 sets a c_active line on the CBus 231 when it is busy executing an instruction. The instruction controller 235 can then determine when instructions have been completed by "OR-ing" the c_active lines coming from each of the modules over the CBus 231. The local memory controller module 236 and the peripheral interface controller module 237 are able to execute overlapped instructions and include a c_background line which is activated when they are executing an overlapped instruction. The overlapped instructions are "local DMA" instructions transferring data between the local memory interface and the peripheral interface.

The execution cycle for an overlapped local DMA instruction is slightly different from the execution cycle of other instructions. If an overlapped instruction is encountered for execution, the instruction controller 235 checks whether there is already an overlapped instruction executing. If there is, or overlapping is disabled, the instruction controller 235 waits for that instruction to finish before proceeding with execution of that instruction. If there is not, and overlapping is enabled, the instruction controller 235 immediately decodes the overlapped instruction and configures the peripheral interface controller 237 and local memory controller 236 to carry out the instruction. After the register configuration is completed, the instruction controller 235 then goes on to update its registers (including finished register, status register, instruction pointer, etc.) without waiting for the instruction to "complete" in the conventional sense. At this moment, if the finished sequence number equals the interrupt sequence number, 'the overlapped instruction completed' interrupt is primed rather than raising the interrupt immediately. The 'overlapped instruction completed' interrupt is raised when the overlapped instruction has fully completed.

Once the instruction has been decoded, the instruction controller attempts to prefetch the next instruction while the current instruction is executing. Most instructions take considerably longer to execute than they will to fetch and decode. The instruction controller 235 prefetches an instruction if all of the following conditions are met:

1. the currently executing instruction is not set to interrupt and pause;
2. the currently executing instruction is not a jump instruction;
3. the next instruction stream is prefetch-enabled; and
4. there is another instruction pending.

If the instruction controller 235 determines that prefetching is possible it requests the next instruction. places it in a prefetch buffer and then validates the buffer. At this point there is nothing more for the instruction controller 235 to do until the currently executing instruction has completed. The instruction controller 235 determines the completion of an instruction bt examining the c_active and c_background lines associated with the CBus 231.

3.8 Update Registers of Instruction Controller

Upon completion of an instruction, the instruction controller 235 updates its registers to reflect the new state. This must be done atomically to avoid problems with synchronising with possible external accesses. This atomic update process involves:

1. Obtaining the appropriate Register Access Semaphore. If the semaphore is taken by an agent external to the Instruction Controller 235, the instruction execution cycle waits at this point for the semaphore to be released before proceeding.
2. Updating the appropriate registers. The instruction pointer (ic_ipa or ic_ipb) is incremented by the size of an instruction, unless the instruction was a successful jump, in which case the target value of the jump is loaded into the instruction pointer.

The finished register (ic_fna or ic_fnb), is then incremented if sequence numbering is enabled.

The status register (ic_stat) is also updated appropriately to reflect the new state. This includes setting the pause bits if necessary. The Instruction Controller 235 pauses if an interrupt has occurred and pausing is enabled for that interrupt or if any error has occurred. Pausing is implemented by setting the instruction stream pause bits in the status register (a_pause or b_pause bits in ic_stat). To resume instruction execution, these bits should be reset to 0.

3. Asserting a c_end signal on the CBus 231 for one clock cycle, which indicates to other modules in the co-processor 224 that an instruction has been completed.
4. Raising an interrupt if required. An interrupt is raised if:
   a. "Sequence number completed" interrupt occurs. That is, if the finished register (ic_fna or ic_fnb) sequence number is the same as interrupt sequence number. Then this interrupt is primed, sequence numbering is enabled, and the interrupt occurs; or
   b. the just completed instruction was coded to interrupt on completion, then this mechanism is enabled.

3.9 Semantics of the Register Access Semaphore

The Register Access Semaphore is a mechanism that provides atomic accesses to multiple instruction controller registers. The registers that can require atomic access are as follows:

1. Instruction pointer register (ic_ipa and ic_ipb)
2. To do registers (ic_tda and ic_tdb)
3. Finished registers (ic_fna and ic_fnb)
4. Interrupt registers (ic_inta and ic_intb)
5. The pause bits in the configuration register (ic_cfg)

External agents can read all registers safely at any time. External agents are able to write any registers at any time, however to ensure that the Instruction Controller 235 does not update values in these registers, the external agent must first obtain the Register Access Semaphore. The Instruction Controller does not attempt to update any values in the above mentioned registers if the Register Access Semaphore is claimed externally. The instruction controller 235 updates all of the above mentioned registers in one clock cycle to ensure atomicity.

As mentioned above, unless the mechanism is disabled, each instruction has associated with it a 32 bit "sequence number". Instruction sequence numbers increment wrapping through from 0xFFFFFFFF to 0x00000000.

When an external write is made into one of the Interrupt Registers (ic_inta or ic_intb), the instruction controller 235 immediately makes the following comparisons and updates:

1. If the interrupt sequence number (ie. the value in the Interrupt Register) is "greater" (in a modulo sense) than the finished sequence number (ie. the value in the Finished Register) of the same stream, the instruction controller primes the "sequence number completed" interrupt mechanism by setting the "sequence number completed" primed bit (a_primed or b_primed bit in ic_stat) in the status register.
2. If the interrupt sequence number is not "greater" than the finished sequence number, but there is an overlapped instruction in progress in that stream and the interrupt sequence number equals the last overlapped instruction sequence number (ie. the value in the ic_loa or ic_lob register), then the instruction controller primes the "overlapped instruction sequence number completed" interrupt mechanism by setting the a_ol_primed or b_ol_primed bits in the ic_stat register.

3. If the interrupt sequence number is not "greater" than the finished sequence number, and there is an overlapped instruction in progress in that stream, but the interrupt sequence number does not equal the last overlapped instruction sequence number, then the interrupt sequence number represents a finished instruction, and no interrupt mechanism is primed.

4. If the interrupt sequence number is not "greater" than the finished sequence number, and there is no overlapped instruction in progress in that stream, then the interrupt sequence number must represent a finished instruction, and no interrupt mechanism is primed.

External agents can set any of the interrupt primed bits (bits a_primed, a_ol primed, b_primed or b_ol_primed) in the status register to activate or de-activate this interrupt mechanism independently.

3.10 Instruction Controller

Figure 13:
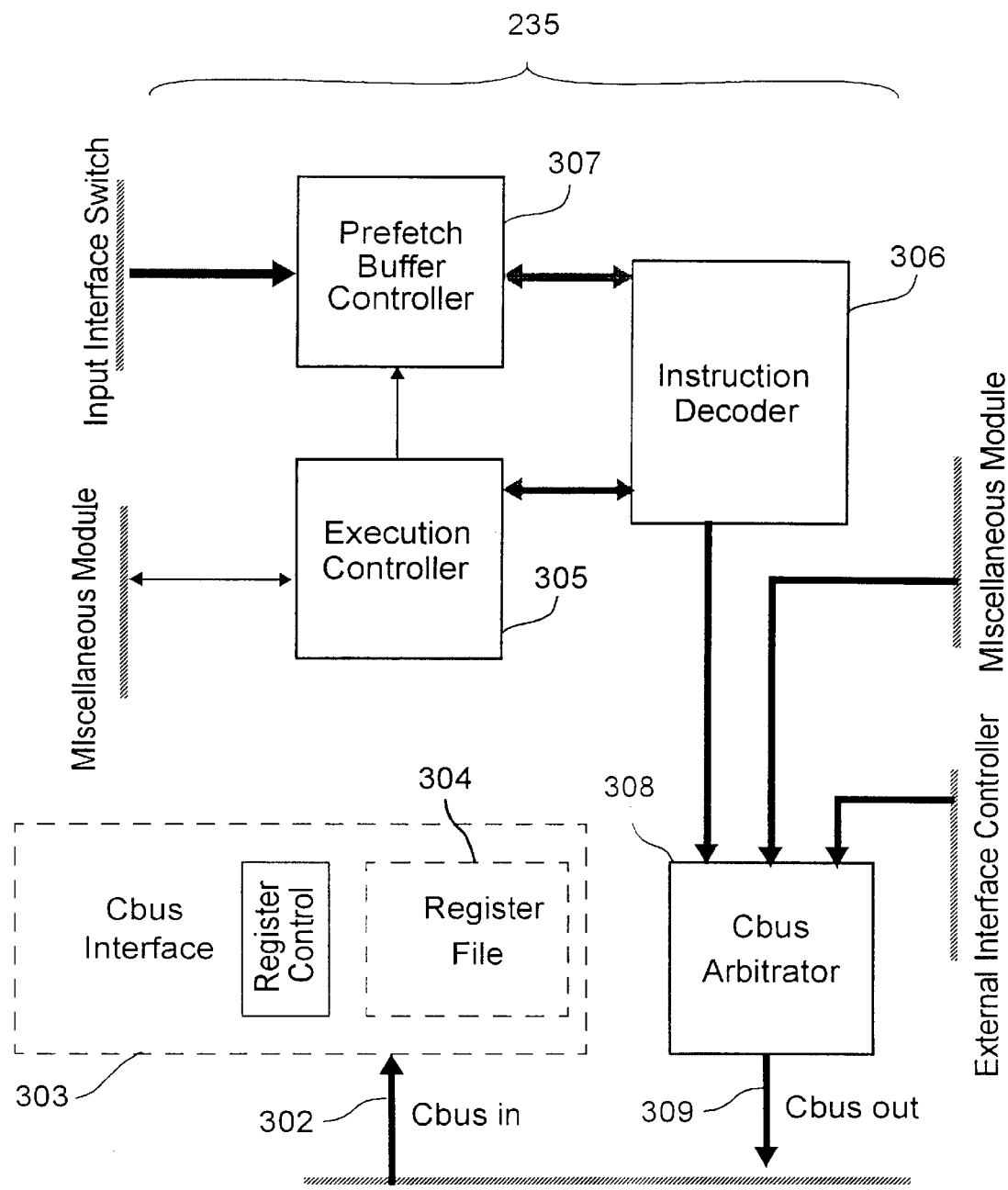
FIG. 13 illustrates schematically the instruction controller of FIG. 2.

Turning now to FIG. 13, there is illustrated the instruction controller 235 in more detail. The instruction controller 235 includes an execution controller 305 which implements the instruction execution cycle as well as maintaining overall executive control of the co-processor 224. The functions of the execution controller 305 include maintaining overall executive control of the instruction controller 235, determining instructing sequencing, instigating instruction fetching and prefetching, initiating instructing decoding and updating the instruction controller registers. The instruction controller further includes an instruction decoder 306. The instruction decoder 306 accepts instructions from a prefetch buffer controller 307 and decodes them according the aforementioned description. The instruction decoder 306 is responsible for configuring registers in the other co-processor modules to execute the instruction. The prefetch buffer controller 307 manages the reading and writing to a prefetch buffer within the prefetch buffer controller and manages the interfacing between the instruction decoder 306 and the input interface switch 252 (FIG. 2). The prefetch buffer controller 307 is also responsible for managing the updating of the two instruction pointer registers (ic_ipa and ic_ipb). Access to the CBus 231 (FIG. 2) by the instruction controller 235, the miscellaneous module 239 (FIG. 2) and the external interface controller 238 (FIG. 2) is controlled by a "CBus" arbitrator 308 which arbitrates between the three modules' request for access. The requests are transferred by means of a control bus (CBus) 231 to the register units of the various modules.

Figure 14:
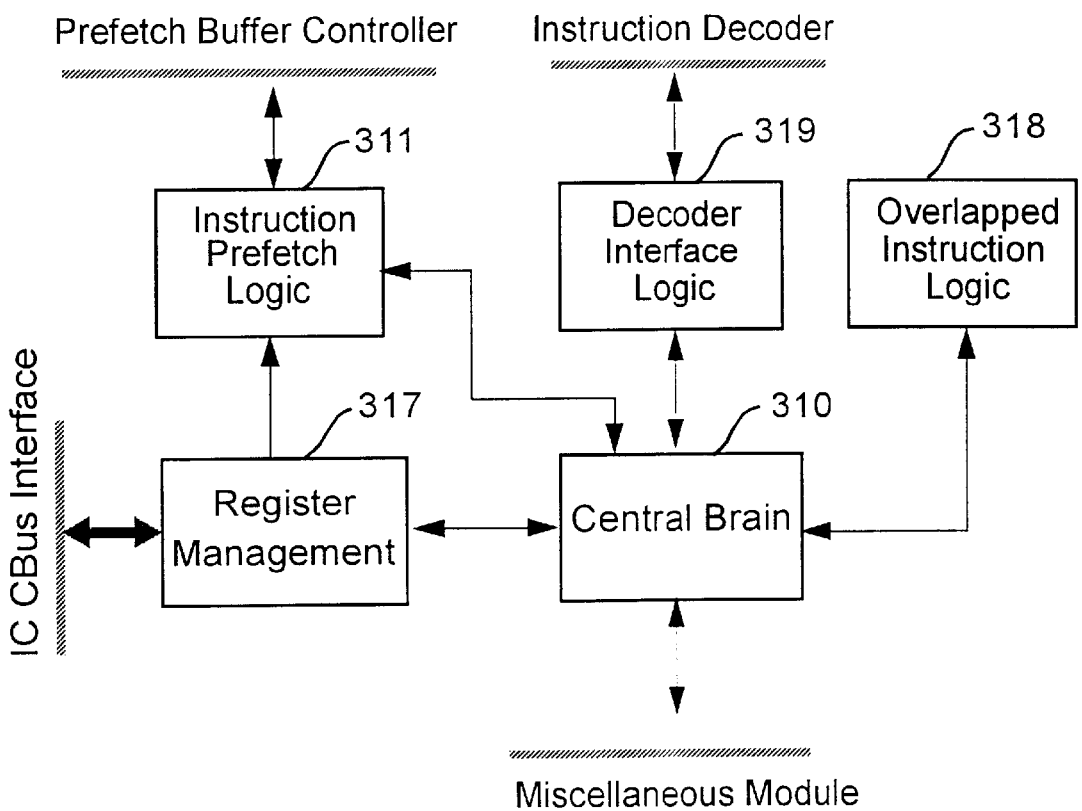
FIG. 14 illustrates the execution controller of FIG. 13 in more detail.

Turning now to FIG. 14, there is illustrated the execution controller 305 of FIG. 13 in more detail. As noted previously, the execution controller is responsible for implementing the instruction execution cycle 275 of FIG. 9 and, in particular, is responsible for:

1. Determining which instruction stream the next instruction is to come from;
2. Initiating fetching of that instruction;
3. Signalling the instruction decoder to decode the instruction as residing in the prefetch buffer;
4. Determining and initiating any prefetching of the next instruction;
5. Determining instruction completion; and
6. Updating the registers alter the instruction has completed.

Figure 15:
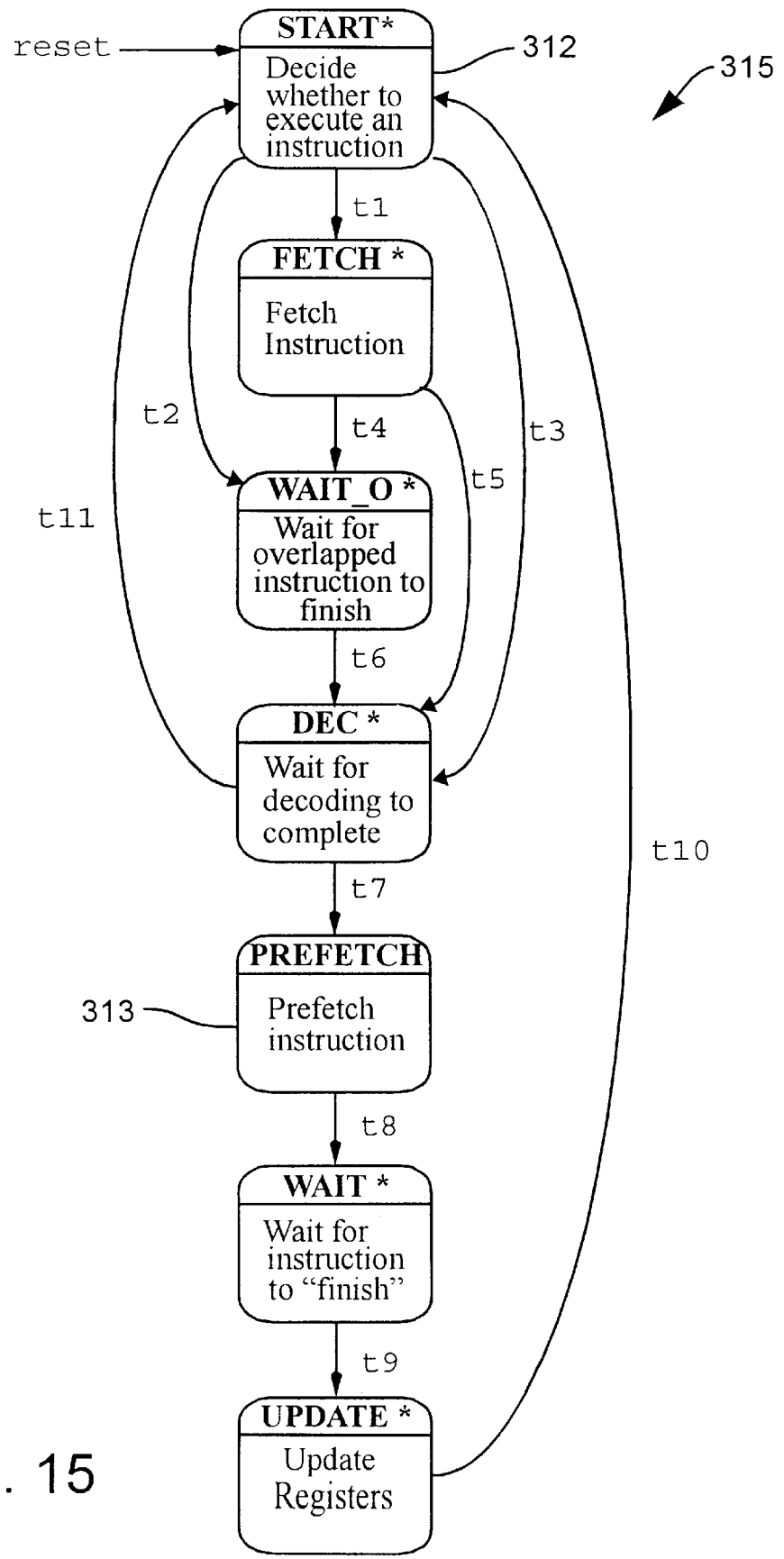
FIG. 15 illustrates a state transition diagram of the instruction controller.

The execution controller includes a large core state machine 310 hereinafter known as "the central brain" which implements the overall instruction execution cycle. Turning to FIG. 15, there is illustrated the state machine diagram for the central brain 310 implementing the instruction execution cycle as aforementioned. Returning to FIG. 14, the execution controller includes an instruction prefetch logic unit 311. This unit is responsible for determining whether there is an outstanding instruction to be executed and which instruction stream the instruction belongs to. The start 312 and prefetch 313 states of the transition diagram of FIG. 15 utilize this information in obtaining instructions. A register management unit 317 of FIG. 14 is responsible for monitoring the register access semaphores on both instruction streams and updating all necessary registers in each module. The register management unit 317 is also responsible for comparing the finished register (ic_fna or ic_fnb) with the interrupt register (ic_inta or ic_intb) to determine if a "sequence number completed" interrupt is due. The register management unit 317 is also responsible for interrupt priming. An overlapped instructions unit 318 is responsible for managing the finishing off of an overlapped instruction through management of the appropriate status bits in the ic_stat register. The execution controller also includes a decoder interface unit 319 for interfacing between the central brain 310 and the instruction decoder 306 of FIG. 13.

Figure 16:
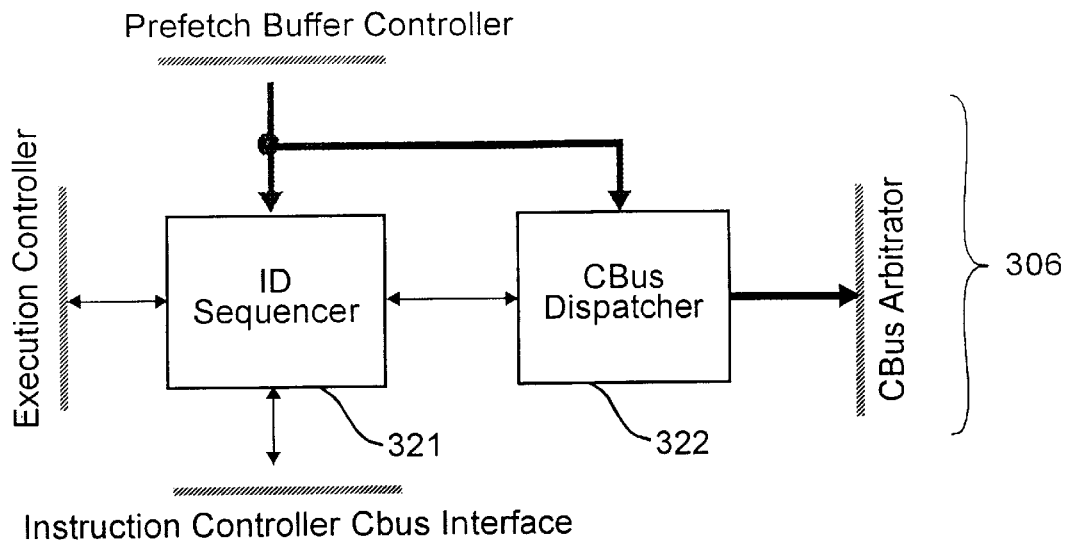
FIG. 16 illustrates the instruction decoder of FIG. 13.

Turning now to FIG. 16, there is illustrated the instruction decoder 306 in more detail. The instruction decoder is responsible for configuring the co-processor to execute the instructions residing in the prefetch buffer. The instruction decoder 306 includes an instruction decoder sequencer 321 which comprises one large state machines broken down into many smaller state machines. The instruction sequencer 321 communicates with a CBus dispatcher 312 which is responsible for setting the registers within each module. The instruction decoder sequencer 321 also communicates relevant information to the execution controller such as instruction validity and instruction overlap conditions. The instruction validity check being to check that the instruction opcode is not one of the reserved opcodes.

Figure 17:
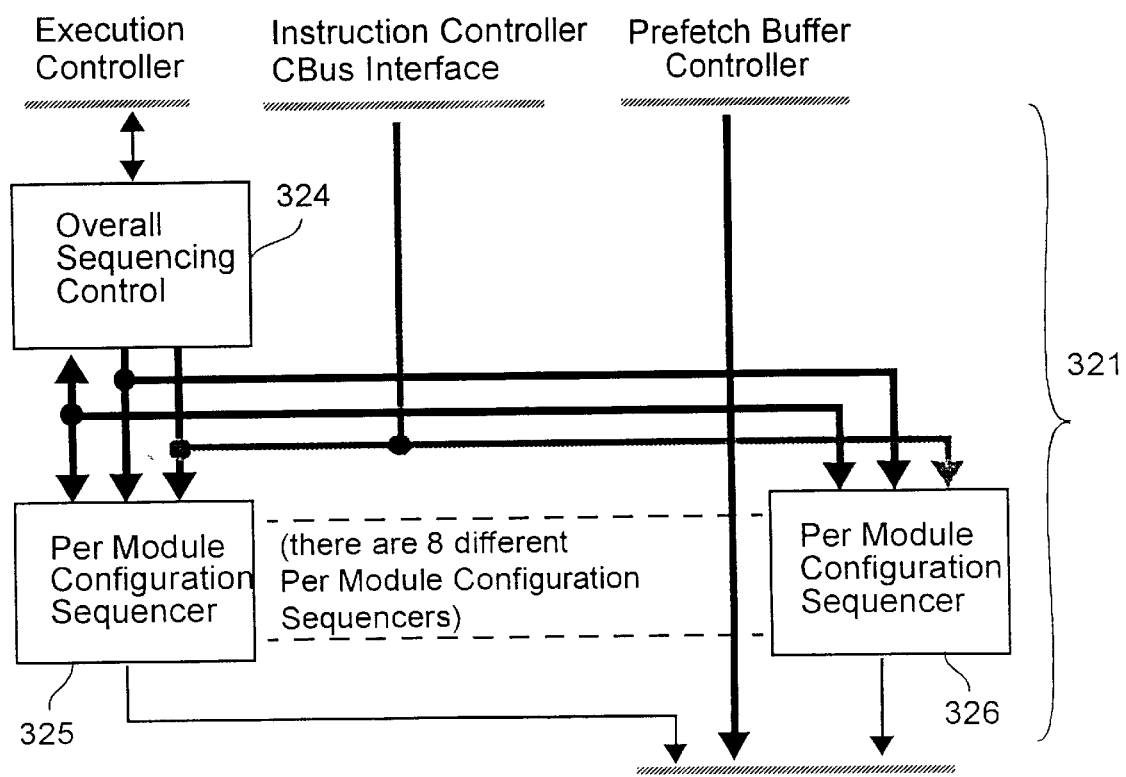
FIG. 17 illustrates the instruction sequencer of FIG. 16 in more detail.

Turning now to FIG. 17, there is illustrated, in more detail, the instruction dispatch sequencer 321 of FIG. 16. The instruction dispatch sequencer 321 includes a overall sequencing control state machine 324 and a series of per module configuration sequencer state machines, eg. 325, 326. One per module configuration sequencer state machine is provided for each module to be configured. Collectively the state machines implement the co-processor's microprogramming of the modules. The state machines, eg. 325. instruct the CBus dispatcher to utilize the global CBus to set various registers so as to configure the various modules for processing. A side effect of writing to particular registers is that the instruction execution commences. Instruction execution typically takes much longer than the time it takes for the sequencer 321 to configure the co-processor registers for execution. In appendix A, attached to the present specification, there is disclosed the microprogramming operations performed by the instruction sequencer of the co-processor in addition to the form of set up by the instruction sequencer 321.

In practice, the Instruction Decode Sequencer 321 does not configure all of the modules within the co-processor for every instruction. The table below shows the ordering of module configuration for each class of instruction with the module configured including the pixel organizer 246 (PO), the data cache controller 240 (DCC), the operand organizer B 247 (OOB), the operand organizer C 248 (OOC), main data path 242 (MDP), results organizer 249 (RO), and JPEG encoder 241 (JC). Some of the modules are never configured during the course of instruction decoding. These modules are the External Interface Controller 238 (EIC), the Local Memory Controller 236 (LMC), the Instruction Controller 235 itself (IC), the Input Interface Switch 252 (IIS) and the Miscellaneous Module (MM).

TABLE 5

Module Setup Order

| Instruction Class | Module Configuration Sequence | Sequence ID |
|---|---|---|
| Compositing | PO, DCC, OOB, OOC, MDP, RO | 1 |
| CSC | PO, DCC, OOB, OOC, MDP, RO | 2 |
| JPEG coding | PO, DCC, OOB, OOC, JC, RO | 3 |
| Data coding | PO, DCC, OOB, OOC, JC, RO | 3 |
| Transformations and Convolutions | PO, DCC, OOB, OOC, MDP, RO | 2 |
| Matrix Multiplication | PO, DCC, OOB, OOC, MDP, RO | 2 |
| Halftoning | PO, DCC, OOB, MDP, RO | 4 |
| General memory copy | PO, JC, RO | 8 |
| Peripheral DMA | PIC | 5 |
| Hierarchial Image — Horizontal Interpolation | PO, DCC, OOB, OOC, MDP, RO | 6 |
| Hierarchial Image — others | PO, DCC, OOB, OOC, MDP, RO | 4 |
| Internal access others | RO, RO, RO, RO | 7 |
|  | — | — |

Turning now to FIG. 17, each of the module configuration sequencers, eg. 325 is responsible for carrying out t he required register access operations to configure the particular module. The overall sequencing control state machine 324 is responsible for overall operation of the module configuration sequencer in the aforementioned order.

Figure 18:
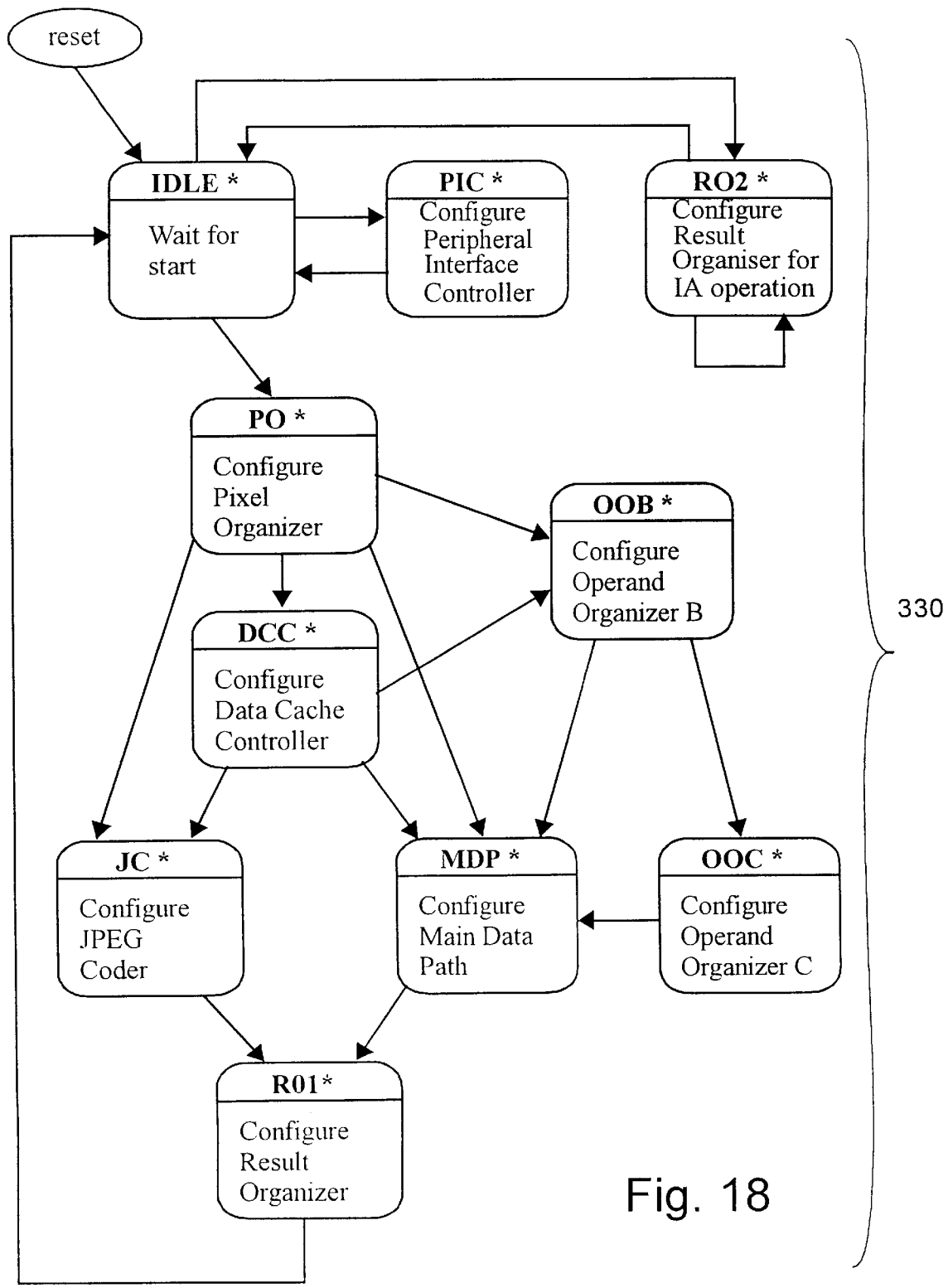
FIG. 18 illustrates a transition diagram for the ID sequencer of FIG. 16.

Referring now to FIG. 18. there is illustrated 330 the state transition diagram for the overall sequencing control unit which basically activates the relevant module configuration sequencer in accordance with the above table. Each of the modules configuration sequencers is responsible for controlling the CBus dispatcher to alter register details in order to set the various registers in operation of the modules.

Figure 19:
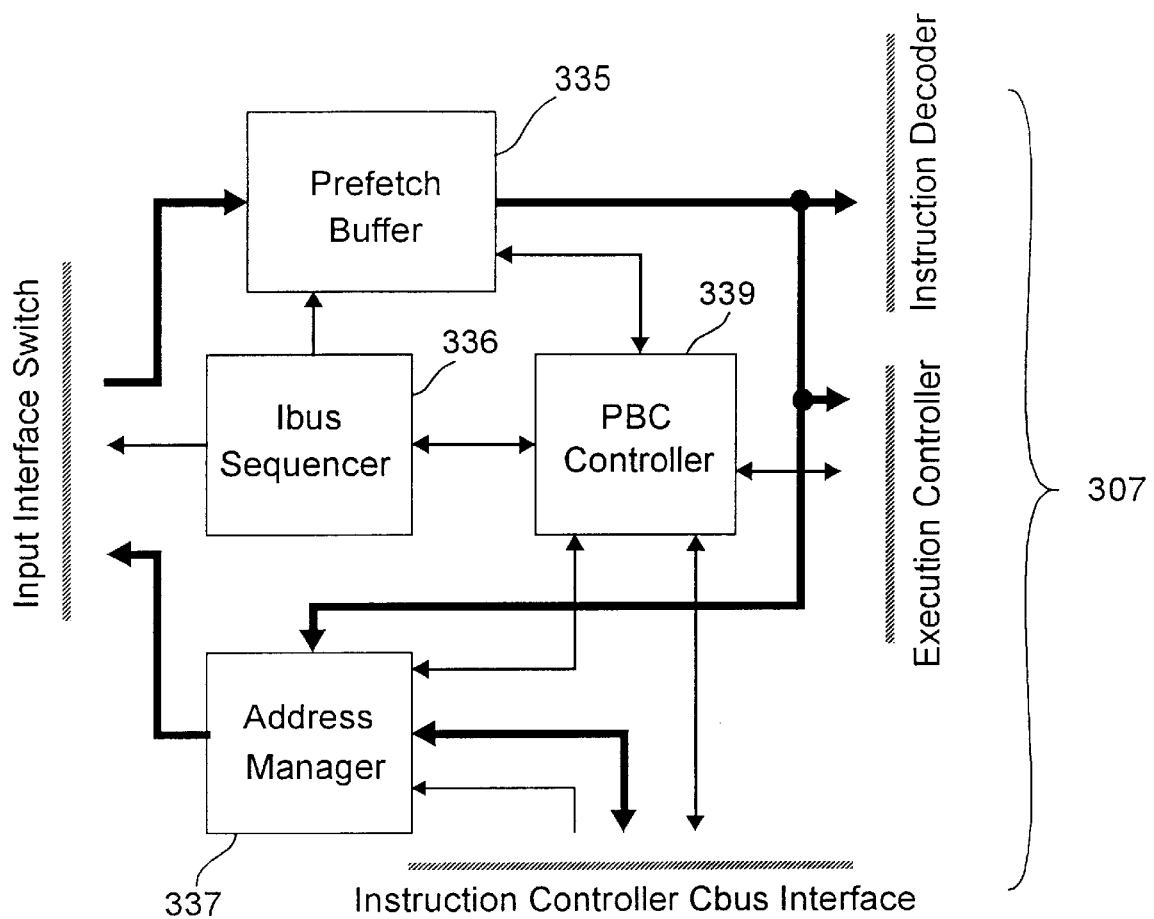
FIG. 19 illustrates schematically the prefetch buffer controller of FIG. 13 in more detail.

Turning now to FIG. 19, there is illustrated the prefetch buffer controller 307 of FIG. 13 in more detail. The prefetch buffer controller consists of a prefetch buffer 335 for the storage of a single co-processor instruction (six times 32 bit words). The prefetch buffer includes one write port controlled by a Ibus sequencer 336 and one read port which provides data to the instruction decoder, execution controller and the instruction controller CBus interface. The Ibus sequencer 336 is responsible for observing bus protocols in the connection of the prefetch buffer 335 to the input interface switch. An address manager unit 337 is also provided which deals with address generation for instruction fetching. The address manager unit 337 performs the functions of selecting one of ic_ipa or ic_ipb to place on the bus to the input interface switch, incrementing one of ic_ipa or ic_ipb based on which stream the last instructions was fetched from and channelling jump target addresses back to the ic_ipa and ic_ipb register. A PBC controller 339 maintains overall control of the prefetched buffer controller 307.

3.11 Description of a Modules Local Register File

Figure 20A:
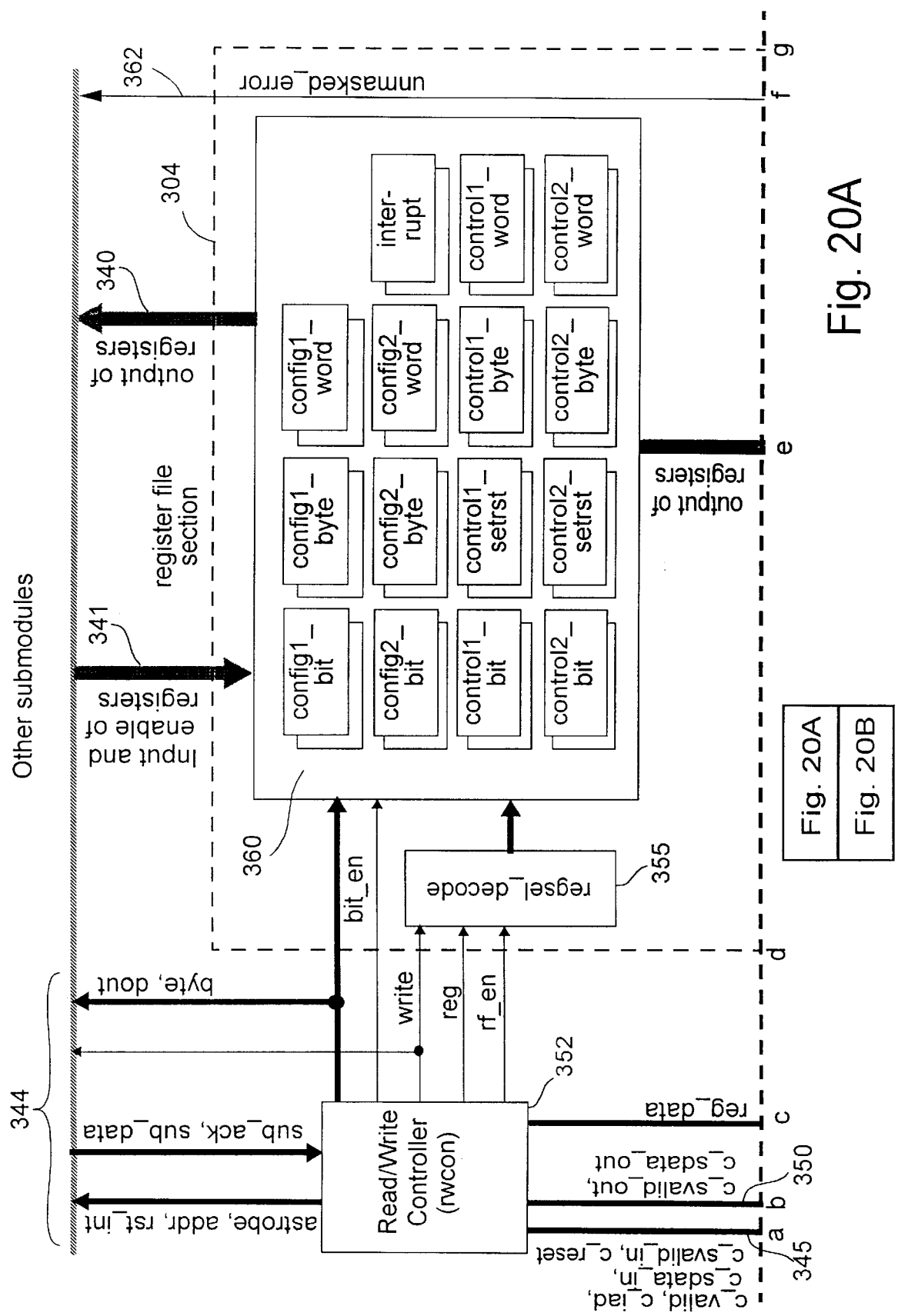
FIG. 20 illustrates the standard form of register storage and module interaction as utilized in the co-processor.
Figure 20B:
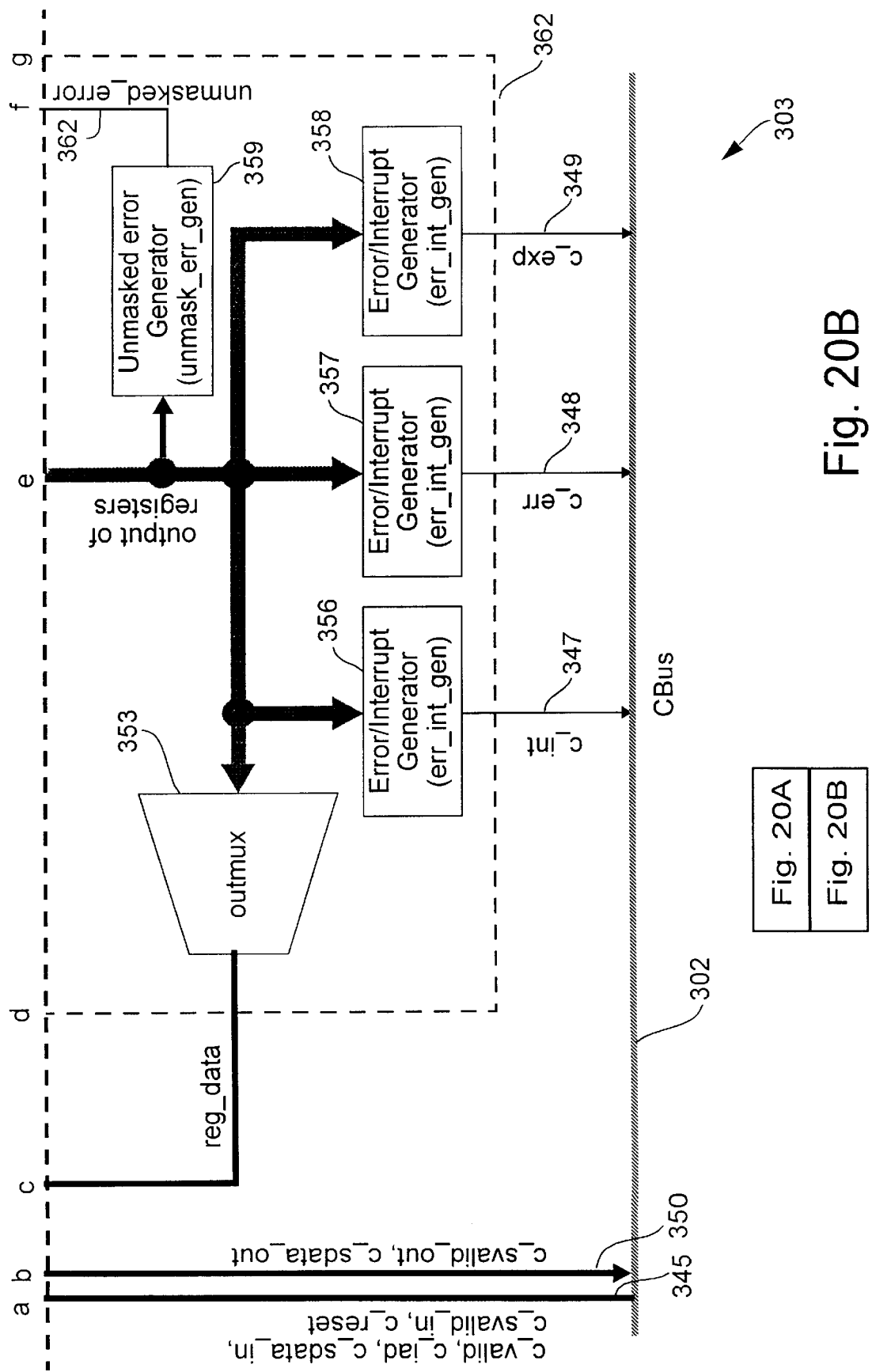

As illustrated in FIG. 13, each module, including the instruction controller module itself, has an internal set of registers 304 as previously defined in addition to a CBus interface controller 303 as illustrated in FIG. 20 and which is responsible for receiving CBus requests and updating internal registers in light of those requests. The module is controlled by writing registers 304 within the module via a CBus interface 302. A CBus arbitrator 308 (FIG. 13) is responsible for determining which module of the instruction controller 235. the external interface controller or the miscellaneous module is able to control the CBus 309 for acting as a master of the CBus and for the writing or reading of registers.

FIG. 20, illustrates, in more detail, the standard structure of a CBus interface 303 as utilized by each of the modules. The standard CBus interface 303 accepts read and write requests from the CBus 302 and includes a register file 304 which is utilized 341 and updated on 341 by the various submodules within a module. Further, control lines 344 are provided for the updating of any submodule memory areas including reading of the memory areas. The standard CBus interface 303 acts as a destination on the CBus. accepting read and write requests for the register 304 and memory objects inside other submodules.

A "c_reset" signal 345 sets every register inside the Standard CBus interface 103 to their default states. However, "c_reset" will not reset the state machine that controls the handshaking of signals between itself and the CBus Master, so even if "c_reset" is asserted in the middle of a CBus transaction, the transaction will still finish, with undefined effects. The "c_int" 347, "c_exp" 348 and "c_err" 349 signals are generated from the content of a modules err_int and err_int_en registers by the following equations:

$$c\_err = \sum_{error[i]\,not\,reserved} error[i] \text{ AND } err\_mask[i] \quad (1)$$

$$c\_int = \sum_{int\,errupt[i]\,not\,reserved} interrupt[i] \text{ AND } int\_mask[i] \quad (2)$$

$$c\_exp = \sum_{[i]\,not\,reserved} exception[i] \text{ AND } exp\_mask[i] \quad (3)$$

The signals "c_sdata_in" 345 and "c_svalid_in" are data and valid signals from the previous module in a daisy chain of modules. The signals "c_sdata_out" and "c_svalid_out" 350 are data and valid signals going to the next module in the daisy chain.

The functionality of the Standard CBus interface 303 includes:
1. register read/write handling
2. memory area read/write handling
3. test mode read/write handling
4. submodule observe/update handling 3.12 Register Read/Write Handling The Standard CBus Interface 303 accepts register read/write and bit set requests that appears on the CBus. There are two types of CBus instructions that Standard CBus Interface handles:
1. Type A Type A operations allow other modules to read or write 1, 2, 3, or 4 bytes into any register inside Standard CBus Interface 303. For write operations, the data cycle occurs in the clock cycle immediately after the instruction cycle. Note that the type no field for register write and read are "1000" and "1001" respectively. The Standard CBus Interface 303 decodes the instruction to check whether the instruction is addressed to the module, and whether it is a read or write operation. For read operation, the Standard CBus Interface 303 uses the "reg" field of the CBus transaction to select which register output is to put into the "c_sdata" bus 350. For write operations, the Standard CBus Interface 303 uses the "reg" and "byte" fields to write the data into the selected register. After read operation is completed, the Standard CBus Interface returns the data and asserts "c_svalid" 350 at the same time. After write operations are completed, the Standard CBus Interface 303 asserts "c_svalid" 350 to acknowledge.

2. Type C

Type C operations allow other modules to write one or more bits in one of the bytes in one of the registers. Instruction and data are packed into one word.

The Standard CBus Interface 303 decodes the instruction to check whether the instruction is addressed to the module. It also decodes "reg". "byte" and "enable" fields to generate the required enable signals. It also latches the data field of the instruction, and distributes it to all four bytes of a word so the required bit(s) are written in every enabled bit(s) in every enabled byte(s). No acknowledgment is required for this operation.

3.13 Memory Area Read/Write Handling

The Standard CBus Interface 303 accepts memory read and memory write requests that appears on the CBus. While accepting a memory read/write request, the Standard CBus Interface 303 checks whether the request is addressed to the module. Then, by decoding the address field in the instruction, the Standard CBus Interface generates the appropriate address and address strobe signals 344 to the submodule which a memory read/write operation is addressed to. For write operations the Standard CBus Interface also passes on the byte enable signals from the instruction to the submodules.

The operation of the standard CBus interface 303 is controlled by a read/write controller 352 which decodes the type field of a CBus instruction from the CBus 302 and generates the appropriate enable signals to the register file 304 and output selector 353 so that the data is latched on the next cycle into the register file 304 or forwarded to other submodules 344. If the CBus instruction is a register read operation, the read/write controller 352 enables the output selector 353 to select the correct register output going onto the "c_sdata bus" 345. If the instruction is a register write operation, the read/write controller 352 enables the register file 304 to select the data in the next cycle. If the instruction is a memory area read or write, then the read/write controller 352 generates the appropriate signals 344 to control those memory areas under a modules control. The register file 304 contains four parts, being a register select decoder 355, an output selector 353, interrupt 356, error 357 and exception 358 generators, unmasked error generator 359 and the register components 360 which make up the registers of that particular module. The register select decoder 355 decodes the signal "ref_en" (register file enable), "write" and "reg" from the read/write controller 352 and generates the register enable signals for enabling the particular register of interest. The output selector 353 selects the correct register data to be output on c_sdata_out lines 350 for register read operations according to the signal "reg" output from the read/write controller 352.

The exception generators 356–359 generate an output error signal, eg. 347–349, 362 when an error is detected on their inputs. The formula for calculating each output error is as aforementioned.

The register components 360 can be defined to be of a number of types in accordance with requirements as previously discussed when describing the structure of the register set with reference to Table 5.

3.14 CBus Structure

As noted previously. the CBus (control bus) is responsible for the overall control of each module by way transferring information for the setting of registers within each module's standard CBus interface. It will be evident from the description of the standard CBus interface that the CBus serves two main purposes:

1. It is the control bus that drives each of the modules.
2. It is the access bus for RAMs, FIFOs and status information contained within each of the modules.

The CBus uses an instruction-address-data protocol to control modules by the setting configuration registers within the modules. In general, registers will be set on a per instruction basis but can be modified at any time. The CBus gathers status and other information, and accesses RAM and FIFO data from the various modules by requesting data.

The CBus is driven on a transaction by transaction basis either by:

1. the Instruction Controller 235 (FIG. 2) when executing instructions,
2. the External Interface Controller 238 (FIG. 2) when performing a target (slave) mode bus operation, or
3. an external device if the External CBus Interface is so configured.

In each of these cases, the driving module is considered to be the source module of the CBus, and all other modules possible destinations. Arbitration on this bus is carried out by the Instruction Controller.

The following table sets out one form of CBus signal definitions suitable for use with the preferred embodiment:

TABLE 6

CBus Signal Definition

| Name | Type | Definition |
| --- | --- | --- |
| c_iad[31:0] | source | instruction-address-data |
| c_valid | source | CBus instruction valid |
| c_sdata[31:0] | destination | status/read data |
| c_svalid | destination | status/read data valid |
| c_reset[15:0] | source | reset lines to each module |
| c_active[15:0] | destination | active lines from each module |
| c_background[15:0] | destination | background active lines from each module |
| c_int[15:0] | destination | interrupt lines from each module |
| c_error[15:0] | destination | error lines from each module |
| c_req1, c_req2 | EIC, external | bus control request |
| c_gnt1, c_gnt2 | IC | bus control grant |
| c_end | IC | end of instruction |
| clk | global | clock |

A CBus c_iad signal contains the addressing data and is driven by the controller in two distinct cycles:

1. Instruction cycles (c_valid high) where the CBus instruction and an address is driven onto c_iad; and
2. Data cycles (c_valid low) where data is driven onto c_iad (write operations) or c_sdata (read operations).

In the case of a write operation, the data associated with an instruction is placed on the c_iad bus in the cycle directly following the instruction cycle. In the case of a read operation, the target module of the read operation drives the c_sdata signal until the data cycle completes.

Turning now to FIG. 21, the bus includes a 32 bit instruction-address-data field which can be one of three types 370–372:

1. Type A operations (370) are used to read and write registers and the per-module data areas within the co-processor. These operations can be generated by the external interface controller 238 performing target mode PCI cycles, by the instruction controller 231 configuring the co-processor for an instruction, and by the External CBus Interface.

For these operations, the data cycle occurs in the clock cycle immediately following the instruction cycle. The data cycle is acknowledged by the designation module using the c_svalid signal.

2. Type B operations (371) are used for diagnostic purposes to access any local memory and to generate cycles on the Generic Interface. These operations will be generated by the External Interface Controller performing target mode PCI cycles and by the External CBus Interface. The data cycle can follow at any time after the instruction cycle. The data cycle is acknowledged by the destination module using the c_svalid signal.

3. Type C operations (372) are used to set individual bits within a module's registers. These operations will be generated by the instruction controller 231 configuring the co-processor's for an instruction and by the External CBus Interface. There is no data cycle associated with a Type C operation, data is encoded in the instruction cycle.

The type field of each instruction encodes the relevant CBus transaction type in accordance with the following table:

TABLE 7

CBus Transaction Types

| c_iad.type value | transaction type | instruction format type |
|---|---|---|
| 0000 | no-op | A, B, C |
| 0001 | reserved | |
| 0010 | peripheral interface write | B |
| 0011 | peripheral interface read | B |
| 0100 | generic bus write | B |
| 0101 | generic bus read | B |
| 0110 | local memory write | B |
| 0111 | local memory read | B |
| 1000 | register write | A |
| 1001 | register read | A |
| 1010 | module memory write | A |
| 1011 | module memory read | A |
| 1100 | test mode write | A |
| 1101 | test mode read | A |
| 1110 | bitset | C |
| 1111 | reserved | |

The byte field is utilized for enabling bits within a register to be set. The module field sets out the particular module to which an instruction on the CBus is addressed. The register field sets out which of the registers within a module is to be updated. The address field is utilized for addressing memory portions where an operation is desired on those memory portions and can be utilized for addressing RAMs, FIFOs, etc. The enable field enables selected bits within a selected byte when a bit set instruction is utilized. The data field contains the bit wize data of the bits to be written to the byte selected for update.

As noted previously, the CBus includes a c_active line for each module, which is asserted when ever a module has outstanding activity pending. The instruction controller utilizes these signals to determine when an instruction has completed. Further, the CBus contains a c_background line for each module that can operate in a background mode in addition to any preset, error and interrupt lines, one for each module, for resetting detecting errors and interrupts.

3.15 Co-processor Data Types and Data Manipulation

Figure 22:
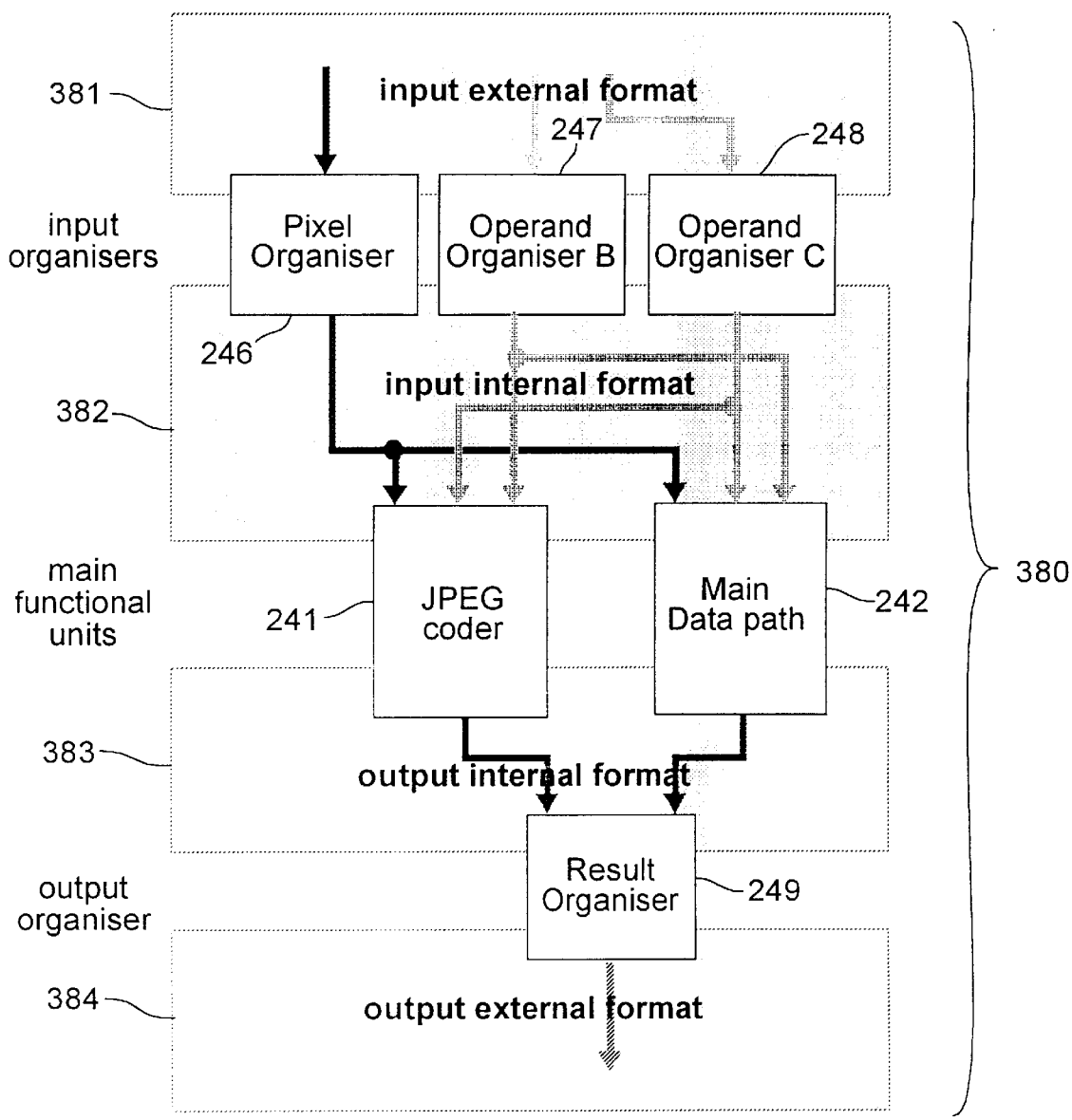
FIG. 22 illustrates the data flow through a portion of the co-processor.

Returning now to FIG. 2, in order to substantially simplify the operation of the co-processor unit 224, and in particular the operation of the major computational units within the co-processor being the JPEG coder 241 and the main data path 242, the co-processor utilizes a data model that differentiates between external formats and internal formats. The external data formats are the formats of data as it appears on the co-processor's external interfaces such as the local memory interface or the PCI bus. Conversely, the internal data formats are the formats which appear between the main functional modules of the co-processor 224. This is illustrated schematically in FIG. 22 which shows the various input and output formats. The input external format 381 is the format which is input to the pixel organizer 246, the operand organizer B 247 and the operand organizer C 248. These organizers are responsible for reformatting the input external format data into any of a number of input internal formats 382, which may be inputted to the JPEG coder unit 241 and the main data path unit 242. These two functional units output data in any of a number of output internal formats 383, which are converted by the results organizer 249 to any of a number of required output formats 304.

Figure 23:
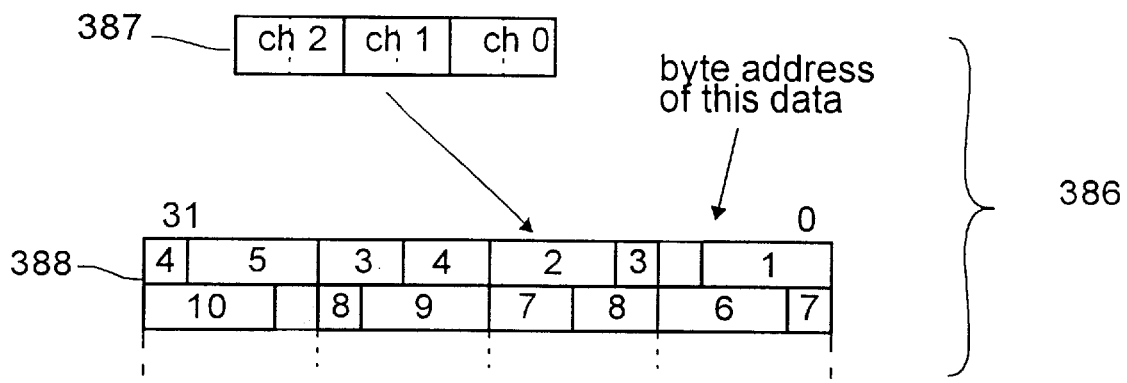
FIGS. 23–29 illustrate various examples of data reformatting as utilized in the co-processor.
Figure 24:
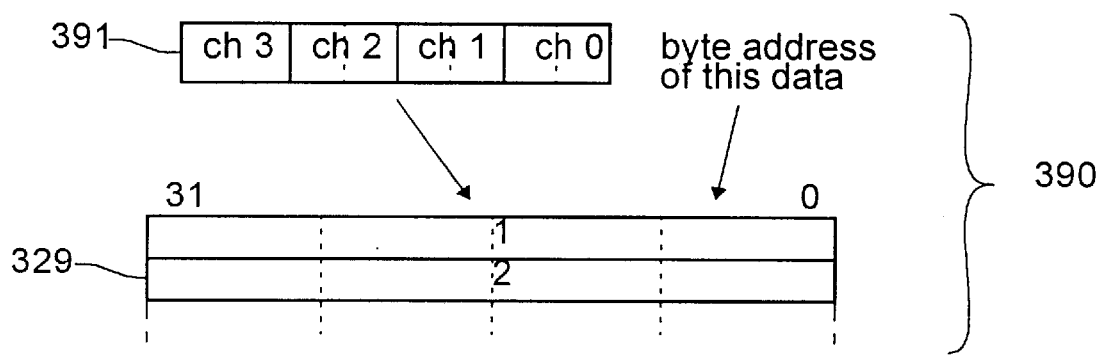
Figure 25:
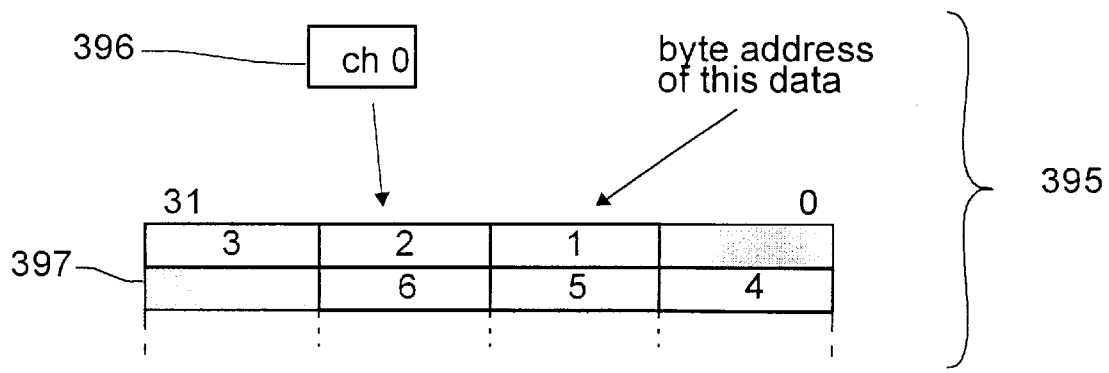

In the embodiment shown, the external data formats can be divided into three types. The first type is a "packed stream" of data which consists of a contiguous stream of data having up to four channels per data quantum, with each channel consisting of one, two, four, eight or sixteen bit samples. This packed stream can typically represent pixels, data to be turned into pixels, or a stream of packed bits. The co-processor is designed to utilize little endian byte addressing and big endian bit addressing within a byte. In FIG. 23, there is illustrated a first example 386 of the packed stream format. It is assumed that each object 387 is made up of three channels being channel 0, channel 1 and channel 2, with two bits per channel. The layout of data for this format is as indicated 388. In a next example 390 of FIG. 24, a four channel object 395 having eight bits per channel is illustrated 396 with each data object taking up a 32 bit word. In a third example 395 of FIG. 25, one channel objects 396 are illustrated which each take up eight bits per channel starting at a bit address 397. Naturally, the actual width and number of channels of data will vary depending upon the particular application involved.

Figure 26:
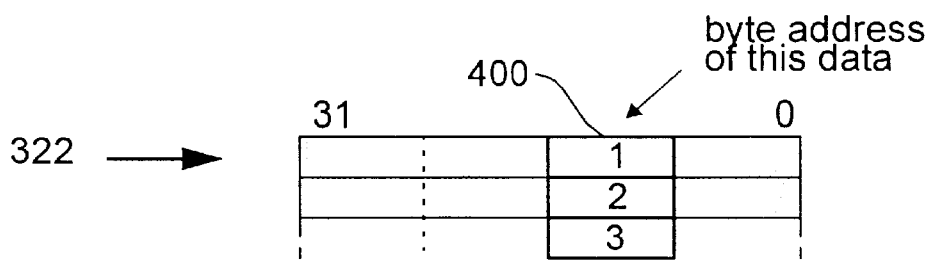

A second type of external data format is the "unpacked byte stream" which consists of a sequence of 32 bit words, exactly one byte within each word being valid. An example of this format is shown in FIG. 26 and designated 399, in which a single byte 400 is utilized within each word.

A further external data format is represented by the objects classified as an "other" format. Typically, these data objects are large table-type data representing information such as colour space conversion tables, Huffman coding tables and the like.

Figure 27:
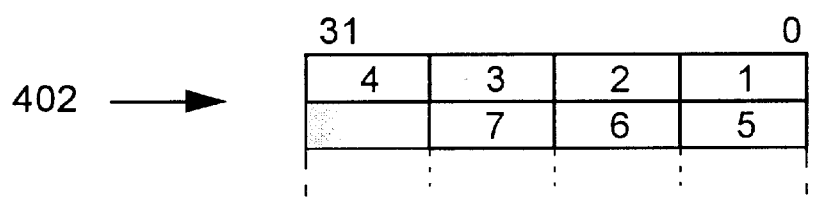

The co-processor utilizes four different internal data types. A first type is known as a "packed bytes" format which comprises 32 bit words, each consisting of four active bytes, except perhaps for a final 32 bit word. In FIG. 27, there is illustrated one particular example 402 of the packed byte format with 4 bytes per word.

Figure 28:
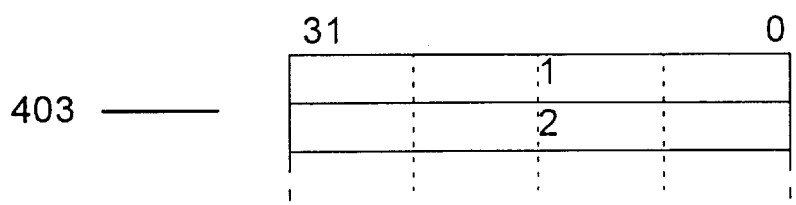

The next data type. illustrated with reference to FIG. 28, is "pixel" format and comprises 32 bit words 403. consisting of four active byte channels. This pixel format is interpreted as four channel data.

Figure 29:
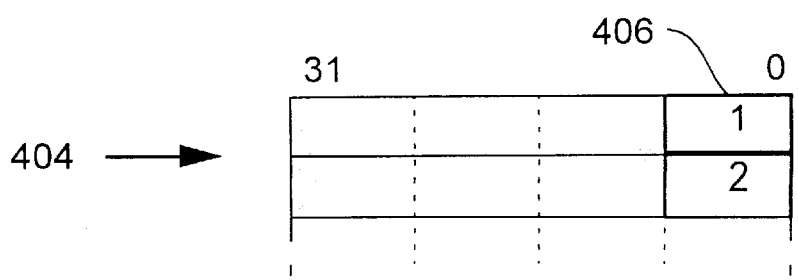

A next internal data type illustrated with reference to FIG. 29 is an "unpacked byte" format, in which each word consists of one active byte channel 405 and three inactive byte channels, the active byte channel being the least significant byte.

All other internal data objects are classified by the "other" data format.

Figure 30:
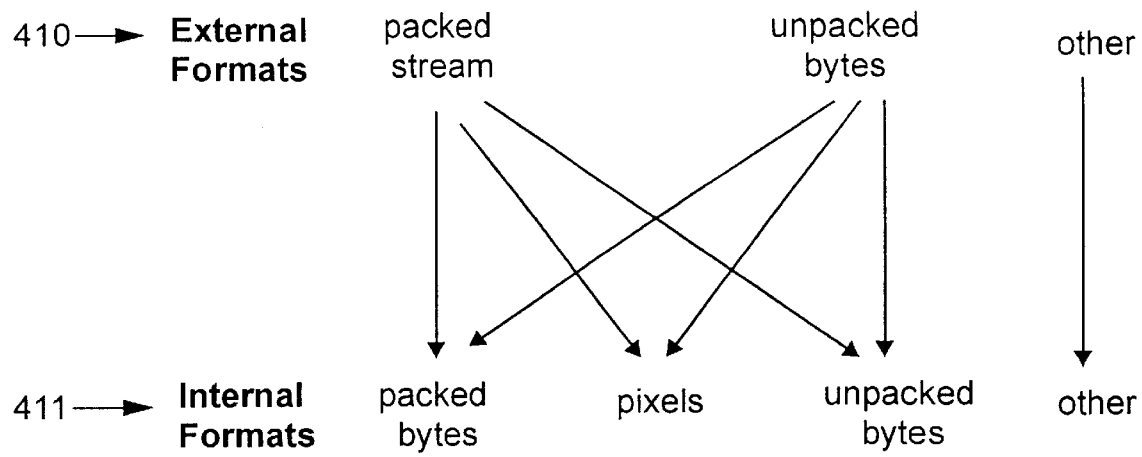
FIGS. 30 and 31 illustrate the format conversions carried out by the co-processor.
Figure 31:
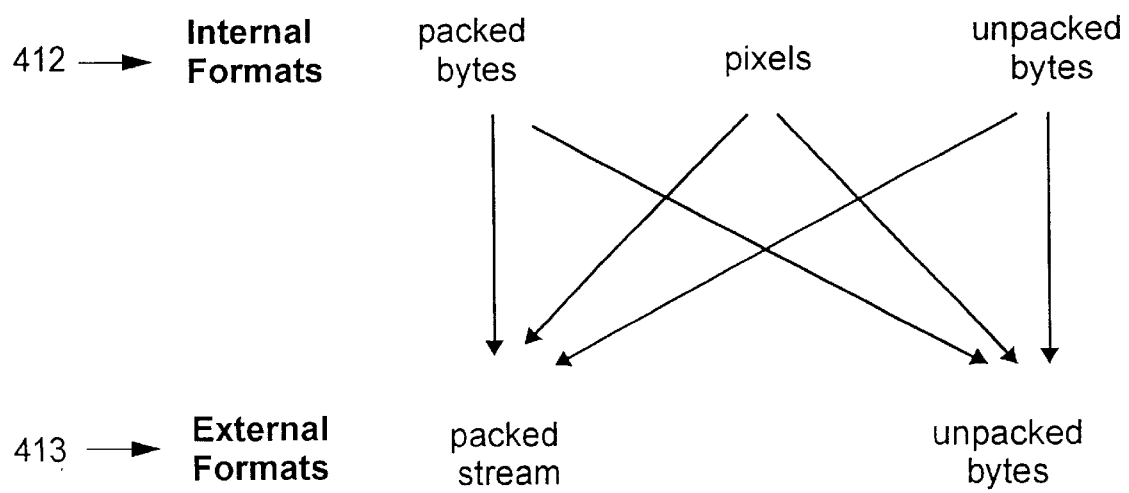

Input data in a given external format is converted to the appropriate internal format. FIG. 30 illustrates the possible conversions carried out by the various organizers from an external format 410 to an internal format 411. Similarly, FIG. 31 illustrates the conversions carried out by the results organizer 249 in the conversion from internal formats 412 to external formats 413.

The circuitry to enable the following conversions to take place are described in greater detail below.

Figure 32:
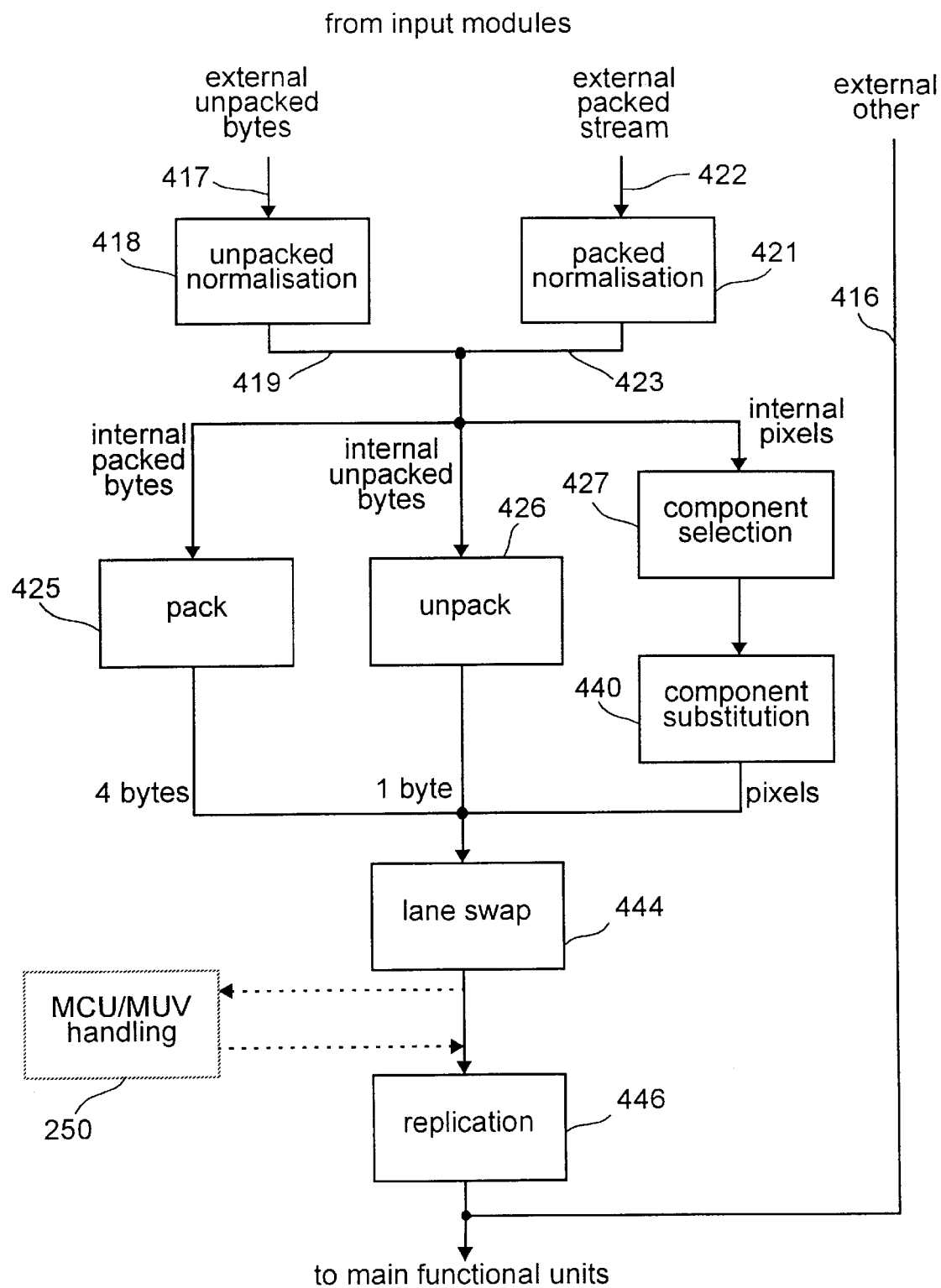
FIG. 32 illustrates the process of input data transformation as carried out in the co-processor.
Figure 33:
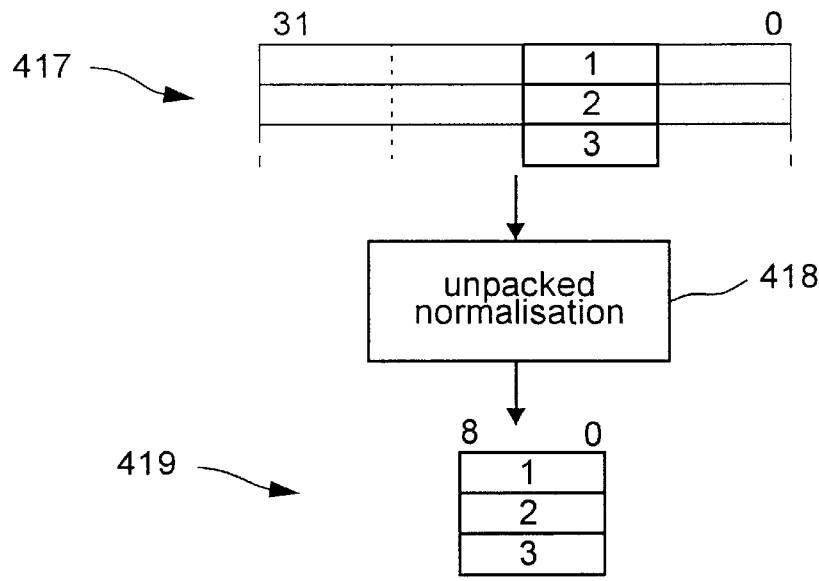
FIGS. 33–41 illustrate various further data transformations as carried out by the co-processor.

Turning firstly to the conversion of input data external formats to internal formats, in FIG. 32 there is shown the methodology utilized by the various organizers in the conversion process. Starting initially with the external other format 416, this is merely passed through the various organizers unchanged. Next, the external unpacked byte format 417 undergoes unpacked normalization 418 to produce a format 419 known as internally unpacked bytes. The process of unpacked normalization 418 involves discarding the three inactive bytes from an externally unpacked byte stream. The process of unpacked normalization is illustrated in FIG. 33 wherein the input data 417 having four byte channels wherein only one byte channel is valid results in the output format 419 which merely comprises the bytes themselves.

Turning again to FIG. 32. the process of packed normalization 421 involves translating each component object in an externally packed stream 422 into a byte stream 423. If each component of a channel is less than a byte in size then the samples are interpolated up to eight bit values. For example. when translating four bit quantities to byte quantities, the four bit quantity 0×N is translated to the byte value 0×NN. Objects larger than one byte are truncated. The input object sizes supported on the stream 422 are 1, 2, 4, 8 and 16 bit sizes, although again these may be different depending upon the total width of the data objects and words in any particular system to which the invention is applied.

Figure 34:
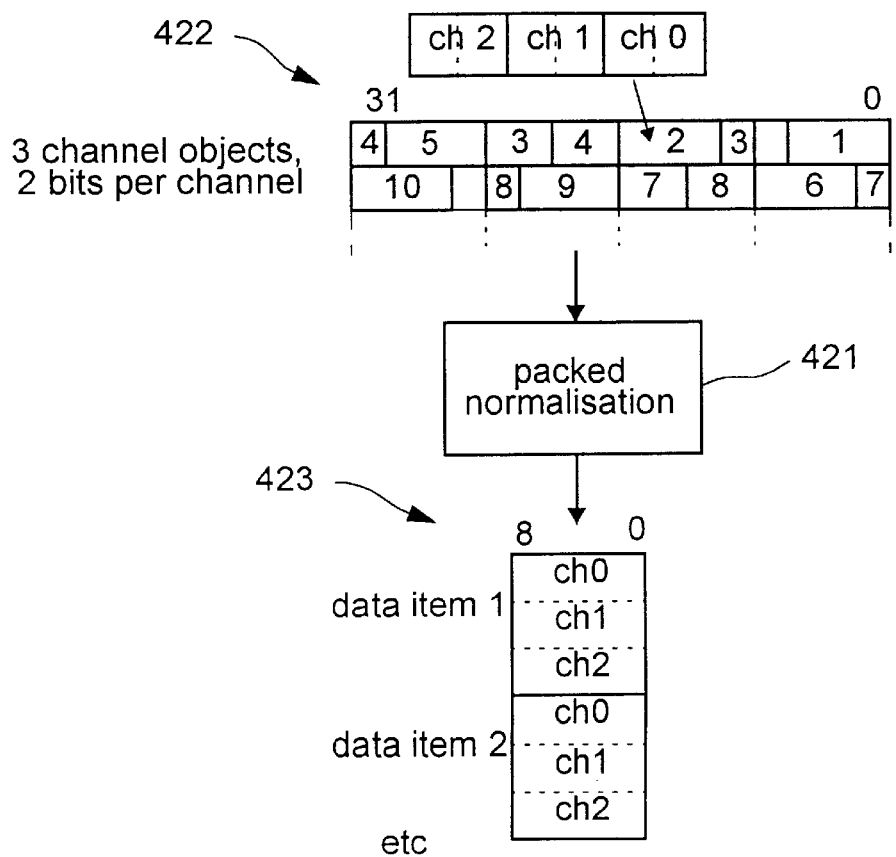

Turning now to FIG. 34, there is illustrated one form of packed normalization 421 on input data 422 which is in the form of 3 channel objects with two bits per channel (as per the data format 386 of FIG. 23). The output data comprises a byte channel format 423 with each channel "interpolated up" where necessary to comprize an eight bit sample.

Returning to FIG. 32, the pixel streams are then subjected to either a pack operation 425, an unpacked operation 426 or a component selection operation 427.

Figure 35:
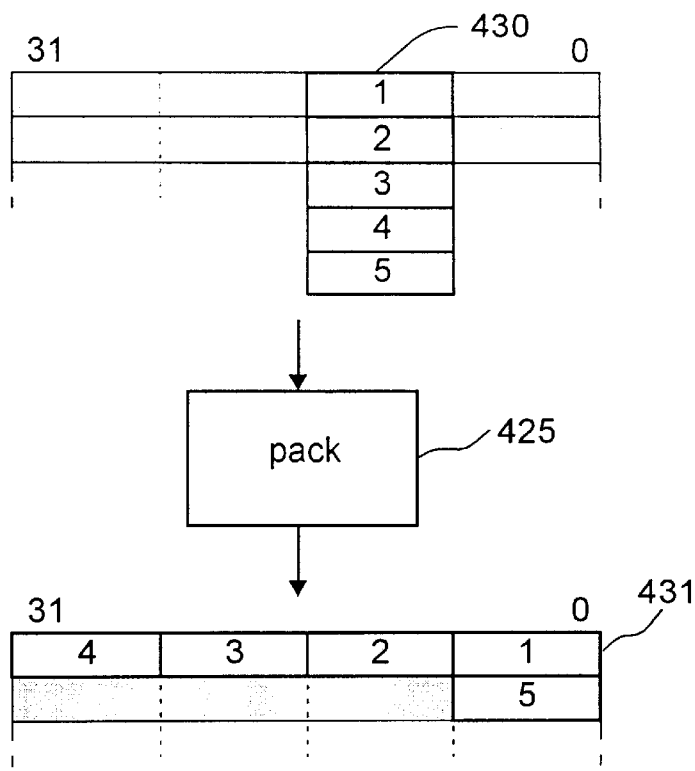
Figure 36:
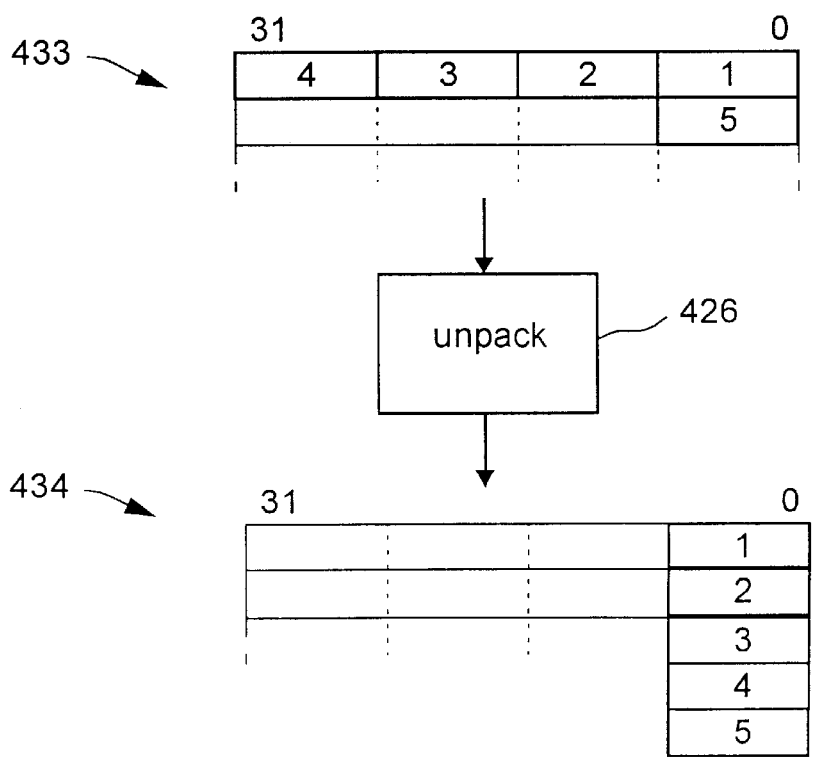

In FIG. 35 there is shown an example of the packed operation 425 which simply involves discarding the inactive byte channel and producing a byte stream, packed up with four active bytes per word. Hence. a single valid byte stream 430 is compressed into a format 431 having four active bytes per word. The unpacking operation 426 involves almost the reverse of the packing operation with the unpacked bytes being placed in the least significant byte of a word. This is illustrated in FIG. 36 wherein a packed byte stream 433 is unpacked to produce result 434.

Figure 37:
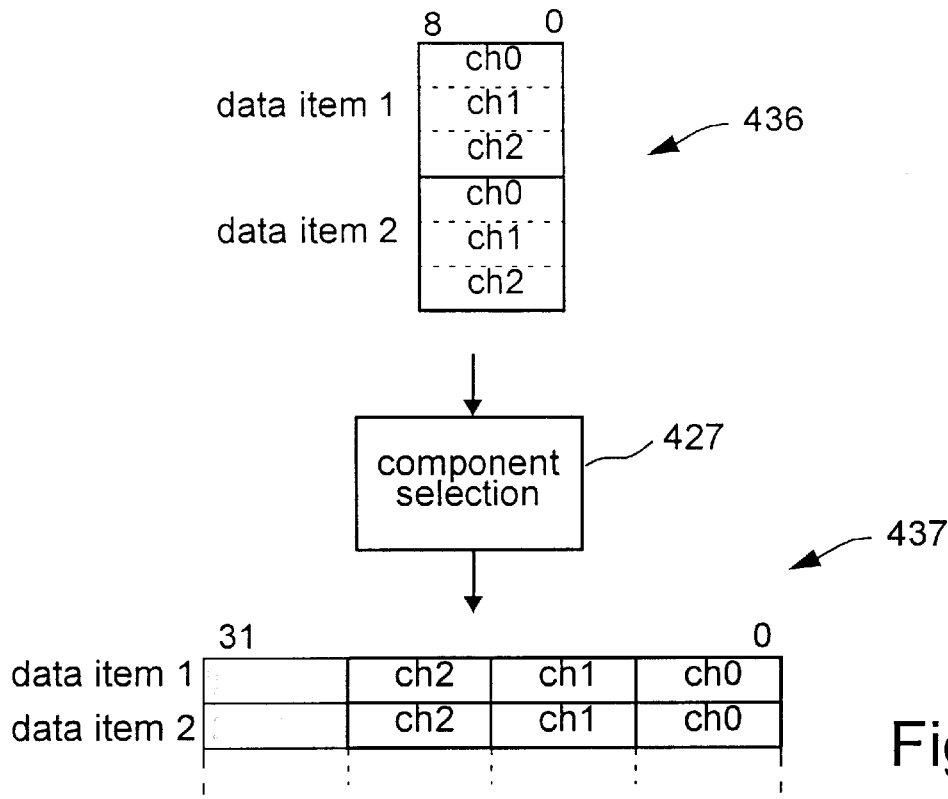
Figure 38:
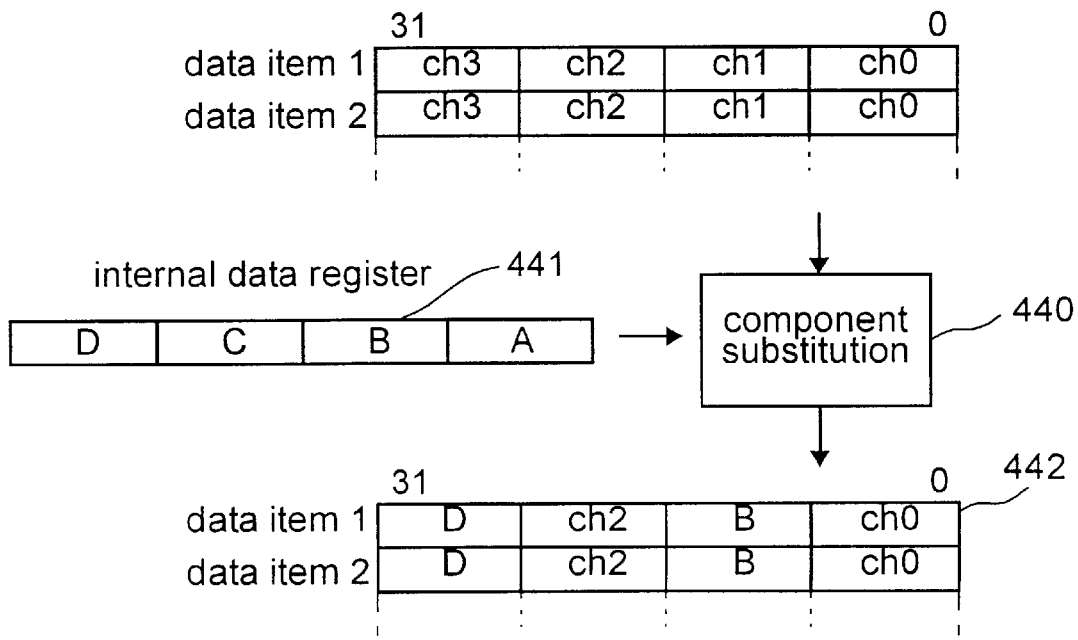

The process of component selection 427 is illustrated in FIG. 37 and involves selecting N components from an input stream, where N is the number of input channels per quantum. The unpacking process can be utilized to produce "prototype pixels" eg. 437, with the pixel channels filled from the least significant byte. Turning to FIG. 38, there is illustrated an example of component selection 440 wherein input data in the form 436 is transformed by the component selection unit 427 to produce prototype pixel format 437.

After component selection, a process of component substitution 440 (FIG. 32) can be utilized. The component substitution process 440 is illustrated in FIG. 38 and comprizes replacing selected components with a constant data value stored within an internal data register 441 to produce, as an example, output components 242.

Figure 39:
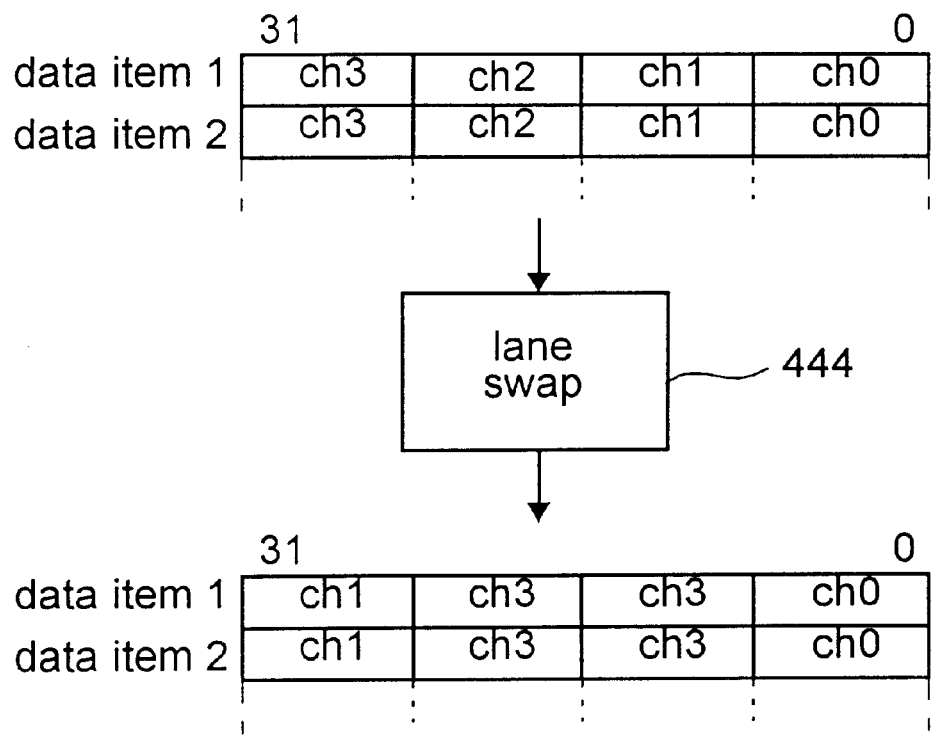

Returning again to FIG. 32, the output of stages 425, 426 and 440 is subjected to a lane swapping process 444. The lane swapping process, as illustrated in FIG. 39. involves a byte-wize multiplexing of any lane to any other lane, including the replication of a first lane onto a second lane. The particular example illustrated in FIG. 39 includes the replacement of channel 3 with channel 1 and the replication of channel 3 to channels 2 and channel 1.

Returning again to FIG. 32, after the lane swapping step 444 the data stream can be optionally stored in the multiused value RAM 250 before being read back and subjected to a replication process 446.

Figure 40:
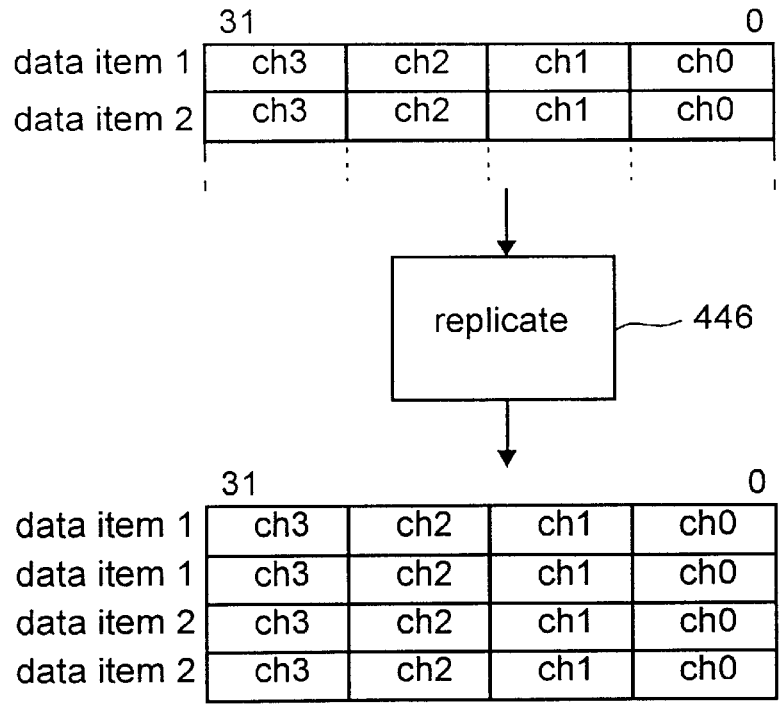

The replication process 446 simply replicates the data object whatever it may be. In FIG. 40, there is illustrated a process of replication 446 as applied to pixel data. In this case, the replication factor is one.

Figure 41:
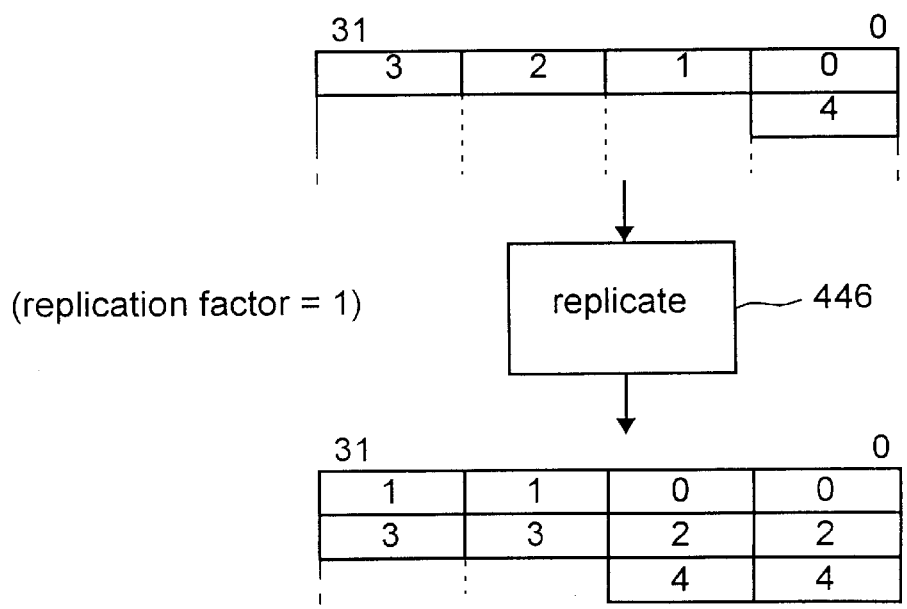

In FIG. 41, there is illustrated a similar example of the process of replication applied to packed byte data.

Figure 42:
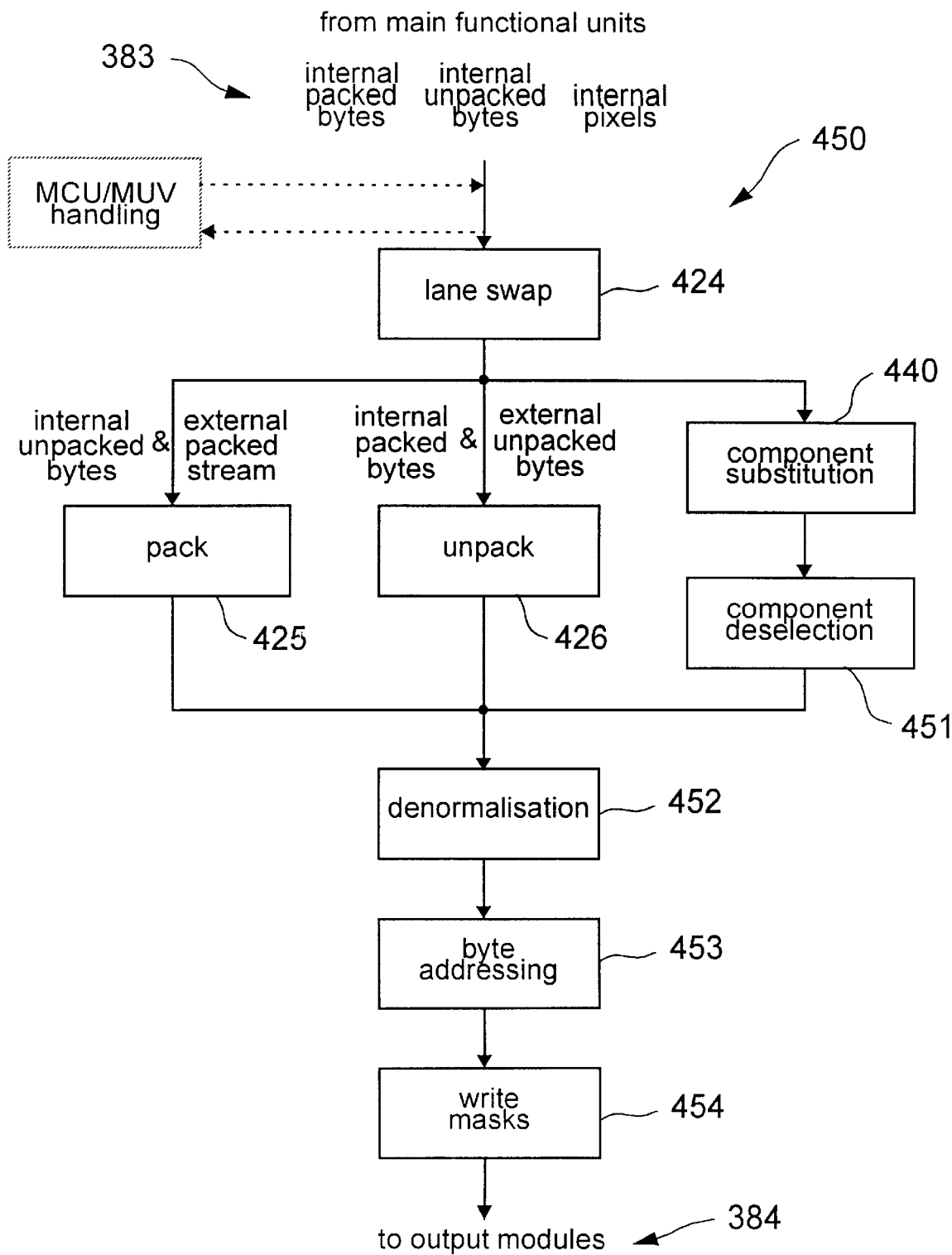
FIG. 42 illustrates various internal to output data transformations carried out by the co-processor.
Figure 43:
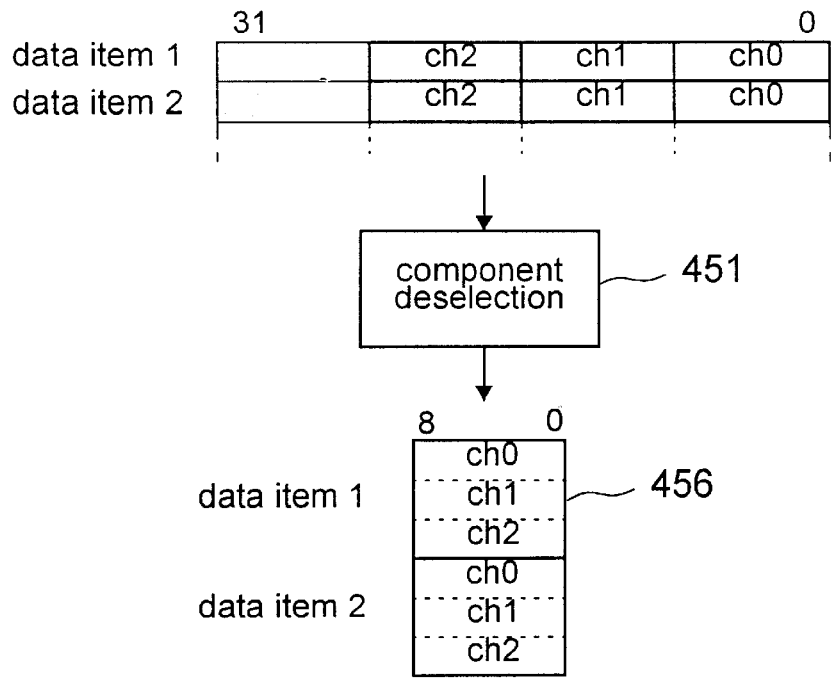
FIGS. 43–47 illustrate various further example data transformations carried out by the co-processor.

In FIG. 42, there is illustrated the process utilized by the result organizer 249 for transferral of data in an output internal format 383 to an output external format 384. This process includes equivalent steps 424, 425, 426 and 440 to the conversion process described in FIG. 32. Additionally, the process 450 includes the steps of component deselection 451, denormalization 452, byte addressing 453 and write masking 454. The component deselection process 451, as illustrated in FIG. 43, is basically the inverse operation of the component selection process 427 of FIG. 37 and involves the discarding of unwanted data. For example, in FIG. 43, only 3 valid channels of the input are taken and packed into data items 456.

Figure 44:
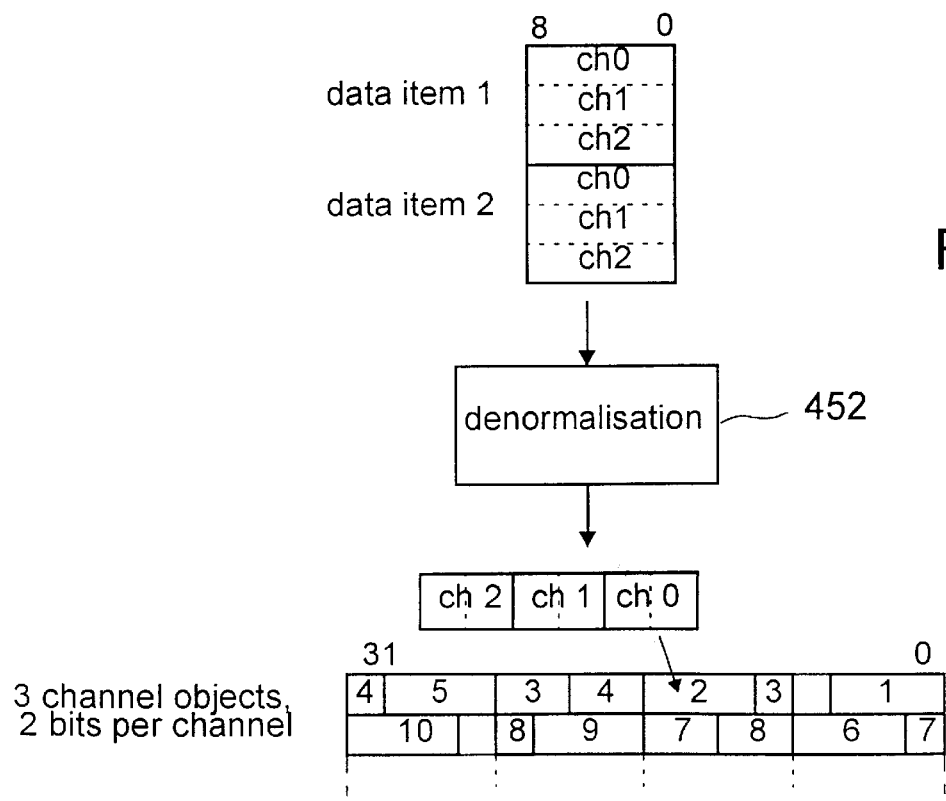

The denormalization process 452 is illustrated with reference to FIG. 44 and is loosely the inverse operation of the packed normalization process 421 of FIG. 34. The denormalization process involves the translation of each object or data item, previously treated as a byte, to a non-byte value.

Figure 45:
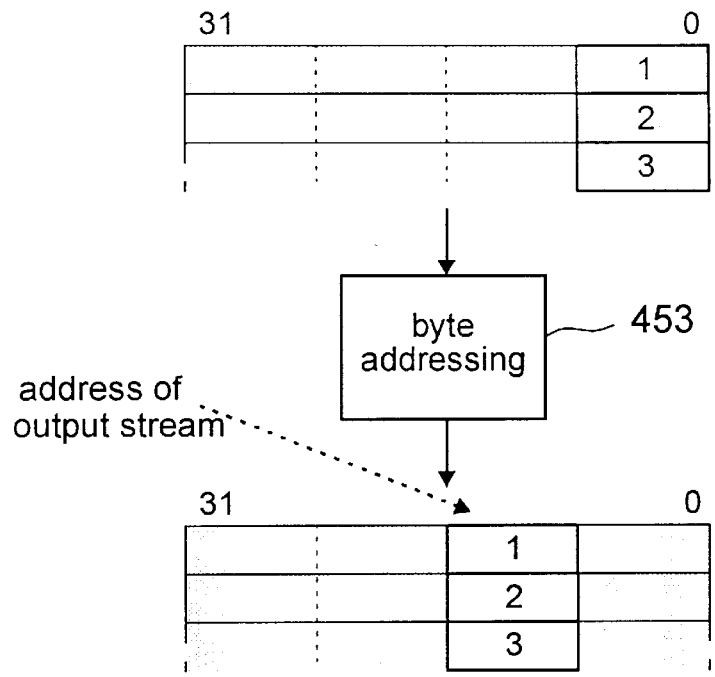
Figure 46:
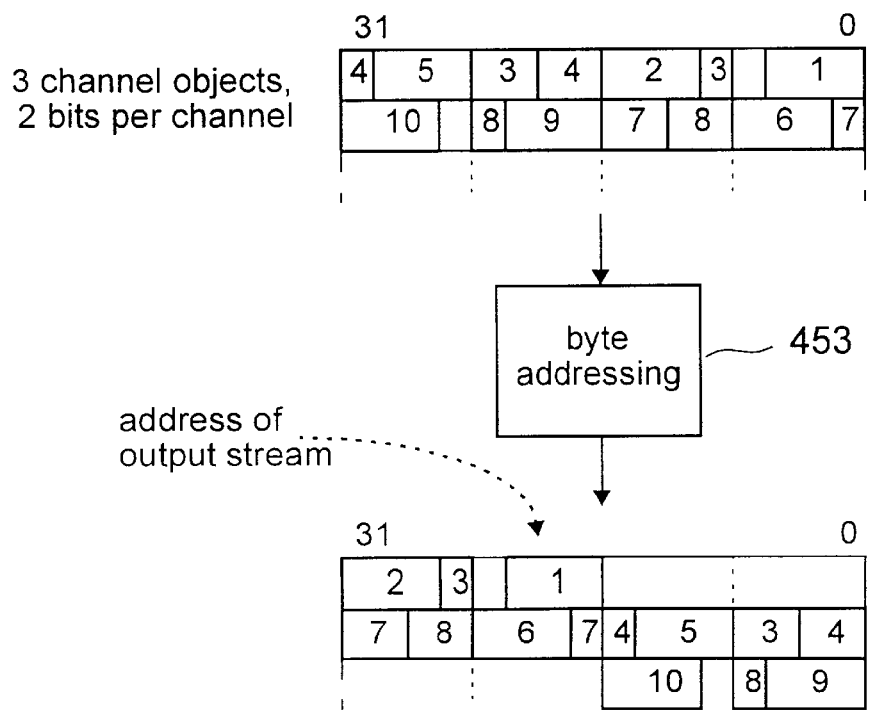

The byte addressing process 453 of FIG. 42 deals with any byte wize reorganization that is necessary to deal with byte addressing issues. For an externally unpacked byte output stream. the least two significant bits of the stream's address correspond to the active stream. The byte addressing step 453 is responsible for re-mapping the output stream from one byte channel to another when external unpacked bytes are utilized (FIG. 45). Where an externally packed stream is utilized (FIG. 46), the byte addressing module 453 remaps the start address of the output stream as illustrated.

Figure 47:
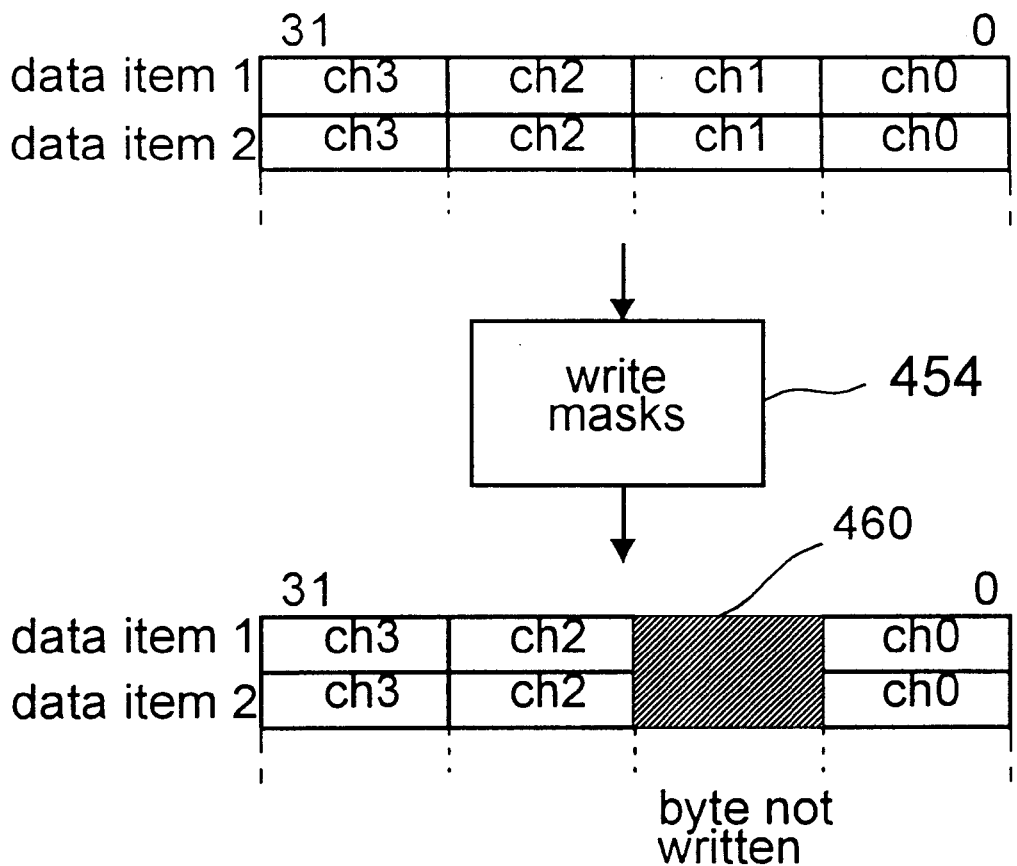

The write masks process 454 of FIG. 42 is illustrated in FIG. 47 and is used to mask off a particular channel eg. 460 of a packed stream which is not to be written out.

The details of the input and output data type conversion to be applied are specified by the contents of the corresponding Data Manipulation Registers:

The Pixel Organizer Data Manipulation Register (po_dmr)

The Operand Organizer B and Operand Organizer C Data Manipulation Registers (oob_dmr, ooc_dmr);

The Result Organizer Data Manipulation Register (ro_dmr);

Each of the Data Manipulation Registers can be set up for an instruction in one of two ways:

1. They can be explicitly set using any of the standard methods for writing to the co-processor's registers immediately prior to the execution of the instruction; or 2. They can be set up by the co-processor itself to reflect a current instruction.

During the instruction decoding process, the co-processor examines the contents of the Instruction Word and the Data Word of the instruction to determine, amongst other things, how to set up the various Data Manipulation Registers. Not all combinations of the instruction and operands make sense. Several instructions have implied formats for some operands. Instructions that are coded with inconsistent operands may complete without error, although any data so generated is "undefined". If the 'S' bit of the corresponding Data Descriptor is 0, the co-processor sets the Data Manipulation Register to reflect the current instruction.

The format of the Data Manipulation Registers is illustrated in FIG. 48. The following table sets out the format of the various bits within the registers as illustrated in FIG. 48:

TABLE 8

Data Manipulation Register Format

| Field | Description |
|---|---|
| ls3 | Lane Swap for byte 3 (most significant byte) |
| ls2 | Lane swap for byte 2 |
| ls1 | Lane swap for byte 1 |
| ls0 | Lane swap for byte 0 |
| suben | Substitution Enables<br>1 = substitute data from Internal Data Register for this byte<br>0 = do not substitute data from Internal Data Register for this byte |
| replicate | Replication Count<br>Indicates the number of additional data items to generate. |
| wrmask | Write Masks<br>0 = write out corresponding byte channel<br>1 = do not write out corresponding byte channel |
| cmsb | Choose most significant bits<br>0 = choose least significant bits of a byte when performing denormalization (useful for halftoning operations)<br>1 = choose most significant bits of a byte when performing denormalization (useful as inverse of input normalization) |
| normalize | Normalization factor: represents the number of bits to be translated to a byte:<br>0 = 1 bit data objects<br>1 = 2 bit data objects<br>2 = 4 bit data objects<br>3 = 8 bit data objects |

TABLE 8-continued

Data Manipulation Register Format

| Field | Description |
|---|---|
| | 4 = 16 bit data objects |
| bo | Bit Offset: represents the starting bit address for objects smaller than a byte. Bit addressing is big endian. |
| P | External Format:<br>0 = unpacked bytes<br>1 = packed stream |
| if | Internal Format:<br>0 = pixels<br>1 = unpacked bytes<br>2 = packed bytes<br>3 = other |
| cc | Channel count:<br>For the Input Organizers this defines the number of normalized input bytes collected to form each internal data word during component selection. For the Output Organizer his defines the number of valid bytes from the internal data word that will be used to construct output data.<br>0 = 4 active channels<br>1 = 1 active channels<br>2 = 2 active channels<br>3 = 3 active channels |
| L | Immediate data:<br>0 = not long: immediate data<br>1 = long: pointer to data |
| what | addressing mode:<br>0 = instruction specific mode<br>1 = sequential addressing<br>2 = tile addressing<br>3 = constant data. ie, one item of internal data is produced, and this item is used repetitively. |

A plurality of internal and external data types may be utilized with each instruction. All operand results and instruction type combinations are potentially valid, although typically only a subset of those combinations will lead to meaningful results. Particular operand and result data types that are expected for each instruction are detailed below in a first table (Table 9) summarising the expected data types for external and internal formats:

TABLE 9

Expected Data Types

| Instruction | Operand A (Pixel Organizer) | | Operand B (Operand Organizer B) | | Operand C (Operand Organizer C) | | Result (Result Organizer) | |
|---|---|---|---|---|---|---|---|---|
| Compositing | ps | px | ps | px (T)<br>bl (B) | ps<br>ub<br>const | ub | px<br>ub | ps<br>ub |
| GCSC | ps<br>ift | ift | mcsc<br>scsc<br>(B) | mcsc<br>scsc<br>(B) | mcsc<br>scsc<br>(B) | mcsc<br>scsc<br>(B) | | |
| JPEG comp. | ps<br>us | pb | et<br>(B) | et (B) | et (B) | et (B) | ub | ps |
| JPEG decomp | ps | pb | fdt<br>sdt<br>(B) | fdt<br>sdt (B) | fdt<br>sdt (B) | fdt<br>sdt<br>(B) | pb | ps<br>ub |
| Data coding | ps<br>ub | px<br>pb<br>ub | et<br>fdt<br>sdt<br>(B) | et<br>fdt<br>sdt (B) | et<br>fdt<br>sdt (B) | et<br>fdt<br>sdt<br>(B) | px<br>pb<br>ub | ps<br>ub |
| Transformations and Convolutions | skd<br>lkd | skd<br>lkd | it (B) | it (B) | it (B) | it (B) | px | ps<br>ub |
| Matrix Multiplication | ps<br>ub | px | mm<br>(B) | mm<br>(B) | mm<br>(B) | mm<br>(B) | px | ps<br>ub |

TABLE 9-continued

| | Expected Data Types | | | | | | | |
|---|---|---|---|---|---|---|---|---|
| Instruction | Operand A (Pixel Organizer) | | Operand B (Operand Organizer B) | | Operand C (Operand Organizer C) | | Result (Result Organizer) | |
| Halftoning | ps | px | ps | px | — | — | px | ps |
| | ub | pb | ub | pb | | | pb | ub |
| | | ub | | ub | | | ub | |
| Hierarchial Image: horizontal interpolation | ps | px | — | — | — | — | px | ps |
| | ub | pb | | | | | pb | ub |
| | | ub | | | | | ub | |
| Hierarchial Image: vertical interpolation and residual merging | ps | px | ps | px | — | — | px | ps |
| | ub | pb | ub | pb | | | pb | ub |
| | | ub | | ub | | | ub | |
| General Memory Copy | ps | px | — | — | — | — | px | ps |
| | ub | pb | | | | | pb | ub |
| | | ub | | | | | ub | |
| Peripheral DMA | — | — | — | — | — | — | — | — |
| Internal Access | — | — | — | — | — | — | — | — |
| Flow Control | — | — | — | — | — | — | — | — |

The symbols utilized in the above table are as follows:

TABLE 10

Symbol Explanation

| Symbol | Explanation |
|---|---|
| ps | packed stream |
| pb | packed bytes |
| ub | unpacked bytes |
| px | pixels |
| bl | blend |
| const | constant |
| mcsc | 4 output channel |
| scsc | 1 output channel color conversion table |
| ift | Interval and Fraction tables |
| et | JPEG encoding table |
| fdt | fast JPEG decoding table |
| sdt | slow JPEG decoding table |
| skd | short kernel descriptor |
| lkd | long kernel descriptor |
| mm | matrix co-efficient table |
| it | image table |
| (B) | this organizer in bypass mode for this operation |
| (T) | operand may tile |
| — | no data flows via this operand |

3.16 Data Normalization Circuit

Figure 49:
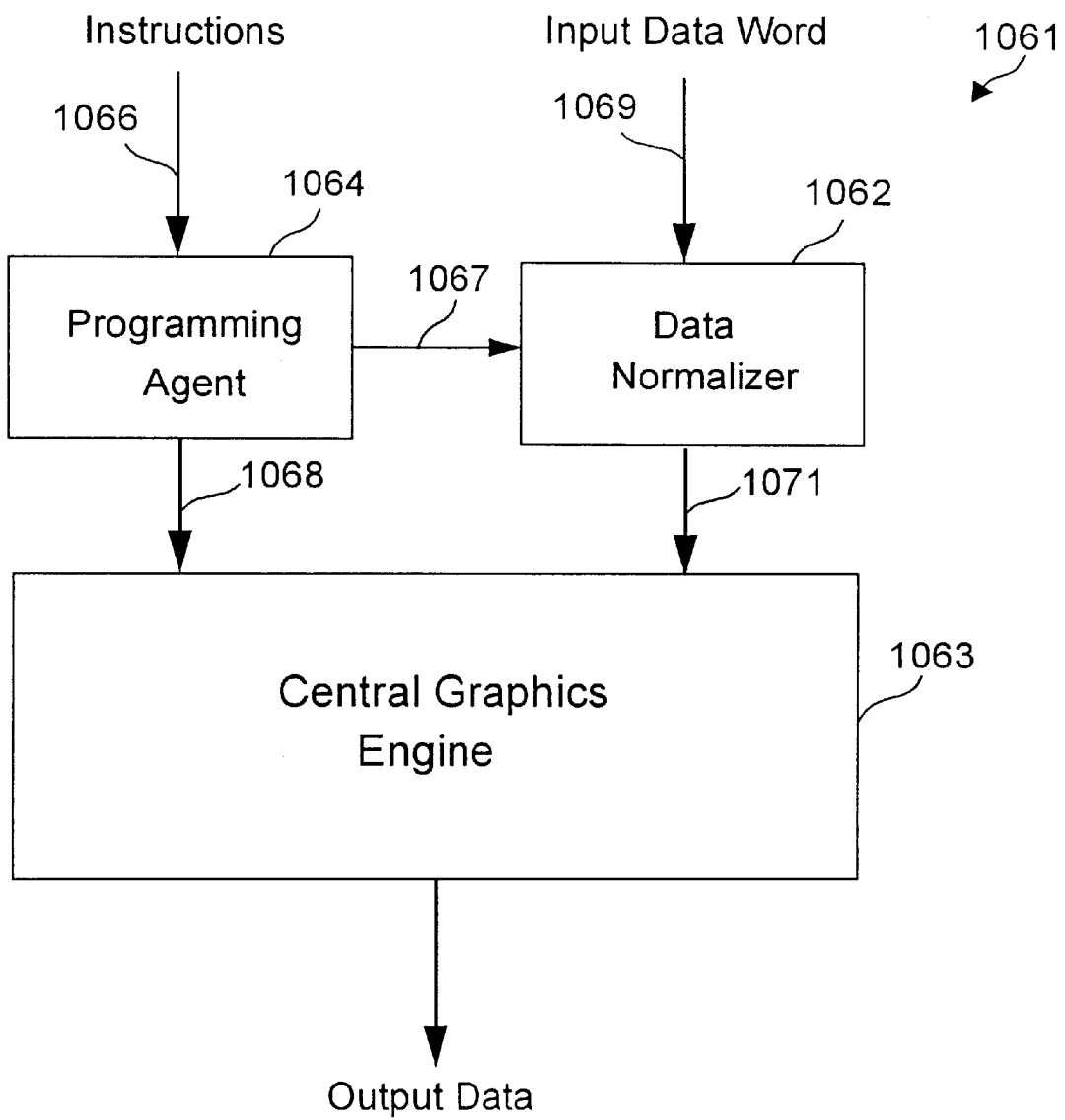
FIG. 49 depicts a block diagram of a graphics subsystem that uses data normalization.

Referring to FIG. 49, there is shown a computer graphics processor having three main functional blocks: a data normalizer 1062 which may be implemented in each of the pixel organizer 246 and operand organizers B and C 247, 248, a central graphics engine in the form of the main data path 242 or JPEG units 241 and a programming agent 1064, in the form of an instruction controller 235. The operation of the data normalizer 1062 and the central graphics engine 1064 is determined by an instruction stream 1066 that is provided to the programming agent 1064. For each instruction, the programming agent 1064 performs a decoding function and outputs internal control signals 1067 and 1068 to the other blocks in the system. For each input data word 1069, the normalizer 1062 will format the data according to the current instruction and pass the result to the central graphics engine 1063, where further processing is performed.

The data normalizer represents, in a simplified form, the pixel organizer and the operand organizers B and C. Each of the organizers implements the data normalization circuitry, thereby enabling appropriate normalization of the input data prior to it passing to the central graphics engine in the form of the JPEG coder or the main data path.

The central graphics engine 1063 operates on data that is in a standard format, which in this case is 32-bit pixels. The normalizer is thus responsible for converting its input data to a 32-bit pixel format. The input data words 1069 to the normalizer are also 32 bits wide, but may take the form of either packed components or unpacked bytes. A packed component input stream consists of consecutive data objects within a data word, the data objects being 1,2,4,8 or 16 bits wide. By contrast, an unpacked byte input stream consists of 32-bit words of which only one 8-bit byte is valid. Furthermore, the pixel data 11 produced by the normalizer may consist of 1,2,3 or 4 valid channels, where a channel is defined as being 8 bits wide.

Figure 50:
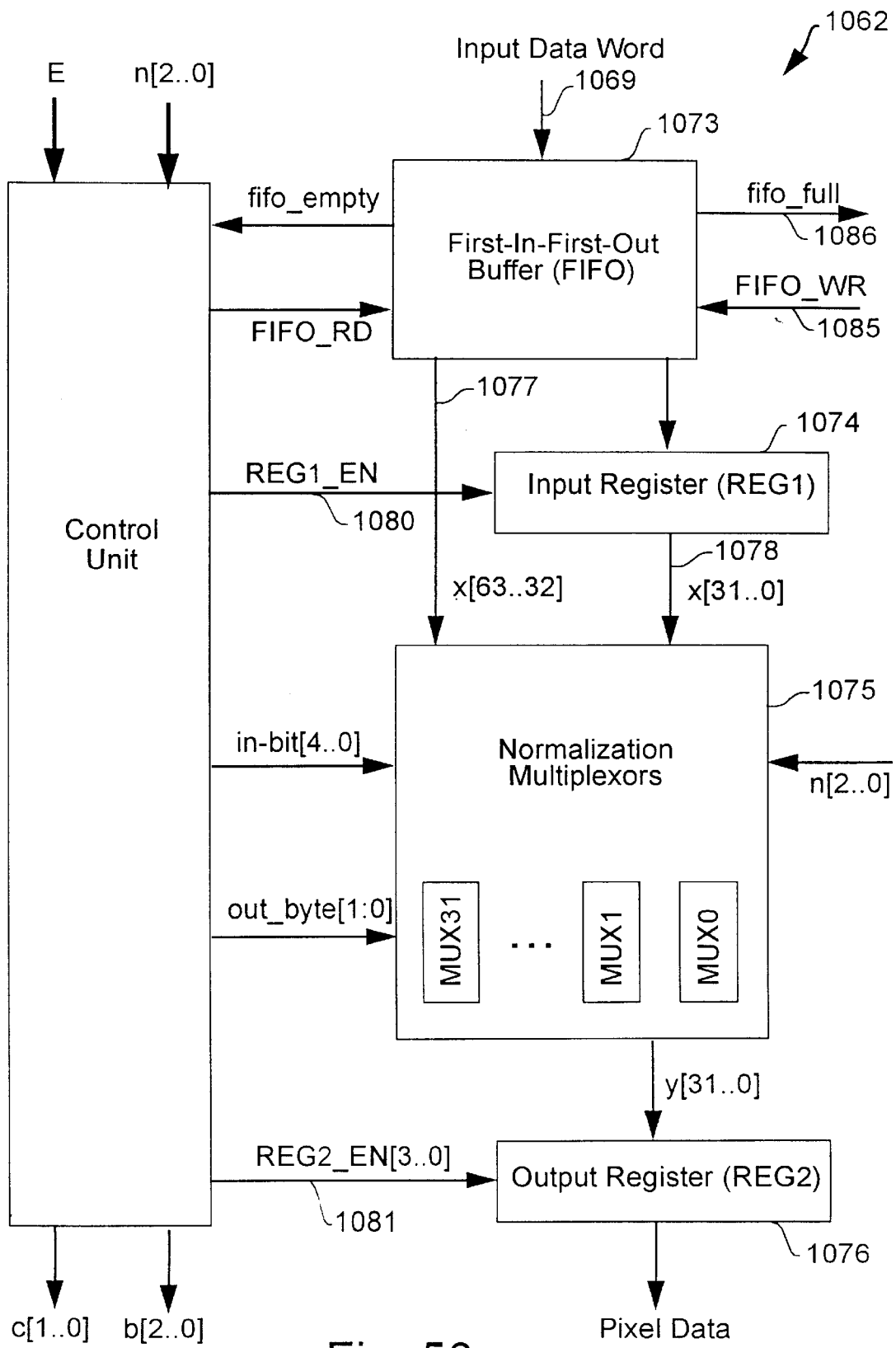
FIG. 50 illustrates a circuit diagram of a data normalization apparatus.

Turning now to FIG. 50, there is illustrated in greater detail a particular hardware implementation of the data normalizer 1062. The data normalization unit 1062 is composed of the following circuits: a First-In-First-Out buffer (FIFO) 1073, a 32-bit input register (REG1) 1074, a 32-bit output register (REG2) 1076, normalization multiplexors 1075 and a control unit 1076. Each input data word 1069 is stored in the FIFO 1073 and is subsequently latched into REG1 1074, where it remains until all its input bits have been converted into the desired output format. The normalization multiplexors 1075 consist of 32 combinatorial switches that produce pixels to be latched into REG2 by selecting bits from the value in REG1 1074 and the current output of the FIFO 1073. Thus the normalization multiplexors 1075 receive two 32-bit input words 1077, 1078. denoted as x[63 . . . 32] and x[31 . . . 0].

It has been found that such a method improves the overall throughput of the apparatus, especially when the FIFO contains at least two valid data words during the course of an instruction. This is typically due to the way in which data words originally fetched from memory. In some cases, a desired data word or object may be spread across or "wrapped" into a pair of adjacent input data words in the FIFO buffer. By using an additional input register 1074, the normalization multiplexers can reassemble a complete input data word using components from adjacent data words in the FIFO buffer, thereby avoiding need for additional storage or bit-stripping operations prior to the main data manipulation stages. This arrangement is particularly advantageous where multiple data words of a similar type are inputted to the normalizer.

The control unit generates enable signals REG1_EN 20 and REG2_EN[3 . . . 0] 1081 for updating REG1 1074 and REG2 1076. respectively, as well as signals to control the FIFO 1073 and normalization multiplexors 1075.

The programming agent 1064 in FIG. 49 provides the following configuration signals for the data normalizer 1062: a FIFO_WR 4 signal, a normalization factor n[2 . . . 0], a bit offset b[2 . . . 0], a channel count c[1 . . . 0] and an external format (E). Input data is written into the FIFO 1073 by asserting the FIFO_WR signal 1085 for each clock cycle that valid data is present. The FIFO asserts a tifo full status flag 1086 when there is no space available. Given 32-bit input data, the external format signal is used to determine whether the input is in the format of a packed stream (when E=1) or consists of unpacked bytes (when E=0). For the case when E=1, the normalization factor encodes the size of each component of a packed stream, namely: n=0 denotes 1-bit wide components, n=1 denotes 2 bits per component, n=2 denotes 4 bits per component, n=3 denotes 8-bit wide components and n>3 denotes 16-bit wide components. The channel count encodes the maximum number of consecutive input objects to format per clock cycle in order to produce pixels with the desired number of valid bytes. In particular, c=1 yields pixels with only the least significant byte valid, c=2 denotes least significant 2 bytes valid, c=3 denotes least significant 3 bytes valid and c=0 denotes all 4 bytes valid.

When a packed stream consists of components that are less than 8 bits wide, the bit offset determines the position in x[31 . . . 0], the value stored in REG1, from which to begin processing data. Assuming a bit offset relative to the most significant bit of the first input byte, the method for producing an output data byte y[7 . . . 0] is described by the following set of equations:

where $n = 0$:

$y[i] = x[7 - b]$,  where $0 <= i <= 7$ where $n = 1$:

$y[i] = x[7 - b]$,  where $i = 1, 3, 5, 7$
$y[i] = x[6 - b]$,  where $i = 0, 2, 4, 6$ where $n = 2$:

$y[3] = x[7 - b]$
$y[2] = x[6 - b]$
$y[1] = x[5 - b]$
$y[0] = x[4 - b]$
$y[7] = y[3]$
$y[6] = y[2]$
$y[5] = y[1]$
$y[4] = y[0]$ where $n = 3$:

$y[i] = x[i]$,  where $0 <= i < = 7$ where $n > 3$:

$y[7 \ldots 0] = x[15 \ldots 8]$

Corresponding equations may be used to generate output data bytes y[15 . . . 8], y[23 . . . 16] and y[31 . . . 24].

The above method may be generalized to produce an output array of any length by taking each component of the input stream and replicating it as many times as necessary to generate output objects of standard width. In addition, the order of processing each input component may be defined as little-endian or big-endian. The above example deals with big-endian component ordering since processing always begins from the most significant bit of an input byte. Little-endian ordering requires redefinition of the bit offset to be relative to the least significant bit of an input byte. In situations where the input component width exceeds the standard output width, output components are generated by truncating each input component, typically by removing a suitable number of the least significant bits. In the above set of equations, truncation of 16-bit input components to form 8-bit wide standard output is performed by selecting the most significant byte of each 16-bit data object.

The control unit of FIG. 50 performs the decoding of n[2 . . . 0] and c[1 . . . 0], and uses the result along with b[2 . . . 0] and E to provide the select signals for the normalization multiplexors and the enable signals for REG1 and REG2. Since the FIFO may become empty during the course of an instruction, the control unit also contains counters that record the current bit position, in_bit[4 . . . 0], in REG1 from which to select input data, and the current byte, out_byte[1 . . . 0], in REG2 to begin writing output data. The control unit detects when it has completed processing each input word by comparing the value of in_bit [4 . . . 0] to the position of the final object in REG1, and initiates a FIFO read operation by asserting the FIFO_RD signal for one clock cycle when the FIFO is not empty. The signals fifo_empty and fifo_full denote the FIFO status flags, such that fifo_empty=1 when the FIFO contains no valid data, and fifo_full=1 when the FIFO is full. In the same clock cycle that FIFO_RD is asserted, REG1 EN is asserted so that new data are captured into REG1. There are 4 enable signals for REG2, one for each byte in the output register. The control unit calculates REG2_EN[3 . . . 0] by taking the minimum of the following 3 values: the decoded version of c[1 . . . 0], the number of valid components remaining to be processed in REG1, and the number of unused channels in REG2. When E=0 there is only one valid component in REG1. A complete output word is available when the number of channels that have been filled in REG2 is equal to the decoded version of c[1 . . . 0].

In a particularly preferred embodiment of the invention, the circuit area occupied by the apparatus in FIG. 50 can be substantially reduced by applying a truncation function to the bit offset parameter, such that only a restricted set of offsets are used by the control unit and normalization multiplexors. The offset truncation depends upon the normalization factor and operates according to the following equation:

$b\_trunc[2 \ldots 0] = 0$, where $n >= 3$
$= b[2 \ldots 0]$, where $n = 0$
$= b[2 \ldots 1]$ & "0", where $n = 1$
$= b[2]$ & "00", where $n = 2$ (Note that "&" denotes bitwize concatenation).

The above method allows each of the normalization multiplexors, denoted in FIG. 50 by MUX0, MUX1 . . . MUX31, to be reduced from 32-to-1 in size when no truncation is applied, to be a maximum size of 20-to-1 with bit offset truncation. The size reduction in turn leads to an improvement in circuit speed.

It can be seen from the foregoing that the preferred embodiment provides an efficient circuit for the transformation of data into one of a few normalized forms.

3.17 Image Processing Operations of Accelerator Card

Returning again to FIG. 2 and Table 2, as noted previously, the instruction controller 235 "executes" instructions which result in actions being performed by the co-processor 224. The instructions executed include a number of instructions for the performance of useful functions by the main data path unit 242. A first of these useful instructions is compositing.

3.17.1 Compositing

Figure 51:
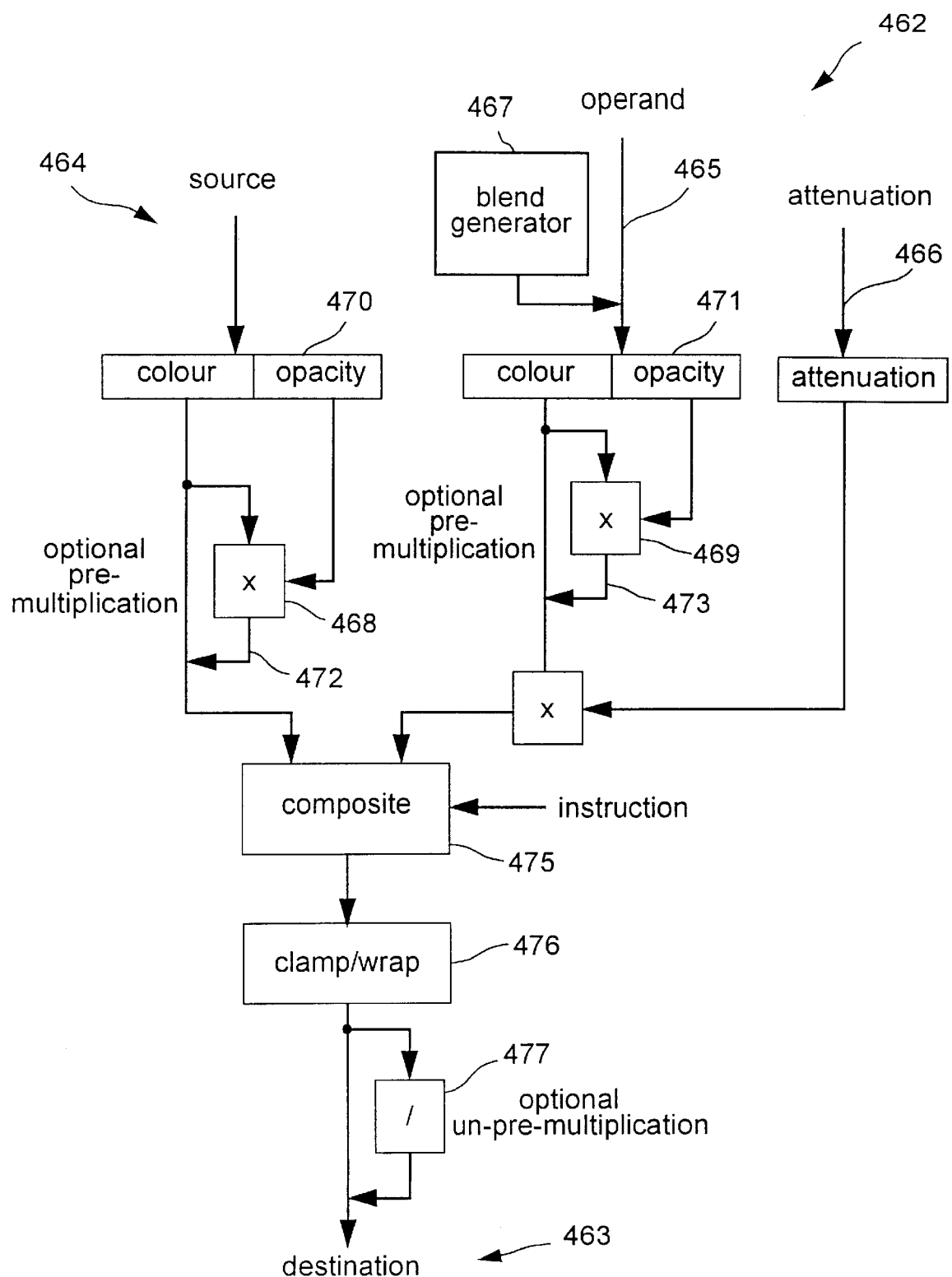
FIG. 51 illustrates the pixel processing carried out for compositing operations.

Referring now to FIG. 51, there is illustrated the compositing model implemented by the main data path unit 242. The compositing model 462 generally has three input sources of data and the output data or sink 463. The input sources can firstly include pixel data 464 from the same destination within the memory as the output 463 is to be written to. The instruction operands 465 can be utilized as a data source which includes the color and opacity information. The color and opacity can be either flat, a blend, pixels or tiled. The flat or blend is generated by the blend generator 467. as it is quicker to generate them internally than to fetch via input/output. Additionally, the input data can include attenuation data 466 which attenuates the operand data 465. The attenuation can be flat, bit map or a byte map.

As noted previously, pixel data normally consists of four channels with each channel being one byte wide. The opacity channel is considered to be the byte of highest address. For an introduction to the operation and usefulness of compositing operations, reference is made to the standard texts including the seminal paper by Thomas Porter and Tom Duff "Compositing Digital Images" in Computer Graphics, Volume 18, Number 3, July 1984.

The co-processor can utilize pre-multiplied data. Pre-multiplication can consist of pre-multiplying each of the colored channels by the opacity channel. Hence, two optional pre-multiplication units 468, 469 are provided for pre-multiplying the opacity channel 470, 471 by the colored data to form, where required, pre-multiplied outputs 472, 473. A compositing unit 475 implements a composite of its two inputs in accordance with the current instruction data. The compositing operators are illustrated in Table 11 below:

TABLE 11

Compositing Operations

| Operator | Definition |
| --- | --- |
| $(a_{co}, a_o)$ over $(b_{co}, b_o)$ | $(a_{co}+b_{co}(1-a_o), a_o+b_o(1-a_o))$ |
| $(a_{co}, a_o)$ in $(b_{co}, b_o)$ | $(a_{co}B_o, a_o b_o)$ |
| $(a_{co}, a_o)$ out $(b_{co}, b_o)$ | $(a_{co}(1-b_o), a_o(1-b_o))$ |
| $(a_{co}, a_o)$ atop $(b_{co}, b_o)$ | $(a_{co}b_o+b_{co}(1-a_o), b_o)$ |
| $(a_{co}, a_o)$ xor $(b_{co}, b_o)$ | $(a_{co}(1-b_o)+b_{co}(1-a_o), a_o(1-b_o)+b_o(1-a_o))$ |
| $(a_{co}, a_o)$ plus $(b_{co}, b_o)$ | $(wc(a_{co}+b_{co}-r(a_o+b_o-255)/255)+r(\text{clamp}(a_o+b_o)-255)/255, \text{clamp}(a_o+b_o))$ |
| $(a_{co}, a_o)$ loadzero $(b_{co}, b_o)$ | $(0,0)$ |
| $(a_{co}, a_o)$ loadc $(b_{co}, b_o)$ | $(b_{co}, a_o)$ |
| $(a_{co}, a_o)$ loado $(b_{co}, b_o)$ | $(a_{co}, b_o)$ |
| $(a_{co}, a_o)$ loadco $(b_{co}, b_o)$ | $(b_{co}, b_o)$ |

The nomenclature $(a_{co}, a_o)$ refers to a pre-multiplied pixel of color $a_c$ and opacity $a_o$. R is an offset value and "wc" is a wrapping/clamping operator whose operation is explained below. It should be noted that the reverse operation of each operator in the above table is also implemented by a compositing unit 475.

A clamp/wrapping unit 476 is provided to clamp or wrap data around the limit values 0–255. Further, the data can be subjected to an optional "unpre-multiplication" 477 restoring the original pixel values as required. Finally, output data 463 is produced for return to the memory.

Figure 52:
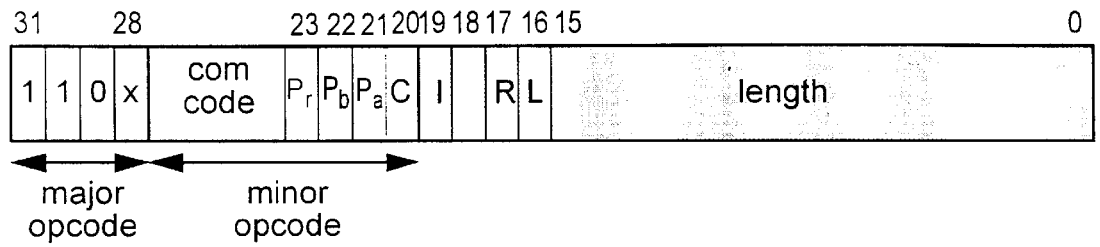
FIG. 52 illustrates the instruction word format for compositing operations.

In FIG. 52, there is illustrated the form of an instruction word directed to the main data path unit for compositing operations. When the X field in the major op-code is 1, this indicates a plus operator is to be applied in accordance with the aforementioned table. When this field is 0, another instruction apart from the plus operator is to be applied. The $P_a$ field determines whether or not to pre-multiply the first data stream 464 (FIG. 51). The $P_b$ field determines whether or not to pre-multiply the second data stream 465. The $P_r$ field determines whether or not to "unpre-multiply" the result utilising unit 477. The C field determines whether to wrap or clamp, overflow or underflow in the range 0–255. The "com-code" field determines which operator is to be applied. The plus operator optionally utilizes an offset register (mdp_por). This offset is subtracted from the result of the plus operation before wrapping or clamping is applied. For plus operators, the com-code field is interpreted as a per channel enablement of the offset register.

The standard instruction word encoding 280 of FIG. 10 previously discussed is altered for compositing operands. As the output data destination is the same as the source, operand A will always be the same operand as the result word so operand A can be utilized in conjunction with operand B to describe at greater length the operand B. As with other instructions, the A descriptor within the instructions still describes the format of the input and the R descriptor defines the format of the output.

Figure 53:
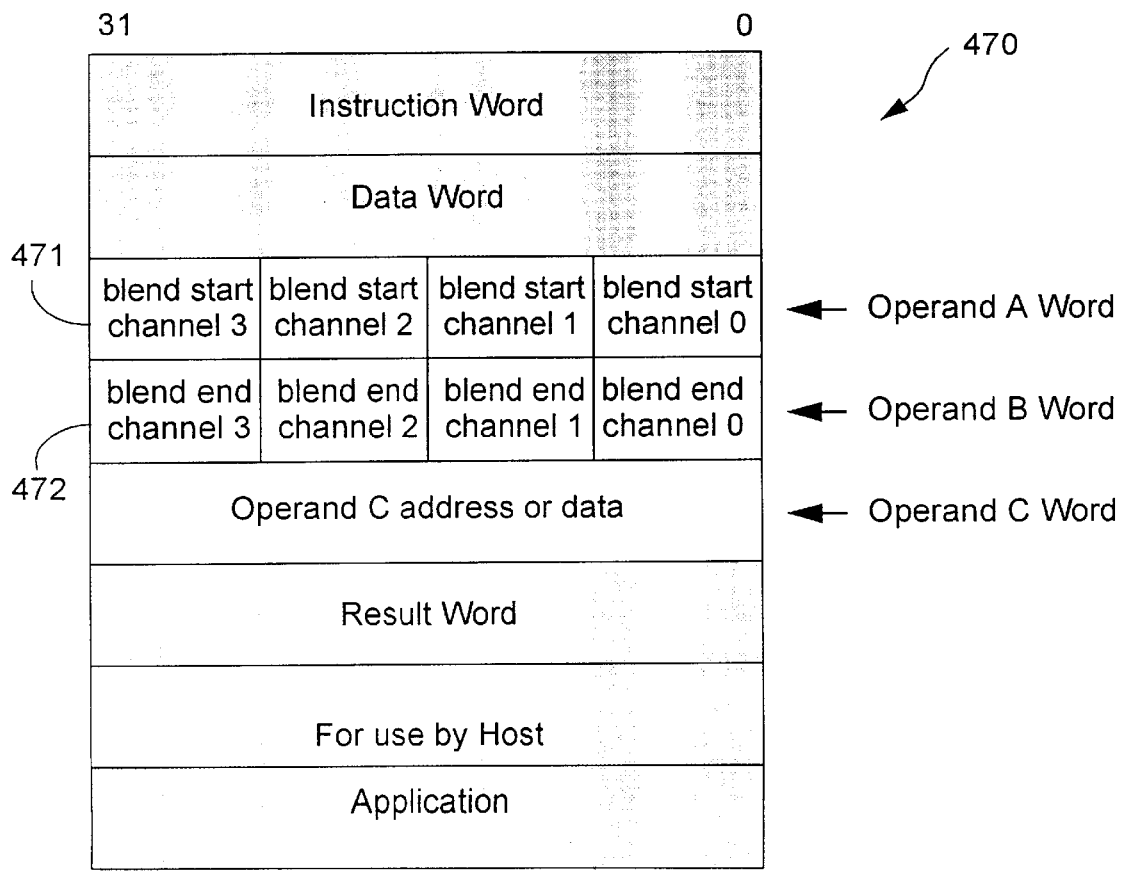
FIG. 53 illustrates the data word format for compositing operations.
Figure 54:
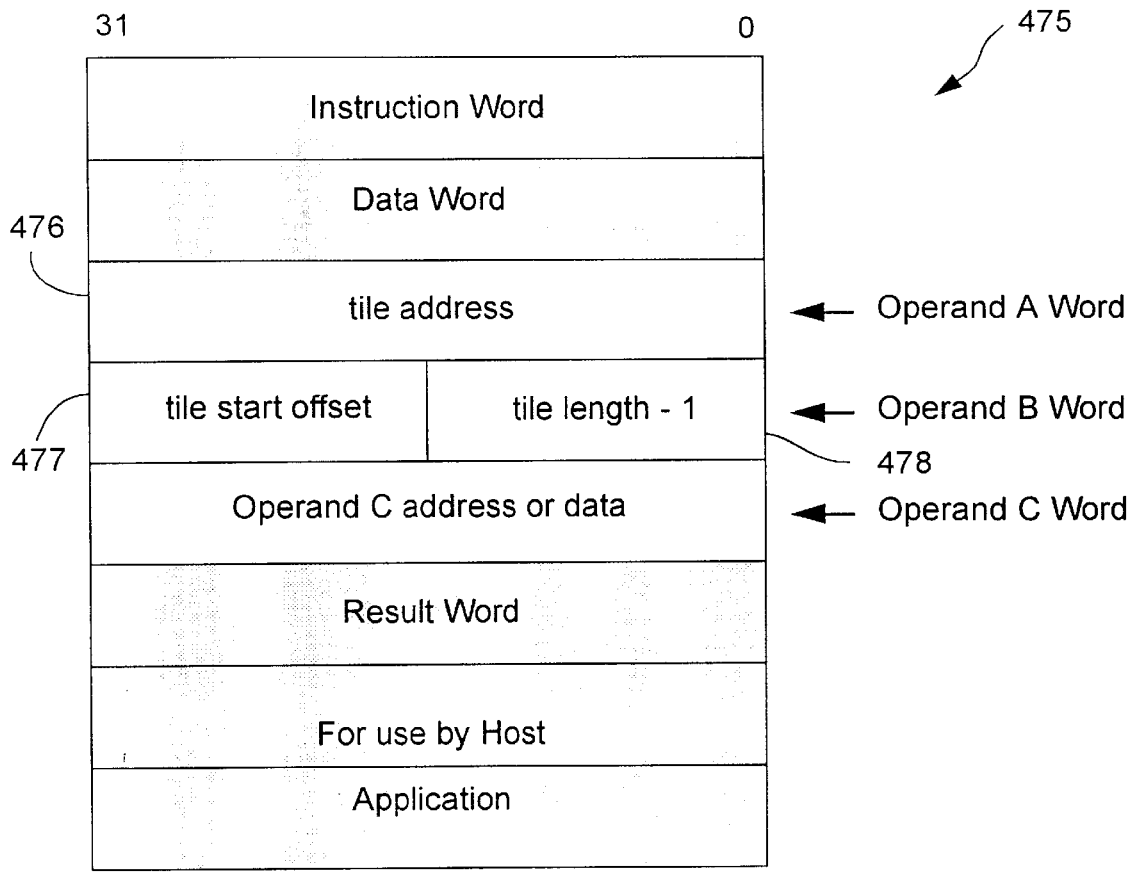
FIG. 54 illustrates the instruction word format for tiling operations.
Figure 55:
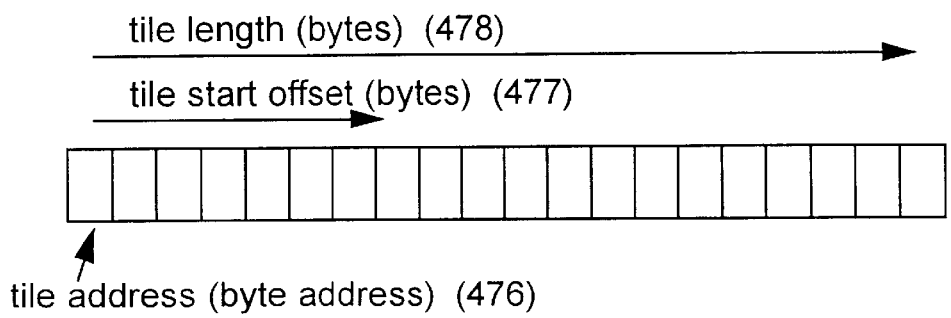
FIG. 55 illustrates the operation of a tiling instruction on an image.

Turning now to FIG. 53, there is illustrated in a first example 470, the instruction word format of a blend instruction. A blend is defined to have a start 471 and end value 472 for each channel. Similarly, in FIG. 54 there is illustrated 475 the format of a tile instruction which is defined by a tile address 476 a start offset 477, a length 478. All tile addresses and dimensions are specified in bytes. Tiling is applied in a modular fashion and, in FIG. 55, there is shown the interpretation of the fields 476–478 of FIG. 54. The tile address 476 denotes the start address in memory of the tile. A tile start offset 477 designates the first byte to be utilized as a start of the tile. The tile length 478 designates the total length of the tile for wrap around.

Returning to FIG. 51, every color component and opacity can be attenuated by an attenuation value 466. The attenuation value can be supplied in one of three ways:

1. Software can specify a flat attenuation by placing the attenuation factor in the operand C word of the instruction.
2. A bit map attenuation where 1 means fully on and 0 means fully off can be utilized with software specifying the address of the bit map in the operand C word of the instruction.
3. Alternatively, a byte map attenuation can be provided again with the address of the byte map in operand C.

Since the attenuation is interpreted as an unsigned integer from 0–255, the pre-multiplied color channel is multiplied by the attenuation factor by effectively calculating:

$$C_{oa} = C_{oa} \times A/255$$

Where A is the attenuation and $C_o$ is the pre-multiplied color channel.

3.17.2 Color Space Conversion Instructions

Returning again to FIG. 2 and Table 2, the main data path unit 242 and data cache 230 are also primarily responsible for color conversion. The color space conversion involves the conversion of a pixel stream in a first color space format, for example suitable for RGB color display, to a second color space format, for example suitable for CYM or CYMK printing. The color space conversion is designed to work for all color spaces and can be used for any function from at least one to one or more dimensions.

The instruction controller 235 configures, via the Cbus 231, the main data path unit 242, the data cache controller 240, the input interface switch 252, the pixel organizer 246, the MUV buffer 250, the operand organizer B 247, the operand organizer C 248 and the result organizer 249 to operate in the color conversion mode. In this mode, an input image consisting of a plurality of lines of pixels is supplied, one line of pixels after another, to the main data path unit 242 as a stream of pixels. The main data path unit 242 (FIG. 2) receives the stream of pixels from the input interface switch 252 via the pixel organizer 246 for color space conversion processing one pixel at a time. In addition, interval and fractional tables are pre-loaded into the MUV buffer 250 and color conversion tables are loaded into the data cache 230. The main data path unit 242 accesses these tables via the operand organizers B and C, and converts these pixels, for example from the RGB color space to the CYM or CYMK color space and supplies the converted pixels to the result organizer 249. The main data path unit 242, the data cache 230, the data controller 240 and the other above mentioned devices are able to operate in either of the following two modes under control of the instruction controller 235; a Single Output General Color Space (SOGCS) Conversion mode or a Multiple Output General Color Space (MOGCS) Conversion Mode. For more details on the data cache controller 240 and data cache 230, reference is made to the section entitled Data Cache Controller and Cache 240, 230 (FIG. 2).

Accurate color space conversion can be a highly non-linear process. For example, color space conversion of a RGB pixel to a single primary color component (e.g. cyan) of the CYMK color space is theoretically linear, however in practice non-linearities are introduced typically by the output device which is used to display the colour components of the pixel. Similarly for the color space conversion of the RGB pixel to the other primary color components (yellow, magenta or black) of the CYMK color space. Consequently a non-linear colour space conversion is typically used to compensate for the non-linearities introduced on each colour component. The highly non-linear nature of the color conversion process requires either a complex transfer function to be implemented or a look-up table to be utilized. Given an input color space of, for example, 24 bit RGB pixels, a look-up table mapping each of these pixels to a single 8 bit primary color component of the CYMK color space (i.e. cyan) would require over 16 megabytes. Similarly, a look-up table simultaneously mapping the 24 bit RGB pixels to all four 8 bit primary color components of the CYMK color space would require over 64 megabytes, which is obviously excessive. Instead, the main data path 242 (FIG. 2) uses a look-up table stored in the data cache 230 having sparsely located output color values corresponding to points in the input color space and interpolates between the output color values to obtain an intermediate output.

a. Single Output General Color Space (SOGCS) Conversion Mode

In both the single and multiple output color conversion modes (SOGCS) and (MOGCS), the RGB color space is comprized of 24 bit pixels having 8 bit red, green and blue color components. Each of the RGB dimensions of the RGB color space is divided into 15 intervals with the length of each interval having a substantially inverse proportionality to the non-linear behavior of the transfer function between the RGB to CYMK color space of the printer. That is, where the transfer function has a highly non-linear behavior the interval size is reduced and where the transfer function has a more linear behavior, the size of the interval is increased. Preferably, the color space of each output printer is accurately measured to determine those non-linear portions of its transfer function. However, the transfer function can be approximated or modelled based on know-how or measured characteristics of a type printer (e.g.: ink-jet). For each color channel of an input pixel, the color component value defines a position within one of the 15 intervals. Two tables are used by the main data path unit 242 to determine which interval a particular input color component value lies within and also to determine a fraction along the interval in which a particular input color component value lies. Of course, different tables may be used for output printers having different transfer functions.

As noted previously. each of the RGB dimensions is divided into 15 intervals. In this way the RGB color space forms a 3-dimensional lattice of intervals and the input pixels at the ends of the intervals form sparsely located points in the input color space. Further, only the output color values of the output color space corresponding to the end-points of the intervals are stored in look-up tables. Hence, an output color value of an input color pixel can be calculated by determining the output color values corresponding to the endpoints of the intervals within which the input pixel lies and interpolating such output color values utilising the fractional values. This technique reduces the need for large memory storage.

Figure 56:
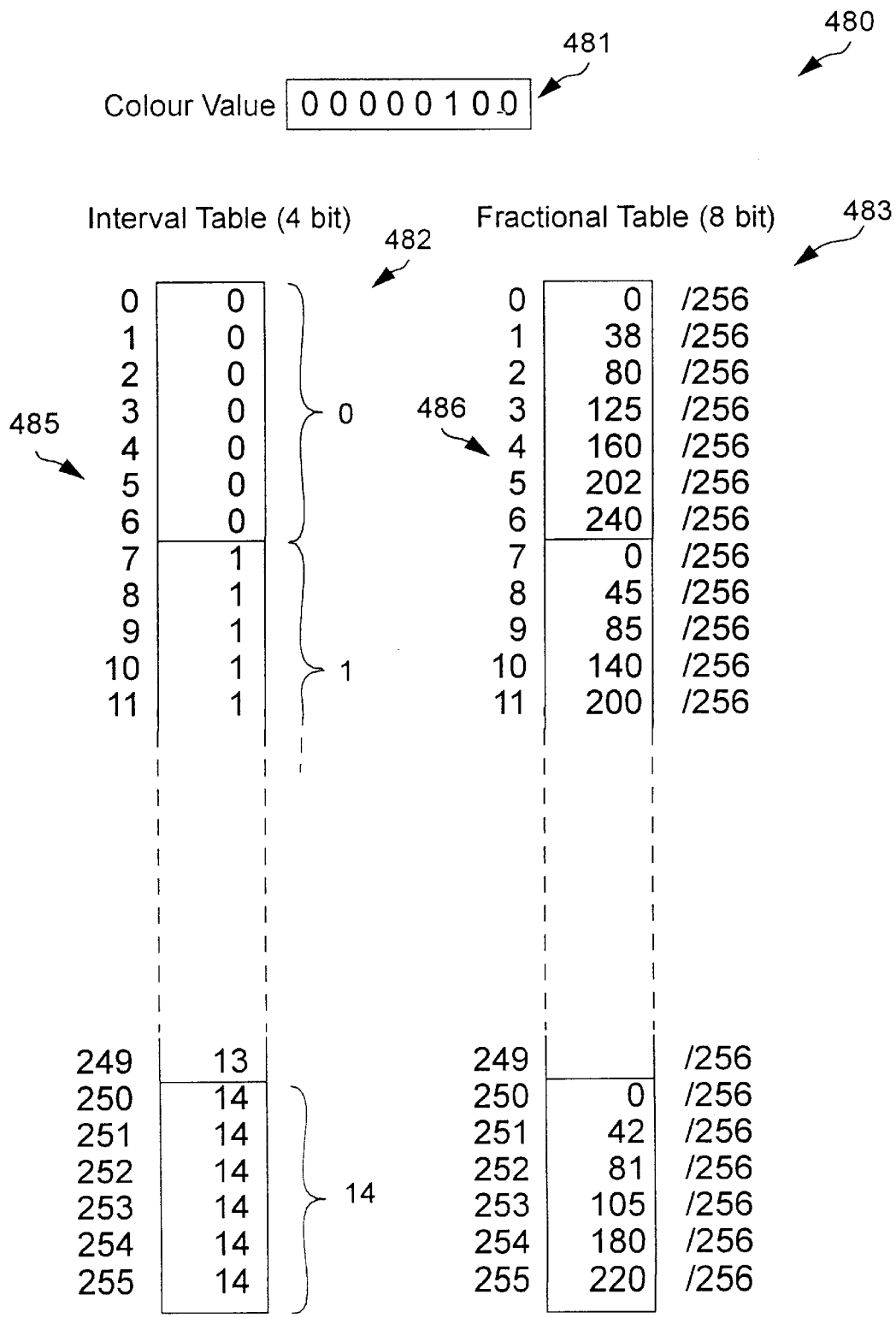
FIG. 56 illustrates the process of utilization of interval and fractional tables to re-map color gamuts.

Turning now to FIG. 56, there is illustrated 480 an example of determining for a particular input RGB color pixel, the corresponding interval and fractional values. The conversion process relies upon the utilization of an interval table 482 and a fractional table 483 for each 8 bit input color channel of the 24 bit input pixel. The 8 bit input color component 481, shown in a binary form in FIG. 56 having the example decimal number 4, is utilized as a look-up to each of the interval and fractional tables. Hence, the number of entries in each table is 256. The interval table 482 provides a 4 bit output defining one of the intervals numbered 0 to 14 into which the input color component value 481 falls. Similarly, the fractional table 483 indicates the fraction within an interval that the input color value component 481 falls. The fractional table stores 8 bit values in the range of 0 to 255 which are interpreted as a fraction of 256. Hence, for an input color value component 481 having a binary equivalent to the decimal value 4, this value is utilized to look-up the interval table 482 to produce an output value of 0. The input value 4 is also utilized to look-up the fractional table 483 to produce an output value of 160 which designates the fraction 160/256. As can be seen from the interval and fractional tables 482 and 483, the interval lengths are not equal. As noted previously the length of the intervals are chosen according to the non-linear behavior of the transfer function.

Figure 57:
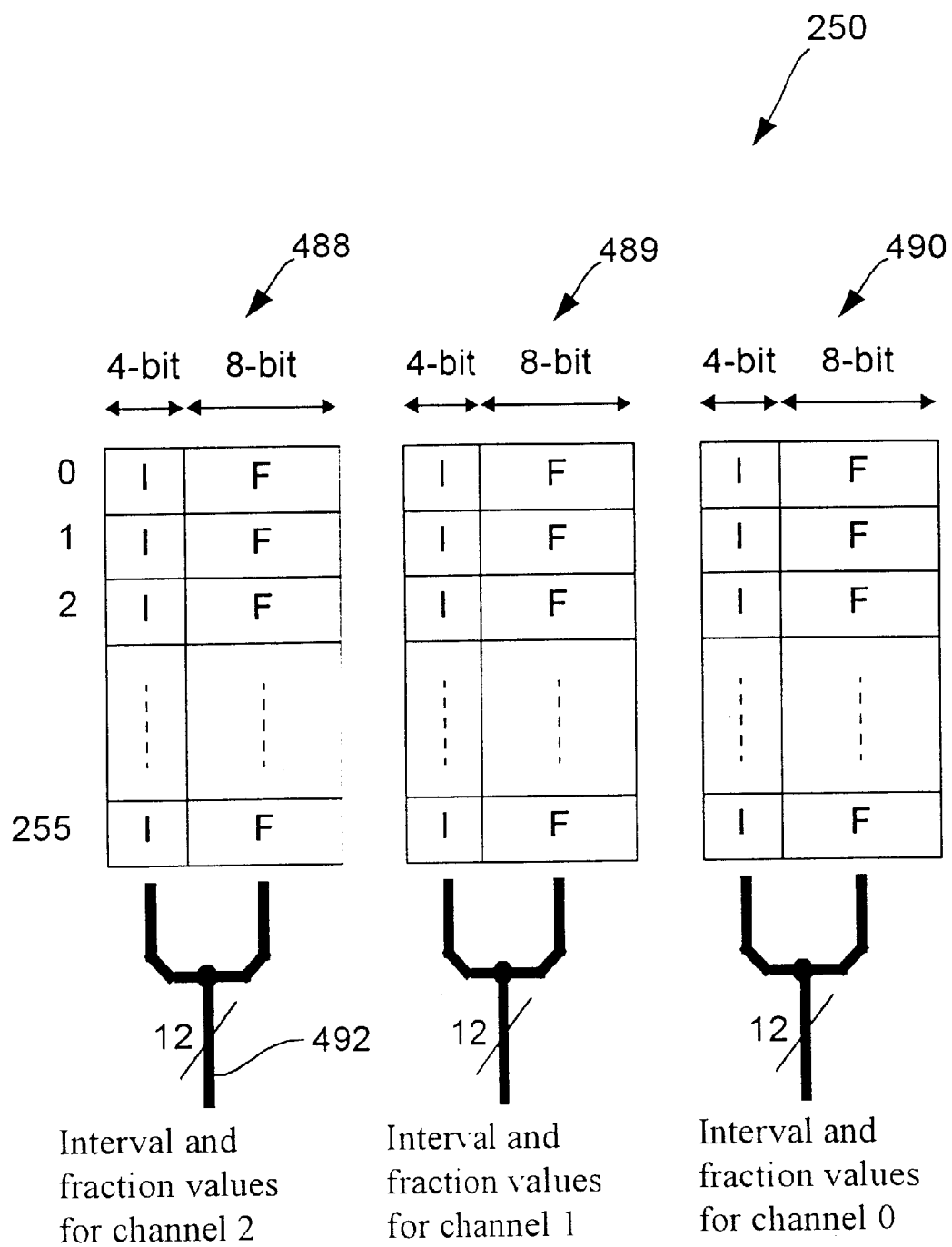
FIG. 57 illustrates the form of storage of interval and fractional tables within the MUV buffer of the co-processor.

As mentioned above the separate interval and fractional tables are utilized for each of the RGB color components resulting in three interval outputs and three fractional outputs. Each of the interval and fractional tables for each color component are loaded in the MUV buffer 250 (FIG. 2) and accessed by the main data path unit 242 when required. The arrangement of the MUV buffer 250 for the color conversion process is as shown in FIG. 57. The MUV buffer 250 (FIG. 57) is divided into three areas 488, 489 and 490, one area for each color component. Each area e.g. 488 is further divided into a 4 bit interval table and a 8 bit fractional table. A 12 bit output 492 is retrieved by the main data path unit 242 from the MUV buffer 250 for each input color channel. In the example given above of a single input color component having a decimal value 4, the 12 bit output will be 000001010000.

Figure 58:
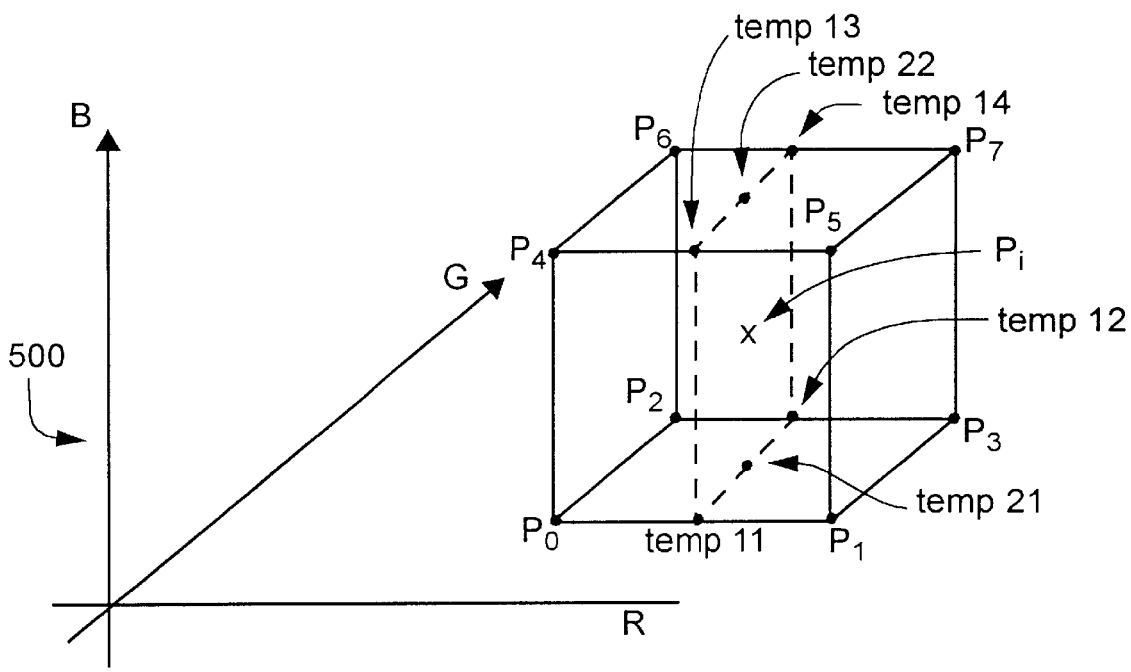
FIG. 58 illustrates the process of color conversion utilising interpolation as carried out in the co-processor.

Turning now to FIG. 58, there is illustrated an example of the interpolation process. The interpolation process consists primarily of interpolation from one three dimensional space 500, for example RGB color space to an alternative color space, for example CMY or CMYK. The pixels P0 to P7 form sparsely located points in the RGB input color space and having corresponding output color values CV(P0) to CV(P7) in the output color space. The output color component value corresponding to the input pixel Pi falling between the pixels P0 to P7 is determined by; firstly, determining the endpoints P0, P1, . . . , P7 of the intervals surrounding the input pixel Pi; secondly, determining the fractional components frac_r, frac_g and frac_b; and lastly interpolating between the output color values CV(P0) to CV(P7) corresponding to the endpoints P0 to P7 using the fractional components.

The interpolation process includes a one dimensional interpolation in the red (R) direction to calculate the values temp 11, temp 12, temp 13, temp 14 in accordance with the following equations:

temp 11=CV(P0)+frac_r(CV(P1)−CV(P0))

temp 12=CV(P2)+frac_r(CV(P3)−CV(P2))

temp 13=CV(P4)+frac_r(CV(P5)−CV(P4))

temp 14=CV(P6)+frac_r(CV(P7)−CV(P6))

Next, the interpolation process includes the calculation of a further one dimensional interpolation in the green (G) direction utilising the following equations to calculate the values temp 21 and temp 22:

temp 21=temp 11+frac_g(temp 12−temp 11)

temp 22=temp 13+frac_g(temp 14−temp 13)

Finally, the final dimension interpolation in the blue (B) direction is carried out to calculate a final color output value in accordance with the following equation.

final=temp 21+frag_b(temp 22−temp 21)

Figure 59:
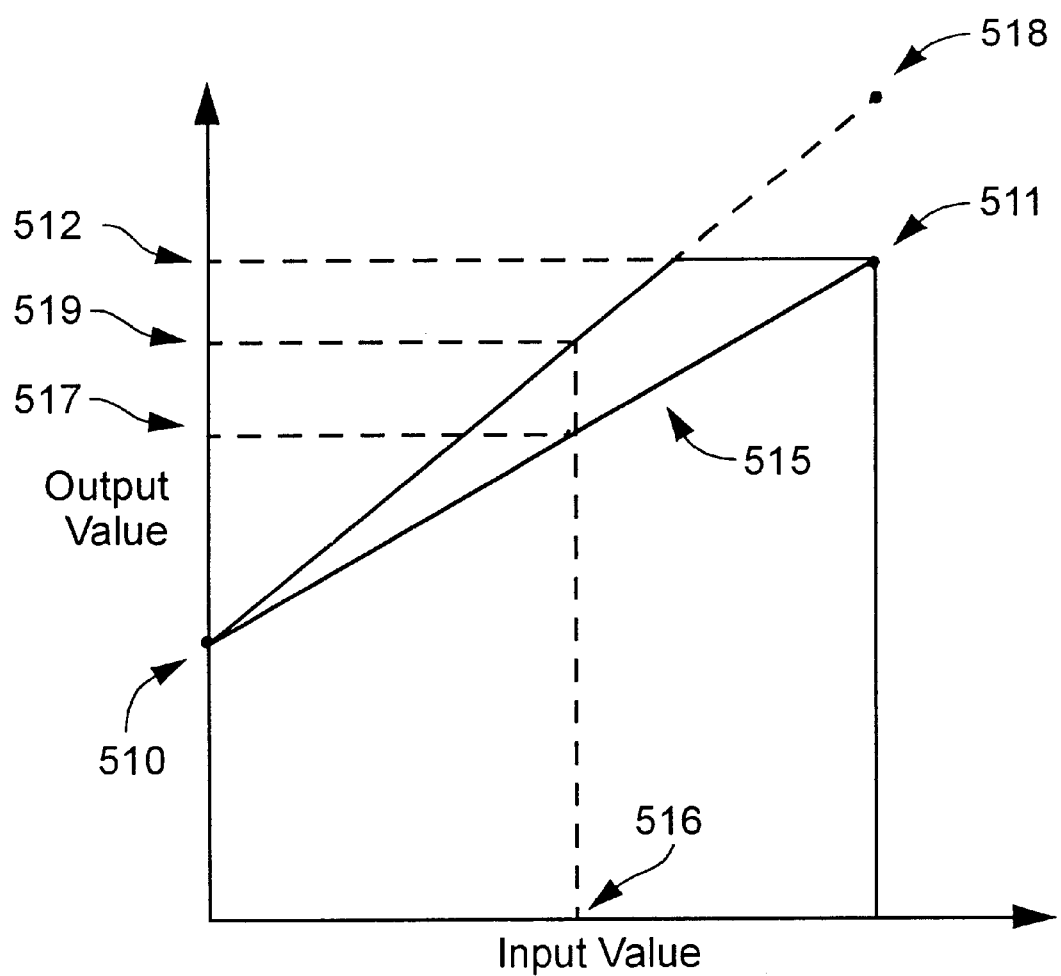
FIG. 59 illustrates the refinements to the rest of the color conversion process at gamut edges as carried out by the co-processor.

Unfortunately, it is often the case that the input and output gamut may not match. In this respect, the output gamut may be more restricted that the input gamut and in this case, it is often necessary to clamp the gamut at the extremes. This often produces unwanted artifacts when converting using the boundary gamut colors. An example of how this problem can occur will now be explained with reference to FIG. 59, which represents a one dimensional mapping of input gamut values to output gamut values. It is assumed that output values are defined for the input values at points 510 and 511. However, if the greatest output value is clamped at the point 512 then the point 511 must have an output value of this magnitude. Hence, when interpolating between the two points 510 and 511, the line 515 forms the interpolation line and the input point 516 produces a corresponding output value 517. However, this may not be the best color mapping, especially where, without the gamut limitations, the output value would have been at the point 518. The interpolation line between 510 and 518 would produce an output value ot 519 for the input point 516. The difference between the two output values 517 and 519 can often lead to unsightly artifacts, particularly when printing edge of gamut colors. To overcome this problem, the main data path unit can optionally calculate in an expanded output color space and then scale and clamp to the appropriate range utilising the following formula:

$$\text{out} = \begin{cases} 0 & \text{if } x \leq 63 \\ 2(x-64) & \text{if } (64 \leq x \leq 191) \\ 255 & \text{if } (192 \leq x) \end{cases} \quad (4)$$

Returning now to FIG. 58, it will be evident that the interpolation process can either be carried out in the SOCGS conversion mode which converts RGB pixels to a single output color component (for example, cyan) or the MOGCS mode which converts RGB pixels to all the output color components simultaneously. Where color conversion is to be carried out for each pixel in an image, many millions of pixels may have to be independently color converted. Hence, in order for high speed operation, it is desirable to be able to rapidly locate the 8 values (P0–P7) around a particular input value.

As noted previously with respect to FIG. 57, the main data path unit 242 retrieves for each color input channel, a 12 bit output consisting of a 4 bit interval part and a 8 bit fractional part. The main data path unit 242 concatenates these 4 bit interval parts of the red, green and blue color channels to form a single 12 bit address ($I_R$, $I_G$, $I_B$), as shown in FIG. 60 as 520.

Figure 60:
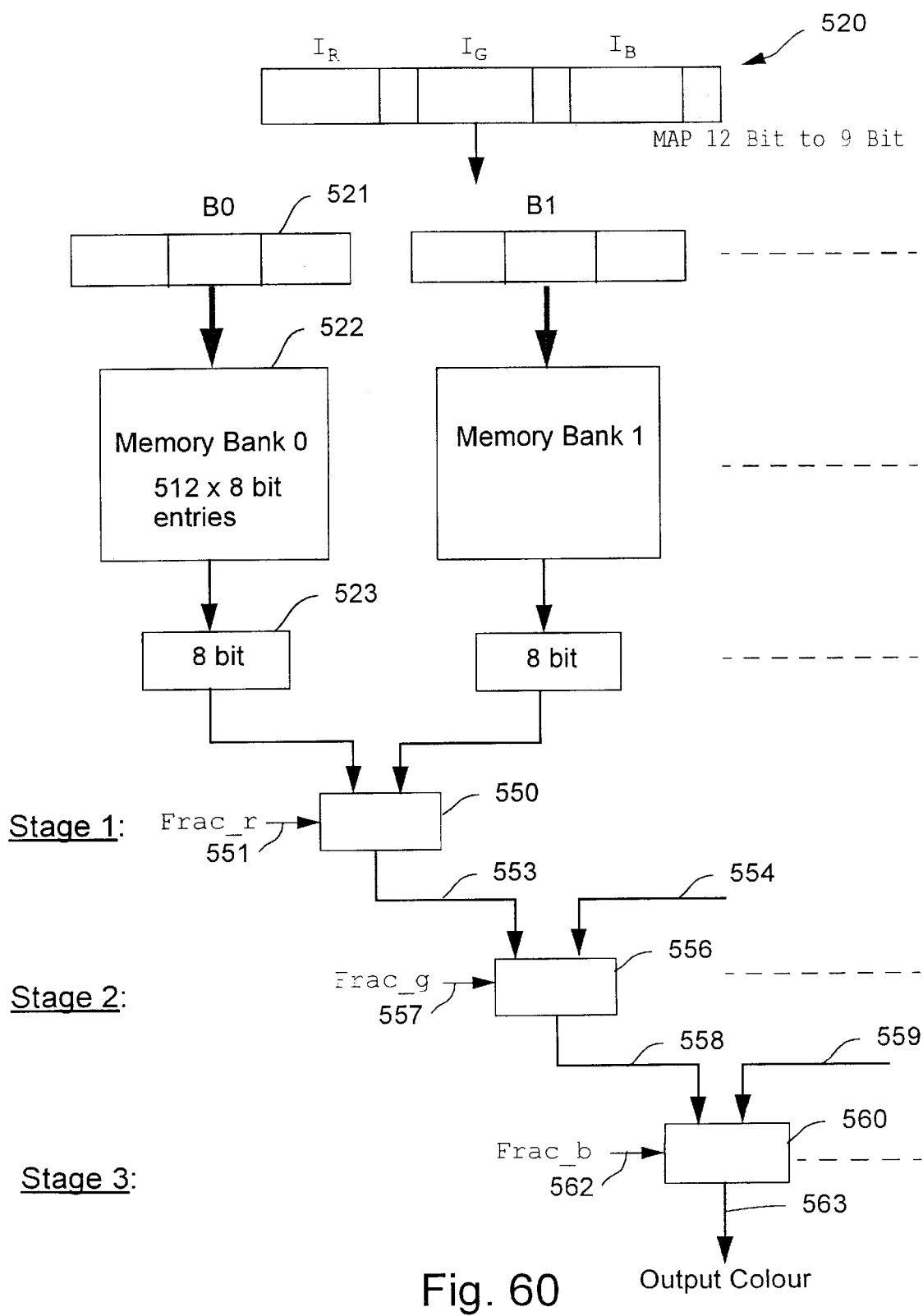
FIG. 60 illustrates the process of color space conversion for one output color as implemented in the co-processor.

FIG. 60 shows a data flow diagram illustrating the manner in which a single output color component 563 is obtained in response to the single 12 bit address 520. The 12 bit address 520 is first fed to an address generator of the data cache controller 240, such as the generator 1881 (shown in FIG. 141) which generates 8 different 9 bit line and byte addresses 521 for memory banks ($B_O$, $B_1$, . . . $B_7$). The data cache 230 (FIG. 2) is divided into 8 independent memory banks 522 which can be independently addressed by the respective 8 line and byte addresses. The 12 bit address 520 is mapped by the address generator into the 8 line and byte addresses in accordance with the following table:

TABLE 12

Address Composition for SOGCS Mode

| | Bit [8:6] | Bit [5:3] | Bit [2:0] |
|---|---|---|---|
| Bank 7 | R[3:1] | G[3:1] | B[3:1] |
| Bank 6 | R[3:1] | G[3:1] | B[3:1]+B[0] |
| Bank 5 | R[3:1] | G[3:1]+G[0] | B[3:1] |
| Bank 4 | R[3:1] | G[3:1]+G[0] | B[3:1]+B[0] |
| Bank 3 | R[3:1]+R[0] | G[3:1] | B[3:1] |
| Bank 2 | R[3:1]+R[0] | G[3:1] | B[3:1]+B[0] |
| Bank 1 | R[3:1]+R[0] | G[3:1]+G[0] | B[3:1] |
| Bank 0 | R[3:1]+R[0] | G[3:1]+G[0] | B[3:1]+B[0] | where BIT[8:6], BIT[5:3] and BIT[2:0] represent the sixth to eighth bits, the third to fifth bits and the zero to second bits of the 9 bit bank addresses respectively; and where R[3:1], G[3:1] and B[3:1] represent the first to third bits of the 4 bit intervals $I_R$, $I_G$ and $I_B$ of the 12 bit address 520 respectively.

Reference is made to memory bank 5 of Table 12 for a more detailed explanation of the 12 bit to 9 bit mapping. In this particular case, the bits 1 to 3 of the 4 bit red interval $I_r$ of the 12 bit address 520 are mapped to bits 6 to 8 of the 9 bit address B5; bits 1 to 3 and bit 0 of the 4 bit green interval $I_g$ are summed and then mapped to bits 3 to 5 of the 9 bit address B5; and bits 1 to 3 of the 4 bit blue interval $I_b$ are mapped to bits 0 to 2 of the 9 bit address B5.

Each of the 8 different line and byte addresses 521 is utilized to address a respective memory bank 522 which consists of 512×8 bit entries, and the corresponding 8 bit output color component 523 is latched for each of the memory banks 522. As a consequence of this addressing method, the output color values of CV(P0) to CV(P7) correseponding to the endpoints P0 to P7 may be located at different positions in the memory banks. For example, a 12 bit address of 0000 0000 0000 will result in the same bank address for each bank, ie 000 000 000. However a 12 bit address of 0000 0000 0001 will result in different bank addresses, ie a bank address of 000 000 000 for banks 7, 5, 3 and 1 and a bank address of 000 000 001 for banks 6, 4, 2 and 0. It is in this way the eight single output color values CV(P0)–CV(P7) surrounding a particular input pixel value are simultaneously retrieved from respective memory banks and duplication of output color values in the memory banks can be avoided.

Figure 61:
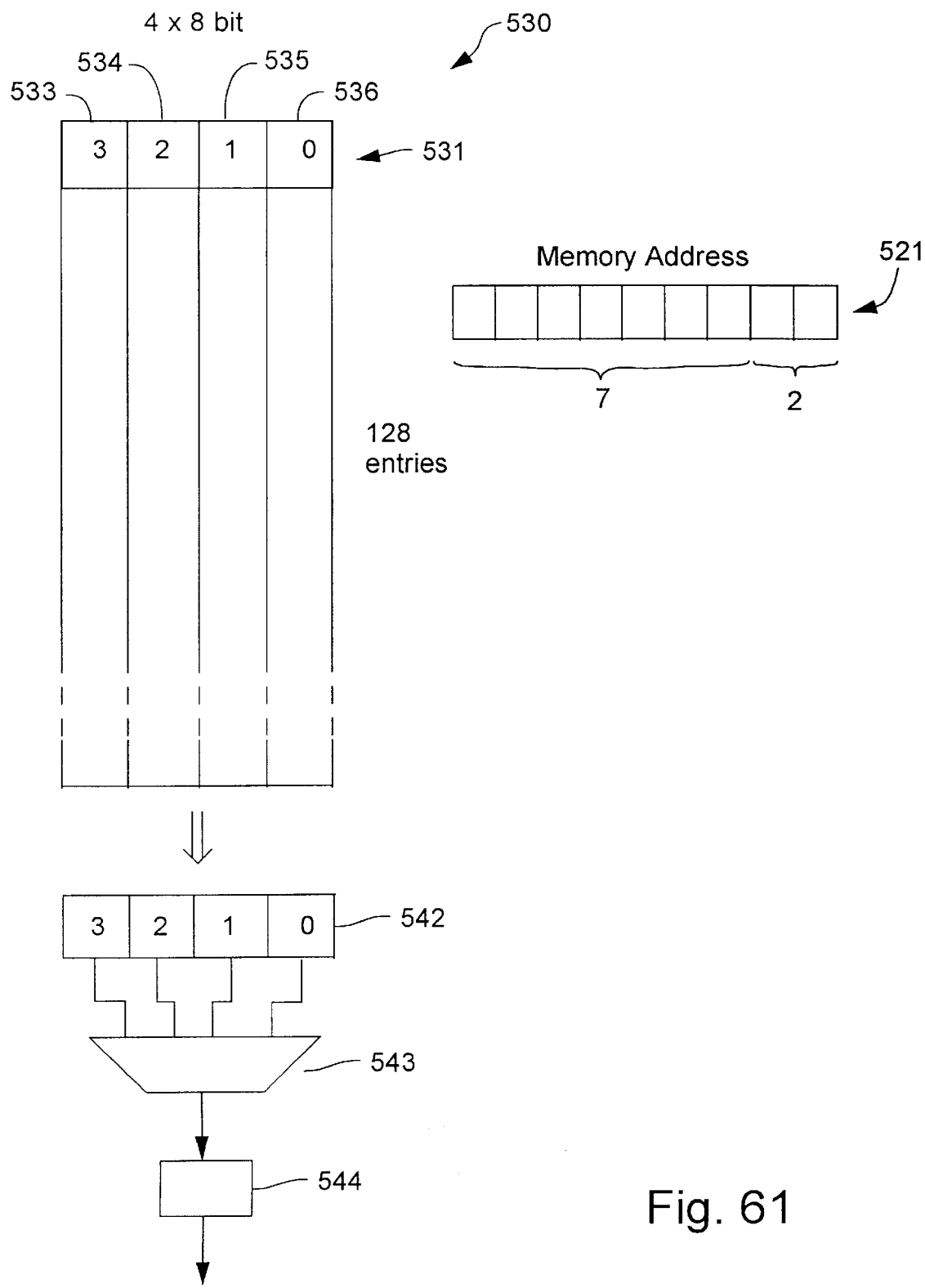
FIG. 61 illustrates the memory storage within a cache of the co-processor when utilising single color output color space conversion.

Turning now to FIG. 61, there is illustrated the structure of a single memory bank of the data cache 230 when utilized in the single color conversion mode. Each memory bank consists of 128 line entries 531 which are 32 bits long and comprize 4×8 bit memories 533–536. The top 7 bits of the memory address 521 are utilized to determine the corresponding row of data within the memory address to latch 542 as the memory bank output. The bottom two bits are a byte address and are utilized as an input to multiplexer 543 to determine which of the 4×8 bit entries should be chosen 544 for output. One data item is output for each of the 8 memory banks per clock cycle for return to the main data path unit 242. Hence, the data cache controller receives a 12 bit byte address from the operand organizer 248 (FIG. 2) and outputs in return to the operand organizers 247, 248, the 8 output color values for interpolation calculation by the main data path unit 242.

Returning to FIG. 60, the interpolation equations are implemented by the main data path unit 242 (FIG. 2) in three stages. In the main data path unit, a first stage of multiplier and adder units eg. 550 which take as input the relevant color values output by the corresponding memory banks eg. 522 in addition to the red fractional component 551 and calculate the 4 output values in accordance with stage 1 of the above mentioned equations. The outputs eg. 553, 554 of this stage are fed to a next stage unit 556 which utilizes the frac_g input 557 to calculate an output 558 in accordance with the aforementioned equation for stage 2 of the interpolation process. Finally, the output 558 in addition to other outputs eg. 559 of this stage are utilized 560 in addition to the frac_b input 562 to calculate a final output color 563 in accordance with the aforementioned equations.

The process illustrated in FIG. 60 is implemented in a pipelined manner so as to ensure maximum overall throughput. Further, the method of FIG. 60 is utilized when a single output color component 563 is required. For example, the method of FIG. 60 can be utilized to first produce the cyan color components of an output image followed by the magenta, yellow and black components of an output image reloading the cache tables between passes. This is particularly suitable for a four-pass printing process which requires each of the output colors as part of separate pass.

b. Multiple Output General Color Space Mode

The co-processor 224 operates in the MOGCS mode in a substantially similar manner to the SOCGS mode, with a number of notable exceptions. In the MOGCS mode, the main data path unit 242, the data cache controller 240 and data cache of FIG. 2 co-operate to produce multiple color outputs simultaneously with four primary colors components being output simultaneously. This would require the data cache 230 to be four times larger in size. However, in the MOGCS mode of operation, in order to save storage space, the data cache controller 240 stores only one quarter of all the output color values of the output color space. The remaining output color values of the output color space are stored in a low speed external memory and are retrieved as required. This particular apparatus and method is based upon the surprising revelation that the implementation of sparsely located color conversion tables in a cache system have an extremely low miss rate. This is based on the insight there is a low deviation in color values from one pixel to the next in most color images. In addition, there is a high probability the sparsely located output color values will be the same for neighboring pixels.

Figure 62:
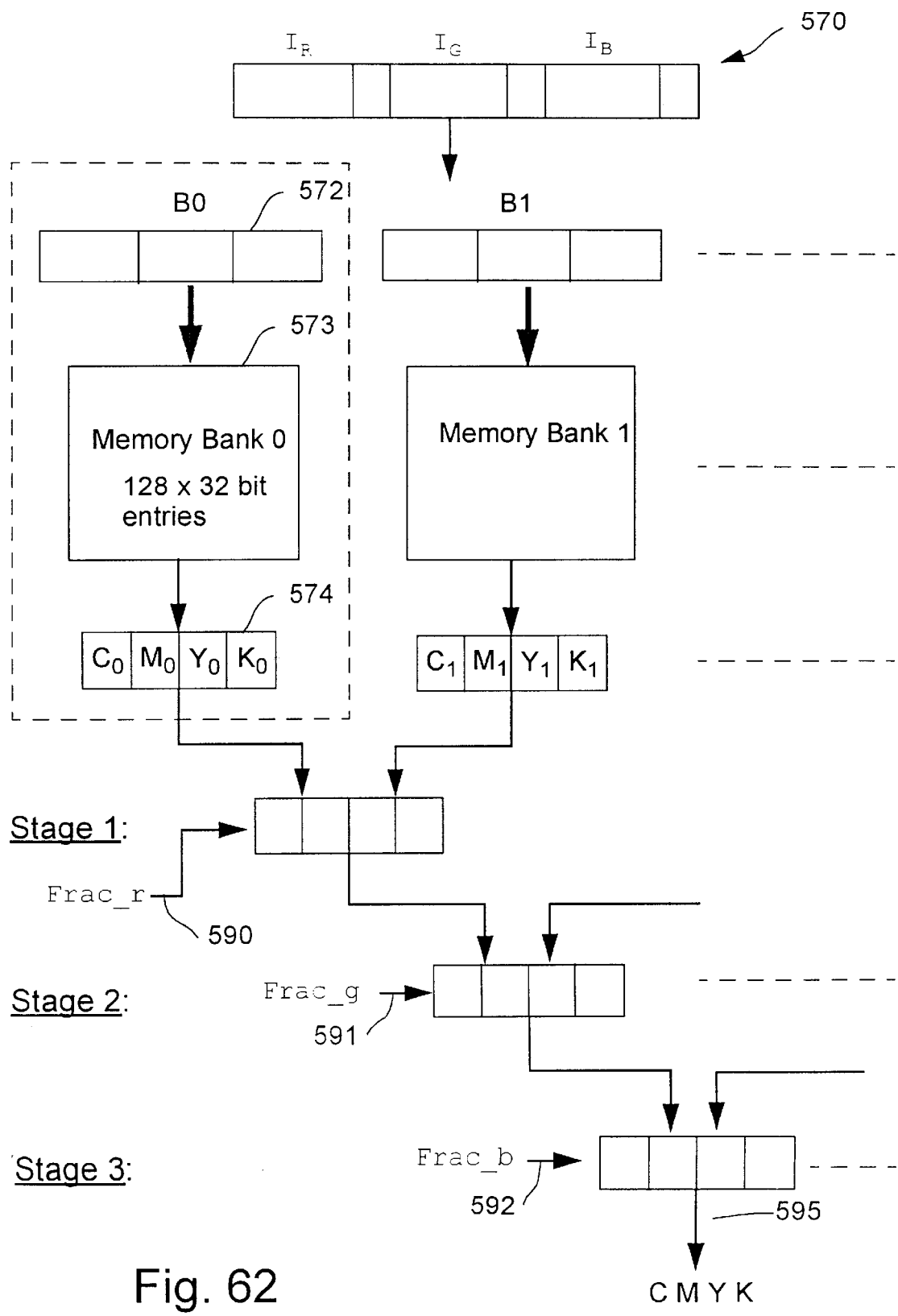
FIG. 62 illustrates the methodology utilized for multiple color space conversion.

Turning now to FIG. 62 there will now be described the method carried out by the co-processor to implement multichannel cached color conversion. Each input pixel is broken into its color components and a corresponding interval table value (FIG. 56) is determined as previously described resulting in the three 4 bit intervals Ir, Ig, lb denoted 570. The combined 12 bit number 570 is utilized in conjunction with the aforementioned table 12 to again derive eight 9-bit addresses. The addresses eg. 572 are then re-mapped as will be discussed below with reference to FIG. 63, and then are utilized to look up a corresponding memory bank 573 to produce four colour output channels 574. The memory bank 573 stores 128×32 bit entries out of a total possible 512×32 bit entries. The memory bank 573 forms part of the data cache 230 (FIG. 2) and is utilized as a cache as will now be described with reference to FIG. 63.

Turning to FIG. 63, the 9 bit bank input 578 is re-mapped as 579 so as to anti-alias memory patterns by re-ordering the bits 580–582 as illustrated. This reduces the likelihood of neighboring pixel values aliasing to the same cache elements.

The reorganized memory address 579 is then utilized as an address into the corresponding memory bank eg. 585 which comprizes 128 entries each of 32 bits. The 7 bit line address is utilized to access the memory 585 resulting in the corresponding output being latched 586 for each of the memory banks. Each memory bank, eg 585 has an associated tag memory which comprizes 128 entries each of 2 bits. The 7 bit line address is also utilized to access the corresponding tag in tag memory 587. The two most significant bits of the address 579 are compared with the corresponding tag in tag memory 587 to determine if the relevant output color value is stored in the cache. These two most significant bits of the 9 bit address correspond to the most significant bits of the red and green data intervals (see Table 12). Thus in the MOGCS mode the RGB input color space is effectively divided into quadrants along the red and green dimensions where the two most significant bits of the 9 bit address designates the quadrant of the RGB input color space. Hence the output color values are effectively divided into four quadrants each designated by a two bit tag. Consequently the output color values for each tag value for a particular line are highly spaced apart in the output color space, enabling anti-aligning of memory patterns.

Where the two bit tags do not match a cache miss is recorded by the data cache controller and the corresponding required memory read is initiated by the data cache controller with the cache look up process being stalled until all values for that line corresponding to that two bit tag entry are read from an external memory and stored in the cache. This involves the reading of the relevant line of the color conversion table stored in the external memory. The process 575 of FIG. 63 is carried out for each of the memory banks eg. 573 of FIG. 62 resulting, depending on the cache contents, in a time interval elapsing before the results eg. 586 are output from each corresponding memory bank. Each of the eight 32 bit sets of data 586 are then forwarded to the main data path unit (242) which carries out the aforementioned interpolation process (FIG. 62) in three stages 590–592 to each of the colored channels simultaneously and in a pipelined manner so as to produce four color outputs 595 for sending to a printer device.

Experiments have shown that the caching mechanism as described with reference to FIGS. 62 and 63 can be advantageously utilized as typical images have a cache miss-rate on average requiring between 0.01 and 0.03 cache line fetches per pixel. The utilization of the caching mechanism therefore leads to substantially reduced requirements, in the typical case, for memory accesses outside of the data cache.

The instruction encoding for both color space conversion modes (FIG. 10) utilized by the co-processor has the following structure:

TABLE 12A

Instruction Encoding for Color Space Conversion

| Operand | Description | Internal Format | External Format |
|---|---|---|---|
| Operand A | source pixels | pixels | packed stream |
| Operand B | multi output channel color conversion tables | other | multi channel csc tables |
| Operand C | Interval and Fraction Tables | — | I&F table format |
| Result | pixels bytes | pixels unpacked bytes | packed stream unpacked bytes, packed stream |

Figure 64:
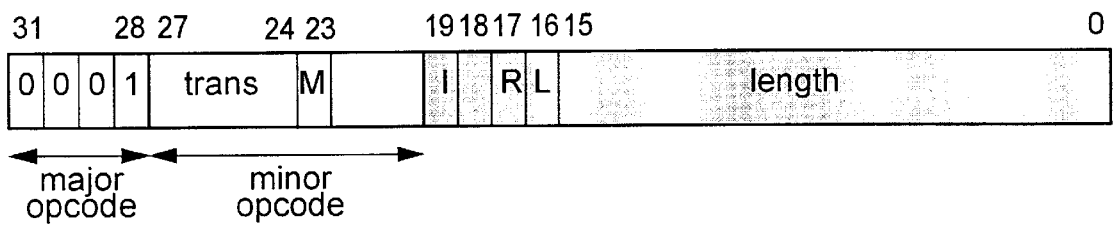
FIG. 64 illustrates the instruction word format for color space conversion instructions.

The instruction field encoding for color space conversion instruction is illustrated in FIG. 64 with the following minor opcode encoding for the color conversion instructions.

TABLE 13

Minor Opcode Encoding for Color Conversion Instructions

| Field | Description |
|---|---|
| trans [3:0] | 0 = do not apply translation and clamping step to corresponding output value on this channel |
| M | 0 = single channel color table format<br>1 = multi channel color table format |

Figure 65:
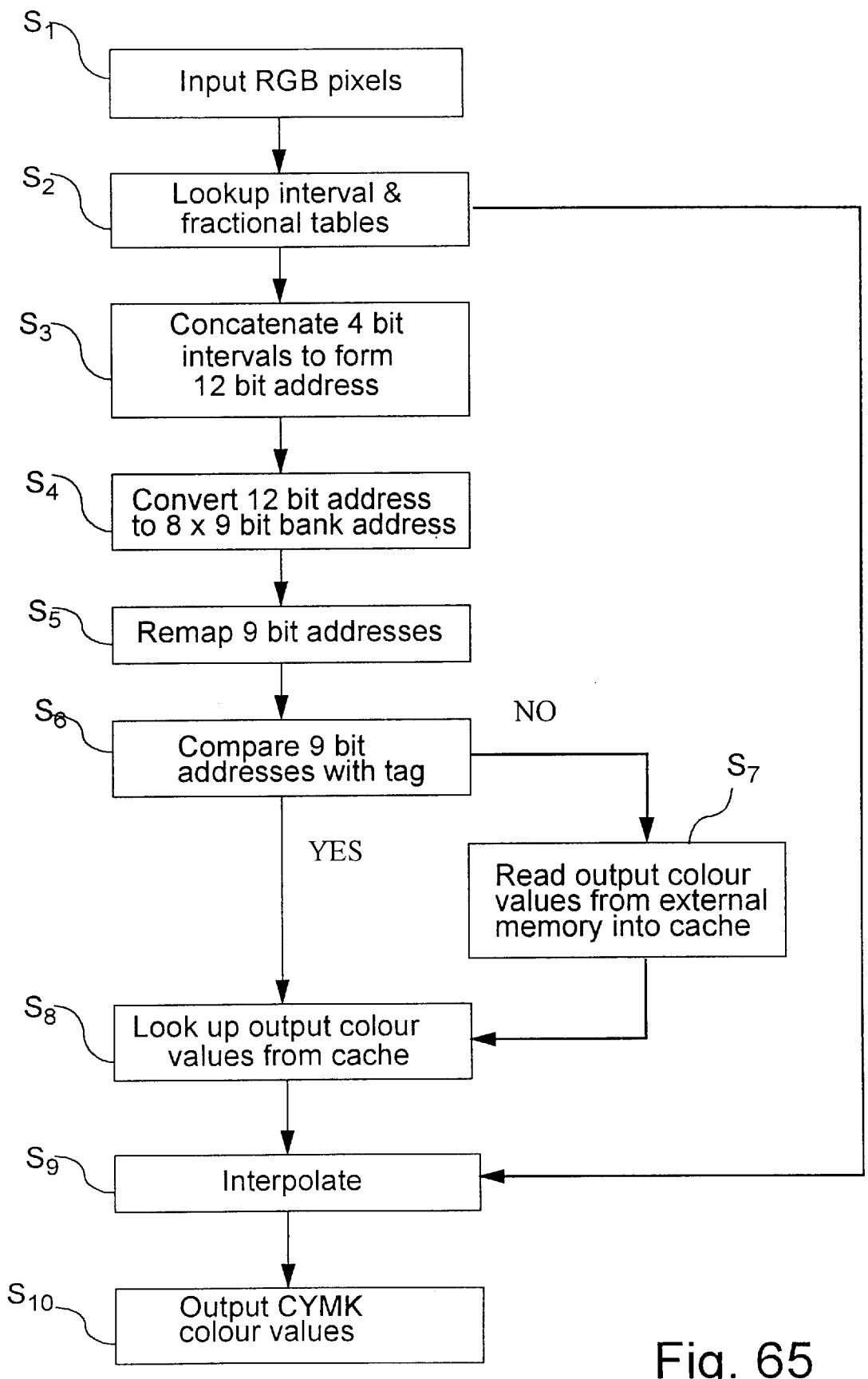
FIG. 65 illustrates a method of multiple color conversion.

FIG. 65 shows a method of converting a stream of RGB pixels into CYMK color values according to the MOGCS mode. In step $S_1$, a stream of 24 bit RGB pixels are received by the pixel organiser 246 (FIG. 2). In step $S_2$, the pixel organiser 246 determines the 4 bit interval values and the 8 bit fractional values of each input pixel from look-up tables, in the manner previously discussed with respect to FIGS. 56 and 57. The interval and fractional values of the input pixel designate which intervals and fractions along the intervals in which the input pixel lies. In step S3, the main data path unit 242 concatenates the 4 bit intervals of the red, green and blue color components of the input pixel to form a 12 bit address word and supplies this 12 bit address word to the data cache controller 240 (FIG. 2). In step $S_4$, the data cache controller 240 converts this 12 bit address word into 8 different 9 bit addresses, in the manner previously discussed with respect to Table 12 and FIG. 62. These 8 different addresses designate the location of the 8 output color values CV(P0)–CV(P7) in the respective memory banks 573 (FIG. 62) of the data cache 230 (FIG. 2). In step $S_5$, the data cache controller 240 (FIG. 2) remaps the 8 different 9 bit addresses in the manner described previously with respect to FIG. 63. In this way, the most significant bit of the red and green 4 bit intervals are mapped to the two most significant bits of the 9 bit addresses.

In step $S_6$, the data cache controller 240 then compares the two most significant bits of the 9 bit addresses with respective 2 bit tags in memory 587 (FIG. 63). If the 2 bit tag does not correspond to the two most significant bits of the 9 bit addresses, then the output color values CV(P0)–CV(P7) do not exist in the cache memory 230. Hence, in step $S_7$, all the output color values corresponding to the 2 bit tag entry for that line are read from external memory into the data cache 230. If the 2 bit tag corresponds to these two most significant bits of the 9 bit addresses, then the data cache controller 240 retrieves in step $S_8$ the eight output color values CV(P0)–CV(P7) in the manner discussed previously with respect to FIG. 62. In this way, the eight output color values CV(P0)–CV(P7) surrounding the input pixel are retrieved by the main data path unit 242 from the data cache 230. In step $S_7$, the main data path unit 242 interpolates the output color values CV(P0)–CV(P7) utilising the fractional values determined in step $S_2$ and outputs the interpolated output color values.

It will be evident to the man skilled in the art, that the storage space of the data cache storage may be reduced further by dividing the RGB color space and the corresponding output color values into more than four quadrants, for example 32 blocks. In the latter case. the data cache can have the capacity of storing only a 1/32 block of output color values.

It will also be evident to the man skilled in the art, that the data caching arrangement utilized in the MOGCS mode can also be used in a single output general conversion mode. Hence, in the latter mode the storage space of the data cache can also be reduced.

3.17.3 JPEG Coding/Decoding

It is well known that a large number of advantages can be obtained from storing images in a compressed format especially in relation to the saving of memory and the speed of transferring images from one place to another. Various popular standards have arizen for image compression. One very popular standard is the JPEG standard and for a full discussion of the implementation of this standard reference is made to the well known text *JPEG: Still Image Data Compression Standard* by Pennebaker and Mitchell published 1993 by Van Nostrand Reinhold. The co-processor 224 utilizes a subset of the JPEG standard in the storage of images. The JPEG standard has the advantage that large factor compression can be gained with the retention of substantial image quality. Of course, other standards for storing compressed images could be utilized. The JPEG standard is well-known to those skilled in the art, and the various JPEG alternative implementations readily available in the marketplace from manufacturers including JPEG core products for incorporation into ASICS.

The co-processor 224 implements JPEG compression and decompression of images consisting of 1, 3 or 4 color components. One-color-component images may be meshed or unmeshed. That is, a single-color-component can be extracted from meshed data or extracted from unmeshed data. An example of meshed data is three-color components per pixel datum (i.e., RGB per pixel datum), and an example of unmeshed data is where each color component for an image is stored separately such that each color component can be processed separately. For three color component images the co-processor 224 utilizes one pixel per word, assuming the three color channels to be encoded in the lowest three bytes.

The JPEG standard decomposes an image into small two dimensional units called minimum coded units (MCU). Each minimal coded unit is processed separately. The JPEG coder 241 (FIG. 2) is able to deal with MCU's which are 16 pixels wide and 8 pixels high for down sampled images or MCU's which are 8 pixels wide and 8 pixels high for images that are not to be down sampled.

Figure 66:
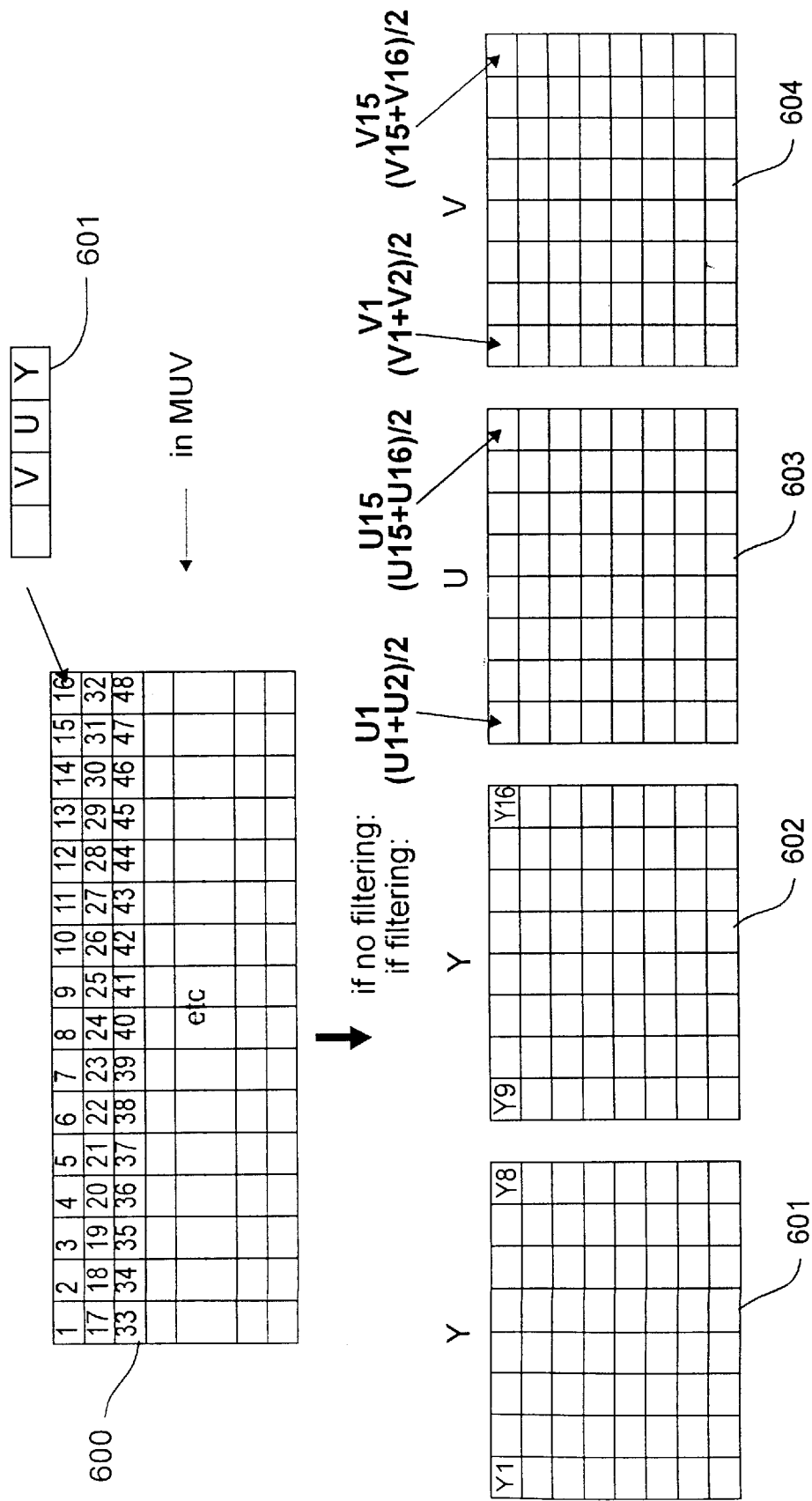
FIGS. 66 and 67 illustrate the formation of MCU's during the process of JPEG conversion as carried out in the co-processor.

Turning now to FIG. 66, there is illustrated the method utilized for down sampling three component images.

The original pixel data 600 is stored in the MUV buffer 250 (FIG. 2) in a pixel form wherein each pixel 601 comprises Y, U and V components of the YUV color space. This data is first converted into a MCU unit which comprises four data blocks 601–604. The data blocks comprize the various color components, with the Y component being directly sampled 601, 602 and the U and V components being sub-sampled in the particular example of FIG. 13 to form blocks 603, 604. Two forms of sub-sampling are implemented by the co-processor 224, including direct sampling where no filtering is applied and odd pixel data is retained while even pixel data is discarded. Alternatively, filtering of the U and V components can occur with averaging of adjacent values taking place.

Figure 67:
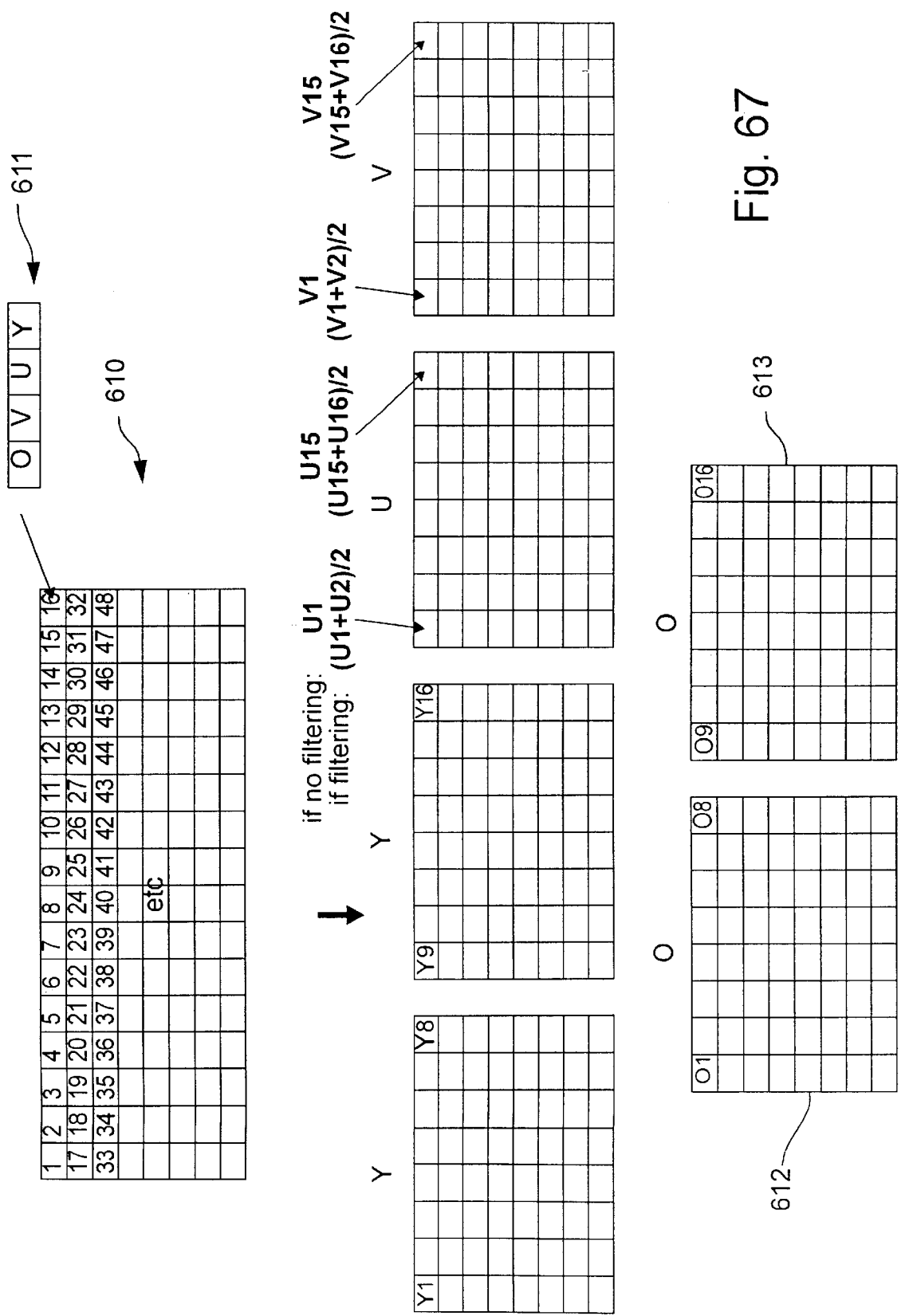

An alternative form of JPEG sub-sampling is four color channel sub-sampling as illustrated in FIG. 67. In this form of sub-sampling, pixel data blocks of 16×8 pixels 610 each have four components 611 including an opacity component (O) in addition to the usual Y, U, V components. This pixel data 410 is sub-sampled in a similar manner to that depicted in FIG. 66

However, in this case, the opacity channel is utilized to form data blocks 612, 613.

Figure 68:
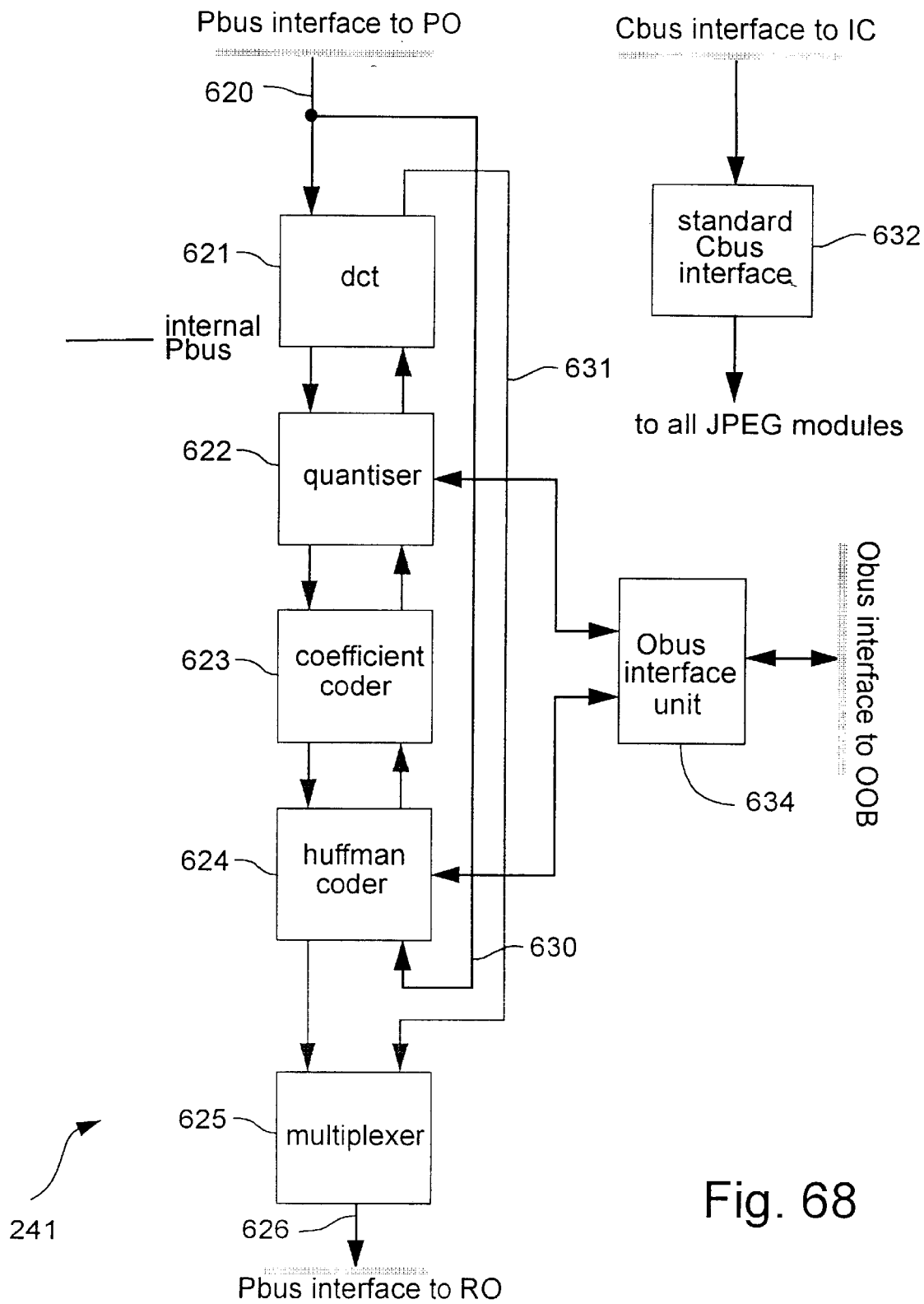
FIG. 68 illustrates the structure of the JPEG coder of the co-processor.

Turning now to FIG. 68, there is illustrated the JPEG coder 241 of FIG. 2 in more detail. The JPEG encoder/decoder 241 is utilized for both JPEG encoding and decoding. The encoding process receives block data via bus 620 from the pixel organizer 246 (FIG. 2). The block data is stored within the MUV buffer 250 which is utilized as a block staging area. The JPEG encoding process is broken down into a number of well defined stages. These stages include:

1. taking a discrete cosine transform (DCT) via DCT unit 621;
2. quantising the DCT output 622;
3. placing the quantized DCT coefficients in a zig zag order, also carried out by quantizer unit 622;
4. predictively encoding the DC DCT coefficients and run length encoding the AC DCT coefficients carried out by co-efficient coder 623; and
5. variable length encoding the output of the coefficients coder stage, carried out by Huffman coder unit 624. The output is fed via multiplexer 625 and Rbus 626 to the result organizer 629 (FIG. 2).

The JPEG decoding process is the inverse of JPEG encoding with the order of operations reversed. Hence, the JPEG decoding process comprises the steps of inputting on Bus 620 a JPEG block of compressed data. The compressed data is transferred via Bus 630 to the Huffman coder unit 624 which Huffman decodes data into DC differences and AC run lengths. Next, the data is forwarded to the co-efficients coder 623 which decodes the AC and DC coefficients and puts them into their natural order. Next, the quantizer unit 622 dequantizes the DC coefficients by multiplying them by a corresponding quantization value. Finally, the DCT unit 621 applies an inverse discrete cosine transform to restore the original data which is then transferred via Bus 631 to the multiplexer 625 for output via Bus 626 to the Result Organizer. The JPEG coder 241 operates in the usual manner via standard CBus interface 632 which contains the registers set by the instructions controller in order to begin operation of the JPEG coder. Further. both the quantizer unit 622 and the Huffman coder 624 require certain tables which are loaded in the data cache 230 as required. The table data is accessed via an OBus interface unit 634 which connects to the operand organizer B unit 247 (FIG. 2) which in turn interacts with the data cache controller 240.

The DCT unit 621 implements forward and inverse discrete cosine transforms on pixel data. Although many different types of DCT transforming implementations are known and discussed in the *Still Image Data Compression Standard* (ibid), the DCT 621 implements a high speed form of transform more fully discussed in the section herein entitled *A Fast DCT Apparatus*, which may implement a DCT transform operation in accordance with the article entitled *A Fast DCT-SQ Scheme for Images* by Arai et. al., published in The Transactions of the IEICE, Vol E71, No. 11, November 1988 at page 1095.

The quantizer 622 implements quantization and dequantization of DCT components and operates via fetching relevant values from corresponding tables stored in the data cache via the OBus interface unit 634. During quantization, the incoming data stream is divided by values read from quantization tables stored in the data cache. The division is implemented as a fixed point multiply. During dequantization, the data stream is multiplied by values kept in the dequantization table.

Figure 69:
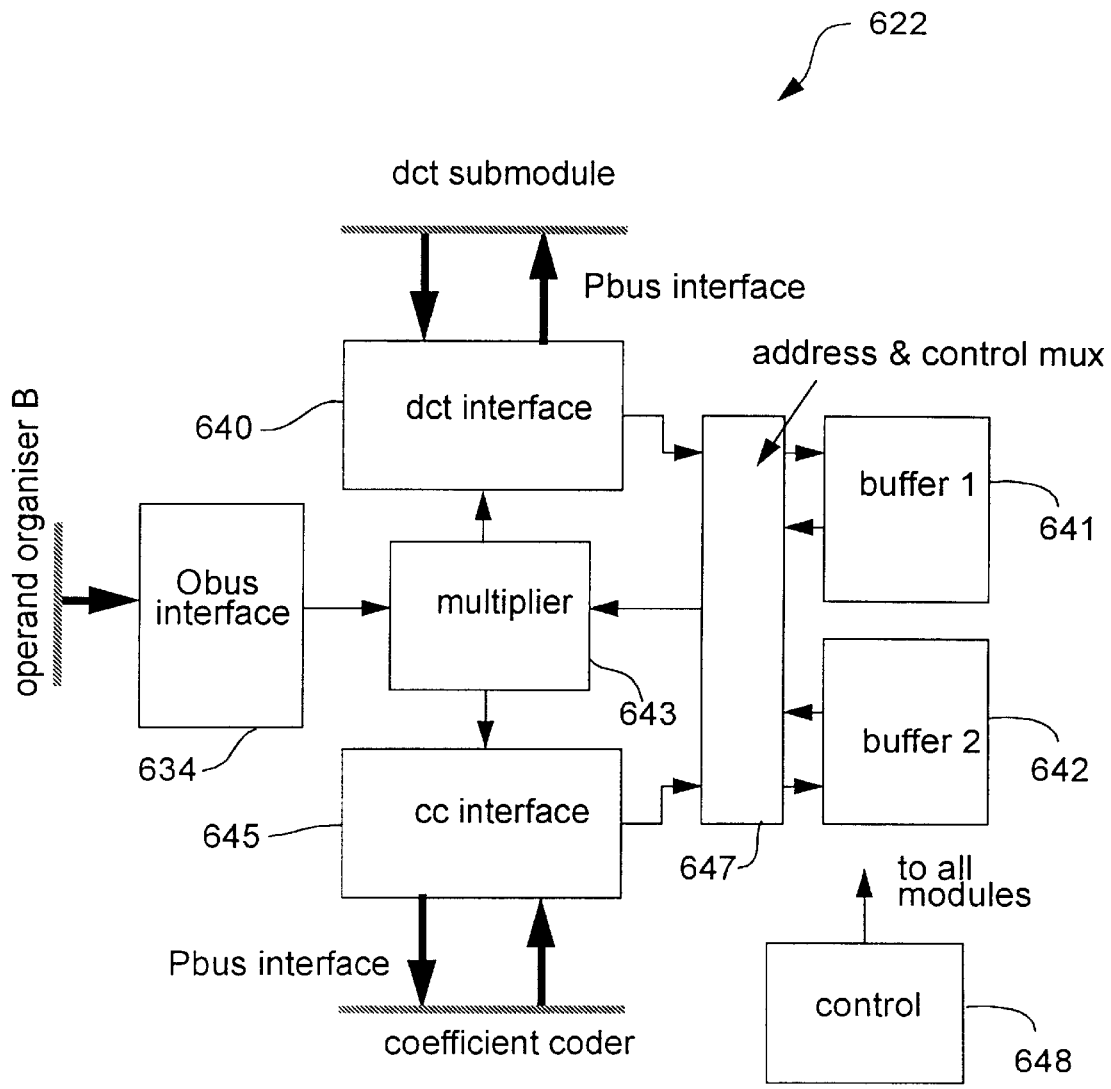
FIG. 69 illustrates the quantizer portion of FIG. 68 in more detail.

Turning to FIG. 69. there is illustrated the dequantizer 622 in more detail. The quantizer 622 includes a DCT interface 640 responsible for passing data to and receiving data from the DCT module 621 via a local Bus. During quantization, the quantizer 622 receives two DCT coefficients per clock cycle. These values are written to one of the quantizers internal buffers 641, 642. The buffers 641, 642 are dual ported buffers used to buffer incoming data. During quantization, co-efficient data from the DCT sub-module 621 is placed into one of the buffers 641, 642. Once the buffer is full, the data is read from the buffer in a zig zag order and multiplied by multiplier 643 with the quantization values received via OBus interface unit 634. The output is forwarded to the co-efficient coder 623 (FIG. 68) via co-efficient coder interface 645. While this is happening, the next block of coefficients is being written to the other buffer. During JPEG decompression, the quantizer module dequantizes decoded DCT coefficients by multiplying them by values stored in the table. As the quantization and dequantization operations are mutually exclusive, the multiplier 643 is utilized during quantization and dequantization. The position of the co-efficient within the block of 8×8 values is used as the index into the dequantization table.

As with quantization, the two buffers 641, 642 are utilized to buffer incoming co-efficient data from the co-efficient coder 623 (FIG. 68). The data is multiplied with its quantization value and written into the buffers in reverse zig zag order. Once full, the dequantized coefficients are read out of the utilized buffer in natural order, two at a time, and passed via DCT interface 640 to the DCT sub-module 621 (FIG. 68). Hence the coefficients coder interface module 645 is responsible for interfacing to the co-efficients coder and passes data and receives data from the coder via a local Bus. This module also reads data from buffers in zig zag order during compression and writes data to the buffers in reverse zig zag order during decompression. Both the DCT interface module 640 and the CC interface module 645 are able to read and write from buffers 641, 642. Hence, address and control multiplexer 647 is provided to select which buffer each of these interfaces is interacting with under the control of a control module 648, which comprizes a state machine for controlling all the various modules in the quantizer. The multiplier 643 can be a 16×8, 2's complement multiplier which multiplies DCT coefficients by quantization table values.

Turning again to FIG. 68, the co-efficient coder 623 performs the functions of:

(a) predictive encoding/decoding of DC coefficients in JPEG mode; and (b) run length encoding/decoding of AC coefficients in JPEG mode.

Preferably, the co-efficient coder 623 is also able to be utilized for predictive encoding/decoding of pixels and memory copy operations as required independently of JPEG mode operation. The co-efficient coder 623 implements predictive and run length encoding and decoding of DC and AC coefficients as specified in the Pink Book. A standard implementation of predictive encoding and predictive decoding in addition to JPEG AC coefficients run lengthing encoding and decoding as specified in the JPEG standard is implemented.

The Huffman coder 624 is responsible for Huffman encoding and decoding of the JPEG data train. In Huffman encoding mode, the run length encoded data is received from the coefficients coder 623 and utilized to produce a Huffman stream of packed bytes. Alternatively, or in addition, in Huffman decoding, the Huffman stream is read from the PBus interface 620 in the form of packed bytes and the Huffman decoded coefficients are presented to the co-efficient coder module 623. The Huffman coder 624 utilizes Huffman tables stored in the data cache and accessed via OBus interface 634. Alternatively, the Huffman table can be hardwired for maximum speed.

When utilising the data cache for Huffman coding, the eight banks of the data store data tables as follows with the various tables being described in further hereinafter.

TABLE 14

Huffman and Quantization Tables as stored in Data Cache

| Bank | Description |
| --- | --- |
| 0 | This bank hold the 256, 16 bit entries of a EHUFCO_DC_1 or EHUFCO table. The least significant bit of the index chooses between the two 16 bit items in the 32 bit word. All 128 lines of this bank of memory are used. |
| 1 | This bank holds the 256, 16 bit entries of a EHUFCO_DC_2 table. The least significant bit of the index chooses between the two 16 bit items in the 32 bit word. All 128 lines of this bank of memory are used. |
| 2 | This bank holds the 256, 16 bit entries of a EHUFCO_AC_1 table. The least significant bit of the index chooses between the two 16 bit items in the 32 bit word. All 128 lines of this bank of memory are used. |
| 3 | This bank holds the 256, 16 bit entries of a EHUFCO_AC_2 table. The least significant bit of the index chooses between the two 16 bit items in the 32 bit word. All 128 lines of this bank of memory are used. |
| 4 | This bank holds the 256, 4 bit entries of a EHUFSI_DC 1 or EHUFSI table, as well as the 256, 4 bit entries of a |

TABLE 14-continued

Huffman and Quantization Tables as stored in Data Cache

| Bank | Description |
| --- | --- |
|   | EHUFSI_DC_2 table. All 128 lines of this bank of memory are used. |
| 5 | This bank holds the 256, 4 bit entries of a EHUFSI_AC_1 table, as well as the 256, 4 bit entries of a EHUFSI_AC_2 table. All 128 lines of this bank of memory are used. |
| 6 | Not used |
| 7 | This banks holds the 128, 24 bit entries of the quantization table. It occupies the least significant 3 bytes of all 128 lines of this bank of memory. |

Figure 70:
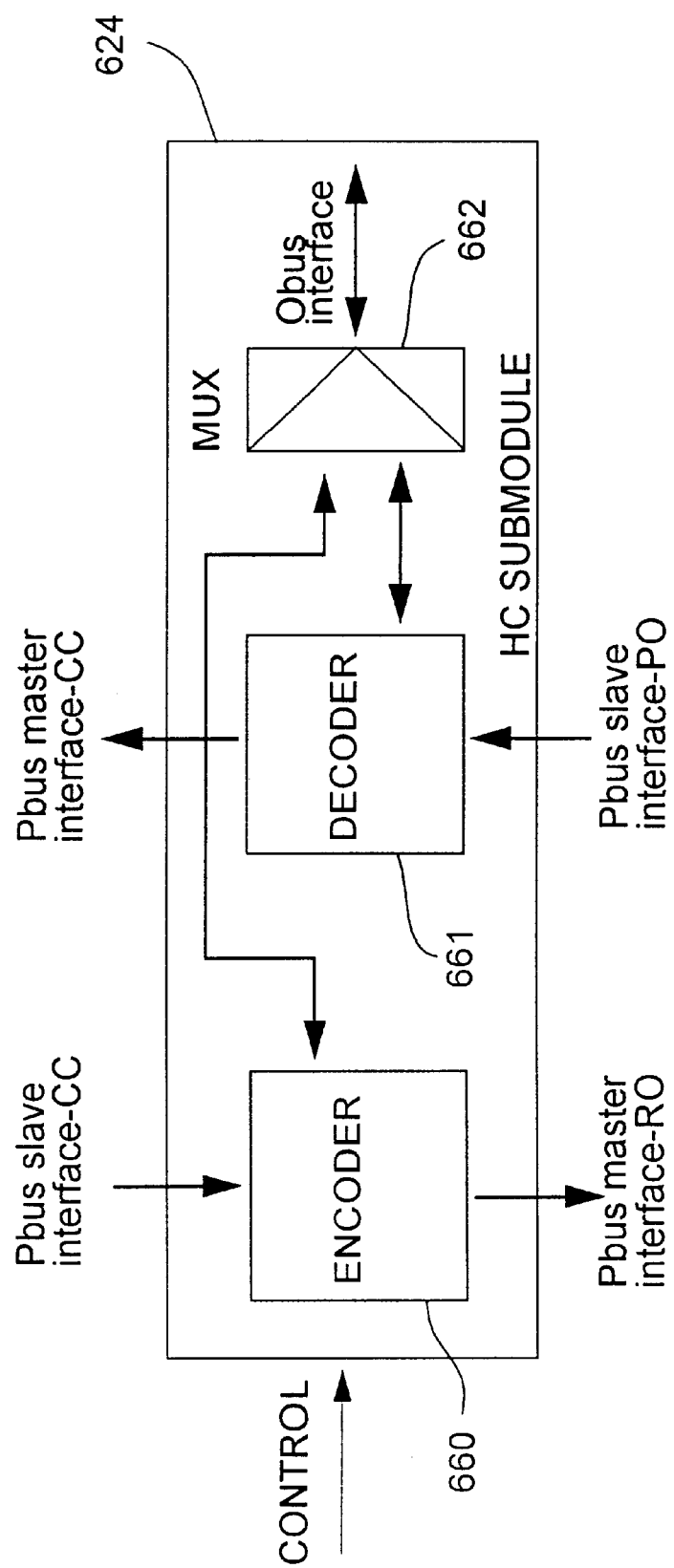
FIG. 70 illustrates the Huffman coder of FIG. 68 in more detail.

Turning now to FIG. 70, the Huffman coder 624 consists primarily of two independent blocks being an encoder 660 and a decoder 661. Both blocks 660,661 share the same OBus interface via a multiplexer module 662. Each block has its own input and output with only one block active at a time, depending on the function performed by the JPEG encoder.

a. Encoding

During encoding in JPEG mode, Huffman tables are used to assign codes of varying lengths (up to 16 bits per code) to the DC difference values and to the AC run-length values, which are passed to the HC submodule from the CC submodule. These tables have to be preloaded into the data cache before the start of the operation. The variable length code words are then concatenated with the additional bits for DC and AC coefficients (also passed from the CC submodule, then packed into bytes. A X'00 byte is stuffed in if an X'FF byte is obtained as a result of packing. If there is a need for an $RST_m$ marker it is inserted. This may require byte padding with "1" bits of the last Huffman code and X'00 byte stuffing if the padded byte results in X'FF. The need for an $RST_m$ marker is signalled by the CC submodule. The HC submodule inserts the EOI marker at the end of image, signalled by the "final" signal on the PBus-CC slave interface. The insertion procedure of the EOI marker requires similar packing, padding and stuffing operations as for $RST_m$ markers. The output stream is finally passed as packed by,tes to the Result Organizer 249 for writing to external memory.

In non-JPEG mode data is passed to the encoder from the CC submodule (PBus-CC slave interface) as unpacked bytes. Each byte is separately encoded using tables preloaded into the cache (similarly to JPEG mode), the variable length symbols are then assembled back into packed bytes and passed to the Results Organizer 249. The very last byte in the output stream is padded with 1's.

b. Decoding

Two decoding al-orithms are implemented: fast (real time) and slow (versatile). The fast algorithm works only in JPEG mode, the versatile one works both in JPEG and non-JPEG modes.

The fast JPEG Huffman decoding algorithm maps Iluffman symbols to either DC difference values or AC run-length values. It is specifically tuned for JPEG and assumes that the example Huffman tables (K3, K4, K5 and K6) were used during compression. The same tables are hard wired in to the algorithm allowing decompression without references to the cache memory. This decoding style is intended to be used when decompressing images to be printed where certain data rates need to be guaranteed. The data rate for the HC submodule decompressing a band (a block between $RST_m$ markers) is almost one DC/AC co-efficient per clock cycle. One clock cycle delay between the HC submodule and CC sub-module may happen for each X'00 stuff byte being removed from the data stream, however this is strongly data dependent.

The Huffman decoder operates in a faster mode for the extraction of one Huffman symbol per clock cycle. The fast Huffman decoder is described in the section herein entitled *Decoder of Variable Length Codes*.

Figure 71:
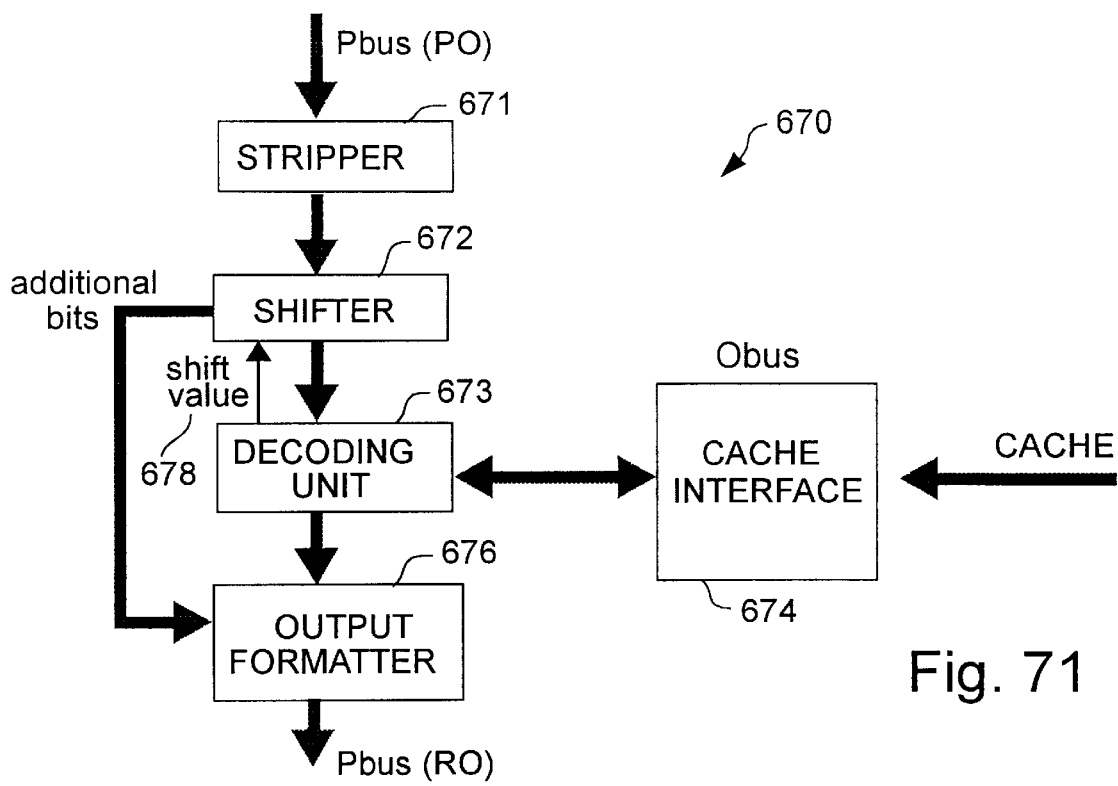
FIGS. 71 and 72 illustrate the Huffman coder and decoder in more detail.

Additionally, the Huffman decoder 661 also implements a heap-based slow decoding algorithm and has a structure 670 as illustrated in FIG. 71.

For a JPEG encoded stream, the STRIPPER 671 removes the X'00 stuff bytes, the X'FF fill bytes and $RST_m$ markers, passing Huffman symbols with concatenated additional bits to the SHIFTER 672. This stage is bypassed for Huffman-only coded streams.

The first step in decoding a Huffman symbol is to look up the 256 entries HUFVAL table stored in the cache addressing it with the first 8 bits of the Huffman data stream. If this yields a value (and the true length of the corresponding Huffman symbol), the value is passed on to the OUTPUT FORMATTER 676, and the length of the symbol and the number of the additional bits for the decoded value are fed back to the SHIFTER 672 enabling it to pass the relevant additional bits to the OUTPUT FORMATTER 676 and align the new front of the Huffman stream presented to the decoding unit 673. The number of the additional bits is a function of the decoded value. If the first look up does not result in a decoded value, which means that the Huffman symbol is longer than 8 bits, the heap address is calculated and successive heap (located in the cache, too) accesses are performed following the algorithm until a match is found or an "illegal Huffman symbol" condition met. A match results in identical behavior as in case of the first match and "illegal Huffman symbol" generates an interrupt condition.

The algorithm for heap-based decoding algorithm is as follows:

```
loop until end of image
    set symbol length N to 8
    get first 8 bits of the input stream into INDEX
    fetch HUFVAL(INDEX)
    if HUFVAL(INDEX) = = 00xx 0000 111 -- (ILL)
        signal "illegal Huffman symbol"
        exit
    elsif HUFVAL(INDEX) = = 1nnn eeee eeee -- (HIT)
        pass nnn bits to eeee eeee as the value
        pass symbol length N = decimal (nnn)/*000
        as symbol length 8*/
        adjust the input stream
        break
    else/* HUFVAL (INDEX) = = 01iii iiii iiii -- (MISS)*/
        set HEAPINDEX = ii iiii iiii -- (we assume heapbase = 0)
        set N = 9
        if 9th bit of the input stream = = 0
            increment HEAPINDEX
        fi
    fetch VALUE = HEAP (HEAPINDEX) -- (code for 9th bit)
    loop
        if VALUE = = 0001 0000 1111 -- (ILL)
            signal "illegal Huffman symbol"
            exit
        elsif VALUE = = 1000 eeee eeee
            pass eeee eeee as the value
            pass symbol length N
            adjust the input stream
            break
        else/* VALUE = = 01iii iiii iiii -- (MISS) */
            set N = N + 1 -- (HEAPINDEX = ii iiii iiii)
            if Nth bit of the input stream = = 0
                increment HEAPINDEX
            fi
        fetch VALUE = HEAP (HEAPINDEX)
        pool
    pool
```

The STRIPPER 671 removes any X'00 stuff bytes, X'FF fill bytes and $RST_m$ markers from the incoming JPEG 671 coded stream and passes "clean" Huffman symbols with concatenated additional bits to the shifter 672. There are no additional bits in Huffman-only encoding, so in this mode the passed stream consists of Huffman symbols only.

The shifter 672 block has a 16 bit output register in which it presents the next Huffman symbol to the decoding unit 673 (bitstream running from MSB to LSB). Often the symbol is shorter than 16 bits, but it is up to the decoding unit 673 to decide how many bits are currently being analysed. The shifter 672 receives a feedback 678 from the decoding unit 673, namely the length of the current symbol and the length of the following additional bits for the current symbol (in JPEG mode), which allows for a shift and proper alignment of the beginning of the next symbol in the shifter 672.

The decoding unit 673 implements the core of the heap based algorithm and interfaces to the data cache via the OBus 674. It incorporates a Data Cache fetch block, lookup value comparator, symbol length counter, heap index adder and a decoder of the number of the additional bits (the decoding is based on the decoded value). The fetch address is interpreted as follows:

TABLE 15

| Field (bits) | Fetch Address Description |
|---|---|
| [32:25] | Index into dequantization tables. |
| [24:19] | Not used. |
| [18:9] | Index into the heap. |
| [8:0] | Index into Huffman decode table. |

The OUTPUT FORMATTER block 676 packs decoded 8-bit values (standalone Huffman mode), or packs 24-bit value+additional bits+$RST_m$ marker information (JPEG mode) into 32-bit words. The additional bits are passed to the OUTPUT FORMATTER 676 by the shifter 672 after the decoding unit 673 decides on the start position of the additional bits for the current symbol. The OUTPUT FORMATTER 673 also implements a 2 deep FIFO buffer using a one word delay for prediction of the final value word. During the decoding process, it may happen that the shifter 672 (either fast or slow) tries to decode the trailing padding bits at the end of the input bitstream. This situation is normally detected by the shifter and instead of asserting the "illegal symbol" interrupt, it asserts a "force final" signal. Active "force final" signal forces the OUTPUT FORMATTER 676 to signal the last but one decoded word as "final" (this word is still present in the FIFO) and discard the very last word which does not belong to the decoded stream.

Figure 72:
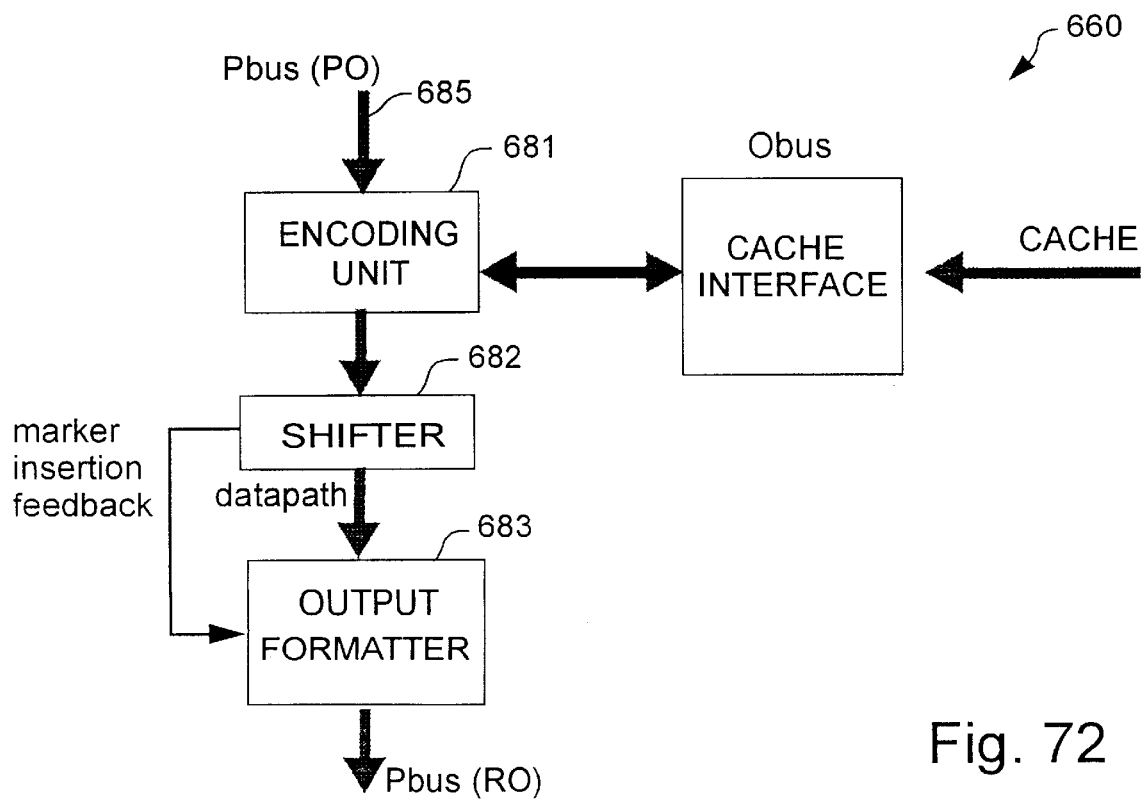

The Huffman encoder 660 of FIG. 70 is illustrated in FIG. 72 in more detail. The Huffman encoder 660 maps byte data into Huffman symbols via look up tables and includes a encoding unit 681. a shifter 682 and a OUTPUT FORMATTER 683 with the lookup tables being accessed from the cache.

Each submitted value 685 is coded by the encoding unit 681 using coding tables stored in the data cache. One access to the cache 230 is needed to encode a symbol, although each value being encoded requires two tables, one that contains the corresponding code and the other that contains the code length. During JPEG compression, a separate set of tables is needed for AC and DC coefficients. If subsampling is performed. separate tables are required for subsampled and non subsampled components. For non-JPEG compression, only two tables (code and size) are needed. The code is then handled by the shifter 682 which assembles the outgoing stream on bit level. The Shifter 682 also performs $RST_m$ and EOI markers insertion which implies byte padding, if necessary. Bytes of data are then passed to the OUTPUT FORMATTER 683 which does stuffing (with X'00 bytes), filling with X'FF bytes, also the FF bytes leading the marker codes and formatting to packed bytes. In the non-JPEG mode, only formatting of packed bytes is required.

Insertion of X'FF bytes is handled by the shifter 682, which means that the output formatter 683 needs to tell which bytes passed from the shifter 682 represent markers, in order to insert an X'FF byte before. This is done by having a register of tags which correspond to bytes in the shifter 682. Each marker, which must be on byte boundaries anyway, is tagged by the shifter 682 during marker insertion. The packer 683 does not insert stuff bytes after the X"FF" bytes preceding the markers. The tags are shifted synchronously with the main shift register.

The Huffman encoder uses four or eight tables during JPEG compression, and two tables for straight Huffman encoding. The tables utilized are as follows:

TABLE 16

Tables Used by the Huffman Encoder

| Name | Size | Description |
| --- | --- | --- |
| EHUFSI | 256 | Huffman code sizes. Used during straight Huffman encoding. Uses the coded value as an index. |
| EHUFCO | 256 | Huffman code values used during straight Huffman encoding. Uses the coded value as an index. |
| EHUFSI_DC_1 | 16 | Huffman codes sizes used to code DC co-efficients during JPEG compression. Uses magnitude category as the index. |
| EHUFCO_DC_1 | 16 | Huffman code values used to code DC co-efficients during JPEG compression. Uses magnitude category as an index. Used for subsampled blocks. |
| EHUFSI_DC_2 | 16 | Huffman code sizes used to code DC co-efficients during JPEG compression. Uses magnitude category as an index. Used for subsampled blocks. |
| EHUFCO_DC_2 | 16 | Huffman code sizes used to code DC co-efficients during JPEG compression. Uses magnitude category as an index. Used for subsampled blocks. |
| EHUFSI_AC_1 | 256 | Huffman code sizes used to code AC co-efficients during JPEG compression. Uses magnitude category and run-length as an index. |
| EHUFCO_AC_1 | 256 | Huffman code sizes used to code AC co-efficients during JPEG compression. Uses magnitude category and run-length as an index. |
| EHUFSI_AC_2 | 256 | Huffman code sizes used to code AC co-efficients during JPEG compression for subsampled components. Uses magnitude category and run-length as an index. |
| EHUFCO_AC_2 | 256 | Huffman code sizes used to code AC co-efficients during JPEG compression for subsampled components. Uses magnitude category and run-length as an index. |

3.17.4 Table Indexing

Huffman tables are stored locally by the co-processor data cache 230. The data cache 230 is organized as a 128 line, direct mapped cache, where each line comprises 8 words. Each of the words in a cache line are separately addressable, and the Huffman decoder uses this feature to simultaneously access multiple tables. Because the tables are small (<=256 entries), the 32 bit address field of the OBus can carry indexes into multiple tables.

As noted previously, in JPEG slow decoding mode, the data cache is utilized for storing various Huffman tables. The format of the data cache is as follows:

TABLE 17

Bank Address for Huffman and Quantization Tables

| Bank | Description |
| --- | --- |
| 0 to 3 | These banks hold the 1024, 16 bit entries of the heap. The least significant index bit selects between the two 16 bit words in each bank. All 128 lines of the four banks of memory are used. |
| 4 | This bank holds the 512, least significant 8 bits of the 12 bit entries of the DC Huffman decode table. The least significant two bits of the index chooses between the four, byte items in the 32 bit word. All 128 line of this bank of memory are used. |
| 5 | This bank holds the 512, least significant 8 bits of the 12 bit entries of the AC Huffman decode table. The least significant two bits of the index chooses between the four, byte items in the 32 bit word. All 128 lines of this bank of memory are used. |
| 6 | This bank holds the most significant 4 bits of both the DC and AC Huffman decode tables. The least significant 2 bits of each index chooses between the 4 respective nibbles within each word. |
| 7 | This bank holds the 128, 24 bit entries of the quantization table. It occupies the least significant 3 bytes of all 128 lines of this bank of memory. |

Prior to each JPEG instruction being executed by the JPEG coder 241 (FIG. 2) the appropriate image width value in the image dimensions register (PO_IDR) or (RO_IDR) must be set. As with other instructions, the length of the instruction refers to the number of input data items to be processed. This includes any padding data and accounts for any sub-sampling options utilized and for the number of color channels used.

All instructions issued by the co-processor 224 may utilize two facilities for limiting the amount of output data produced. These facilities are most useful for instructions where the input and output data sizes are not the same and in particular where the output data size is unknown, such as for JPEG coding and decoding. The facilities determine whether the output data is written out or merely discarded with everything else being as if the instruction was properly processed. By default, these facilities are normally disabled and can be enabled by enabling the appropriate bits in the RO_CFG register. JPEG instructions however, include specific option for setting these bits. Preferably, when utilising JPEG compression, the co-processor 224 provides facilities for "cutting" and "limiting" of output data.

Figure 73:
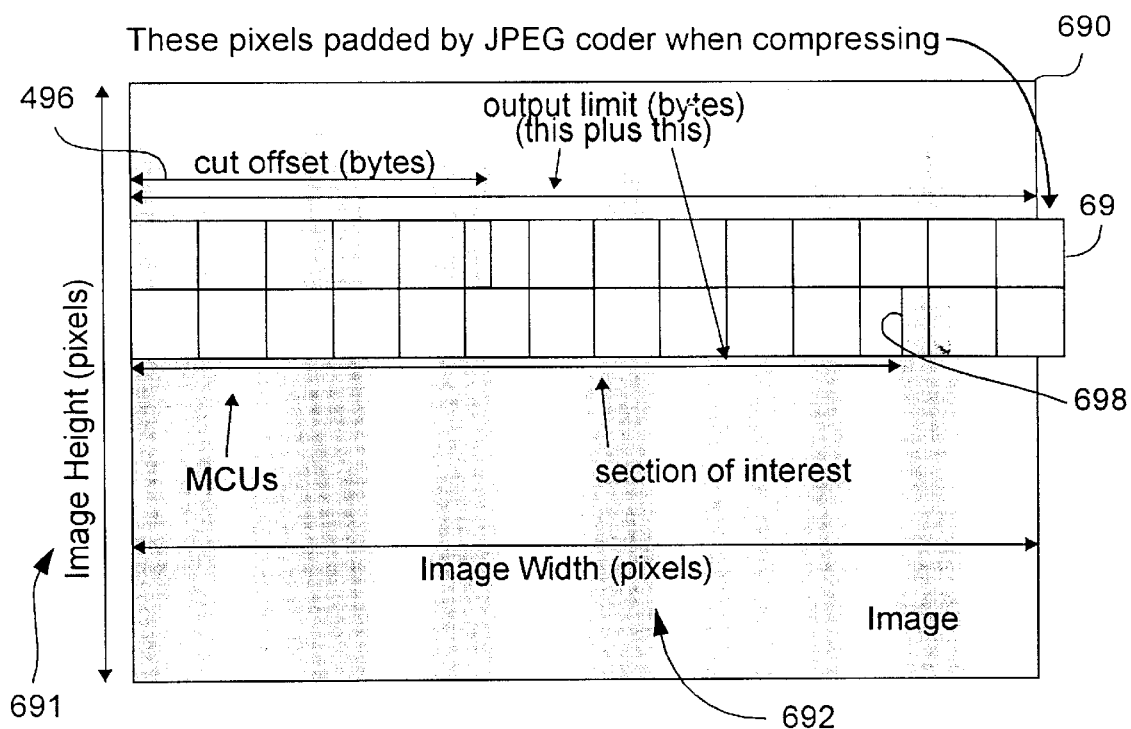
FIGS. 73–75 illustrate the process of cutting and limiting of JPEG data as utilized in the co-processor.

Turning to FIG. 73, there is now described the process of cutting and limiting. An input image 690 may be of a certain height 691 and a certain width 692. Often, only a portion of the image is of interest with other portions being irrelevant for the purposes of printing out. However, the JPEG encoding system deals with 8×8 blocks of pixels. It may be the case that, firstly, the image width is not an exact multiple of 8 and additionally, the section of interest comprising MCU 695 does not fit across exact boundaries. An output cut register, RO_cut specifies the number of output bytes at 696 at the beginning of the output data stream to discard. Further, an output limit register, RO_LMT specifies the maximum number of output bytes to be produced. This count includes any bytes that do not get written to memory as a result of the cut register. Hence, it is possible to target a final output byte 698 beyond which no data is to be outputted.

Figure 74:
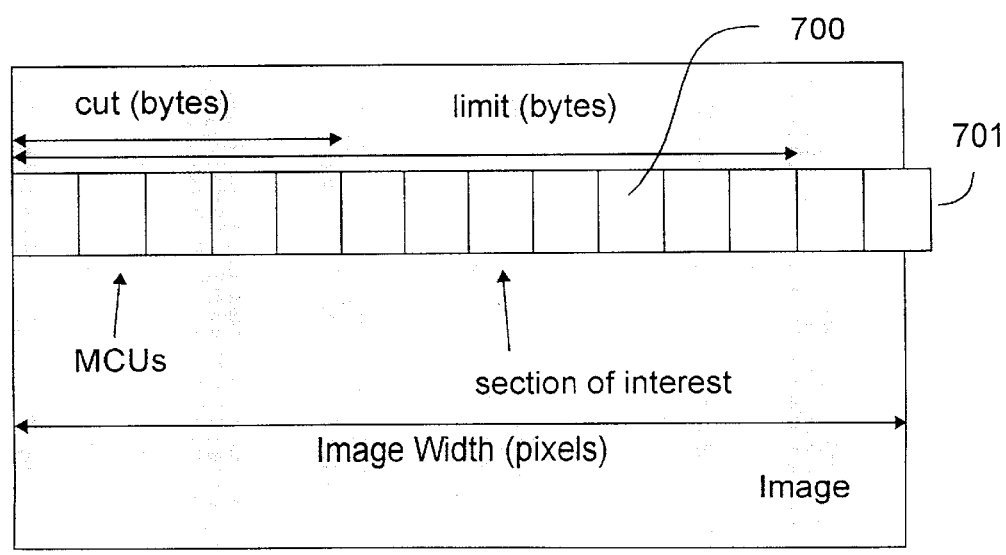
Figure 75:
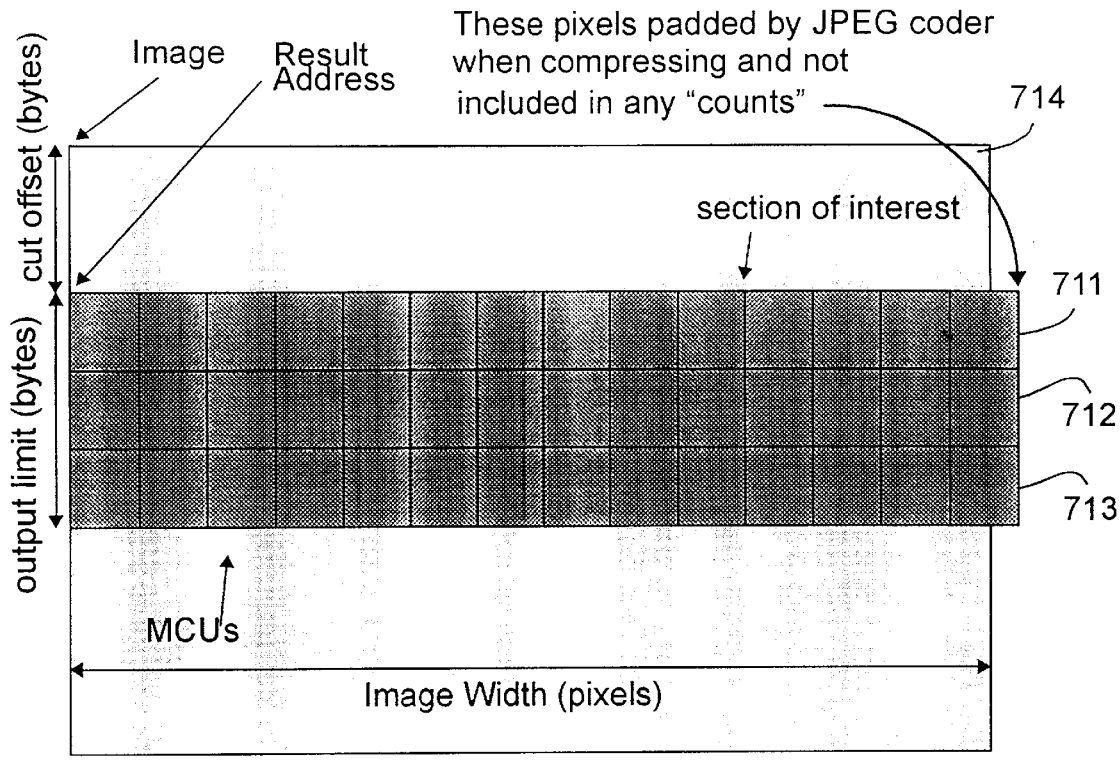

There are two particular cases where the cut and limited functionality of the JPEG decoder is considered to be extremely useful. The first case, as illustrated in FIG. 74, is the extraction or decompression of a sub-section 700 of one strip 701 of a decompressed image. The second useful case is illustrated in FIG. 75 wherein the extraction or decompression of a number of complete strips (eg. 711, 712 and 713) is required from an overall image 714.

Figure 76:
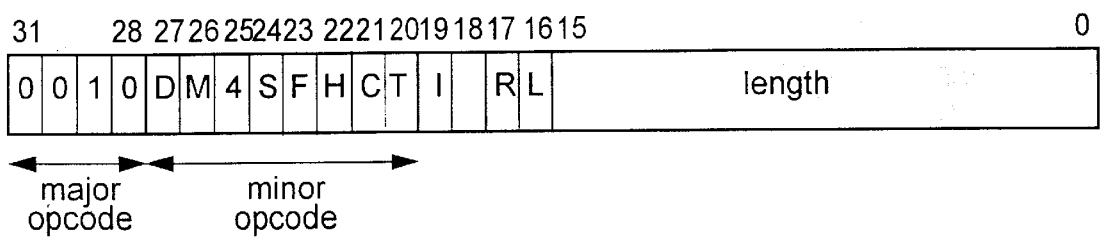
FIG. 76 illustrates the instruction word format for JPEG instructions.

The instruction format and field encoding for JPEG instructions is as illustrated in FIG. 76. The minor opcode fields are interpreted as follows:

TABLE 18

Instruction Word - Minor Opcode Fields

| Field | Description |
| --- | --- |
| D | 0 = encode(compress) |
|   | 1 = decode(decompress) |
| M | 0 = single color channel |
|   | 1 = multi channel |
| 4 | 0 = three channel |
|   | 1 = four channel |
| S | 0 = do not use a sub/up sampling regime |
|   | 1 = use a subsampling regime |
| H | 0 = use fast Huffman coding |
|   | 1 = use general purpose Huffman coding |
| C | 0 = do not use cut register |
|   | 1 = use cut register |
| T | 0 = do not truncate on output |
|   | 1 = truncate on output |
| F | 0 = do not low pass filter before subsampling |
|   | 1 = low pass filter before subsampling |

3.17.5 Data Coding Instructions

Preferably, the co-processor 224 provides for the ability to utilize portions of the JPEG coder 241 of FIG. 2 in other ways. For example, Huffman coding is utilized for both JPEG and many other methods of compression. Preferably, there is provided data coding instructions for manipulating the Huffman coding unit only for hierarchial image decompression. Further, the run length coder and decoder and the predictive coder can also be separately utilized with similar instructions.

3.17.6 A Fast DCT Apparatus

Figure 77:
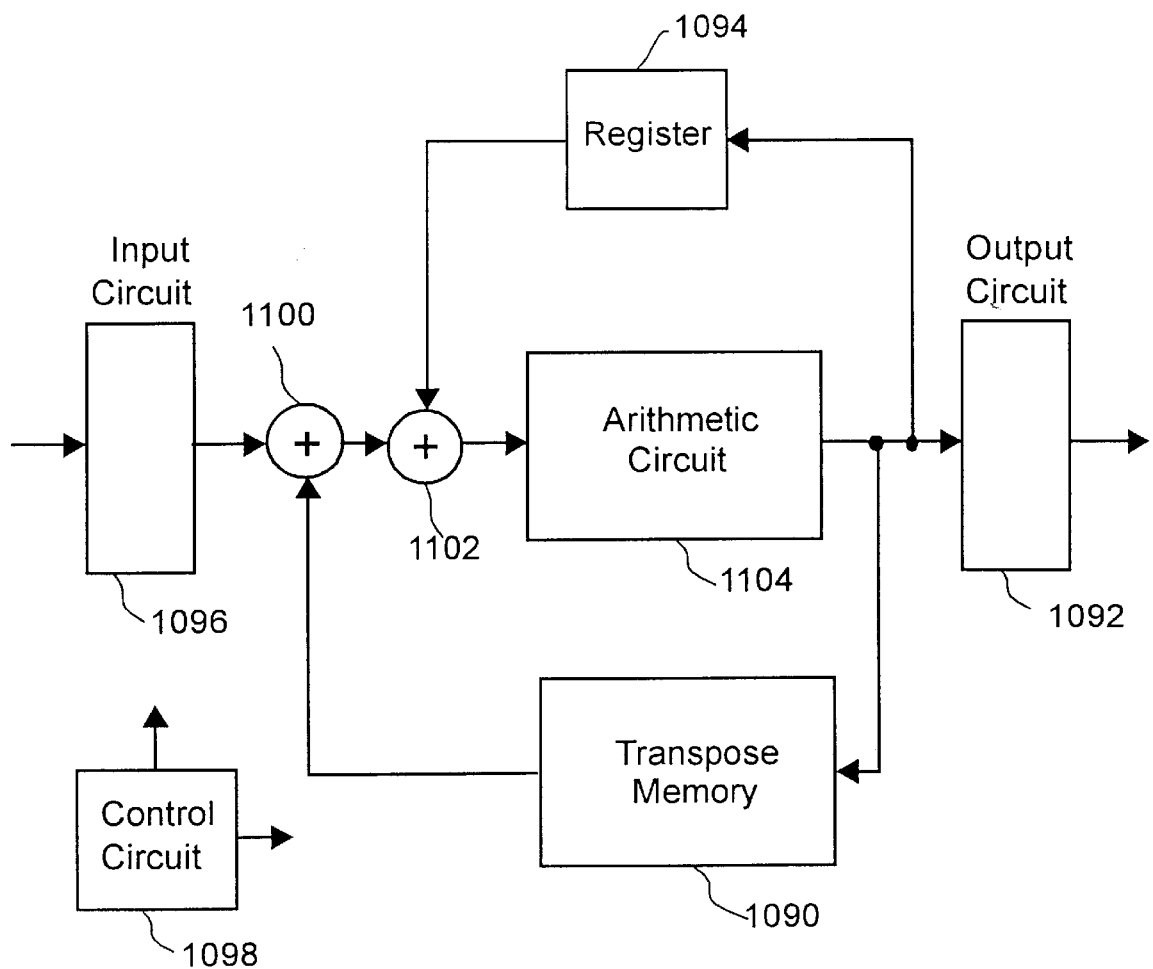
FIG. 77 shows a block diagram of a typical discrete cosine transform apparatus (prior art)

Conventionally, a discrete cosine transform (DCT) apparatus as shown in FIG. 77 performs a full two-dimensional (2-D) transformation of a block of 8×8 pixels by first performing a 1-D DCT on the rows of the 8×8 pixel block. It then performs another 1-D DCT on the columns of the 8×8 pixel block. Such an apparatus typically consists of an input circuit 1096, an arithmetic circuit 1104, a control circuit 1098, a transpose memory circuit 1090, and an output circuit 1092.

The input circuit 1096 accepts 8-bit pixels from the 8×8 block. The input circuit 1096 is coupled by intermediate multiplexers 1100, 1102 to the arithmetic circuit 1004. The arithmetic circuit 1104 performs mathematical operations on either a complete row or column of the 8×8 block. The control circuit 1098 controls all the other circuits, and thus implements the DCT algorithm. The output of the arithmetic circuit is coupled to the transpose memory 1090, register 1095 and output circuit 1092. The transpose memory is in turn connected to multiplexer 1100, which provides output to the next multiplexer 1102. The multiplexer 1102 also receives input from the register 1094. The transpose circuit 1090 accepts 8×8 block data in rows and produces that data in columns. The output circuit 1092 provides the coefficients of the DCT performed on a 8×8 block of pixel data.

In a typical DCT apparatus, it is the speed of the arithmetic circuit 1104 that basically determines the overall speed of the apparatus, since the arithmetic circuit 1104 is the most complex.

The arithmetic circuit 1104 of FIG. 77 is typically implemented by breaking the arithmetic process down into several stages as described hereinafter with reference to FIG. 78. A single circuit is then built that implements each of these stages 1114, 1148, 1152, 1156 using a pool of common resources, such as adders and multipliers. Such a circuit 1104 is mainly disadvantageous due to it being slower than optimal, because a single, common circuit is used to implement the various stages of circuit 1104. This includes a storage means used to store intermediate results. Since the time allocated for the clock cycle of such a circuit must be greater or equal to the time of the slowest stage of the circuit, the overall time is potentially longer than the sum of all the stages.

Figure 78:
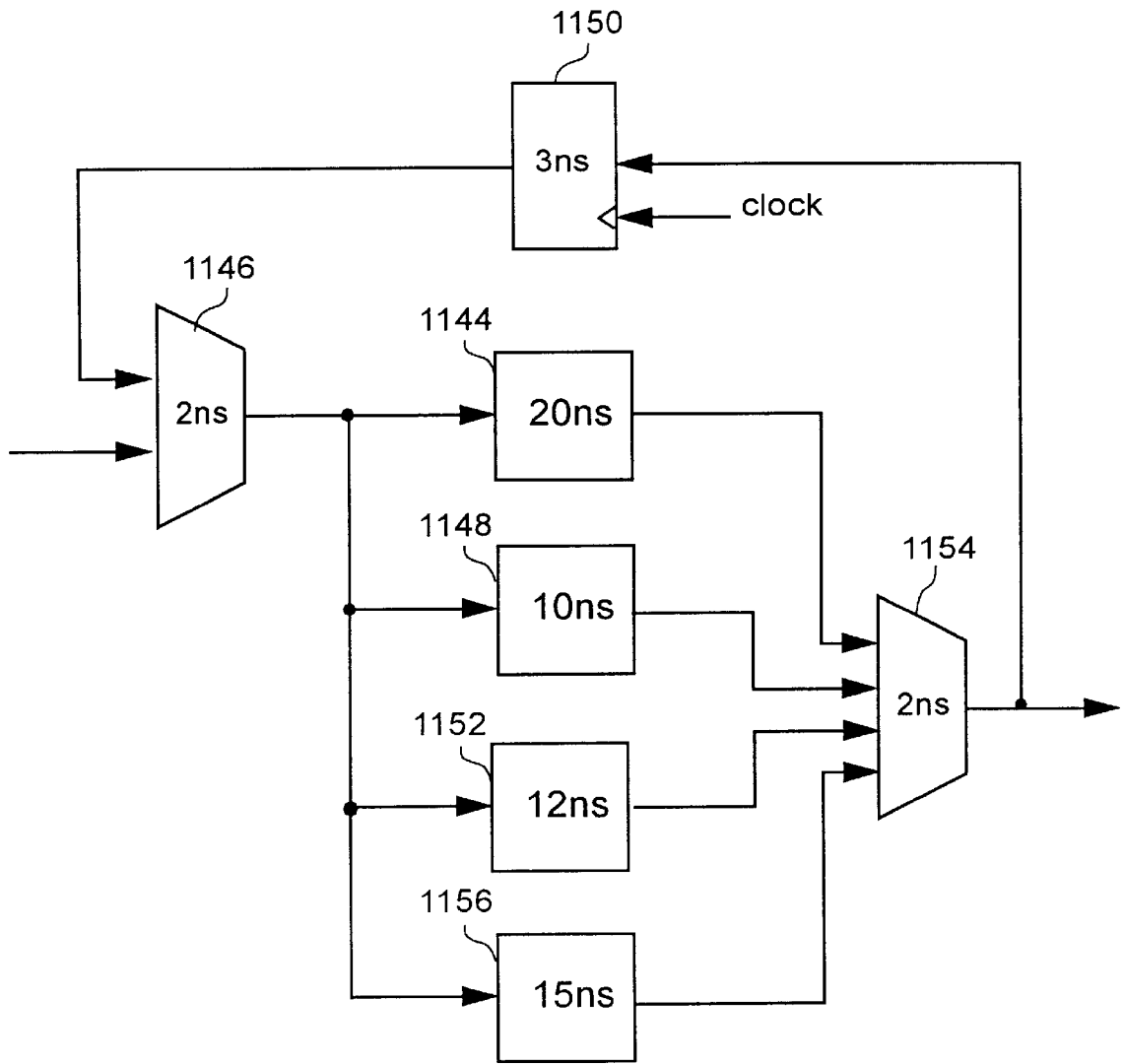
FIG. 78 illustrates an arithmetic data path of a prior art DCT apparatus.

FIG. 78 depicts a typical arithmetic data path, in accordance with the apparatus of FIG. 77, as part of a DCT with four stages. The drawing does not reflect the actual implementation, but instead reflects the functionality. Each of the four stages 1144, 1148, 1152, and 1156 is implemented using a single, reconfigurable circuit. It is reconfigured on a cycle-by-cycle basis to implement each of the four arithmetic stages 1144, 1148, 1152, and 1156 of the 1-D DCT. In this circuit, each of the four stages 1144, 1148. 1152, and 1156 uses pool of common resources (e.g. adders and multipliers) and thus minimises hardware.

However, the disadvantage of this circuit is that it is slower than optimal. The four stages 1144, 1148, 1152, and 1156 are each implemented from the same pool of adders and multipliers. The period of the clock is therefore determined by the speed of the slowest stage, which in this example is 20 ns (for block 1144). Adding in the delay (2 ns each) of the input and output multiplexers 1146 and 1154 and the delay (3 ns) of the flip-flop 1150, the total time is 27 ns. Thus, the fastest this DCT implementation can run at is 27 ns.

Pipelined DCT implementations are also well known. The drawback with such implementations is that They require large amounts of hardware to implement. Whilst the present invention does not offer the same performance in terms of throughput, it offers an extremely good performance/size compromise, and good speed advantages over most of the current DCT implementations.

Figure 79:
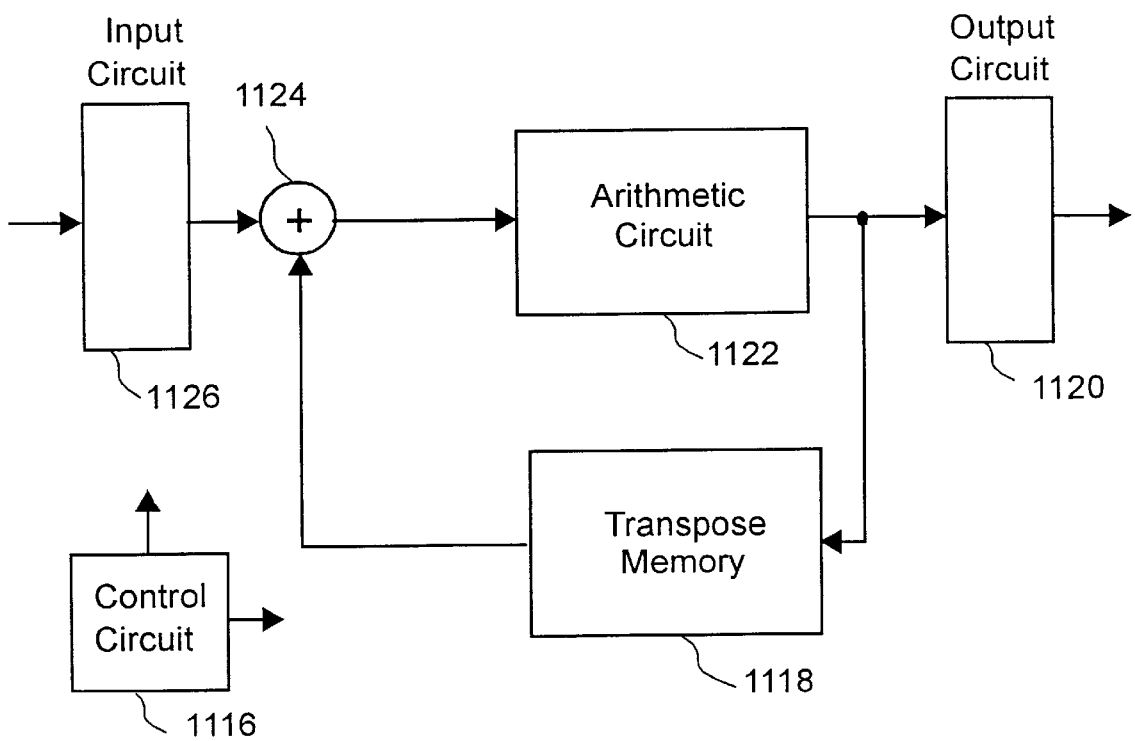
FIG. 79 shows a block diagram of a DCT apparatus utilized in the co-processor.

FIG. 79 shows a block diagram of the preferred form of discrete cosine transform unit utilized in the JPEG coder 241 (FIG. 2) where pixel data is inputted to an input circuit 1126 which captures an entire row of 8-bit pixel data. The transpose memory 1118 converts row formatted data into column formatted data for the second pass of the two dimensional discrete cosine transform algorithm. Data from the input circuit 1126 and the transpose memory 1118 is multiplexed by multiplexer 1124, with the output data from multiplexer 1124 presented to the arithmetic circuit 1122. Results data from the arithmetic circuit 1122 is presented to the output circuit 1120 after the second pass of the process. The control circuit 1116 controls the flow of data through the discrete cosine transform apparatus.

During the first pass of the discrete cosine transform process row data from the image to be transformed. or transformed image coefficients to be transformed back to pixel data is presented to the input circuit 1126. During this first pass, the multiplexer 1124 is configured by the control circuit 1116 to pass data from the input circuit 1126 to the arithmetic circuit 1122.

Figure 80:
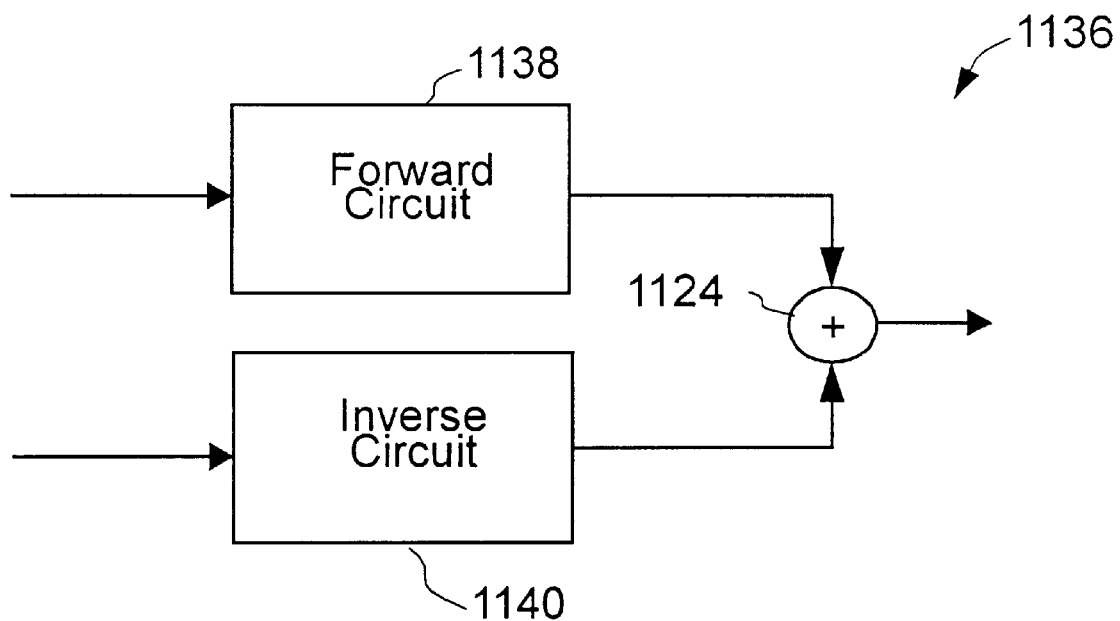
FIG. 80 depicts a block diagram of the arithmetic circuit of FIG. 79 in more detail.

Turning to FIG. 80. there is shown the structure of the arithmetic circuit 1122 in more detail. In the case of performing a forward discrete cosine transform, the results from the forward circuit 1138 which is utilized to calculate the forward discrete cosine transform is selected via the multiplexer 1142, which is configured in this way by the control circuit 1116. When an inverse discrete cosine transform is to be performed, the output from the inverse circuit 1140 is selected via the multiplexer 1142, as controlled by the control circuit 1126. During the first pass, after each row vector has been processed by the arithmetic circuit 1122 (configured in the appropriate way by control circuit 1116), that vector is written into the transpose memory 1118. Once all eight row vectors in an 8×8 block have been processed and written into the transpose memory 1118, the second pass of the discrete cosine transform begins.

During the second pass of either the forward or inverse discrete cosine transforms, column ordered vectors are read from the transpose memory 1118 and presented to the arithmetic circuit 1122 via the multiplexer 1124. During this second pass, the multiplexer 1124 is configured by the control circuit to ignore data from the input circuit 1136 and pass column vector data from the transpose memory 1118 to the arithmetic circuit 1122. The multiplexer 1142 in the arithmetic circuit 1122 is configured by the control circuit 1116 to pass results data from the inverse circuit 1140 to the output of the arithmetic circuit 1122. When results from the arithmetic circuit 1122 are available, they are captured by the output circuit 1120 under direction from the control circuit 1116 to be outputted sometime later.

The arithmetic circuit 1122 is completely combinatorial, in that is there are no storage elements in the circuit storing intermediate results. The control circuit 1116 knows how long it takes for data to flow from the input circuit 1136, through the multiplexer 1124 and through the arithmetic circuit 1122, and so knows exactly when to capture the results vector from the outputs of the arithmetic circuit 1122 into the output circuit 1120. The advantage of having no intermediate stages in the arithmetic circuit 1122 is that no time is wasted getting data in and out of intermediate storage elements, but also the total time taken tor data to tlow through the arithmetic circuit 1122 is equal to the sum of all the internal stages and not N times the delay of the longest stage (as with conventional discrete cosine transform implementations), where N is the number of stages in the arithmetic circuit.

Referring to FIG. 81, the total time delay is simply the sum of the four stage 1158, 1160, 1162, 1164, which is 20 ns+10 ns+12 ns+15 ns=57 ns, which is faster that the circuit depicted in FIG. 78. The advantage of this circuit is that it provides an opportunity to reduce the overall system's clock period. Assuming that four clock cycles are allocated to getting a result from the circuit depicted in FIG. 81, the fastest run time for the entire DCT system would be 57/4 ns (14.25 ns), which is a significant improvement over the circuit in FIG. 78 which only allows for a DCT clock period of substantially 27 ns.

An examplary implementation of the present DCT apparatus might, but not necessarily, use the DCT algorithm proposed in the paper to The Transactions of the IEICE, Vol. E 71. No. 11, November 1988, entitled *A Fast DCT-SQ Scheme for Images* at page 1095 by Yukihiro Arai, Takeshi Agui and Masayuki Nakajima. By implementing this algorithm in hardware, it can then easily be placed in the current DCT apparatus in the arithmetic circuit 1122. Likewize, other DCT algorithms may be implemented in hardware in place of arithmetic circuit 1122.

3.17.7 Huffman Decoder

The aspects of the following embodiment relate to a method and apparatus for variable-length codes interleaved with variable length bit fields. In particular, the embodiments of the invention provide efficient and fast, single stage (clock cycle) decoding of variable-length coded data in which byte aligned and not variable length encoded data is removed from the encoded data stream in a separate pre-processing block. Further, information about positions of the removed byte-aligned data is passed to the output of the decoder in a way which is synchronous with the data being decoded. In addition, it provides fast detection and removal of not byte-aligned and not variable length encoded bit fields that are still present in the pre-processed input data.

The preferred embodiment of the present invention preferably provides for a fast Huffman decoder capable of decoding a JPEG encoded data at a rate of one Huffman symbol per clock cycle between marker codes. This is accomplished by means of separation and removal of byte aligned and not Huffman encoded marker headers, marker codes and stuff bytes from the input data first in a separate pre-processing block. After the byte aligned data is removed, the input data is passed to a combinatorial data-shifting block, which provides continuous and contiguous filling up of the data decode register that consequently presents data to a decoding unit. Positions of markers removed from the original input data stream are passed on to a marker shifting block, which provides shifting of marker position bits synchronously with the input data being shifted in the data shifting block.

The decoding unit provides combinatorial decoding of the encoded bit field presented to its input by the data decode register. The bit field is of a fixed length of n bits. The output of the decoding unit provides the decoded value (v) and the actual length (m) of the input code, where m is less than or equal to n. It also provides the length (a) of a variable length bit field, where (a) is greater than or equal to 0. The variable-length bit field is not Huffman encoded and follows immediately the Huffman code. The n-long bit field presented to the input of the decoding unit may be longer than or equal to the actual code. The decoding unit determines the actual length of the code (m) and passes it together with the length of the additional bits (a) to a control block. The control block calculates a shift value (a+m) driving the data and marker shifting blocks to shift the input data for the next decoding cycle.

The apparatus of the invention can comprise any combinatorial decoding unit, including ROM, RAM, PLA or anything else based as long as it provides a decoded value, the actual length of the input code, and the length of the following not Huffman encoded bit field within a given time frame.

In the illustrated embodiment, the decoding unit outputs predictively encoded DC difference values and AC run-length values as defined in JPEG standard. The not Huffman encoded bit fields, which are extracted from the input data simultaneously with decoded values, represent additional bits determining the value of the DC and AC coefficients as defined in JPEG standard. Another kind of not Huffman encoded bit fields, which are removed from the data present in the data decode register, are padding bits as defined in JPEG standard that precede byte-aligned markers in the original input data stream. These bits are detected by the control block by checking the contents of a padding zone of the data register. The padding zone comprises up to k most significant bits of the data register and is indicated by the presence of a marker bit within k most significant bits of the marker register, position of said marker bit limiting the length of the padding zone. If all the bits in the padding zone are identical (and equal to 1s in case of JPEG standard), They are considered as padding bits and are removed from the data register accordingly without being decoded. The contents of the data and marker registers are then adjusted for the next decoding cycle.

The exemplary apparatus comprises an output block that handles formatting of the outputted data according to the requirements of the preferred embodiment of the invention. It outputs the decoded values together with the corresponding not variable length encoded bit fields. such as additional bits in JPEG, and a signal indicating position of any inputted bhte aligned and not encoded bit fields, such as markers in JPEG, with respect to the decoded values.

Data being decoded by the JPEG coder 241 (FIG. 2) is JPEG compatible and comprizes variable length Huffman encoded codes interleaved with variable length not encoded bit fields called "additional bits", variable length not encoded bit fields called "padding bits" and fixed length, byte aligned and not encoded bit fields called "markers", "stuff bytes" and "fill bytes". FIG. 82 shows a representative example of input data.

The overall structure and the data flow in the Huffman decoder of the JPEG coder 241 is presented in FIG. 83 and FIG. 84, where FIG. 83 illustrates the architecture of the Huffman decoder of the JPEG data in more detail. The stripper 1171 removes marker codes (code $FFXX_{hex}$, XX being non zero), fill bytes (code $FF_{hex}$) and stuff bytes (code $00_{hex}$ following code $FF_{hex}$), that is all byte aligned components of the input data, which are presented to the stripper as 32 bit words. The most significant bit of the first word to be processed is the head of the input bit stream. In the stripper 1171, the byte aligned bit fields are removed from each input data word before the actual decoding of Huffman codes takes place in the downstream parts of the decoder.

The input data arrives at the stripper's 1171 input as 32-bit words, one word per clock cycle. Numbering of the input bytes 1211 from 0 to 3 is shown in FIG. 85. If a byte of a number (i) is removed because it is a fill byte, a stuff byte or belongs to a marker, the remaining bytes of numbers (i-1) down to 0 are shifted to the left on the output of the stripper 1171 and take numbers (i) down to 1. Byte 0 becoming a "don't care" byte. Validity of bytes outputted by the stripper 1171 is also coded by means of separate output tags 1212 as shown in FIG. 85. The bytes which are not removed by the stripper 1171 are left aligned on the stripper's output. Each byte on the output has a corresponding tag indicating if the corresponding byte is valid (i.e. passed on by the stripper 1171), or invalid (i.e. removed by the stripper 1171) or valid and following a removed marker. The tags 1212 control loading of the data bytes into the data register 1182 through the data shifter and loading of marker positions into the marker register 1183 through the marker shifter. The same scheme applies if more than one byte is removed from the input word: all the remaining valid bytes are shifted to the left and the corresponding output tags indicate validity of the output bytes. FIG. 85 provides examples 1213 of output bytes and output tags for various example combinations of input bytes.

Returning to FIG. 83, the role of the preshifter and postshifter blocks 1172, 1173, 1180, 1181 is to assure loading of the data into the corresponding data register 1182 and marker register 1183 in a contiguous way whenever there is enough room in the data register and the marker register. The data shifter and the marker shifter blocks, which consist of the respective pre- and postshifters, are identical and identically controlled. The difference is that while the data shifter handles data passed by the stripper 1171, the marker shifter handles the tags only and its role is to pass marker positions to the output of the decoder in a way synchronous with the decoded Huffman values. The outputs of the postshifters 1180, 1181 feed directly to the respective registers 1182, 1183, as shown in FIG. 83.

In the data preshifter 1172, as also shown in FIG. 86, data arriving from the stripper 1171 is firstly extended to 64 bits by appending 32 zeroes to the least significant bit 1251. Then the extended data is shifted in a 64 bit wide barrel shifter 1252 to the right by a number of bits currently present in the data register 1182. This number is provided by the control logic 1185 which keeps track of how many valid bits are there in the data 1182 and marker 1183 registers. The barrel shifter 1252 then presents 64 bits to the multiplexer block 1253, which consists of 64 2×1 elementary multiplexers 1254. Each elementary 2×1 multiplexer 1254 takes as inputs one bit from the barrel shifter 1252 and one bit from the data register 1182. It passes the data register bit to the output when this bit is still valid in the data register. Otherwize, it passes the barrel shifter's 1252 bit to the output. The control signals to all the elementary multiplexers 1254 are decoded from a control block's shift control 1 signals as shown in FIG. 86, which are also shown in FIG. 87 as preshifter control bits 0 . . . 5 of register 1223. The outputs of the elementary multiplexers 1254 drive a barrel shifter 1255. It shifts left by the number of bits provided on a 5 bit control signal shift control 2 as shown in FIG. 86. These bits represent the number of bits consumed from the data register 1182 by the decoding of the current data, which can be either the length of the currently decoded Huffman code plus the number of the following additional bits, or the number of padding bits to be removed if padding bits are currently being detected, or zero if the number of valid data bits in the data register 1182 is less then the number of bits to be removed. In this way, the data appearing on the output of barrel shifter 1255 contains new data to be loaded into the data register 1182 after a single decoding cycle. The contents of the data register 1182 changes in such a way that the leading (most significant) bits are shifted out of the register as being decoded, and 0, 8, 16, 24 or 32 bits from the stripper 1171 are added to the contents of the data register 1182. If there are not enough bits in the data register 1182 to decode them, data from the stripper 1171, if available. is still loaded in the current cycle. If there is no data available from the stripper 1171 in the current cycle, the decoded bits from the data register 1182 are still removed if there is a sufficient amount of them, otherwize the content of the data register 1182 does not change.

The marker preshifter 1173, postshifter 1181 and the marker resister 1183 are units identical to the data preshifter 1172, data postshifter 1180 and the data register 1182, respectively. The data flow inside units 1173, 1181 and 1183 and among them is also identical as the data flow among units 1172, 1180 and 1182. The same control signals are provided to both sets of units by the control unit 1185. The difference is only in the type of data on the inputs of the marker preshifter 1173 and data preshifter 1172, as well as in how the contents of the marker register 1183 and the data register 1182 are used. As shown in FIG. 88, tags 1261 from the stripper 1171 come as eight bit words, which provide two bits for each corresponding byte of data going to the data register 1182. According to the coding scheme shown in FIG. 85, an individual two bit tag indicating valid and following a marker byte has 1 on the most significant position. Only this most significant position of each of the four tags delivered by the stripper 1171 simultaneously is driven to the input 1262 of the marker preshifter 1173. In this way, on the input to the marker preshifter there may be bits set to 1 indicating positions of the first encoded data bits following markers. At the same time, they mark the positions of the first encoded data bits in the data register 1182 which follow a marker. This synchronous behavior of the marker position bits in the marker register 1183 and the data bits in the data register 1182 is used in the control block 1185 for detection and removal of padding bits, as well as for passing marker positions to the output of the decoder in a way synchronous with the decoded data. As mentioned, the two preshifters (data 1172 and marker 1173), postshifters (data 1180 and marker 1181) and registers (data 1182 and marker 1183) get the same control signals which facilitates fully parallel and synchronous operation.

The decoding unit 1184, also shown in FIG. 89 gets the sixteen most significant its of the data register 1182 which are driven to a combinatorial decoding unit 1184 for extraction of a decoded Huffman value, the length of the present input code being decoded and the length of the additional bits following immediately the input code (which is a function of the decoded value). The length of the additional bits is known after the corresponding preceding Huffman symbol is decoded, so is the starting position of the next Huffman symbol. This effectively requires, if speed of one value decoded per clock cycle is to be maintained, that decoding of a Huffman value is done in a combinatorial block. Preferably, the decoding unit comprizes four PLA style decoding tables hardwired as a combinatorial block taking a 16-bit token on input from the data register 1182 and producing a Huffman value (8 bits), the length of the corresponding Huffman-encoded symbol (4 bits) and the length of the additional bits (4 bits) as illustrated in FIG. 89.

Removal of padding bits takes place during the actual decoding when a sequence of padding bits is detected in the data register 1182 by a decoder of padding bits which is part of the control unit 1185. The decoder of padding bits operates as shown in FIG. 90. Eight most significant bits of the marker register 1183, 1242 are monitored for presence of a marker position bit. If a marker position bit is detected, all the bits in the data register 1182, 1241 which correspond to, that is have the same positions as, the bits preceding the marker bit in the marker register 1242 are recognized as belonging to a current padding zone. The content of the current padding zone is checked by the detector of padding bits 1243 for 1's. If all the bits in the current padding zone are 1's, they are recognized as padding bits and are removed from the data register. Removal is done by means of shifting of the contents of the data register 1182, 1241 (and at the same time the marker register 1183, 1242) to the left using the respective shifters 1172, 1173, 1180. 1181 in one clock cycle, as in normal decode mode with the difference that no decoded value is outputted. If not all the bits in the current padding zone are 1's, a normal decode cycle is performed rather than a padding bits removal cycle. Detection of padding bits takes place each cycle as described, in case there are some padding bits in the data register 1182 to be removed.

The control unit 1185 is shown in detail in FIG. 87. The central part of the control unit is the register 1223 holding the current number of valid bits in the data register 1182. The number of valid bits in the marker register 1183 is always equal to the number of valid bits in the data register 1182. The control unit preforms three functions. Firstly, it calculates a new number of bits in the data register 1182 to be stored in the register 1223. Secondly, it determines control signals for the shifters 1172, 1173, 1180, 1181, 1186, 1187 decoding unit 1184, and the output formatter 1188. Finally, it detects padding bits in the data register 1182, as described above.

The new number of bits in the data register 1182 (new_nob) is calculated as the current number of bits in the data register 1182 (nob) plus the number of bits (nos) available for loading from the stripper 1171 in the current cycle, less the number of bits (nor) removed from the data register 1182 in the current cycle, which is either a decode cycle or a padding bits removal cycle. The new number of bits is calculated as follows:

$$\text{new\_nob} = \text{nob} + \text{nos} - \text{nor}$$

The respective arithmetic operations are done in adder 1221 and subtractor 1222. It should be noted that (nos) can be 0 if there is no data available from the stripper 1171 in the current cycle. Also, (nor) can be 0 if there is no decoding done in the current cycle because of shortage of bits in the data register 1182, which means there are less bits in the data register than the sum of the current code length and the following additional bits length as delivered by the control unit 1185. The value (new_nob) may exceed 64 and block 1224 checks for this condition. In such a case, the stripper 1171 is stalled and no new data is loaded. Multiplexer 1233 is used for zeroing the number of bits to be loaded from the stripper 1171. A corresponding signal for stalling the stripper 1171 is not shown. Signal "padding cycle" driven by decoder 1231 controls multiplexer 1234 to select either the number of padding bits or the number of decoded bits (that is the length of code bits plus additional bits) as number of bits to be removed (nor). If the number of the decoded bits is greater than the number (nob) of the bits in the data register, which is checked in comparator 1228, the effective number of bits to shift as provided for multiplexer 1234 is set to zero by a complex NAND gate 1230. As a result, (nor) is set to zero and no bits are removed from the data register. The output of multiplexer 1234 is also used to control postshifters 1182 and 1183. The width of the data register 1182 must be chosen in a way preventing a deadlock situation. This means that at any time either there needs to be room in the data register to accommodate the maximum number of bits available from the stripper 1171 or sufficient number of valid bits to be removed as a result of a decode or a padding of bits removed cycle.

Calculation of the number of bits to be removed in a decode cycle is performed by adder 1226. Its operands come from the combinatorial decoding unit 1184. As the code length of 16 bits is coded as "0000" by the decoding unit, "or_reduce" logic 1225 provides encoding of "0000" into "10000", yielding a correct unsigned operand. This operand together with the output of subtractor 1227 provide control signals to the output formatting shifters 1186 and 1187.

Block 1229 is used for detection of EOI (End Of Image) marker position. The EOI marker itself is removed by the stripper 1171, but there can be some padding bits which are the very last bits of the data and which used to precede the EOI marker before its removal in the stripper 1171. The comparator 1229 checks if the number of bits in the data register 1182, stored in register 1223 is less than eight. If it is, and there is no more data to come from the stripper 1171 (that is the data register 1182 holds all the remaining bits for of the data unit being decoded), the remaining bits define the size of the padding zone before the removed EOI marker. Further handling of the padding zone and possible removal of padding bits is identical to the procedure applied in case of padding bits before RST markers, which has been described before.

Barrel shifters 1186, 1187 and output formatter 1188 play a support role and depending on the embodiment may have a different implementation or may not be implemented at all. Control signals to them come from the control unit 1185, as described above. The ab_reshifter (additional bits preshifter) 1186 takes 32 bits from the data register as input and shifts them to the left by the length of the Huffman code being presently decoded. In this way, all the additional bits following the code being presently decoded appear left aligned on the output of the barrel shifter 1186 which is also the input to the barrel shifter 1187. The ab_postshifter (additional bits postshifter) 1187 adjusts the position of the additional bits from left aligned to right aligned in an 11 bit field, as used in the output format of the data and shown in FIG. 91. The additional bits field extends from bit 8 to bit 18 in the output word format 1196 and some of the most significant bits may be invalid, depending on the actual number of the additional bits. This number in encoded on bits 0 to 3 of 1196, as specified by the JPEG standard. If a different format of the output data is adopted, the barrel shifters 1186 and 1187 and their functionality may change accordingly.

The output formatter block 1188 packs the decoded values, which in JPEG standard are DC and AC coefficients, (1196, bits 0 to 7) and a DC coefficient indicator (1196, bit 19) passed by the control unit 1185 together with the additional bits (1196, bits 8 to 18) passed by the ab_postshifter 1187 and the marker position bit (1196, bit 23) from the marker register 1183 into words according to the format presented in FIG. 91. The output formatter 1188 also handles any particular requirements as to the output interface of the decoder. The implementation of the output formatter is normally expected to change if the output interface changes as a result of different requirements. The foregoing described Hluffman decoder provides a highly effective form of decoding providing a high speed decoding operation.

3.17.8 Image Transformation Instructions

These instructions implement general affine transformations of source images. The operation to construct a portion of a transformed image falls generally into two broad areas. These include firstly working out which parts of the source image are relevant to constructing the current output scanline and, if necessary, decompressing them. The second step normally comprizes necessary sub-sampling and/or interpolation to construct the output image on a pixel by pixel basis.

Turning to FIG. 92, there is illustrated a flow chart of the steps required 720 to calculate the value of a destination pixel assuming that the appropriate sections of the source image have been decompressed. Firstly, the relevant sub-sampling, if present, must be taken into account 721. Next, two processes are normally implemented, one involving interpolation 722 and the other being sub-sampling. Normally interpolation and sub-sampling are alternative steps, however in some circumstances interpolation and sub-sampling may be used together. In the interpolation process, the first step is to find the four surrounding pixels 722, then determine if pre-multiplication is required 723, before performing bilinear interpolation 724. The bilinear interpolation step 724 is often computationally intensive and limits the operation of the image transformation process. The final step in calculating a destination pixel value is to add together the possibly bilinear interpolated sub-samples from the source image. The added together pixel values can be accumulated 727 in different possible ways to produce destination image pixels of 728.

The instruction word encoding for image transformation instructions is as illustrated in FIG. 93 with the following interpretation being placed on the minor opcode fields.

TABLE 19

Instruction Word - Minor Opcode Fields

| Field | Description |
|---|---|
| S | 0 = bi-linear interpolation is used on the four surrounding source image pixels to determine the actually sampled value |
| | 1 = sampled value is snapped to the closest source image pixel value |
| off[3:0] | 0 = do not apply the offset register (mdp_por) to the corresponding channel |
| | 1 = apply the offset register (mdp_por) to the corresponding channel |
| P | 0 = do not pre-multiply source image pixels |
| | 1 = pre-multiply source image pixels |
| C | 0 = do not clamp output values |
| | 1 = clamp output underflows to 0x00 and overflows to 0xFF |
| A | 0 = do not take absolute value of output values |
| | 1 = take absolute value of output values before wrapping or clamping |

The instruction operand and result fields are interpreted as follows:

TABLE 20

Instruction Operand and Results Word

| Operand | Description | Internal Format | External Format |
|---|---|---|---|
| Operand A | kernel descriptor | — | short or long kernel descriptor table |
| Operand B | Source Image Pixels | other | image table format |
| Operand C | unused | — | — |
| Result | pixels | pixles | packed stream, unpacked bytes |

Operand A points to a data structure known as a "kernel descriptor" that describes all the information required to define the actual transformation. This data structure has one of two formats (as defined by the L bit in the A descriptor). FIG. 94 illustrates the long form of kernel descriptor coding and FIG. 95 illustrates the short form of encoding. The kernel descriptor describes:

1. Source image start co-ordinates 730 (unsigned fixed point, 24.24 resolution). Location (0,0) is at the top left of the image.
2. Horizontal 731 and vertical 732 (sub-sample) deltas (2's complement fixed point, 24.24. resolution)
3. A 3 bit bp field 733 defining the location of the binary point within the fixed point matrix coefficients as described hereinafter.
4. Accumulation matrix co-efficients 735 (if present). These are of "variable" point resolution of 20 binary places (2's complement), with the location of the binary point implicitly specified by the bp field.
5. An rl field 736 that indicates the remaining number of words in the kernel descriptor. This value is equal to the number of rows times the number of columns minus 1.

The kernel co-efficients in the descriptor are listed row by row, with elements of alternate rows listed in rev-erse direction, thereby forming a zig zag pattern.

Turning now to FIG. 96, the operand B consists of a pointer to an index table indexing into scan lines of a source image. The structure of the index table is as illustrated in FIG. 96, with the operand B 740 pointing to an index table 741 which in turn points to scan lines (eg. 742) of the required source image pixels. Typically, the index table and the source image pixels are cacheable and possibly located in the local memory.

The operand C stores the horizontal and vertical sub-sample rate. The horizontal and vertical sub-sample rates are defined by the dimensions of the sub-sample weight matrix which are specified if the C descriptor is present. The dimensions of the matrix r and c are encoded in the data word of the image transformation instruction as illustrated in FIG. 97.

Channel N of a resultant pixel P[N] is calculated in accordance with the following equation:

$$p[n] = (I.\text{offset}[n] \cdot mdp_{por} : 0000) + \sum_r \sum_c w_{r,c} \cdot s(x + r\Delta x, y + c\Delta y)[n]$$

Internally, the accumulated value is kept to 36 binary places per channel. The location of the binary point Within this field is specified by the BP field. The BP field indicates the number of leading bits in the accumulated result to discard. The 36 bit accumulated value is treated as a signed 2's compliment number and is clamped or wrapped as specified. In FIG. 98, there is illustrated an example of the interpretation of the BP field in co-efficient encoding.

3.17.9 Convolution Instructions

Convolutions, as applied to rendering images, involves applying a two dimensional convolution kernel to a source image to produce a resultant image. Convolving is normally used for such matters as edge sharpening or indeed any image filter. Convolutions are implemented by the co-processor 224 in a similar manner to image transformations with the difference being that, in the case of transformations the kernel is translated by the width of the kernel for each output pixel, in the case of convolutions, the kernel is moved by one source pixel for each output pixel.

If a source image has values S(x,y) and a n×m convolution kernel has values C(x,y), then the nth channel of the convolution H[n] of S and C is given by:

$$H(x, y)[n] = (I.\text{offset}[n] \cdot mdp_{por} : 0000) + \sum_i \sum_j S(x+i, y+j) \cdot C(i, j)[n]$$

where i∈[0,c] and j∈[0,r].

The interpretation of the offset value, the resolution of intermediate results and the interpretation of the bp tield are the same as for Image Transformation instructions.

In FIG. 99, there is illustrated an example of how a convolution kernel 750 is applied to a source image 751 to produce a resultant image 752. Source image address generation and output pixel calculations are performed in a similar manner to that for image transformation instructions. The instruction operands take a similar form to image transformations. In FIG. 100, there is illustrated the instruction word encoding for convolution instructions with the following interpretation being applied to the various fields.

TABLE 21

Instruction Word

| Field | Description |
| --- | --- |
| S | 0 = bi-linear interpolation is used on the four surrounding source image pixels to determine the actually sampled value<br>1 = sampled value is snapped to the closest source image pixel value |
| C | 0 = do not clamp resultant vector values<br>1 = clamp result vector values: underflow to 0x00, overflow to 0xFF |
| P | 0 = do not pre-multiply input pixels<br>1 = pre multiply input pixels |
| A | 0 = do not take absolute value of output values<br>1 = take absolute value of output values before wrapping or clamping |
| off[3:0] | 0 = do not apply the offset register to this channel<br>1 = apply the offset register to this channel |

3.17.10 Matrix Multiplication

Matrix multiplication is utilized for many things including being utilized for color space conversion where an affine relationship exists between two color spaces. Matrix multiplication is defined by the following equation:

$$\begin{bmatrix} r_x \\ r_y \\ r_z \\ r_0 \end{bmatrix} = \begin{bmatrix} b_{0,0} & b_{0,1} & b_{0,2} & b_{0,3} & b_{0,4} \\ b_{1,0} & b_{1,1} & b_{1,2} & b_{1,3} & b_{1,4} \\ b_{2,0} & b_{2,1} & b_{2,2} & b_{2,3} & b_{2,4} \\ b_{3,0} & b_{3,0} & b_{3,2} & b_{3,3} & b_{3,4} \end{bmatrix} \begin{bmatrix} a_x \\ a_y \\ a_z \\ a_0 \\ 1 \end{bmatrix}$$

The matrix multiplication instruction operands and results have the following format:

TABLE 22

| Operand | Description | Internal Format | External Format |
| --- | --- | --- | --- |
| Operand A | source image pixels | pixels | packed stream |
| Operand B | matrix co-efficients | other | image table format |
| Operand C | unused | — | — |
| Result | pixels | pixels | packed stream, unpacked bytes |

The instruction word encoding for matrix multiplication instructions as illustrated in FIG. 101 with the following table summarising the minor opcode fields.

TABLE 23

Instruction Word

| Field | Description |
| --- | --- |
| C | 0 = do not clamp resultant vector values.<br>1 = clamp resultant vector values: underflow to 0x00, overflow to 0xFF |
| P | 0 = do not pre-multiply input pixels<br>1 = pre-multiply input pixels |
| A | 0 = do not take absolute value of output values<br>1 = take absolute value of output values before wrapping or clamping |

3.17.11 Halftoning

The co-processor 224 implements a multi-level dither for halftoning. Anything from 2 to 255 is a meaningful number of halftone levels. Data to be halftoned can be either bytes (ie. unmeshed or one channel from meshed data) or pixels (ie. meshed) as long as the screen is correspondingly meshed or unmeshed. Up to four output channels (or four bytes from the same channel) can be produced per clock, either packed bits (for bi-level halftoning) or codes (for more than two output levels) which are either packed together in bytes or unpacked in one code per bye.

The output half-toned value is calculated using the following formula:

$$(p \times (1-1) + d)/255$$

Where p is the pixel value ($0 \leq p \leq 255$), 1 is the number of levels ($2 \leq 1 \leq 255$) and d is the dither matrix value ($0 \leq d \leq 254$). The operand encoding is as follows:

TABLE 24

Instruction Operand and Results Word

| Operand | Description | Internal Format | External Format |
| --- | --- | --- | --- |
| Operand A | source image pixels | pixels | packed stream |
|  | source image bytes | packed bytes, unpacked bytes | packed stream |
| Operand B | dither matrix co-efficients | pixels, packed bytes, unpacked bytes | packed stream, unpacked bytes |
| Operand C | unused | — | — |
| Result | halftone codes | pixels, packed bytes unpacked bytes | packed stream, unpacked bytes |

In the instruction word encoding, the minor op code specifies a number of halftone levels. The operand B encoding is for the halftone screen and is encoded in the same way as a compositing tile.

3.17.12 Hierarchial Image Format Decompression

Hierarchial image format decompression involves several stages. These stages include horizontal interpolation, vertical interpolation, lluffman decoding and residual merging. Each phase is a separate instruction. In the Huffman decoding step, the residual values to be added to the interpolated values from the interpolation steps are Huffman coded. Hence, the JPEG decoder is utilized for Huffman decoding.

In FIG. 102, there is illustrated the process of horizontal interpolation. The output stream 761 consists of twice as much data as the input stream 762 with the last data value 763 being replicated 764. FIG. 103 illustrates horizontal interpolation by a factor of 4.

In the second phase of hierarchial image format decompression, rows of pixels are up sampled by a factor of two or four vertically by linear interpolation. During this phase, one row of pixels is on operand A and the other row is on operand B.

When vertically interpolating, either by a factor of two or four, the output data stream contains the same number of pixels as each input stream. In FIG. 104, there is illustrated an example of vertical interpolation wherein two input data streams 770, 771 are utilized to produce a first output stream 772 having a factor of two interpolation or a second output stream 773 having a factor of 4 interpolation. In the case of pixel interpolation, interpolation occurs separately on each of the four channels of four channel pixels.

The residual merging process involves the bytewize addition of two streams of data. The first stream (operand A) is a stream of base values and the second stream (operand B) is a stream of residual values.

In FIG. 105, there is illustrated two input streams 780, 781 and a corresponding output stream 782 for utilising the process of residual merging.

In FIG. 106 there is illustrated the instruction word encoding for hierarchial image format instructions with the following table providing the relevant details of the minor op code fields.

TABLE 25

Instruction Word - Minor Opcode Fields

| Field | Description |
| --- | --- |
| R | 0 = interpolation |
|  | 1 = residual merging |
| V | 0 = horizontal interpolation |
|  | 1 = vertical interpolation |
| F | 0 = interpolate by a factor of 2 |
|  | 1 = interpolate by a factor of 4 |
| C | 0 = do not clamp resultant values |
|  | 1 = clamp resultant values: underflow to 0x00, overflow to 0xFF |

3.17.13 Memory Copy Instructions

These instructions are divided into two specifically disjointed groups.

a. General Purpose Data Movement Instructions

These instructions utilize the normal data flow path through the co-processor 224, comprising the input interface module, input interface switch 252, pixel organizer 246, JPEG coder 241, result organizer 249 and then the output interface module. In this case, the JPEG coder module sends data straight through without applying any operation.

Other instructions include data manipulation operations including:

packing and unpacking sub-byte values (such as bits, two bit values and four bit values) to a byte packing and unpacking bytes within a word aligning meshing and unmeshing byte lane stvapping and duplicating memory clearing replicating values The data manipulation operation is carried out by a combination of the pixel organizer (on input) and the result organizer (on output). In many cases, these instructions can be combined with other instructions.

b. Local DMA Instructions

No data manipulation takes place. As seen in FIG. 2 data transfer occurs (in either direction) between the Local Memory 236 and the Peripheral Interface 237. These instructions are the only ones for which execution can be overlapped with some other instruction. A maximum of one of these instructions can execute simultaneously with a "non overlapped" instruction.

In memory copy instructions, operand A represents the data to be copied and the result operand represents the target address of the memory copy instructions. For general purpose memory copy instructions, the particular data manipulation operation is specified by the operand B for input and operand C for output operand words.

3.17.14 Flow Control Instructions

The flow control instructions are a family of instructions that provide control over various aspect of the instruction execution model as described with reference to FIG. 9. The flow control instructions include both conditional and unconditional jumps enabling the movement from one virtual address to another when executing a stream of instructions. A conditional jump instruction is determined by taking a co-processor or register, masking off any relevant fields and comparing it to given value. This provides for reasonable generality of instructions. Further, flow control instructions include wait instructions which are typically used to synchronize between overlapped and non-overlapped instructions or as part of micro-programming.

In FIG. 107, there is illustrated instruction when encoding for flow control instructions with the minor opcodes being interpreted as follows:

TABLE 26

Instruction Word - Minor Opcode Fields

| Field | Description |
|---|---|
| type | 00 = jump |
| | 01 = wait |
| C | 0 = unconditional jump |
| | 1 = condition jump |
| S | 0 = use Operand B as Condition Register and Operand C as Condition mask |
| | 1 = any interrupt condition set |
| N | 0 = jump if condition is true |
| | 1 = dont jump if condition is true |
| O | 0 = wait on non-overlapped instruction to finish |
| | 1 = wait on overlapped instruction to finish |

In respect of Jump Instructions, the operand A word specified the target address of the jump instruction. If the S bit of the Minor Opcode is set to 0, then operand B specified a co-processor register to use as the source of the condition. The value of the operand B descriptor specifies the address of the register, and the value of the operand B word defines a value to compare the contents of the register against. The operand C word specifies a bitwize mask to apply to the result. That is, the Jump Instruction's condition is true of the bitwize operation:

(((register_value xor Operand B) and Operand C)=0x00000000)

Further instructions are also provided for accessing registers for providing full control at the micro programmed level.

3.18 Modules of the Accelerator Card

Turning again to FIG. 2, there will now be provided further separate description of the various modules.

3.18.1 Pixel Organizer

The pixel organizer 246 addresses and buffers data streams from the input interface switch 252. The input data is stored in the pixel organizer's internal memory or buffered to the MUV buffer 250. Any necessary data manipulation is performed upon the input stream before it is delivered to the main data path 242 or JPEG coder 241 as required. The operating modes of the pixel organizer are configurable by the usual CBus interface. The pixel organizer 246 operates in one of five modes, as specified by a PO_CFG control register. These modes include:

(a) Idle Mode—where the pixel organizer 246 is not performing any operations.

(b) Sequential Mode—when input data is stored in an internal FIFO and the pixel organizer 246 sends out requests for data to the input interface switch 252, generating 32 bit addresses for this data.

(c) Color Space Conversion Mode—when the pixel organizer buffers pixels for color space conversion. In addition. requests are made for interval and fractional values stored in the MUV buffer 250.

(d) JPEG Compression Mode—when the pixel organizer 246 utilizes the MUV buffer to buffer image data in the form of MCU's.

(e) Convolution and Image Transformation Mode—when the pixel organizer 246 stores matrix coefficients in the MUV buffer 250 and passes them, as necessary, to the main data path 242.

The MUV buffer 250 is therefore utilized by the pixel organizer 246 for both main data path 242 and JPEG coder 241 operations. During color space conversion, the MUV RAM 250 stores the interval and fractional tables and they are accessed as 36 bits of data (four color channels)×(4 bit interval values and 8 bit fractional values). For image transformation and convolution, the MUV RAM 250 stores matrix co-efficients and related configuration data. The co-efficient matrix is limited to 16 rows×16 columns with each co-efficient being at a maximum 20 bits wide. Only one co-efficient per clock cycle is required from the MUV RAM 250. In addition to co-efficient data, control information such as binary point, source start coordinates and sub-sample deltas must be passed to the main data path 242. This control information is fetched by the pixel organizer 246 before any of the matrix coefficients are fetched.

During JPEG compression, the MUV buffer 250 is utilized by the pixel organizer 246 to double buffer MCU's. Preferably, the technique of double buffering is employed to increase the performance of JPEG compression. One half of the MUV RAM 250 is written to using data from the input interface switch 252 while the other half is read by the pixel organizer to obtain data to send to the JPEG coder 241. The pixel organizer 246 is also responsible for performing horizontal sub-sampling of color components where required and to pad MCU's where an input image does not have a size equal to an exact integral number of MCUs.

The pixel organizer 246 is also responsible for formatting input data including byte lane swapping, normalization, byte substitution, byte packing and unpacking and replication operations as hereinbefore discussed with reference to FIG. 32 of the accompanying drawings. The operations are carried out as required by setting the pixel organizers registers.

Turning now to FIG. 108, there is shown the pixel organizer 246 in more detail. The pixel organizer 246 operates under the control of its own set of registers contained within a CBus interface controller 801 which is interconnected to the instruction controller 235 via the global CBus. The pixel organizer 246 includes an operand fetch unit 802 responsible for generating requests from the input interface switch 252 for operand data needed by the pixel organizer 246. The start address for operand data is given by the PO_SAID register which must be set immediately before execution. The PO_SAID register may also hold immediate data, as specified by the L bit in the PO_DMR register. The current address pointer in stored in the PO_CDP register and is incremented by the burst length of any input interface switch request. When data is fetched into the MUV RAM 250, the current offset for data is concatenated with a base address for the MUV RAM 250 as given by the PL_MUV register.

A FIFO 803 is utilized to buffer sequential input data fetched by the operand fetch unit 802. The data manipulation unit 804 is responsible for implementing for implementing the various manipulations as described with reference to FIG. 32. The output of the data manipulation unit is passed to the MUV address generator 805 which is responsible for passing data to the MUV RAM 250, main data path 242 or JPEG coder 241 in accordance with configuration registers. A pixel organizer control unit 806 is a state machine that generates the required control signals for all the sub-modules in the pixel organizer 246. Included in these signals are those for controlling communication on the various Bus interfaces. The pixel organizer control unit outputs diagnostic information as required to the miscellaneous module 239 according to its status register settings.

Turning now to FIG. 109, there is illustrated the operand fetch unit 802 of FIG. 108 in more detail. The operand fetch unit 802 includes an Instruction Bus address generator (IAG) 810 which contains a state machine for generating requests to fetch operand data. These requests are sent to a request arbiter 811 which arbitrates between requests from the address generator 810 and those from the MUV address generator 805 (FIG. 108) and sends the winning requests to the input (MAG) interface switch 252. The request arbiter 811 contains a state machine to handle requests. It monitors the state of the FIFO via FIFO count unit 814 to decide when it should dispatch the next request. A byte enable generator 812 takes information on the IAG 810 and generates byte enable patterns 816 specifying the valid bytes within each operand data word returned by the input interface switch 252. The byte enabled pattern is stored along with the associated operand data in the FIFO. The request arbiter 811 handles MAG requests before IAG requests when both requests arrive at the same time.

Figure 110:

Returning to FIG. 108, the MUV address generator 805 operates in a number of different modes. A first of these modes is the JPEG (compression) mode. In this mode, input data for JPEG compression is supplied by the data manipulation units 804 with the MUV buffer 250 being utilized as a double buffer. The MUV RAM 250 address generator 805 is responsible for generating the right addresses to the MUV buffer to store incoming data processed by the data manipulation unit 804. The MAG 805 is also responsible for generating read addresses to retrieve color component data from the stored pixels to form 8×8 blocks for JPEG compression. The MAG 805 is also responsible for dealing with the situation when a MCU lies partially on the image. In FIG. 110, there is illustrated an example of a padding operation carried out by the MAG 805.

Figure 111:
Figure 112:
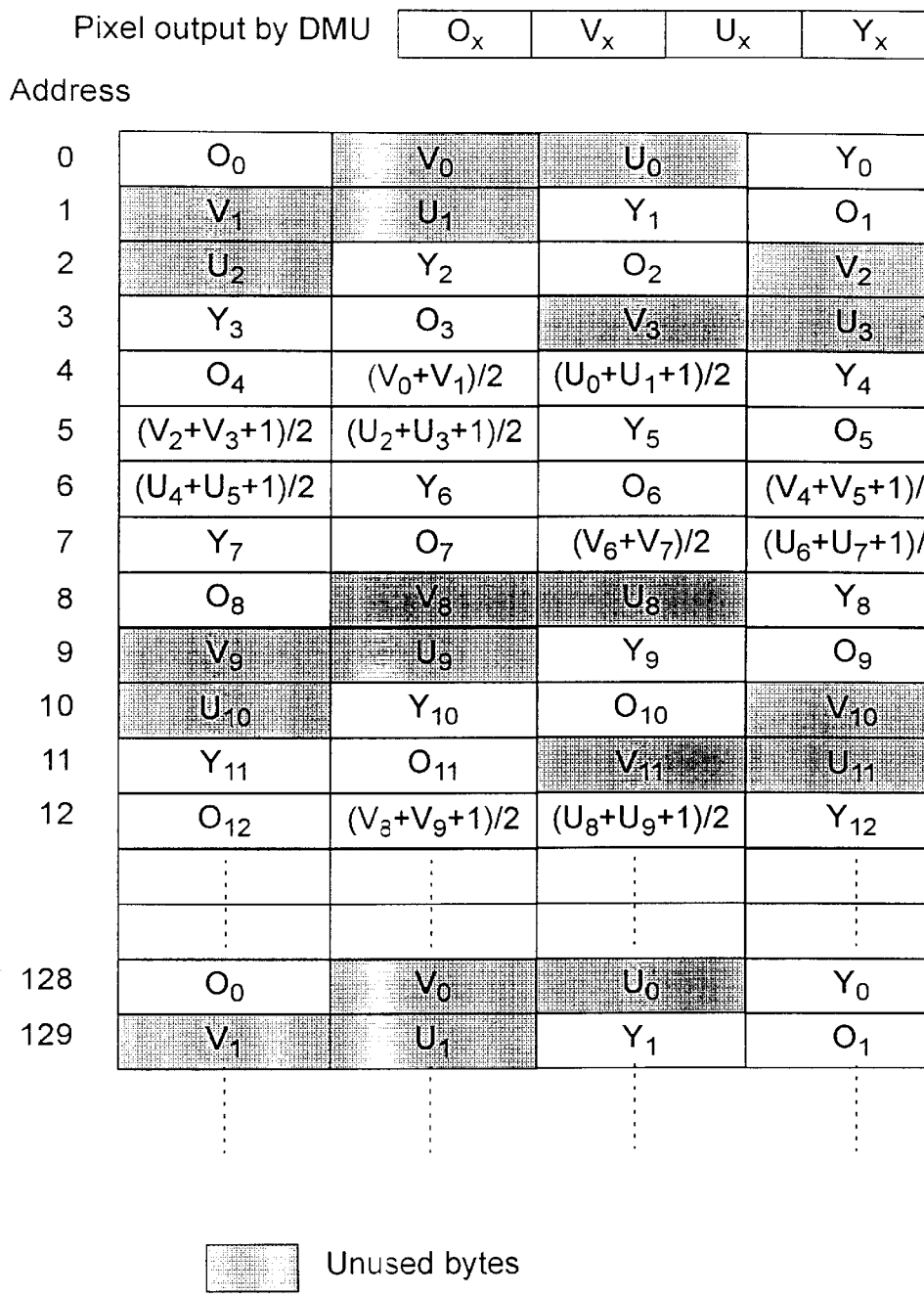
Figure 113:
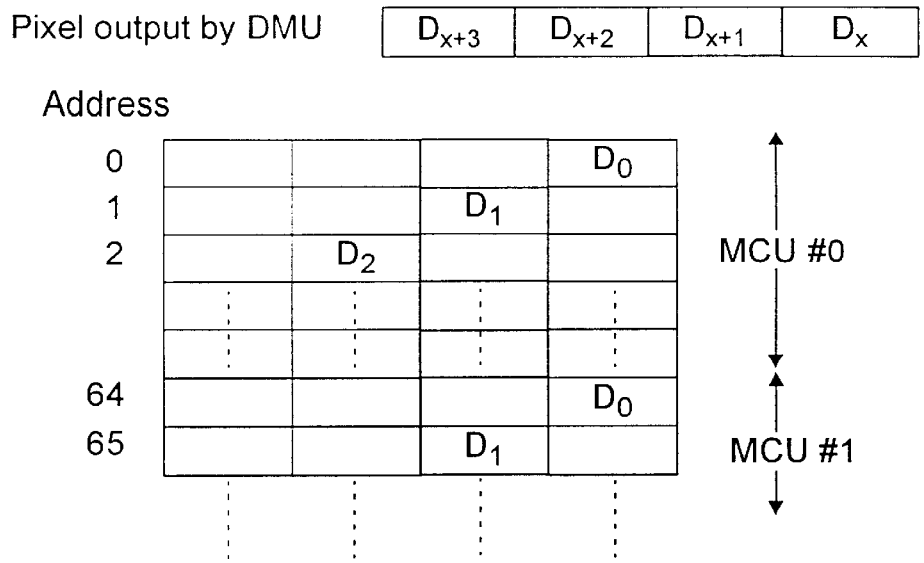

For normal pixel data, the MAG 805 stores the four color components at the same address within the IUV RAM 250 in four 8 bit rams. To facilitate retrieval of data from the same color channel simultaneously, the MCU data is barrel shifted to the left before it is stored in the MUV RAM 250. The number of bytes the data is shifted to the left is determined by the lowest two bits of the write address. For example, in FIG. 111 there is illustrated the data organization within the MUV RAM 250 for 32 bit pixel data when no sub-sa-mpling is needed. Sub-sampling of input data maybe selected for three or four channel interleaved JPEG mode. In multichannel JPEG compression mode with subsampling operating, the MAG 805 (FIG. 108) performs the sub-sampling before the 32 bit data is stored in the MUV RAM 250 for optimal JPEG coder performance. For the first four incoming pixels, only the first and fourth channels stored in the MUV RAM 250 contains useful data. The data in the second and third channel is sub-sampled and stored in a register inside the pixel organizer 246. For the next four incoming pixels, the second and third channel are filled with sub-sampled data. In FIG. 112, there is illustrated an example of MCU data organization for multi-channel sub-sampling mode. The MAG treats all single channel unpacked data exactly the same as multi-channel pixel data. An example of single channel packed data as read from the MUV RAM is illustrated in FIG. 113.

Figure 114:
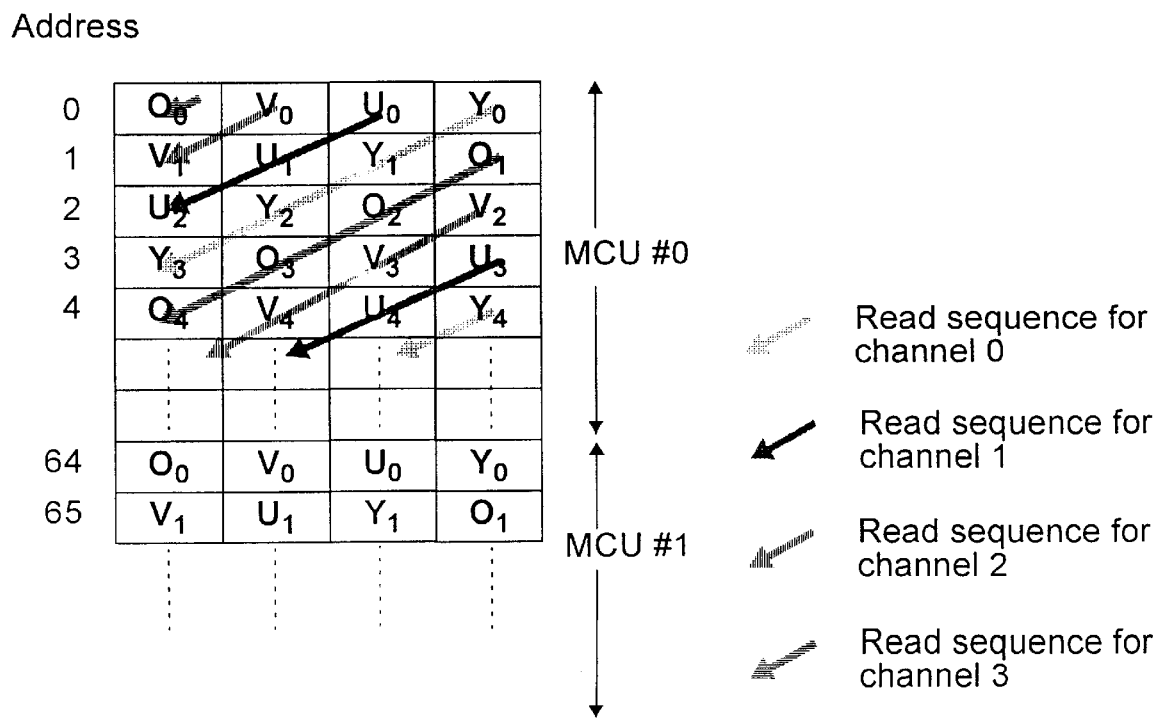

While the writing process is storing an incoming MCU into the MUV RAM, the reading process is reading 8×8 blocks out of the MUV RAM. In general, the blocks are generated by the MAG 805 by reading the data for each channel sequentially, four coefficients at the time. For pixel data and unpacked input data, the stored data is organized as illustrated in FIG. 111. Therefore, to compose one 8×8 block of non-sampled pixel data, the reading process reads data diagonally from the MUV RAM. An example of this process is illustrated in FIG. 114, which shows the reading sequence for four channel data, the form of storage in the MUV RAM 250 assisting to read multiple v alues for the same channel simultaneously.

When operating in color conversion mode, the MUV RAM 250 is used as a cache to hold the interval and fractional values and the MAG 805 operates as a cache controller. The MUV RAM 250 caches values for three color channels with each color channel containing 256 pairs of four bit interval and fractional values. For each pixel output via the DMU, the MAG 805 is utilized to get the values from the MUV RAM 250. Where the value is not available, the MAG 805 generates a memory read request to fetch the missing interval and fractional values. Instead of fetching one entry in each request, multiple entries are fetched simultaneously for better utilization of bandwidth.

For image transformation and convolution, the MUV RAM 250 stores the matrix coefficients for the MDP. The MAG cycles through all the matrix co-efficient stored in the MUV RAM 250. At the start of an image transformation and convolution instruction, the MAG 805 generates a request to the operand fetch unit to fetch the kernal description "header" (FIG. 94) and the first matrix co-efficient in a burst request.

Turning now to FIG. 115, there is illustrated the MUV address generator (MAG) 805 of FIG. 108 in more detail. The MAG 805 includes an IBus request module 820 which multiplexers IBus requests generated by an image transformation controller (ITX) 821 and a color space conversion (CSC) controller 822. The requests are sent to the operand fetch unit which services the request. The pixel organizer 246 is only operated either in image transformation or color space conversion mode. Hence, there is no arbitration required between the two controllers 821, 822. The IBus request module 820 derives the information for generating a request to the operand fetch unit including the burst address and burst length from the relevant pixel organizer registers.

A JPEG controller 824 is utilized when operating in JPEG mode and comprizes two state machines being a JPEG write controller and a JPEG read controller. The two controllers operate simultaneously and synchronize with each other through the use of internal registers.

In a JPEG compression operation, the DMU outputs the MCU data which is stored into the MUV RAM. The JPEG Write Controller is responsible for horizontal padding and control of pixel subsampling, while the JPEG Read Controller is responsible for vertical padding. Horizontal padding is achieved by stalling the DMU output, and vertical padding is achieved by reading the previously read 8×8 block line.

The JPEG Write Controller keeps track of the position of the current MCU and DMU output pixel on the source image, and uses this information to decide when the DMU has to be stalled for horizontal padding. When a MCU has been written into the MUV RAM 250, the JPEG Write Controller sets/resets a set of internal registers which indicates the MCU is on the right edge of the image, or is at the bottom edge of the image. The JPEG Read Controller then uses the content of these registers to decide if it is required to perform vertical padding, and if it has read the last MCU on the image.

The JPEG Write Controller keeps track of DMU output data, and stores the DMU output data into the MUV RAM 250.

The controller uses a set of registers to record the current position of the input pixel. This information is used to perform horizontally padding by stalling the DMU output.

When a complete MCU has been written into the MUV RAM 250, the controller writes the MCU information into JPEG-RW-IPC registers which is later used by the JPEG Read Controller.

The controller enters the SLEEP state after the last MCU has been written into the MUV RAM 250. The controller stays in this state until the current instruction completes.

The JPEG Read Controller read the 8×8 blocks from the MCUs stored in the MUV RAM 250. For multi-channel pixels, the controller reads the MCU several times, each time extracting a different byte from each pixel stored in the MUV RAM.

The controller detects if it needs to perform vertical padding using the information provided by the JPEG-RW-IPC. Vertical padding is achieved by re-reading the last 8-bytes read from the MUV RAM 250.

The Image Transformation Controller 821 is responsible for reading the kernel discriptor from the IBus and passes the kernel header to the MDP 242, and cycles through the matrix coefficients as many times as specified in the po.len register. All data output by the PO 246 in an image transformation and Convolution instruction are fetched directly from the IBus and not passed through the DMU.

The top eight bits of the first matrix co-efficient fetched immediately after the kernel header contains the number of remaining matrix coefficients to be fetched.

The kernel header is passed to the MDP directly without modifications, whilst the matrix coefficients are sign extended before they are passed to the MDP.

The pixel sub-sampler 825 comprises two identical channel sub-samplers, each operating on a byte from the input word. When the relevant configuration register is not asserted, the pixel sub-sampler copies its input to its output. When the configuration register is asserted, the sub-sampler sub-samples the input data either by taking the average or by decimation.

An MUV multiplexer module 826 selects the MUV read and write signals from the currently active controller. Internal multiplexers are used to select the read addresses output via the various controllers that utilize the MUV RAM 250. An MUV RAM write address is held in an 8 bit register in an MUV multiplexer module. The controllers utilising the MUV RAM 250, load the write address register in addition to providing control for determining a next MUV RAM address.

A MUV valid access module 827 is utilized by the color space conversion controller to determine if the interval and fractional values for a current pixel output by the data manipulation unit is axvailable in the MUV RAM 250. When one or more color channels are missing, the MUV valid access module 827 passes the relevant address to the IBus request module 820 for loading in burst mode, interval and fractional values. Upon servicing a cache miss, the MUV valid access module 827 sets internal validity bits which map the set of interval and fractional values fetched so far.

A replicate module 829 replicates the incoming data, the number of times as specified by an internal pixel register. The input stream is stalled while the replication module is replicating the current input word. A PBus interface module 630 is utilized to re-time the output signals of the pixel organizer 246 to the main data path 242 and JPEG coder 241 and vice versa. Finally, a MAG controller 831 generates signals for initiating and shutting down the various sub-modules. It also performs multiplexing of incoming PBus signals from the main data path 242 and JPEG coder 241.

3.18.2 MUV Buffer

Returning to FIG. 2. it will be evident from the foregoing discussion that the pixel organizer 246 interacts with the MUV buffer 250.

The reconfigurable MUV buffer 250 is able to support a number of operating modes including the single lookup table mode (mode0), multiple lookup table mode (mode1), and JPEG mode (mode2). A different type of data object is stored in the buffer in each mode. For instance, the data objects that are stored in the buffer can be data words, values of a multiplicity of lookup tables, single channel data and multiple channel pixel data. In general, the data objects can have different sizes. Furthermore, the data objects stored in the reconfigurable MUV buffer 250 can be accessed in substantially different ways which is dependent on the operating mode of the buffer.

To facilitate the different methods needed to store and retrieve different types of data objects, the data objects are often encoded before they are stored. The coding scheme applied to a data object is determined by the size of the data object, the format that the data objects are to be presented, how the data objects are retrieved from the buffer, and also the organization of the memory modules that comprize the buffer.

FIG. 116 is a block diagram of the components used to implement the reconfigurable MUV buffer 250. The reconfigurable MUV buffer 250 comprizes an encoder 1290, a storage device 1293, a decoder 1291, and a read address and rotate signal generator 1292. When a data object arrives from an input data stream 1295, the data object may be encoded into an internal data format and placed on the encoded input data stream 1296 by the encoder 1290. The encoded data object is stored in the storage device 1293.

When decoding previously stored data objects, an encoded data object is read out of the storage device via encoded output data stream 1297. The encoded data object in the encoded output data stream 1297 is decoded by a decoder 1291. The decoded data object is then presented at the output data stream 1298.

The write addresses 1305 to the storage device 1293 are provided by the MAG 805 (FIG. 108). The read addresses 1299, 1300 and 1301 are also provided by the MAG 805 (FIG. 108), and translated and multiplexed to the storage device 1293 by the Read Address and Rotate Signal Generator 1292, which also generates input and output rotate control signals 1303 and 1304 to the encoder and decoder respectively. The write enable signals 1306 and 1307 are provided by an external source. An operating mode signal 1302, which is provided by means of the controller 801(FIG. 108), is connected to the encoder 1290, the decoder 1291, the Read Address and Rotate Signal Generator 1292, and the storage device 1293. An increment signal 1308 increments internal counter(s) in the read address and rotate signal generator and may be utilized in JPEG mode (mode2).

Preferably, when the reconfigurable MUV buffer 250 is operating in the single lookup table mode (mode0), the buffer behaves substantially like a single memory module. Data objects may be stored into and retrieved from the buffer in substantially the same way used to access memory modules.

When the reconfigurable MUV buffer 250 is operating in the multiple lookup table mode (mode 1), the buffer 250 is divided into a plurality of tables with up to three lookup tables may be stored in the storage device 1293. The lookup tables may be accessed separately and simultaneously. For instance, in one example, interval and fraction values are stored in the storage device 1293 in the multiple lookup table mode, and the tables are indexed utilizing the lower three bytes of the input data stream 1295. Each of the three bytes are issued to access a separate lookup table stored in the storage device 1293.

When an image undergoes JPEG compression, the image is converted into an encoded data stream. The pixels are retrieved in the form of MCUs from the original image. The MCUs are read from left to right, and top to bottom from the image. Each MCU is decomposed into a number of single component 8×8 blocks. The number of 8×8 blocks that can be extracted from a MCU depends on several factors including: the number of color components in the source pixels, and for a multiple channel JPEG mode, whether subsampling is needed. The 8×8 blocks are then subjected to forward DCT (FDCT), quantization, and entropy encoding. In the case of JPEG decompression, the encoded data are read sequentially from a data stream. The data stream undergoes entropy decoding, dequantization and inverse DCT (IDCT). The output of the IDCT operation are 8×8 blocks. A number of single component 8×8 blocks are combined to reconstruct a MCU. As with JPEG compression, the number of single component 8×8 blocks are dependent on the same factors mentioned above. The reconfigurable MUV buffer 250 may be used in the process to decompose MCUs into a multiplicity of single component 8×8 blocks, to reconstruct MCUs from a multiplicity of single component 8×8 blocks.

When the reconfigurable MUV buffer 250 is operating in JPEG mode (mode2), the input data stream 1295 to the buffer 250 comprizes pixels for a JPEG compression operation, or single component data in a JPEG decompression operation. The output data stream 1298 of the buffer 250 comprizes single channel data blocks for a JPEG compression operation, or pixel data in a JPEG decompression operation. In this example, for a JPEG compression operation, an input pixel may comprize up to four channels denoted Y, U, V and O. When the required number of pixels have been accumulated in the buffer to form a complete pixel block, the extraction of single component data blocks can commence. Each single component data block comprizes data from the like channel of each pixel stored in the buffer. Thus in this example, up to four single component data blocks may be extracted from one pixel data block. In this embodiment, when the reconfigurable MUV buffer 250 is operating in the JPEG mode (mode2) for JPEG compression, a multiplicity of Minimum Coded Units (MCUs) each containing 64 single or 64 multiple channel pixels may be stored in the buffer, and a multiplicity of 64-byte long single channel component data blocks are extracted from each MCU stored in the buffer. In this embodiment, for the buffer 1289 operating in the JPEG mode (mode2) for a JPEG decompression operations, the output data stream contains output pixels that have up to four components Y, U, V and O. When the required number of complete single component data blocks have been written into the buffer, the extraction of pixel data may commence. A byte from up to four single component block corresponding to different color components are retrieved to form an output pixel.

FIG. 117 illustrates the encoder 1290 of FIG. 116 in more detail. For the pixel block decomposition mode only, each input data object is encoded using a byte-wize rotation before it is stored into the storage device 1293 (FIG. 129). The amount of rotation is specified by the input rotate control signal 1303. As the pixel data has a maximum of four bytes in this example, a 32-bit 4-to-1 multiplexer 1320 and output 1325 is used to select one of the four possible rotated versions of the input pixel. For example, if the four bytes in a pixel are labelled (3,2,1,0), the four possible rotated versions of this pixel are (3,2,1,0), (0,3,2,1), (1,0,3,2) and (2,1,0,3). The four encoded bytes are output 1296 for storage in the storage device.

When the buffer is placed in an operating mode other than the JPEG mode (mode2), for example, single lookup table mode (mode0) and multiple lookup table mode (mode1), byte-wize rotation may not be necessary and may not be performed on the input data objects. The input data object is prevented from being rotated in the latter cases by overriding the input rotate control signal with a no-operation value. This value 1323 can be zero. A 2-to-1 multiplexer 1321 produces control signals 1326 by selecting between the input rotate control signal 1303 and the no-operation value 1323. The current operating mode 1302 is compared with the value assigned to the pixel block decomposition mode to produce the multiplexer select signal 1322. The 4-to-1 multiplexer 1320, which is controlled by signal 1326 selects one of the four rotated version of the input data object on the input data stream 1325, and produces an encoded input data object on the encoded input data stream 1326.

FIG. 118 illustrates a schematic of a combinatorial circuit which implements the decoder 1291 for the decoding of the encoded output data stream 1297. The decoder 1321 operates in a substantially similar manner to the encoder. The decoder only operates on the data when the data buffer is in the JPEG mode (mode2). The lower 32-bit of an encoded output data object in the encoded output data stream 1297 is passed to the decoder. The data is decoded using a byte-wize rotation with an opposite sense of rotation to the rotation performed by the encoder 1290. A 32-bit 4-to-1 multiplexer 1330 is used to select one of the four possible rotated version of the encoded data. For example, if the four bytes in an input pixel are labelled (3,2,1,0), the four possible rotated version of this pixel are (3,2,1,0), (2,1,0,3), (1,0,3,2) and (0,3,2,1). The output rotate control signal 1304 is utilized only when the buffer is in a pixel block decomposition mode, and when overridden by a no-operation value in other operating modes. The no-operation value utilized 1333 is zero. A 2-to-1 multiplexer 1331 produces signal 1334 by selecting selects between the output rotate control signal 1304 and the no-operation value 1333. The current operating mode 1302 is compared with the value assigned to the pixel block decomposition mode to produce the multiplexer select signal 1332. The 4-to-1 multiplexer 1330, which is controlled by signal 1334, selects one of the four rotated version of the encoded output data object on the encoded output data stream 1297, and produces an output data object on the output data stream 1298.

Returning to FIG. 116, the method of internal read address generation used by the circuit is selected by the operating mode 1302 of the reconfigurable MUV buffer 250. For the single lookup table mode (mode0) and multiple lookup table mode (mode1), the read addresses are provided by the MAG 805 (FIG. 108) in the form of external read addresses 1299. 1300, and 1301. For the single lookup table mode (mode0), the memory modules 1380, 1381. 1382, 1383, 1384 and 1385 (FIG. 121) of the storage device 1293 operate together. The read address and the write address supplied to the memory modules 1380 to 1385 (FIG. 121) are substantially the same. Hence the storage device 1293 only needs the external circuits to supply one read address and one write address, and uses internal logic to multiplex these addresses to the memory modules 1380 to 1385 (FIG. 121). For mode0, the read address is supplied by the external read address 1299 (FIG. 116) and is multiplexed to the internal read address 1348 (FIG. 121) without substantial changes. The external read addresses 1300 and 1301 (FIG. 116), and the internal read addresses 1349, 1350 and 1351 (FIG. 121), are not used in mode0. The write address is supplied by the external write address 1305 (FIG. 116), and is connected to the write address of each memory module 1380 to 1385 (FIG. 121) without substantial modification.

In this example, a design that provides three lookup tables in the multiple lookup table mode (mode 1) is presented. The encoded input data is written simultaneously into all memory modules 1380 to 1385 (FIG. 121), while the three tables are accessed independently, and thus require one index to each of the three tables. Three indices, that is, read addresses to the memory modules 1380 to 1385 (FIG. 121), are supplied to the storage device 1293. These read addresses are multiplexed to the appropriate memory modules 1380 to 1385 using internal logic. In substantially the same manner as in the single lookup table mode, the write address supplied externally is connected to the write address of each of the memory modules 1380 to 1385 without substantial modifications. Hence, for the multiple lookup table mode (mode 1), the external read addresses 1299, 1300 and 1311 are multiplexed to internal read addresses 1348, 1349 and 1350 respectively. The internal read address 1351 is not used in mode 1. The method of generating the internal read addresses need in the JPEG mode (mode 2) is different to the method described above.

FIG. 119 illustrates a schematic of a combinatorial circuit which implements the read address and rotate control signals generation circuit 1292 (FIG. 116), for the reconfigurable data buffer operating in the JPEG mode (mode 2) for JPEG compression. In the JPEG mode (mode 2), the generator 1292 uses the output of a component block counter 1340 and the output of a data byte counter 1341 to compute the internal read addresses to the memory modules comprising the storage device 1293. The component block counter 1340 gives the number of component blocks extracted from a pixel data block, which is stored in the storage device. The number of like components extracted from the pixel data block is given by multiplying the output of the data byte counter 1341 by four. In this embodiment, an internal read address 1348, 1349, 1350 or 1351 for the pixel data block decomposition mode is computed as follows. The output of the component block counter is used to generate an offset value 1343, 1344, 1345, 1346 or 1347, and the output of the data byte counter 1341 is used to generate a base read address 1354. The offset value 1343 is added 1358 to the base read address 1354 and the sum is an internal read address 1348 (or 1349, 1350 or 1351). The offset values for the memory modules are in general different for simultaneous read operations performed on multiple memory modules, but the offset value to each memory module is in general substantially the same during the extraction of one component data block. The base addresses 1354 used to compute the four internal read addresses in the pixel data block decomposition mode are substantially the same. The increment signal 1308 is used as the component byte counter increment signal. The counter is incremented after every successful read operation has been performed. A component block counter increment signal 1356 is used to increment the component block counter 1340, after a complete single component data block has been retrieved from the buffer.

The output rotate control signal 1304 (FIG. 116) is derived from the output of the component block counter, and the output of the data byte counter, in substantially similar manner to the generation of an internal read address. The output of the component block counter is used to compute a rotation offset 1347. The output rotate control signal 1304 is given by the lowest two bits of the sum of the base read address 1354 and the rotation offset 1355. The input rotate control signal 1303 is simply given by the lowest two bytes of the external write addresses 1305 in this example of the address and rotate control signals generator.

FIG. 120 shows another example of the address generator 1292 for reassembling multiple channel pixel data from single component data stored in the reconfigurable MUV buffer 250. In this case, the buffer is operating in the JPEG (mode2) for JPEG decompression operation. In this case, single component data blocks are stored in the buffer, and pixel data blocks are retrieved from the buffer. In this example, the write address to the memory modules are provided by the external write address 1305 without substantial changes. The single component blocks are stored in contiguous memory locations. The input rotate control signal 1303 in this example is simply set to the lowest two bits of the write address. A pixel counter 1360 is used to keep track of the number of pixels extracted from the single component blocks stored in the buffer. The output of the pixel counter is used to generate the read addresses 1348, 1349, 1350 and 1351, and the output rotate control signal 1304. The read addresses are in general different for each memory module that comprize the storage device 1293. In this example, a read address comprizes two parts, a single component block index 1362, 1363, 1364 or 1365, and a byte index 1361. An offset is added to bit 3 and 4 of the output of the pixel counter to calculate the single component block index for a particular block. The offsets 1366, 1367, 1368 and 1369 are in general different for each read address. Bit 2 to bit 0 of the output of the pixel counter are used as the byte index 1361 of a read address. A read address is the result of the concatenation of a single component block index 1362, 1363, 1364 or 1365 and a byte index 1361, as illustrated in FIG. 120. In this example, the output rotate control signal 1304 is generated using bit 4 and bit 3 of the output of the pixel counter without substantial change. The increment signal 1308 is used as the pixel counter increment signal to increment the pixel counter 1360. The pixel counter 1360 is incremented after a pixel has been successfully retrieved from the buffer.

FIG. 121 illustrates an example of a structure of the storage device 1293. The storage device 1293 can comprize three 4-bit wide memory modules 1383, 1384 and 1385, and three 8-bit wide memory modules 1380, 1381 and 1382. The memory modules can be combined together to store 36-bit words in the single lookup table mode (mode0), 3×12-bit words in the multiple lookup table mode (mode1), and 32-bit pixels or 4×8-bit single component data in JPEG mode (mode2). Typically each memory module is associated with a different part of the encoded input and output data streams (1296 and 1297). For example, memory module 1380 has its data input port connected to bit 0 to bit 7 of the encoded input data stream 1296, and its data output port connected to bit 0 to bit 7 of the encoded output data stream 1297. In this example, the write addresses to all the memory modules are connected together, and share substantially the same value. In contrast, the read addresses 1386, 1387, 1388, 1389, 1390 and 1391 to the memory modules of the example illustrated in FIG. 121 are supplied by the read address generator 1292, and are in general different. In the example, a common write enable signal is used to provide the write enable signals to all three 8-bit memory modules, and a second common write enable signal is used to provide the write enable signals to all three 4-bit memory modules.

FIG. 122 illustrates a schematic of a combinatorial circuit used for generating read addresses 1386, 1387, 1388, 1389, 1390 and 1391 for accessing to the memory modules contained in a storage device 1293. Each encoded input data object is broken up into parts, and each part is stored into a separate memory module in the storage device. Hence, typically the write addresses to all memory modules for all operating modes are substantially the same and thus substantially no logic is required to compute the write address to the memory modules. The read addresses in this example, on the other hand, are typically different for different operations, and are also different to each memory module within each operating mode. All bytes in the output data stream 1298 of the reconfigurable MUV buffer 250 must contain single component data extracted from the pixel data stored in the buffer in the JPEG mode (mode2) for JPEG compression, or pixel data extracted from the single component data blocks stored in the buffer in the JPEG mode for JPEG decomposition. The requirements on the output data stream are achieved by providing four read addresses 1348, 1349, 1350 and 1351 to the buffer. In the multiple lookup table mode (mode1), up to three lookup tables are stored in the buffer, and thus only up to three read addresses 1348, 1349 and 1350 are needed to index the three lookup tables. The read addresses to all memory modules are substantially the same in the single lookup table mode (mode0), and only read address 248 is used in this mode. The example controller circuit shown in FIG. 122 uses the operating mode signals to the buffer, and up to four read addresses, to compute the read address 1386–1391 to each of the six memory modules comprising the storage device 1293. The read address generator 1292 takes, as its inputs, the external read addresses 1299, which comprises external address buses 1348, 1349, 1350 and 1351, and generates the internal read addresses 1386, 1387, 1388, 1389, 1390 and 1391 to the memory modules that comprize the storage device 1293. No manipulation on the external write addresses 1305 is required in the operation of this example.

FIG. 123 illustrates a representation of an example of how 20-bit matrix coefficients may be stored in the buffer 250 when the buffer 250 is operating in single lookup table mode (mode0). In this example, typically no encoding is applied on the data objects stored in the cache when the data objects are written into the reconfigurable MUV buffer. The matrix coefficients are stored in the 8-bit memory modules 1380, 1381 and 1382. Bit 7 to bit 0 of the matrix coefficient are stored in memory module 1380, bit 15 to bit 8 of the matrix coefficient are stored in memory module 1381, and bit 19 to bit 16 of the matrix coefficient are stored in the lower 4 bits of memory module 1382. The data objects stored in the buffer may be retrieved as many times as required for the rest of the instruction. The write and read addresses to all memory modules involved in the single lookup table mode are substantially the same.

FIG. 124 illustrates a representation of how the table entries are stored in the buffer in the multiple lookup table mode (mode1). In this example, up to three lookup tables may be stored in the buffer, and each lookup table entry comprizes a 4-bit interval value and an 8-bit fraction value. Typically the interval values are stored in the 4-bit memory modules, and the fraction values are stored in the 8-bit memory modules. The three lookup tables 1410, 1411 and 1412 are stored in the memory banks 1380 and 1383, 1381 and 1384, 1382 and 1385 in the example. The separate write enable control signals 1306 and 1307 (FIG. 121) allow the interval values to be written into the storage device 1293 without affecting the fraction values already stored in the storage device. In substantially the same manner, the fraction values may be written into storage device without affecting the interval values already stored in the storage device.

FIG. 125 illustrates a representation of how pixel data is stored in the reconfigurable MUV buffer 250 when the JPEG mode (mode2) for decomposing pixel data blocks into single component data blocks. The storage device 1293 is organized as four 8-bit memory banks, which comprises the memory modules 1380, 1381, 1382, 1383 and 1384, with 1383 and 1384 used together to operate substantially in the same manner as an 8-bit memory module. Memory module 1385 is not used in the JPEG mode (mode2). A 32-bit encoded pixel is broken up into four bytes, and each is stored into a different 8-bit memory module.

FIG. 126 illustrates a representation of how the single component data blocks are stored in the storage device 1293 in single component mode. The storage device 1293 is organized as four 8-bit memory banks, which comprizes the memory modules 1380, 1381, 1382, 1383 and 1384, with 1383 and 1384 used together to operate substantially in the same manner as an 8-bit memory module. A single component block in this example comprizes 64 bytes. A different amount of byte rotation can be applied to each single component block when it is written into the buffer. A 32-bit encoded pixel data is retrieved by reading from the different single component data block stored in the buffer.

For further details on the organization of the data within the MUV buffer 250 reference is made herein to the section entitled Pixel Organizer.

This preferred embodiment has shown that a reconfigurable data buffer may be used to handle data involved in different instructions. A reconfigurable data buffer that provides three operating modes has been disclosed. Different address generation techniques may be needed in each operating mode of the buffer. The single look-up table mode (mode0) may be used to store matrix coefficients in the buffer for an image transformation operation. The multiple look-up table mode (mode1) may be used to store a multiplicity of interval and fraction lookup tables in the buffer in a multiple channel color space conversion (CSC) operation. The JPEG mode (mode2) may be used either to decompose MCU data into single component 8×8 blocks, or to reconstruct MCU data from single-component 8×8 blocks, in JPEG compression and decompression operation respectively.

3.18.3 Result Organizer

The MUV buffer 250 is also utilized by the result organizer 249. The result organizer 249 buffers and formats the data stream from either the main data path 242 or the JPEG coder 241. The result organizer 249 also is responsible for data packing and unpacking, denormalization. byte lane swapping and realignment of result data as previously discussed with reference to FIG. 42. Additionally the result organizer 249 transmits its results to the external interface controller 238, the local memory controller 236, and the peripheral interface controller 237 as required.

When operating in JPEG decompression mode, the results organizer 249 utilizes the MUV RAM 250 to double buffer image data produced by the JPEG coder 241. Double buffering increases the performance of the JPEG decompression by allowing data from the JPEG coder 241 to be written to one half of the MUV RAM 250 while at the same time image data presently in the other half of the MUV RAM 250 is output to a desired destination.

The 1, 3 and 4 channel image data is passed to the result organizer 249 during JPEG decompression in a form of 8×8 blocks with each block consisting of 8 bit components from the same channel. The result organizer stores these blocks in the MUV RAM 250 in the order provided and then, for multi-channel interleaved images, meshing of the channels in performed when reading data from the MUV RAM 250. For example, in a three channel JPEG compression based on Y, U, V color space, the JPEG coder 241 outputs three 8×8 blocks, the first consisting of Y components, the second made of the U components and the third made up of the V components. Meshing is accomplished by taking one component from each block and constructing the pixel in the form of (YUVX) where X represents an unused channel. Byte swapping may be applied to each output to swap the channels as desired. The result organizer 249 must also do any required sub-sampling to reconstruct chroma-data from decompressed output. This can involve replicating each program channel to produce and an one.

Turning to FIG. 127, there is illustrated the result organizer 249 of FIG. 2 in more detail. The result organizer 249 is based around the usual standard CBus interface 840 which includes a register file of registers to be set for operation of the result organizer 249. The operation of the result organizer 249 is similar to that of the pixel organizer 246, however the reverse data manipulation operations take place. A data manipulation unit 842 performs byte lane swapping, component substitution, component deselection and denormalization operations on data provided by the MUV address generator (MAG) 805. The operations carried out are those previously described with reference to FIG. 42 and operate in accordance with various fields set in internal registers. The FIFO queue 843 provides buffering of output data before it is output via RBus control unit 844.

The RBus control unit 844 is composed of an address decoder and state machines for address generation. The address for the destination module is stored in an internal register in addition to data on the number of output bytes required. Further, an internal RO_CUT register specifies how many output bytes to discard before sending a byte stream on the output bus. Additionally, a RO_LMT register specifies the maximum number of data items to be output with subsequent data bytes after the output limit being ignored. The MAG 805 generates addresses for the MUV RAM 250 during JPEG decompression. The MUV RAM 250 is utilized to double buffer output from the JPEG decoder. The MAG 805 performs any appropriate meshing of components in the MUV RAM 250 in accordance with an internal configuration register and outputs single channel, three channel or four channel interleaved pixels. The data obtained from the MUV RAM 250 is then passed through the data manipulation unit 842, since byte lane swapping may need to be applied before pixel data is sent to the appropriate destination. When the results organizer 249 is not configured for JPEG mode, the MAG 805 simply forwards data from the PBus receiver 845 straight through to the data manipulation unit 842.

3.18.4 Operand Organizers B and C

Returning again to FIG. 2, the two identical operand organizers 247, 248 perform the function of buffering data from the data cache control 240 and forwarding the data to the JPEG coder 241 or the main data path 242. The operand organizers 247, 248 are operated in a number of modes:

(a) Idle mode wherein the operand organizer only responds to CBus requests.

(b) Immediate mode when the data of the current instruction is stored in an internal register of the operand organizer.

(c) Sequential mode wherein the operator organizer generates sequential addresses and requests data from the data cache controller 240 whenever its input buffer requires filling.

A number of modes of operation of the main data path 242 require at least one of the operand organizers 247, 248 to operate in sequential mode. These modes include compositing wherein operand organizer B 247 is required to buffer pixels which are to be composited with another image. Operand organizer C 248 is used for compositing operations for attenuation of values for each data channel. In halftoning mode, operand organizer B 247 buffers 8 bit matrix co-efficients and in hierarchial image format decompression mode the operand organizer B 247 buffers data for both vertical interpolation and residual merging instructions.

(d) In constant mode, an operand organizer B constructs a single internal data word and replicates this word a number of times as given by an internal register.

(e) In tiling mode an operand organizer B buffers data that comprizes a pixel tile.

(f) In random mode the operand organizer forwards addresses from the MDP 242 or JPEG coder 241 directly to the data cache controller. These addresses are utilized to index the data cache 230.

An internal length register specifies the number of items to be generated by individual operand organizers 247, 248 when operated in sequential/titling/constant mode. Each operand organizer 247, 248 keeps account of the number of data items processed so far and stops when the count reaches the value specified in its internal register. Each operand organizer is further responsible for formatting input data via byte lane swapping, component substitution, packed/unpacked and normalization functions. The desired operations are configured utilising internal registers. Further, each operand organizer 247. 248 may also be configured to constrict data items.

Turning now to FIG. 128, there is illustrated the structure of operand organizers (247, 248) in more detail. The operand organizer 247, 248 includes the usual standard CBus interface and registers 850 responsible for the overall control of the operand organizer. Further, an OBus control unit 851 is provided for connection to the data cache controller 240 and is responsible for performing address generation for sequential/tile/constant modes, generating control signals to enable communications on the OBus interface to each operand organizer 247, 248 and controlling data manipulation unit operations such as normalization and replication, that require the state to be saved from previous clock cycles of the input stream. When an operand organizer 247, 248 is operating in sequential or tiling mode, the OBus control unit 851 sends requests for data to the data cache controller 240, the addresses being determined by internal registers.

Each operand organizer further contains a 36 bit wide FIFO buffer 852 used to buffer data from the data cache controller 240 in various modes of operation.

A data manipulation unit 853 performs the same functions as the corresponding data manipulation unit 804 of the pixel organizer 246.

A main data path/JPEG coder interface 854 multiplexer address and data to and from the main data path and JPEG coder modules 242, 241 in normal operating mode. The MDP/JC interface 854 passes input data from the data manipulation units 853 to the main data path and in the process may be configured to replicate this data. When operating in color conversion mode, the units 851, 854 are bypassed in order to ensure high speed access to the data cache controller 240 and the color conversion tables.

3.18.5 Main Data Path Unit

The aspects of the following embodiment relate to an image processor providing a low cost computer architecture capable of performing a number of image processing operations at high speed. Still further, the image processor seeks to provide a flexible computer architecture capable of being configured to perform image processing operations that are not originally specified. The image processor also seeks to provide a computer architecture having a large amount of identical logic, which simplifies the design process and lowers the cost of designing such an architecture.

The computer architecture comprises a control register block, a decoding block, a data object processor, and flow control logic. The control register block stores all the relevant information about the image processing operation. The decoding block decodes the information into configuration signals, which configure an input data object interface. The input data object interface accepts and stores data objects from outside, and distributes these data objects to the data object processor. For some image processing operations, the input data object interface may also generate addresses for data objects, so that the source of these data objects can provide the correct data objects. The data object processor performs arithmetic operations on the data objects received. The flow control logic controls the flow of data objects within the data object processing logic.

More particularly, the data object processor can comprise a number of identical data object sub-processors, each of which processes part of an incoming data object. The data object sub-processor includes a number of identical multi-functional arithmetic units that perform arithmetic operations on these parts of data objects, post processing logic that processes the outgoing data objects, and multiplexer logic that connects the multifunctional arithmetic units and the post-processing unit together. The multifunctional arithmetic units contain storage for parts of the calculated data objects. The storage is enabled or disabled by the flow control logic. The multifunctional arithmetic units and multiplexer logic are configured by the configuration signals generated by the decoding logic.

Furthermore, the configuration signals from the decoding logic can be overridden by an external programming agent. Through this mechanism any multifunctional blocks and multiplexer logic can be individually configured by an external programming agent, allowing it to configure the image processor to perform image processing operations that are not specified beforehand. These and other aspects of the embodiments of the invention are described in greater detail hereinafter.

Returning to FIG. 2, as noted previously the main data path unit 242 performs all data manipulation operations and instructions other than JPEG data coding. These instructions include compositing, color space conversion, image transformations, convolution, matrix multiplication, halftoning, memory copying and hierarchial image format decompression. The main data path 242 receives pixel and operand data from the pixel organizer 246, and operand organizers 247, 248 and feeds the resultant output to the result organizer 249.

FIG. 129 illustrates a block diagram of the main data path unit 242. The main data path unit 242 is a general image processor and includes input interface 1460, image data processor 1462. instruction word register 1464, instruction word decoder 1468, control signal register 1470, register file 1472, and a ROM 1475.

The instruction controller 235 transfers instruction words to the instruction word register 1464 via bus 1454. Each instruction word contains information such as the kind of image processing operation to be executed, and flags to enable or disable various options in that image processing operation. The instruction word is then transferred to the instruction word decoder 1468 via bus 1465. Instruction controller 235 can then indicate to the instruction word decoder 1468 to decode the instruction word. Upon receiving that indication, the instruction decoder 1468 decodes the instruction word into control signals. These control signals are then transferred via bus 1469 to the control signal register 1470. The output of the control signal register is then connected to the input interface 1460 and image data processor 1462 via bus 1471.

To add further flexibility to the main data path unit 242, the instruction controller 235 can also write into the control signal register 1470. This allows anyone who is familiar with the structure of the main data path unit 242 to micro-configure the main data path unit 242 so that the main data path unit 242 will execute image processing operations that are not be described by any instruction word.

In cases when all the necessary information to perform the desired image processing operation does not fit into the instruction word, the instruction controller 235 can write all the other information necessary to perform the desired image processing operation into some of the selected registers in register file 1472. The information is then transferred to the input interface 1460 and the image data processor 1462 via bus 1473. For some image processing operations, the input interface 1460 may update the contents of selected registers in the register file 1472 to reflect the current status of the main data path unit 242. This feature helps the instruction controller 235 to find out what the problem is when there is a problem in executing an image processing operation.

Once the decoding of the instruction word is finished, and/or the control signal register is loaded with the desired control signals, the instruction controller 235 can indicate to the main data path unit 242 to start performing the desired image processing operation. Once that indication is received, the input interface 1460 begins to accept data objects coming from bus 1451. Depending on the kind of image processing operation performed, the input interface 1460 may also begins to accept operand data coming from operand bus 1452 and/or operand bus 1453, or generates addresses for operand data and receive operand data from operand bus 1452 and/or operand bus 1453. The input interface 1460 then stores and rearranges the incoming data in accordance with the output of the control signal register 1470. The input interface 1460 also generates coordinates to be fetched via buses 1452 and 1453 when calculating such functions as affine image transformation operations and convolution.

The image data processor 1462 performs the major arithmetic operations on the rearranged data objects from the input interface 1460. The image processor 1462 can: interpolate between two data objects with a provided interpolation factor; multiply two data objects and divide the product by 255; multiply and add two data objects in general; round off fraction parts of a data object which may have various resolutions; clamp overflow of a data object to some maximum value and underflow of a data object to some minimum value; and perform scaling and clamping on a data object. The control signals on bus 1471 control which of the above arithmetic operations are performed on the data objects, and the order of the operations.

A ROM 1475 contains the dividends of 255/x, where x is from 0 to 255, rounded in 8.8 format. The ROM 1475 is connected to the input interface 1460 and the image data processor 1462 via bus 1476. The ROM 1475 is used to generate blends of short lengths and multiply one data object by 255 and dividing the product by another data object.

Preferably, the number of operand buses eg 1452 is limited to 2, which is sufficient for most image processing operations.

FIG. 130 illustrates the input interface 1460 in further detail. Input interface 1460 includes data object interface unit 1480, operand interface units 1482 and 1484, address generation state machine 1486, blend generation state machine 1488, matrix multiplication state machine 1490, interpolation state machine 1490, data synchronizer 1500, arithmetic unit 1496. miscellaneous register 1498, and data distribution logic 1505.

Data object interface unit 1480 and operand interface units 1482 and 1484 are responsible to receive data objects and operands from outside. These interface units 1482, 1484 are all configured by control signals from control bus 1515. These interface units 1482, 1484 have data registers within them to contain the data objects/operands that they have just received, and they all produce a VALID signal which is asserted when the data within the data register is valid. The outputs of the data registers in these interface units 1482, 1484 are connected to data bus 1505. The VALID signals of these interface units 1482, 1484 are connected to flow bus 1510. When configured to fetch operands, operand interface units 1482 and 1484 accept addresses from arithmetic unit 1496, matrix multiplication state machine 1490 and/or the output of data register in data object interface unit 1480, and select amongst them the required address in accordance with the control signals from control bus 1515. In some cases, the data registers in operand interface units 1482 and 1484 can be configured to store data from the output of data register in data object interface unit 1480 or arithmetic unit 1496, especially when they are not needed to accept and store data from outside.

Address generation state machine 1486 is responsible for controlling arithmetic unit 1496 so that it calculates the next coordinates to be accessed in the source image in affine image transformation operations and convolution operations.

The address generation state machine 1486 waits for START signal on control bus 1515 to be set. When the START signal on control bus 1515 is set, address generation state machine 1486 then de-asserts the STALL signal to data object interface unit 1480, and waits for data objects to arrive. It also sets a counter to be the number of data objects in a kernel descriptor that address generation state machine 1486 needs to fetch. The output of the counter is decoded to become enable signals for data registers in operand interface units 1482 and 1484 and miscellaneous register 1498. When the VALID signal from data object interface unit 1480 is asserted, address generation state machine 1486 decrements the counter, so the next piece of data object is latched into a different register.

When the counter reaches zero, address generation state machine 1486 tells operand interface unit 1482 to start fetching index table values and pixels from operand interface unit 1484. Also, it loads two counters, one with the number of rows, another with the number of columns. At every clock edge, when it is not paused by STALL signals from the operand interface unit 1482 or others, the counters are decremented to give the remaining rows and columns, and the arithmetic unit 1496 calculates the next coordinates to be fetched from. When both counters have reached zero, the counters reload themselves with the number of rows and columns again, and arithmetic unit 1496 is configured to find the top left hand corner of the next matrix.

If interpolation is used to determine the true value of a pixel, address generation state machine 1486 decrements the number of rows and columns after every second clock cycle. This is implemented using a 1-bit counter, with the output used as the enable of the row and column counter. After the matrix is traversed around once, the state machine sends a signal to decrement the count in the length counter. When the counter reaches 1, and the final index table address is sent to the operand interface unit 1482, the state machine asserts a final signal, and resets the start bit.

Blend generation state machine 1488 is responsible for controlling arithmetic unit 1496 to generate a sequence of numbers from 0 to 255 for the length of a blend. This sequence of numbers is then used as the interpolation factor to interpolate between the blend start value and blend end value.

Blend generation state machine 1488 determines which mode it should run in (jump mode or step mode). If the blend length is less than or equal to 256, then jump mode is used, otherwize step mode is used.

The blend generation state machine 1488 calculates the following and puts them in registers (reg0, reg1, reg2). If a blend ramp is in step mode for a predetermined length, then latch 511-length in reg0 (24 bits), 512−2*length in reg 1 (24 bits), and end-start in reg 2 (4×9 bits). If the ramp is in jump mode, then latch 0 into reg0, 255/(length−1) into reg1, and end-start into reg2 (4×9 bits).

In step mode, the following operations are performed for every cycle:

If reg0, then add reg0 with reg 1 and store the result in reg0. Another incrementor can also be enabled so its output is incremented by 1. If reg0<=0, then add reg0 with 510 and store the result in reg0. Incrementor is not incremented. The output of the incrementor is the ramp value.

In jump mode, the following is done for every cycle: Add reg0 with reg1. The Adder output is 24 bits, in fixed point format of 16.8. Store the adder output in reg0. If the first bit of fraction result is 1, then increment the integer part.

The least 8 bits of the integer part of the incrementor is the ramp value. The ramp value, the output of reg2, and the blend start value is then fed into the image data processor 1462 to produce the ramp.

Matrix multiplication state machine 1490 is responsible for performing linear color space conversion on input data objects using a conversion matrix. The conversion matrix is of the dimension 4×5. The first four columns multiply with the 4 channels in the data object, while the last column contains constant coefficients to be added to the sum of products. When the START signal from control bus 1515 is asserted, matrix multiplication state machine does the following:

1) It generates line numbers to fetch constant coefficients of the conversion matrix from buses 1482 and 1484. It also enables miscellaneous register 1498 to store these constant coefficients.

2) It contains a 1-bit flipflop, which generates a line number which is used as an address to fetch half of matrix from buses 1482 and 1484. It also generates a "MAT_SEL" signal that selects which half of the data object to be multiplied with that half of matrix.

3) It finishes when there is no data objects coming from data object interface unit 1480.

Interpolation state machine 1494 is responsible for performing horizontal interpolation of data objects. During horizontal interpolation, main data path unit 242 accepts a stream of data objects from bus 1451, and interpolates between adjacent data objects to output a stream of data objects which is twice or 4 times as long as the original stream. Since the data objects can be packed bytes or pixels, interpolation state machine 1494 operates differently in each case to maximize the throughput. Interpolation state machine 1494 does the following:

1) It generates INT_SEL signal to data distribution logic 1503 to rearrange the incoming data objects so that the right pair of data objects are interpolated.
2) It generates interpolation factors to interpolate between adjacent pairs of data objects.
3) It generates a STALL signal to stop data object interface unit 1480 from accepting more data objects. This is necessary as the output stream is longer than the input stream. The STALL signal goes to flow bus 1510.

Arithmetic unit 1496 contains circuitry for performing arithmetic calculations. It is configured by control signals on control bus 1515. It is used by two instructions only: affine image transformation and convolution, and blend generation in compositing.

In affine image transformation and convolution, arithmetic unit 1496 is responsible for:

1) Calculating the next x and y coordinates. To calculate x coordinates arithmetic unit 1496 uses an adder/subtractor to add/subtract the x part of horizontal and vertical delta to/from the current x coordinate. To calculate the y coordinates arithmetic unit 1498 uses an adder/subtractor to add/subtract the y part of the horizontal or vertical delta to/from the current y coordinate.
2) Adding the y coordinate to the index table offset to calculate the index table address. This sum is also incremented by 4 to find the next index table entry, when interpolation is used to find true value of a pixel.
3) Adding the x coordinate to the index table entry to find the address of the pixel.
4) Subtract 1 from the length count.

In blend generation. arithmetic unit 1496 does the following:

1) In step mode, one of the ramp adders is used to calculate an internal variable in the ramp generation algorithm, while the other adder is used to increment the ramp value when the internal variable is greater than 0.
2) In jump mode, only one of the adders is required to add the jump value to the current ramp value.
3) Round off fractions occur in jump mode.
4) Subtract start of blend from end of blend at the beginning of ramp generation.
5) Subtract one from the length count.

Miscellaneous register 1498 provides extra storage space apart from the data registers in data object interface unit 1480 and operand interface units 1482 and 1484. It is usually used to store internal variables or as a buffer of past data objects from data object interface unit 1480. It is configured by control signals on control bus 1515.

Data synchronizer 1500 is configured by control signals on control bus 1515. It provides STALL signals to data object interface unit 1480 and operand interface units 1482 and 1484 so that if one of the interface units receives a piece of data object others have not, that interface unit is stalled until all the other interface units have received their pieces of data.

Data distribution logic 1505 rearranges data objects from data bus 1510 and register file 1472 via bus 1530 in accordance with control signals on control bus 1515, including a MAT_SEL sional from matrix multiplication state machine 1490 and a INT_SEL signal from interpolation state machine 1494. The rearranged data is outputed onto bus 1461.

FIG. 131 illustrates image data processor 1462 of FIG. 129 in further detail. Image data processor 1462 includes a pipeline controller 1540, and a number of color channel processors 1545, 1550, 1555 and 1560. All color channel processors accept inputs from bus 1565, which is driven by the input interface 1460 (FIG. 131). All color channel processors and pipeline controller 1540 are configured by control signals from control signal register 1470 via bus 1472. All the color channel processors also accept inputs from register file 1472 and ROM 1475 of FIG. 129 via bus 1580. The outputs of all the color channel processors and pipeline controller are grouped together to form bus 1570, which forms the output 1455 of image data processor 1462.

Pipeline controller 1540 controls the flow of data objects within all the color channel processors by enabling and disabling registers within all the color channel processors. Within pipeline controller 1540 there is a pipeline of registers. The shape and depth of the pipeline is configured by the control signals from bus 1471, and the pipeline in pipeline controller 1540 has the same shape as the pipeline in the color channel processors. The Pipeline controller accepts VALID signals from bus 1565. For each pipeline stage within pipeline controller 1540, if the incoming VALID signal is asserted and the pipeline stage is not stalled, then the pipeline stage asserts the register enable signals to all color channel processors, and latch the incoming VALID signal. The output of the latch then a VALID signal going to the next pipeline stage. In this way the movement of data objects in the pipeline is simulated and controlled, without storage of any data.

Color channel processors 1545, 1550, 1555 and 1560 perform the main arithmetic operations on incoming data objects, with each of them responsible for one of the channels of the output data object. In the preferred embodiment the number of color channel processors is limited to 4, since most pixel data objects have a maximum of 4 channels.

One of the color channel processors processes the opacity channel of a pixel. There is additional circuitry (not shown in FIG. 131), connected to the control bus 1471, which transforms the control signals from the control bus 1471 so that the color channel processor processes the opacity channel correctly, as for some image processing operations the operations on the opacity channel is slightly different from the operations on the color channels.

FIG. 132 illustrates color channel processor 1545, 1550, 1555 or 1560 (generally denoted by 1600 in FIG. 132) in further detail. Each color channel processor 1545, 1550, 1555 or 1560 includes processing block A 1610, processing block B 1615, big adder 1620, fraction rounder 1625, clamp-or-wrapper 1630, and output multiplexer 1635. The color channel processor 1600 accepts control signals from control signal register 1470 via bus 1602, enable signals from pipeline controller 1540 via bus 1604, information from register file 1472 via bus 1605, data objects from other color channel processor via bus 1603, and data objects from input interface 1460 via bus 1601.

Processing block A 1610 performs some arithmetic operations on the data objects from bus 1601, and produces partially computed data objects on bus 1611. The following illustrates what processing block A 1610 does for designated image processing operations.

In compositing, processing block A 1610 pre-multiplies data objects from data object bus 1451 with opacity. interpolates between a blend start value and a blend end value with an interpolation factor from input interface 1460 in FIG. 129, pre-multiplies operands from operand bus 1452 in FIG. 129 or multiplies blend color by opacity, and attenuates multiplication on pre-multiplied operand or blend color data.

In general color space conversion, the processing block A 1610 interpolates between 4 color table values using two fraction values from bus 1451 in FIG. 129.

In affine image transformation and convolution, the processing block A 1610 pre-multiplies the color of the source pixel by opacity, and interpolates between pixels on the same row using the fraction part of current x-coordinate.

In linear color space conversion, the processing block A 1610 pre-multiplies color of the source pixel by opacity, and multiplies pre-multiplied color data with conversion matrix coefficients.

In horizontal interpolation and vertical interpolation, the processing block A 1610 interpolates between two data objects.

In residual merging, the processing block A 1610 adds two data objects.

Processing block A 1610 includes a number of multifunction blocks 1640 and processing block A glue logic 1645. The multifunction blocks 1640 are configured by control signals, and may perform any one of the following functions:

add/subtract two data objects;

passing one data object;

interpolate between two data objects with a interpolation factor;

pre-multiply a color with an opacity;

multiply two data objects, and then add a third data object to the product; and add/subtract two data objects, and then pre-multiply the sum/difference with an opacity.

The registers within the multifunction blocks 1640 are enabled or disabled by enable signals from bus 1604 generated by pipelined controller 1540 in FIG. 131. Processing block A glue logic 1645 accepts data objects from bus 1601 and data objects from bus 1603, and the outputs of some of the multifunction blocks 1640, and routes them to inputs of other selected multifunction blocks 1640. Processing block A glue logic 1645 is also configured by control signals from bus 1602.

Processing block B 1615 performs arithmetic operations on the data objects from bus 1601, and partially computed data objects from bus 1611, to produce partially computed data objects on bus 1616. The following description illustrates what processing block B 1615 does for designated image processing operations.

In compositing (with non-plus operators), the processing block B 1615 multiplies pre-processed data objects from data object bus 1451 and operands from operand bus 1452 with compositing multiplicands from bus 1603, and multiplies clamped/wrapped data objects by output of the ROM, which is 255/opacity in 8.8 format.

In compositing with plus operator, the processing block B 1615 adds two pre-processed data objects. In the opacity channel, it also subtracts 255 from the sum, multiplies an offset with the difference, and divides the product by 255.

In general color space conversion, the processing block B 1615 interpolates between 4 color table values using 2 of the fraction values from bus 1451, and interpolates between partially interpolated color value from processing block A 1610 and the result of the previous interpolation using the remaining fraction value.

In affine image transformation and convolution, the processing block B 1615 interpolates between partially interpolated pixels using the fraction part of current y-coordinate, and multiplies interpolated pixels with coefficients in a sub-sample weight matrix.

In linear color space conversion, the processing block B 1615 pre-multiplies the color of the source pixel by opacity, and multiplies pre-multiplied color with conversion matrix coefficients.

Processing block B 1615 again includes a number of multifunction blocks and processing block B glue logic 1650. The multifunction blocks are exactly the same as those in processing block A 1610, but the processing block B glue logic 1650 accepts data objects from buses 1601, 1603, 1611, 1631 and the outputs of selected multifunction blocks and routes them to the inputs of selected multifunction blocks. Processing block B glue logic 1650 is also configured by control signals from bus 1602.

Big adder 1620 is responsible for combining some of the partial results from processing block A 1610 and processing block B 1615. It accepts inputs from input interface 1460 via bus 1601, processing block A 1610 via bus 1611, processing block B 1615 via bus 1616, and register file 1472 via bus 1605, and it produces the combined result on bus 1621. It is also configured by control signals on bus 1602.

For various image processing operations, big adder 1620 may be configured differently. The following description illustrates its operation during designated image processing operations.

In compositing with non-plus operators, the big adder 1620 adds two partial products from processing block B 1615 together.

In compositing with plus operator, the big adder 1620 subtracts the sum of pre-processed data objects with offset from the opacity channel, if an offset enable is on.

In affine image transformation/convolution, the big adder 1620 accumulates the products from processing block B 1615

In linear color space conversion, in the first cycle, the big adder adds the two matrix coefficients/data object products and the constant coefficient together. In the second cycle, it adds the sum of last cycle with another two matrix coefficients/data object products together.

Fractions rounder 1625 accepts input from the big adder 1620 via bus 1621 and rounds off fraction part of the output. The number of bits representing the fraction part is described by a BP signal on bus 1605 from register file 1472. The following table shows how the BP signal is interpreted. The rounded output is provided on bus 1626.

TABLE 27

Fraction Table

| bp field | Meaning |
| --- | --- |
| 0 | Bottom 26 bits are fractions. |
| 1 | Bottom 24 bits are fractions. |
| 2 | Bottom 22 bits are fractions. |
| 3 | Bottom 20 bits are fractions. |
| 4 | Bottom 18 bits are fractions. |
| 5 | Bottom 16 bits are fractions. |
| 6 | Bottom 14 bits are fractions. |
| 7 | Bottom 12 bits are fractions. |

As well as rounding off fraction, fraction rounder 1625 also does two things:

1) determines whether the rounded result is negative; and 2) determines whether the absolute value of the rounded result is greater than 255.

Clamp-or-wrapper 1630 accepts inputs from fraction rounder 1625 via bus 1626 and does the following in the order described:

finds the absolute value of the rounded result, if such option is enabled; and clamps any underflow of the data object to the minimum value of the data object, and any overflow of the data object to the maximum value of the data object.

Output multiplexer 1635 selects the final output from the output of processing block B on bus 1616 and the output of clamp-or-wrapper on bus 1631. It also performs some final processing on the data object. The following description illustrates its operation for designated image processing operations.

In compositing with non-plus operators and un-pre-multiplication, the multiplexer 1635 combines some of the outputs of processing block B 1615 to form the un-pre-multiplied data object.

In compositing with non-plus operator and no un-pre-multiplication, the multiplexer 1635 passes on the output of clamp-or-wrapper 1630.

In compositing with plus operator, the multiplexer 1635 combines some of the outputs of processing block B 1630 to form resultant data object.

In general color space conversion, the multiplexer 1635 applies the translate-and-clamp function on the output data object.

In other operations, the multiplexer 1635 passes on the output of clamp-or-wrapper 1630.

FIG. 133 illustrates a single multifunction block (e.g. 1640) in further detail. Multifunction block 1640 includes mode detector 1710, two addition operand logic units 1660 and 1670, 3 multiplexing logic units 1680, 1685 and 1690, a 2-input adder 1675, a 2-input multiplier with 2 addends 1695, and register 1705.

Mode detector 1710 accepts one input from control signal register 1470, in FIG. 129 the MODE signal 1711, and two inputs from input interface 1460, in FIG. 129 SUB signal 1712 and SWAP signal 1713. Mode detector 1710 decodes these signals into control signals going to addition operand logic units 1660 and 1670, and multiplexing logic units 1680, 1685 and 1690, and these control signals configure multifunction block 1640 to perform various operations. There are 8 modes in multifunction block 1640:

1) Add/sub mode: adds or subtract input 1655 to/from input 1665, in accordance with the SUB signal 1712. Also, the inputs can be swapped in accordance with the SWAP signal 693.
2) Bypass mode: bypass input 1655 to output.
3) Interpolate mode: interpolates between inputs 1655 and 1665 using input 1675 as the interpolation factor. Inputs 1655 and 1665 can be swapped in accordance with the SWAP signal 1713.
4) Pre-multiply mode: multiplies input 1655 with input 1675 and divide it by 255. The output of the INC register 1708 tells the next stage whether to increment the result of this stage in bus 1707 to obtain the correct result.
5) Multiply mode: multiplies input 1655 with 1675.
6) Add/subtract-and-pre-multiply mode: adds/subtracts input 1665 to/from input 1655, multiplies the sum/difference with input 1675, and then divide the product by 255. The output of the INC register 1708 tells the next stage whether to increment the result of this stage in bus 1707 to obtain the correct result.

Addition operand logic units 1660 and 1670 find one's complement of the input on demand, so that the adder can do subtraction as well. Adder 1675 adds the outputs of addition operand logic 1660 and 1670 in buses 1662 and 1672 together, and outputs the sum in bus 1677.

Multiplexing logic 1680, 1685 and 1690 select suitable multiplicands and addends to implement, a desired function. They are all configured by control signals on bus 1714 from mode detector 1710.

Multiplier with two addends 1695 multiplies input from bus 1677 with input from bus 1682, then adds the products to the sum of inputs from buses 1687 and 1692.

Adder 1700 adds the least significant 8 bits of the output of multiplier 1695 with the most significant 8 bits of the output of multiplier 1695. The carryout of adder 1700 is latched in INC register 1701. INC register 1701 is enabled by signal 1702. Register 1705 stores the product from multiplier 1695. It is also enabled by signal 1702.

FIG. 134 illustrates a block diagram for the compositing operations. The compositing operation accepts three input streams of data:

1) The accumulated pixel data, which is derived from the same location as the result is stored to in this accumulator model.
2) A compositing operand—which consists of color and opacity. The color and opacity can both be either flat, a blend, pixels or tiled.
3) Attenuation—which attenuates the operand data. The attenuation can be flat, a bit map or a byte map.

Pixel data typically consists of four channels. Three of these channels make up the color of the pixel. The remaining channel is the opacity of the pixel. Pixel data can be pre-multiplied or normal. When pixel data is pre-multiplied, each of the color channels are multiplied with the opacity. Since equations for compositing operators are simple with pre-multiplied pixels, usually pixel data is pre-multiplied before it is composited with another pixel.

The compositing operators implemented in the preferred embodiments are shown in Table 1. Each operator works on pre-multiplied data. ($a_{co}$, $a_o$) refers to a pre-multiplied pixel of color $a_c$ and opacity $a_o$, r is the "offset" value and wc() is the wrapping/clamping operator the reverse operator of each of the over, in, out, atop operators in Table 1 is also implemented, and the compositing model has the accumulator on the left.

Composite block 1760 in FIG. 134 comprises three color sub-blocks and a opacity sub-block. Each color sub-block operates on one color channel, and opacity channel of the input pixels to obtain the color of the output pixel. The following pseudo code shows how this is done.

```
PIXEL Composite(   IN colorA, colorB: PIXEL;
                   IN opacityA, opacityB: PIXEL;
                   IN comp_op: COMPOSITE_OPERATOR
                   )
(
   PIXEL result;
   IF comp_op is rover, rin, rout, ratop THEN
       swap colorA and colorB;
       swap opacityA and opacityB;
   END IF;
   IF comp-op is over or rover or loado or plus THEN
       X = 1;
   ELSE IF comp_op is in or rin or atop or ratop THEN
       X = opacityB;
   ELSE IF comp-op is out or rout or xor THEN
       X = not(opacityB);
   ELSE IF comp-op is loadzero or loadc or loadco THEN
       X = 0
   END IF;
   IF comp-op is over or rover or atop or ratop or xor THEN
       Y = not(opacitya);
   ELSE IF comp_op is plus or loadc or loadco THEN
       Y = not(opacitya);
   ELSE IF comp_op is plus or loadc or loadco THEN
```

-continued

```
    Y = 1;
ELSE IF comp-op is in or rin or out or rout or
       loadzero or loado THEN
    Y = 0
END IF;
result = colorA * X + colorB * Y;
RETURN result;
```

The above pseudo code is different for the opacity sub-block, since the operators 'loade' and 'loado' have different meaning in the opacity channel.

Block 1765 in FIG. 134 is responsible for clamping or wrapping the output of block 1760. When block 1765 is configured to clamp, it forces all values less than the minimum allowable value to the minimum allowed value, and all values more than the maximum allowed value to the maximum allowed value. If block 1765 is configured to wrap, it calculates the following equation:

$$((x-min) \bmod (max-min)) + min,$$

whereby min and max are the minimum and maximum allowed value of the color respectively. Preferably the minimum value for a color is 0, and the maximum value is 255.

Block 1770 in FIG. 134 is responsible for un-pre-multiplying the result from block 1765. It un-pre-multiplies a pixel by multiplying the pre-multiplied color value with 255/o, where o is the opacity after composition. The value 255/o is obtained from a ROM inside the compositing engine. The value stored in the ROM is in the format of 8.8 and the rest of the fraction is rounded. The result of multiplication is stored in the format of 16.8. The result would be rounded to 8 bits to produce the un-pre-multiplied pixel.

Blend generator 1721 generates a blend of a specified length with specified start and end values. Blend generation is done in two stages:

1) ramp generation, and
2) interpolation

In ramp generation, the compositing engine generates a linearly increasing number sequence from 0 to 255 over the length of the instruction. There are two modes in ramp generation: the jump mode, when the length is less than or equal to 255, and the "step" mode when the length is greater than 255. The mode is determined by examining the 24 most significant bits of the length. In the jump mode, the ramp value increases by at least one in every clock period. In the step mode, the ramp value increases by at most one in every clock period.

In the jump mode, the compositing engine uses the ROM to find out the step value 255/(length−1), in 8.8 format. This value is then added to a 16-bit accumulator. The output of the accumulator is rounded to 8 bits to form the number sequence. In the step mode, the compositing engine uses an algorithm similar to Bresenham's line drawing algorithm, as described by the following pseudo code.

```
Void linedraw (   length: INTEGER
                  )
{
    d = 511 − length;
```

-continued

```
    incrE = 510;
    incrNE = 512 − 2*length;
    ramp − 0;
    for (i=0; i(length; i++)
    {
        ifd(= 0 then
            d += incrE;
        else {
            d += incrNE;
            ramp++;
        }
    }
}
```

After that, the following equation is calculated to generate the blend from the ramp.

$$\text{Blend} = ((end - start) \times ramp/255) + start$$

The division by 255 is rounded. The above equation requires 2 adders and a block that "pre-multiplies" (end-start) by ramp for each channel.

Another image processing operation that the main data path unit 242 is able to perform is general color space conversion. Generalized Color Space Conversion (GCSC) uses piecewize tri-linear interpolation to find out the output color value. Preferably, conversion is from a three dimensional input space to one or four dimensional output space.

In some cases, there is a problem with the accuracy of tri-linear interpolation at the edges of the color gamut. This problem is most noticeable in printing devices that have high sensitivity near an edge of the gamut. To overcome this problem, GCSC can optionally be calculated in an expanded output color space and then scaled and clamped to the appropriate range using the formula in equation:

$$out = \begin{cases} 0 & \text{if } x(63 \\ 2(x-64) & \text{if}(64(x(191) \\ 255 & \text{if}(192(x) \end{cases}$$

Yet other image processing operations that the preferred embodiment is able to perform are image transformation and convolution. In image transformation, the source image is scaled, rotated, or skewed to form the destination image. In convolution, the source image pixels are sampled with a convolution matrix to provide the destination image. To construct a scanline in the destination image, the following steps are required:

1) Perform an inverse transform of the scanline in the destination image back to the source image as illustrated in FIG. 135. This tells what pixels in the source image are needed to construct that scanline in the destination image.
2) Decompress the necessary portions of the source image.
3) Inverse-transform the starting x and y coordinates, horizontal and vertical subsampling distances in the destination image back to source image.
4) Pass all these information to the processing units which performs the necessary sub-sampling and/or interpolation to construct the output image pixel by pixel.

The calculations to work out which parts of the source image are relevant, sub-sampling frequencies to use, etc, are performed by the host application. Sub-sampling, interpolation, and writing the pixels into the destination image memory are done by the preferred embodiments.

FIG. 136 shows a block diagram of the steps required to calculate the value for a destination pixel. In general, the computation-intensive part is the bi-linear interpolation. The block diagram in FIG. 136 assumes that all the necessary source image pixels are available.

The final step in calculating a destination pixel is to add together all the possibly bi-linearly interpolated sub-samples from the source image. These values are given different weights.

FIG. 137 illustrates a block diagram of the image transformation engine that can be derived from suitable settings within the main data path unit 242. Image transformation engine 1830 includes address generator 1831, pre-multiplier 1832, interpolator 1833, accumulator 1834, and logic for rounding, clamping and finding absolute value 1835.

Address generator 1831 is responsible for generating x and y coordinates of the source image which are needed to construct a destination pixel. It also generates addresses to obtain index offsets from an input index table 1815 and pixels from image 1810. Before address generator 1831 begins generating x and y coordinates in the source image, it reads in a kernel descriptor. These are two formats of kernel descriptors. They are shown in FIG. 138. The kernel descriptor describes:

1) Source image start coordinates (unsigned fixed point, 24.24 resolution). Location (0,0) is at the top left of the image.
2) Horizontal and vertical sub-sample deltas (2's complement fixed point, 24.24 resolution).
3) a 3 bit bp field defining the location of the binary point within the fixed point matrix coefficients. The definition and interpretation of the bp field is shown in FIG. 150.
4) Accumulation matrix coefficients. These are of "variable" point resolution of 20 binary places (2's complement), with the location of the binary point implicitly specified by the bp field.
5) an rl field that indicates the remaining number of words in the kernel descriptor. This value is equal to the number of rows times the number of columns minus 1.

For the short kernel descriptor, apart from the integer part of start x coordinate, the other parameters are assumed to have the following values:

starting x coordinate fraction<–0,
starting y coordinate<–0,
horizontal delta<–1.0,
vertical delta<–1.0.

After address generator 1831 is configured, it calculates the current coordinates. It does this in two different ways, depending on the dimensions of the subsample matrix. If the dimensions of the subsample matrix are 1×1, address generator 1831 adds the horizontal delta to the current coordinates until it has generated enough coordinates.

If the dimensions of the subsample matrix are not 1×1, address generator 1831 adds the horizontal delta to the current coordinates until one row of the matrix is finished. After that, address generator 1831 adds the vertical delta to the current coordinates to find the coordinates on the next row. After that, address generator 1831 subtracts the horizontal delta from the current coordinates to find the next coordinates, until one more row is finished. After that, address generator 1831 adds the vertical delta to the current coordinates and the procedure is repeated again. Top diagram in FIG. 150 illustrates this method of accessing the matrix. Using this scheme, the matrix is traversed in a zig-zag way, and fewer registers are required since the current x and y coordinates are calculated using the above method, the accumulation matrix coefficients must be listed in the kernel descriptor in the same order.

After generating the current coordinates, the address generator 1831 adds the y coordinate to the index table base address to get the address to the index table. (In case when source pixels are interpolated, address generator 1831 needs to obtain the next index table entry as well.) The index table base address should point to the index table entry for y+0. After obtaining the index offset from the index table, the address generator 1831 adds that to the x coordinate. The sum is used to get 1 pixel from the source image (or 2 if source pixels are interpolated). In case when source pixels are interpolated, the address generator 1831 adds the x coordinates to the next index offset, and two more pixels are obtained.

Convolution uses a similar method to generate coordinates to image transformation. The only difference is that in convolution, the start coordinates of the matrix for the next output pixel is one horizontal delta away from the starting coordinates of the matrix for the previous pixel. In image transformation, the starting coordinates of the matrix for the next pixel is one horizontal delta away from the coordinates of the top right pixel in the matrix for the previous output pixel.

The middle diagrams in FIG. 139 illustrates this difference.

Pre-multiplier 1832 multiplies the color channels with the opacity channel of the pixel if required.

Interpolator 1832 interpolates between source pixels to find the true color of the pixel required. It gets two pixels from the source image memory at all times. Then it interpolates between those two pixels using the fraction part of the current x coordinate and puts the result in a register. After that, it obtains the two pixels on the next row from the source image memory. Then it interpolates between those two pixels using the same x fraction. After that, interpolator 1833 uses the fraction part of the current y coordinate to interpolate between this interpolated result and the last interpolated result.

Accumulator 1834 does two things:

1) it multiplies the matrix coefficients with the pixel, and
2) it accumulates the product above until the whole matrix is traversed. Then it outputs a value to the next stage.

Preferably the accumulator 1834 can be initialized with 0 or a special value on a channel-by-channel basis.

Block 1835 rounds the output of accumulator 1834, then clamps any underflows or overflows to the maximum and minimum values if required, and finds the absolute value of the output if required. The location of the binary point within the output of the accumulator is specified by the bp field in the kernel descriptor. The bp field indicates the number of leading bits in the accumulated result to discard. This is shown in the bottom diagram of FIG. 139. Note that the accumulated value is treated as a signed two's complement number.

Yet another image processing operation that the main data path unit 242 can perform is matrix multiplication. Matrix Multiplication is used for color space conversion where an affine relationship exists between the two spaces. This is distinct from General Color Space Conversion (based on tri-linear interpolation).

The result of Matrix Multiplication is defined by the following equation:

$$\begin{bmatrix} r_x \\ r_y \\ r_z \\ r_o \end{bmatrix} = \begin{bmatrix} b_{0,0} & b_{0,1} & b_{0,2} & b_{0,3} & b_{0,4} \\ b_{1,0} & b_{1,1} & b_{1,2} & b_{1,3} & b_{1,4} \\ b_{2,0} & b_{2,1} & b_{2,2} & b_{2,3} & b_{2,4} \\ b_{3,0} & b_{3,1} & b_{3,2} & b_{3,3} & b_{3,4} \end{bmatrix} \begin{bmatrix} a_x \\ a_y \\ a_z \\ a_o \\ 255 \end{bmatrix}$$

where $r_i$ is the result pixel and $a_i$ is the A operand pixel. Matrix must be 5 columns by 4 rows.

FIG. 140 illustrates a block diagram of the multiplier-adders that perform the matrix multiplication in the main data path unit 242. It includes multipliers to multiply the matrix coefficients with the pixel channels, adders to add the products together, and logic to clamp and find the absolute value of the output if required.

The complete matrix multiplication takes 2 clock cycles to complete. At each cycle the multiplexers are configured differently to select the right data for the multipliers and adders.

At cycle 0, the least significant 2 bytes of the pixel are selected by the multiplexers 1851, 1852. They then multiply the coefficients on the left 2 columns of the matrix, i.e, the matrix coefficients on line 0 in the cache. The results of the multiplication, and the constant term in the matrix, are then added together and stored.

At cycle 1, the more significant 2 bytes of the pixel are selected by the top multiplexers. They then multiply the coefficients on the right 2 columns of the matrix.

The result of the multiplication is then added 1854 to the result of the last cycle. The sum of the adder is then rounded 1855 to 8 bits.

The 'operand logic' 1856 rearranges the outputs of the multipliers to form four of the inputs of the adder 1854. It rearranges the outputs of the multipliers so that they can be added together to form the true product of the 24-bit coefficient and 8-bit pixel component.

The 'AC (Absolute value-clamp/wrap) logic' 1855 firstly rounds off the bottom 12 bits of the adder output. It then finds the absolute value of the rounded result if it is set to do so. After that it clamps or wraps the result according to how it is set up. If the 'AC logic' is set to clamp, it forces all values less than 0 to 0 and all values more than 255 to 255. If the 'AC logic' is set to wrap, the lower 8 bits of the integer part is passed to the output.

Apart from the image processing operations above, the main data path unit 242 can be configured to perform other operations.

The foregoing description provides a computer architecture that is capable of performing various image processing operations at high speed, while the cost is reduced by design reuse. The computer architecture described is also highly flexible, allowing any external programming agent with intimate knowledge of the architecture to configure it to perform image processing operations that were not initially expected. Also, as the core of the design mainly comprises a number of those multifunction blocks, the design effort is reduced significantly.

3.18.6 Data Cache Controller and Cache

The data cache controller 240 maintains a four-kilobyte read data cache 230 within the coprocessor 224. The data cache 230 is arranged as a direct mapped RAM cache, where any one of a group of lines of the same length in external memory can be mapped directly to the same line of the same length in cache memory 230 (FIG. 2). This line in cache memory is commonly referred to as a cache-line. The cache memory comprises a multiple number of such cache-lines.

The data cache controller 240 services data requests from the two operand organizers 247, 248. It first checks to see if the data is resident in cache 230. If not, data will be fetched from external memory. The data cache controller 240 has a programmable address generator, which enables the data cache controller 240 to operate in a number of different addressing modes. There are also special addressing modes where the address of the data requested is generated by the data cache controller 240. The modes can also involve supplying up to eight words (256 bits) of data to the operand organizers 247, 248 simultaneously.

The cache RAM is organized as 8 separately addressable memory banks. This is needed for some of the special addressing modes where data from each bank (which is addressed by a different line address) is retrieved and packed into 256 bits. This arrangement also allows up to eight 32-bits requests to be serviced simultaneously if they come from different banks.

The cache operates in the following modes, which will be discussed in more detail later. Preferably, it is possible to automatically fill the entire cache if this is desired.

1. Normal Mode
2. Single Output General Color Space Conversion Mode
3. Multiple Output General Color Space Conversion Mode
4. JPEG Encoding Mode
5. Slow JPEG Decoding Mode
6. Matrix Multiplication Mode
7. Disabled Mode
8. Invalidate Mode FIG. 141 shows the address, data and control flow of the data cache controller 240 and data cache 230 shown in FIG. 2.

The data cache 230, consists of a direct mapped cache of the type previously discussed. The data cache controller 240, consists of a tag memory 1872 having a tag entry for each cache-line, which tag entry comprises the most significant part of the external memory address that the cache-line is currently mapped to. There is also a line valid status memory 1873 to indicate whether the current cache-line is valid. All cache-lines are initially invalid.

The data cache controller 240 can service data requests from operand organizer B 247 (FIG. 2) and operand organizer C 248 (FIG. 2) simultaneously via the operand bus interface 1875. In operation. one or both of the operand organizers 247 or 248 (FIG. 2), supplies an index 1874 and asserts a data request signal 1876. The address generator 1881 generates one or more complete external addresses 1877 in response to the index 1874. A cache controller 1878 determines if the requested data is present in cache 230 by checking the tag memory 1872 entries for the tag addresses of the generated addresses 1877 and checking the line valid status memory 1873 for the validity of the relevant cache-line(s). If the requested data is present in cache memory 230, an acknowledgment signal 1879 is supplied to the relevant operand organizer 247 or 248 together with the requested data 1880. If the requested data is not present in the cache 230, the requested data 1870 is fetched from external memory, via an input bus interface 1871 and the input interface switch 252 (FIG. 2). The data 1870 is fetched by asserting a request signal 1882 and supplying the generated address(es) 1877 of the requested data 1870. An acknowledgement signal 1883 and the requested data 1870 are then sent to the cache controller 1878 and the cache memory 230 respectively. The relevant cache-line(s) of the cache memory 230 are then updated with the new data 1870. The tag addresses of the new cache-line(s) are also written into tag memory 1872, and the line valid status 1873 for the new cache-line(s) are asserted. An acknowledgment signal 1879 is then sent to the relevant operand organizer 247 or 248 (FIG. 2) together with the data 1870.

Turning now to FIG. 142, which shows the memory organization of the data cache 230. The data cache 230 is arranged as a direct mapped cache with 128 cache-lines C0, . . . ,C127 and a cache-line length of 32 bytes. The cache RAM consists of 8 separately addressable memory banks B0, . . . ,B7, each having 128 bank-lines of 32 bits, with each cache-line Ci consisting of the corresponding 8 bank-lines B0$i$, . . . ,B7$i$ of the 8 memory banks B0, . . . B7.

The composition of the generated complete external memory address is shown in FIG. 143. The generated address is a 32-bit word having a 20-bit tag address, a 7-bit line address, a 3-bit bank address and a 2-bit byte address. The 20-bit tag address is used for comparing the tag address with the tag stored in the tag memory 1872. The 7-bit line address is used for addressing the relevant cache-line in the cache memory 1870. The 3-bit bank address is used for addressing the relevant bank of the memory banks of the cache memory 1870. The 2-bit byte address is used for addressing the relevant byte in the 32-bit bank line.

Turning now to FIG. 144, which shows a block diagram of the data cache controller 240 and data cache 230 arrangement. In this arrangement, a 128 by 256 bit RAM makes up the cache memory 230, and as noted previously is organized as 8 separately addressable memory banks of 128 by 32 bits. This RAM has a common write enable port (write), a common write address port (write_addr) and a common write data port (write_data). The RAM also has a read enable port (read), eight read address ports (read_addr) and eight read data output ports (read_data). A write enable signal is generated by the cache controller block 1878 for supply to the common write enable port (write) for simultaneously enabling writing to all of the memory banks of the cache memory 230. When required, the data cache 230 is updated by one or more lines of data from external memory via the common write data port (write_data). A line of data is written utilizing the 8:1 multiplexer MUX supplying the line address to the write address port (write_addr). The 8:1 multiplexer MUX selects the line address from the generated external addresses under the control of the data cache controller (addr_select). A read enable signal is generated by the cache controller block 1878 for supply to the common read port (read) for simultaneously enabling reading of all the memory banks of cache memory 230. In this way, eight different bank-lines of data can be simultaneously read from eight read data ports (read_data) in response to respective line addresses supplied on the eight read address ports (read_addr) of the memory banks of the cache memory 230.

Each bank of the cache memory 230 has its own programmable address generator 1881. This allows eight different locations to be simultaneously accessed from the respective eight banks of memory. Each address generator 1881 has a dcc-mode input for setting the mode of operation of the address generator 1881, an index-packet input, a base-address input and an address output. The modes of operation of the programmable address generator 1881 include (a) Random access mode where a signal on the dcc-mode input sets each address generator 1881 to the random access mode and complete external memory address (es) are supplied on the index-packet input(s) and outputted on the address output of one or more of the address generators 1881; and (b) JPEG encoding and decoding, color space conversion, and matrix multiplication modes, where a signal on the dcc-mode input sets each address generator 1881 to the appropriate mode. In these modes, each address generator 1881 receives an index on the index-packet input and generates an index address. The index addresses are then added to a fixed base address supplied on the base-address input resulting in a complete external memory address which is then outputted on the address output. Depending upon the mode of operation, the address generators are able to generate up to eight different complete external memory addresses.

The eight address generators 1881 consist of eight different combinational logic circuits each having as their inputs; a base-address, a dcc-mode and an index and each having a complete external memory address as an output.

A base-address register 1885 stores the current base address that is combined with the index packet and a dcc-mode register 1888 stores the current operational mode (dcc-mode) of the data cache controller 240.

The tag memory 1872 comprizes one block of 128 by 20 bit, multi-port RAM. This RAM has one write port (update-line-addr), one write enable port (write), eight read ports (read0line-addr, . . . ,read7line-addr) and eight read output ports (tag0_data, . . . ,tag7_data). This enables eight simultaneous lookups on the ports (read0line-addr, . . . , read7line-addr) by the eight address generators 1881 to determine, for each line address of the one or more generated memory addresses, the tag addresses currently stored for those lines. The current tag addresses for those lines are outputted on the ports (tag0-data, . . . tag7-data) to the tag comparator 1886. When required, a tag write signal is generated by the cache controller block 1878 for supply to the write port (write) of the tag memory 1872 to enable writing to the tag memory 1872 on the port (update-line-addr).

A 128-bit line valid memory 1873 contains the line valid status for each cache-line of the cache memory 230. This is 128 by 1 bit memory with one write port (update-line-addr), one write enable port (update), eight read ports (read0line-addr, . . . ,read7line-addr) and eight read output ports (linevalid0, . . . ,linevalid7). In a similar manner to the tag memory, this allows eight simultaneous lookups on the ports (read0line-addr, . . . ,read7line-addr) by the eight address generators 1881 to determine, for each line address of the one or more generated memory addresses, the line valid status bits currently stored for those lines. The current line valid bits for those lines are outputted on the ports (linevalid0, . . . ,linevalid7) to the tag comparator 1886. When required, a write signal is generated by the cache controller block 1878 for supply to the write port (update) of the line valid status memory 1873 to enable writing to the line valid status memory 1873 on the port (update-line-addr).

The tag comparator block 1886 consists of eight identical tag comparators having; tag_data inputs for respectively receiving the tag addresses currently stored in tag memory 1872 at those lines accessed by the line addresses of the currently generated complete external addresses, tag_addr inputs for respectively receiving the tag addresses of the currently generated complete external memory addresses, a dcc_input for receiving the current operational mode signal (dcc_mode) for setting the parts of the tag addresses to be compared, and a line_valid input for receiving the line valid status bits currently stored in the line valid status memory

1873 at those lines accessed by the line addresses of the currently generated complete external memory addresses. The comparator block 1886 has eight hit outputs for each of the eight address generators 1881. A hit signal is asserted when the tag address of the generated complete external memory address matches the contents of the tag memory 1872 at the location accessed by the line address of the generated complete external memory address, and the line valid status bit 1873 for that line is asserted. In this particular embodiment, the data structures stored in external memory are small, and hence the most significant bits of the tag addresses are the same. Thus it is preferable to compare only those least significant bits of the tag addresses which may vary. This is achieved by the current operational mode signal (dcc_mode) setting the tag comparator 1886 for comparing those least significant bits of the tag addresses which may vary.

The cache controller 1878 accepts a request (proc_req) 1876 from the operand B 247 or operand C 248 and acknowledges (proc_ack) 1879 this request if the data is available in cache memory 230. Depending on the mode of operation, up to eight differently addressed data items may be requested, one from each of the eight banks of cache memory 230. The requested data is available in cache memory 230 when the tag comparator 1886 asserts a hit for that line of memory. The cache controller 1878 in response to the asserted hit signal (hit0, . . . ,hit7) generates a read enable signal on the port (cache_read) for enabling reading of those cache-lines for which the hit signal has been asserted. When a request (proc_req) 1876 is asserted, but not the hit signal (hit0, . . . ,hit7), a generated request (ext req) 1890 is sent to the external memory together with the complete external memory address for that cache-line of data. This cache-line is written into the eight banks of cache memory 230 via the input (ext_data) when it is available from the external memory. When this happens, the tag information is also written into the tag memory 1886 at that line address, and the line status bit 1873 for that line asserted.

Data from the eight banks of cache memory 230 is then outputted through a series of multiplexers in a data organizer 1892. so that data is positioned in a predetermined manner in an output data packet 1894. In one operational mode, the data organizer 1892 is able to select and output eight 8-bit words from the respective eight 32-bit words outputted from the eight memory banks by utilising the current operational mode signal (dcc_mode) and the byte addresses (byte_addr) of the current generated complete external memory addresses. In another operational mode, the data organizer 1892 directly outputs the eight 32-bit words outputted from the eight memory banks. As noted previously, the data organizer arranges this data in a predetermined manner for output.

A request would comprize the following steps:

1) The processing unit requests a packet of data by supplying an address to the processing unit interface of the cache controller 1878;
2) Each of the eight address generator units 1881 then generate a separate address for each block of cache memory depending on the mode of operation;
3) The Tag portion of each of the generated addresses is then compared to the Tag address stored in the four blocks of triple-port Tag memory 1886 and addressed by each of the corresponding line part of the eight generated addresses;
4) If they match, and the line valid status 1873 for that line is also asserted, the data requested for that block of memory is deemed to be resident in the said cache memory 230;
5) Data that is not resident is fetched via the external bus 1890 and all eight blocks of the cache memory 230 are updated with that line of data from external memory. The Tag address of the new data is then written to the Tag memory 1886 at the said line address, and the line valid status 1873 for that line asserted:
6) When all requested data items are resident in cache memory 230. it is presented to the processing unit in a predetermined packet format.

Figure 153:
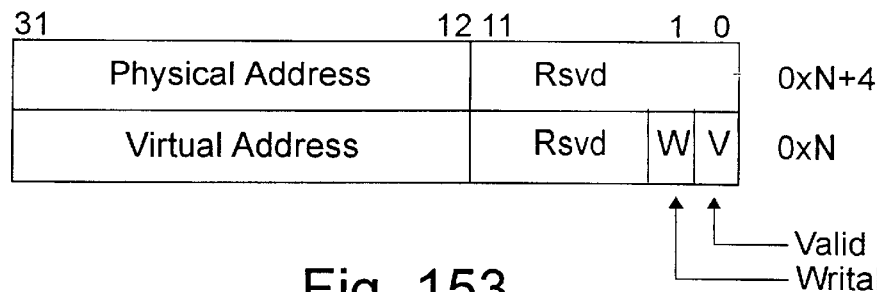

As previously noted, all the modules (FIG. 2) of the coproccessor 224 include a standard cBus interface 303 (FIG. 20). For more details on the standard cBus interface registers for the data cache controller 240 and cache 230, reference is made to pages B42 to B46 of Appendix B. The settings in these registers control the operation of the data controller 240. For the sake of simplicity only two of these registers are shown in FIG. 153, i.e. base_address and dcc_mode.

Once the data cache controller 240 and data cache 230 are enabled, the data cache controller initially operates in the normal mode with all cache lines invalid. At the end of an instruction, the data cache controller 240 and cache 230 always reverts to the normal mode of operation. In all of the following modes except the "Invalidate" mode, there is an "Auto-fill and validate" option. By setting a bit in the dcc_cfg2 register, it is possible to fill the entire cache starting at the address stored in the base_address register. During this operation, the data requests from the operand organizers B and C 247,248 are locked out until the operation is complete. The cache is validated at the end of this operation.

a. Normal Cache Mode

In this mode, the two operand organizers supply the complete external memory addresses of the data requested. The address generator 1881 outputs the complete external memory addresses which are then checked independently using the internal tag memory 1872 to see that if the data requested is resident in the memory cache 230. If both requested data items are not in cache 230, data will be requested from the input interface switch 252. Round Robin scheduling will be implemented to service persistent simultaneous requests.

For simultaneous requests, if one of the data items is resident in cache, it will be placed on the least significant 32 bits of each requestor's data bus. The other data will be requested externally via the input interface switch.

b. The Single Output General Color Space Conversion Mode

In this mode, the request comes from operand organizer B in the form of a 12-bit byte address. The requested data items are 8-bit color output values as previously discussed with reference to FIG. 60. The 12-bit address is fed to the index_packet inputs of the address generators 1881 and the eight address generators 1881 generate eight different 32-bit complete external memory addresses of the format shown in FIG. 96. The bank, line and byte addresses of the generated complete addresses are determined in accordance with Table 12 and FIG. 61. The external memory address is interpreted as eight 9-bit line and byte addresses, which are used to address a byte from each of the eight banks of RAM. The cache is accessed to obtain the eight byte values from each bank which are returned to the operand organizers for subsequent interpolation by the main data path 242 in accordance with the principles previously discussed with reference to FIG. 60. As the single output color value table is able to fit entirely within the cache memory 230, it is preferable to load the entire single output color value table within the cache memory 230 prior to enabling the single color conversion mode.

c. Multiple Output General Color Space Conversion Mode

In this mode, a 12-bit word address is received from operand organizer B 247. The requested data items are 32-bit color output values as previously discussed with reference to FIG. 62. The 12-bit address is fed to the index_packet inputs of the address generators 1881 and the eight address generators 1881 generate eight different 32-bit complete external memory addresses of the format shown in FIG. 96. The line and tag addresses of the complete external memory addresses are determined in accordance with table 12 and FIG. 63. The completed external memory address is interpreted as eight 9-bit addresses with the 9-bit address being decomposed into a 7-bit line address and a 2-bit tag address as discussed previously with reference to FIG. 63. Upon the tag address not being found, the cache stalls while the appropriate data is loaded from the input interface switch 252 (FIG. 2). Upon the data being available, the output data is returned to the operand organizers.

d. JPEG Encoding Mode

In this mode, the necessary tables for JPEG encoding and other operational sub-sets are stored in each bank of cache RAM. The storage of tables being previously described in the previous discussion of the JPEG encoding mode (Tables 14 and 16).

e. Slow JPEG Decoding Mode

In this mode, the data is organized in accordance with Table 17.

f. Matrix Multiplication Mode

In this mode, the cache is utilized to access 256 byte lines of data.

g. Disabled Mode

In this mode, all requests are passed through to the input interface switch 252.

h. Invalidate Mode

In this mode, the contents of the entire cache are invalidated by clearing all the line valid status bits.

3.18.7 Input Interface Switch

Returning again to FIG. 2, the input interface switch 252 performs the function of arbitrating data requests from the pixel organizer 246, the data cache controller 240 and the instruction controller 235. Further, the input interface switch 252 transmits addresses and data as required to the external interface controller 238 and local memory controller 236.

The input interface switch 252 stores in one of its configuration register the base address or the memory object in the host memory map. This is a virtual address that must be aligned on a page boundary, hence 20 address bits are required. For each request made by the pixel organizer, data cache controller, instruction controller, the input interface switch 252 first subtracts the co-processor's base address bits from the most significant 6 bits of the start address of the data. If the result is negative, or the most significant 6 bits of the result are non-zero, this indicates that the desired destination is the PCI bus.

If the most significant 6 bits of the result are zero, this indicates that the data maps to a co-processor's memory location. The input interface switch 252 then needs to check the next 3 bits to determine if the co-processor's location is legal or not.

The legal co-processor's locations that may act as a source of data are:

1) 16 Mbytes occupied by the Generic interface, beginning at an offset of 0x01000000 from the co-processor's base address.
2) 32 Mbytes occupied by the local memory controller (LMC), starting at an offset of 0x02000000 from the base address of the co-processor's memory object.

Requests that map to an illegal co-processor's location are flagged as errors by the Input Interface Switch.

The PCI bus is the source of data corresponding to any addresses that map outside of the range occupied by the co-processor's memory object. An i-source signal is used by the input interface switch to indicate to the EIC whether requested data is to originate from the PCI bus or the Generic interface.

After the address decoding process, legal requests are routed to the appropriate IBus interface when the bus is free. The EIC or LMC is busy with a data transaction to the input interface switch when they have their i-ack signal asserted. However, the input interface switch does not keep a count for the number of incoming words, and so must monitor the i-oe signal, controlled by the pixel organizer, instruction controller or data cache controller, in order to determine when the current data transaction has completed.

The input interface switch 252 must arbitrate between three modules: the pixel organizer, data cache controller and instruction controller. All of these modules are able to request data simultaneously, but not all requests can be instantly met since there are only two physical resources. The arbitration scheme used by the input interface switch is priority-based and programmable. Control bits within a configuration register of the input interface switch specify the relative priorities of the instruction controller, data cache controller and pixel organizer. A request from the module with the lower priority is granted when neither of the other two modules are requesting access to the same resource as it is. Assigning the same priority to at least two of the requesters results in the use of a round robin scheme to deduce the new winners.

As immediate access to a resource may not be possible, the input interface switch needs to store the address, burst length and whether to prefetch data provided by each requester. For any given resource, the arbitration process only needs to determine a new winner when there is not an IBus transaction in progress.

Turning to FIG. 145, there is illustrated the instruction interface switch 252 in more detail. The switch 252 includes the standard CBus interface and register file 860 in addition to two IBus transceivers 861 and 862 between an address decoder 863 and arbiter 864.

The address decoder 863 performs address decoding operations for requests received from the pixel organizer, data cache controller and instruction controller. The address decoder 863 checks the address is a legal one and performs any address remapping required. The arbiter 864 decides which request to pass from one IBus transceiver 661 to a second IBus transceiver 862. Preferrably, the priority system is programmable.

The IBus transceivers 861, 862 contain all the necessary multiplexing/demultiplexing and tristate buffering to enable communication over the various interfaces to the input interface switch.

3.18.8 Local Memory Controller

Returning again to FIG. 2, the local memory controller 236 is responsible for all aspects of controlling the local memory and handling access requests between the local memory and modules within the co-processor. The local memory controller 236 responds to write requests from the result organizer 249 and read requests from the input interface switch 252. Additionally, it also responds to both read and write requests from the peripheral interface controller 237 and the usual global CBus input. The local memory controller utilizes a programmable priority system and further utilizes FIFO buffers to maximize throughput.

In the present invention, a multi-port burst dynamic memory controller is utilized in addition to using First-In-First-Out (FIFO) buffers to de-couple the ports from a memory array.

FIG. 146 depicts a block diagram of a four-port burst dynamic memory controller according to a first embodiment of the present invention. The circuit includes two write ports (A 1944 and B 1946) and two read ports (C 1948 and D 1950) that require access to a memory array 1910. The data paths from the two write ports pass through separate FIFOs 1920, 1922 and to the memory array 1910 via a multiplexer 1912, while the data paths of the read ports 1948, 1950 pass from the memory array 1910 via separate FIFOs 1936, 1938. A central controller 1932 coordinates all port accesses as well as driving all the control signals necessary to interface to the dynamic memory 1910. A refresh counter 1934 determines when dynamic memory refresh cycles for the memory array 1910 are required and coordinates these with the controller 1932.

Preferably, the data is read from and written to the memory array 1910 at twice the rate that data is transferred from the write ports 1944, 1946 to the FIFOs 1920, 1922 or from the FIFOs 1936, 1938 to the read ports 1948, 1950. This results in as little time as possible being taken up doing transfers to or from the memory array 1910 (which is the bottleneck of any memory system) relative to the time taken to transfer data through the write and read ports 1944, 1946, 1948, 1950.

Data is written into the memory array 1910 via either one of the write ports 1944, 1946. The circuits connected to the write ports 1944, 1946 see only a FIFO 1920, 1922 which are initially empty. Data transfers through the write ports 1944, 1946 proceed unimpeded until the FIFO 1920, 1922 is filled, or the burst is ended. When data is first written into the FIFO 1920, 1922, the controller 1932 arbitrates with the other ports for the DRAM access. When access is granted, data is read out of the FIFO 1920, 1922 at the higher rate and written into the memory array 1910. A burst write cycle to DRAM 1910 is only initiated when a preset number of data words have been stored in the FIFO 1920, 1922, or when the burst from the write port ends. In either case, the burst to DRAM 1910 proceeds when granted and continue until the FIFO 1920, 1922 is emptied, or there is a cycle request from a higher priority port. In either event, data continues to be written into the FIFO 1920, 1922 from the write port without hindrance, until the FIFO is filled, or until the burst ends and a new burst is started. In the latter case, the new burst cannot proceed until the previous burst has been emptied from the FIFO 1920, 1922 and written to the DRAM 1910. In the former case, data transfers recommences as soon as the first word is read out of the FIFO 1920, 1922 and written to DRAM 1910. Due to the higher rate of data transfers out of the FIFO 1920, 1922, it is only possible for the write port 1944, 1946 to stall if the controller 1932 is interrupted with cycle requests from the other ports. Any interruption to the data transfers from the write ports 1944, 1946 to the FIFOs 1920, 1922 is preferably kept to a minimum.

The read ports 1948, 1950 operate in a converse fashion. When a read port 1948, 1950 initiates a read request, a DRAM cycle is immediately requested. When granted, the memory array 1910 is read and data is written into the corresponding FIFO 1936, 1938. As soon as the first data word is written into the FIFO 1936, 1938, it is available for read-out by the read port 1948, 1950. Thus there is an initial delay in obtaining the first datum word but after that there is a high likelihood that there are no further delays in retrieving the successive data words. DRAM reads will be terminated when a higher priority DRAM request is received, or if the read FIFO 1936, 1938 becomes full, or when the read port 1948, 1950 requires no more data. Once the read has been terminated in this way, it is not restarted until there is room in the FIFO 1936, 1938 for a preset number of data words. Once the read port terminates the cycle, any data remaining in the FIFO 1936, 1938 is discarded.

In order to keep DRAM control overheads to a minimum, rearbitration for the DRAM access is restricted so that bursts cannot be interrupted until a preset number of data words have been transferred (or until the corresponding write FIFO 1920, 1922 is emptied, or read FIFO 1936, 1938 is filled).

Each of the access ports 1944, 1946, 1948. 1950 has an associated burst start address which is latched in a counter 1942 at the start of the burst. This counter holds the current address for transactions on that port so that, should the transfer be interrupted it can be resumed at any time at the correct memory address. Only the address for the currently active DRAM cycle is selected by multiplexer 1940 and passed on to the row address counter 1916 and column address counter 1918. The low order N bits of address are inputted to the column counter 1918 while the higher order address bits are inputted to the row counter 1916. Multiplexer 1914 outputs row addresses from the row counter 1916 to the memory array 1910 during the row address time of the DRAM and passes column addresses from the column counter 1918 during column address time of the DRAM. The row address counter 1916 and the column address counter 1918 are loaded at the start of any burst to the memory array DRAM 1910. This is true both at the start of a port cycle and at the continuation of an interrupted burst. The column address counter 1918 is incremented after each transfer to memory has taken place while the row address counter 1916 is incremented when the column address counter 1918 rolls over to a count of zero. When the latter happens, the burst must be terminated and restarted at the new row address.

In the preferred embodiment it is assumed that memory array 1910 comprizes 4×8 bit byte lines making up a 32 bits per word. Further there is associated with each write port 1944, 1946 a set of four byte write enable signals 1952, 1954 which individually allow data to be written to each 8-bit portion of each 32-bit data word in the memory array 1910. Since it is possible to arbitrarily mask the writing of data to any byte within each word that is written to the memory array 1910, it is necessary to store the write enable information along with each data word in corresponding FIFOs 1926, 1928. These FIFOs 1926, 1928 are controlled by the same signals that control the write FIFOs 1920, 1922 but are only 4 bits wide instead of the 32 bits required for the write data in FIFOs 1920, 1922. In like fashion. multiplexer 1930 is controlled in the same manner as the multiplexer 1912. The selected byte write enables are inputted to the controller 1932 which uses the information to selectively enable or disable writing to the addressed word in the memory arra 1910 in synchronization with the write data being inputted to the memory array 1910 by way of multiplexer 1912.

The arrangement of FIG. 146 operates under the control of the controller 1932. FIG. 147 is a state machine diagram depicting the detail of operation of the controller 1932 of FIG. 146. After power up and at the completion of reset the state machine is forced into state IDLE 1960 in which all DRAM control signals are driven inactive (high) and multiplexer 1914 drives row addresses to the DRAM array 1910. When a refresh or cycle request is detected, the transition is made to state RASDEL1 1962. On the next clock edge the transition to state RASDEL2 1964 is made. On the next clock edge, if the cycle request and refresh have gone away, the state machine returns to state IDLE 1900, otherwize, when the DRAM tRP (RAS precharge timing constraint) period has been satisfied, the transition to state RASON 1966 is made at which time the row address strobe signal, RAS, is asserted low. After tRCD (RAS to CAS delay timing constraint) has been satisfied, the transition to state COL 1968 is made, in which the multiplexer 1914 is switched over to select column addresses for inputting to the DRAM array 1910. On the next clock edge the transition to state CASON 1970 is made and the DRAM column address strobe (CAS) signal is driven active low. Once the tCAS (CAS active timing constraint) has been satisfied, the transition to state CASOFF 1972 is made in which the DRAM column address strobe (CAS) is driven inactive high once again. At this point, if further data words are to be transferred and a higher priority cycle request or refresh is not pending or if it is too soon to rearbitrate anyway, and once the tCP (CAS precharge timing constraint) has been satisfied, the transition back to state CASON 1970 will be made in which the DRAM column address strobe (CAS) is driven active low again. If no further data words are to be transferred, or if rearbitrating is taking place and a higher priority cycle request or refresh is pending, then the transition is made to state RASOFF 1974 instead, providing tRAS (RAS active timing constraint) and tCP (CAS precharge timing constraint) are both satisfied. In this state the DRAM row address strobe (RAS) signal is driven inactive high. On the next clock edge the state machine returns to state IDLE 1860 ready to start the next cycle.

When in state RASDEL2 1964 and a refresh request is detected, the transition will be made to state RCASON 1980 once tRP (RAS precharge timing constraint) has been satisfied. In this state DRAM column address strobe is driven active low to start a DRAM CAS before RAS refresh cycle. On the next clock edge the transition to state RRASON 1978 is made in which DRAM row address strobe (RAS) is driven active low. When tCAS (CAS active timing constraint) has been met, the transition to state RCASOFF 1976 will be made in which DRAM column address strobe (CAS) is driven inactive high. Once tRAS (RAS active timing constraint) has been met, the transition to state RASOFF 1974 is made in which DRAM row address strobe (RAS) is driven inactive high effectively ending the refresh cycle. The state machine then continues as above for a normal DRAM cycle, making the transition back to state IDLE 1960.

The refresh counter 1934 of FIG. 146 is simply a counter that produces refresh request signals at a fixed rate of once per 15 microseconds, or other rate as determined by the particular DRAM manufacturer's requirements. When a refresh request is asserted, it remains asserted until acknowledged by the state machine of FIG. 147. This acknowledgement is made when the state machine enters state RCASON 1980 and remains asserted until the state machine detects the refresh request has been de-asserted.

In FIG. 148, there is set out in pseudo code form, the operation of the arbitrator 1924 of FIG. 146. It illustrates the method of determining which of four cycle requesters is granted access to the memory array 1910, and also a mechanism for modifying the cycle requester priorities in order to maintain a fair access regime. The symbols used in this code are explained in FIG. 149.

Each requester has 4 bits associated with it that represent that requester's priority. The two high order bits are preset to an overall priority by way of configuration values set in a general configuration register. The two low order bits of priority are held in a 2-bit counter that is updated by the arbitrator 24. When determining the victor in an arbitration, the arbitrator 1924 simply compares the 4-bit values of each of the requesters and grants access to the requester with the highest value. When a requester is granted a cycle its low order 2-bit priority count value is cleared to zero, while all other requesters with identical high order 2-bit priority values and whose low order 2-bit priority is less than the victor's low order 2-bit priority have their low order 2-bit priority counts incremented by one. This has the effect of making a requester that has just been granted access to the memory array 1910 the lowest priority among requesters with the same priority high order 2-bit value. The priority low order 2-bit value of other requesters with priority high order 2-bit value different to that of the winning requester are not affected. The high order two bits of priority determine the overall priority of a requester while the low order two bits instil a fair arbitration scheme among requesters with identical high order priority. This scheme allows a number of arbitration schemes to be implemented ranging from hard-wired fixed priority (high order two bits of each requester unique) through part rotating and part hard-wired (some high order 2-bit priorities different to others, but not all) to strictly fair and rotating (all priority high order 2-bit fields the same).

FIG. 149 depicts the structure of the priority bits associated with each requester and how the bits are utilized. It also defines the symbols used in FIG. 148.

In the preferred embodiment, the various FIFOs 1920, 1922, 1938 and 1936 are 32 bits wide and 32 words deep. This particular depth provides a good compromise between efficiency and circuit area consumed. However, the depth may be altered, with a corresponding change in performance, to suit the needs of any particular application.

Also, the four port arrangement shown is merely a preferred embodiment. Even the provision of a single FIFO buffer between the memory array and either a read or write port will provide some benefits. However, the use of multiple read and write ports provides the greatest potential speed increase.

3.18.9 Miscellaneous Module

The miscellaneous module 239 provides clock generation and selection for the operation of the co-processor 224, reset synchronization, multiplexing of error and interrupt signals by routing of internal diagnostic signals to external pins as required, interfacing between the internal and external form of the CBus and multiplexing of internal and generic Bus signals onto a generic/external CBus output pins. Of course, the operation of the miscellaneous module 239 varies in accordance with clocking requirements and implementation details depending on the ASIC technology utilized.

3.18.10 External Interface Controller

The following described apsects of the invention relate to a method and an apparatus for providing virtual memory in a host computer system having a co-processor that shares the virtual memory. The embodiments of the invention seek to provide a co-processor able to operate in a virtual memory mode in conjunction with the host processor.

In particular, the co-processor is able to operate in a virtual memory mode of the host processor. The co-processor includes a virtual-memory-to-physical-memory mapping device that is able to interrogate the host processor's virtual memory tables, so as to map instruction addresses produced by the co-processor into corresponding physical addresses in the host processor's memory. Preferably, the virtual-memory-to-physical-memory mapping device forms part of a computer graphics co-processor for the production of graphical images. The co-processor may include a large number of modules able to form various complex operations on images. The mapping device is responsible for the interaction between the co-processor and the host processor.

The external interface controller (EIC) 238 provides the co-processors interface to the PCI Bus and to a generic Bus. It also provides memory management to translate between the co-processor's internal virtual address space and the host system physical address space. The external interface controller 238 acts as a master on the PCI Bus when reading the data from the host memory in response to a request from the input interface switch 252 and when writing data to host memory in response to a request from the result organizer 249. The PCI Bus access is implemented in accordance the well known standard with "PCI Local Bus specification, draft 2.1", PCI special interest group, 1994.

The external interface controller 238 arbitrates between simultaneous requests for PCI transactions from the input interface switch 252 and the result organizer 249. The arbitration is preferably configurable. The types of requests received include transactions for reading less than one cache line of the host co-processor at a time, reading between one and two cache lines of the host and reading two or more cache lines of the host. Unlimited length write transactions are also implemented by the external interface controller 238. Further, the external interface controller 238 optionally also performs prefetching of data.

The construction of the external interface controller 238 includes a memory management unit which provides virtual to physical address mapping of host memory accesses for all of the co-processor's internal modules. This mapping is completely transparent to the module requesting the access. When the external interface controller 238 receives a request for host memory access, it initiates a memory management unit operation to translate the requested address. Where the memory management unit is unable to translate the address, in some cases this results in one or more PCI Bus transaction to complete the address translation. This means that the memory management unit itself can be another source of transaction requests on the PCI Bus. If a requested burst from the input interface switch 252 or results organizer 249 crosses the boundary of a virtual page, the external interface controller 238 automatically generates a memory management unit operation to correctly map all virtual addresses.

The memory management unit (MMU) (915 of FIG. 150) is based around a 16 entry translation look aside buffer (TLB). The TLB acts as a cache of virtual to physical address mappings. The following operations are possible on the TLB:

1) Compare: A virtual address is presented, and the TLB returns either the corresponding physical address, or a TLB miss signal (if no valid entry matches the address).
2) Replace: A new virtual-to-physical mapping is written into the TLB, replacing an existing entry or an invalid entry.
3) Invalidate: A virtual address is presented; if it matches a TLB entry, that entry is marked invalid.
4) Invalidate All. All TLB entries are marked invalid.
5) Read: A TLB entry's virtual or physical address is read, based on a four bit address. Used for testing only.
6) Write: A TLB entry's virtual and physical address is written, based on a four bit address.

Figure 151:
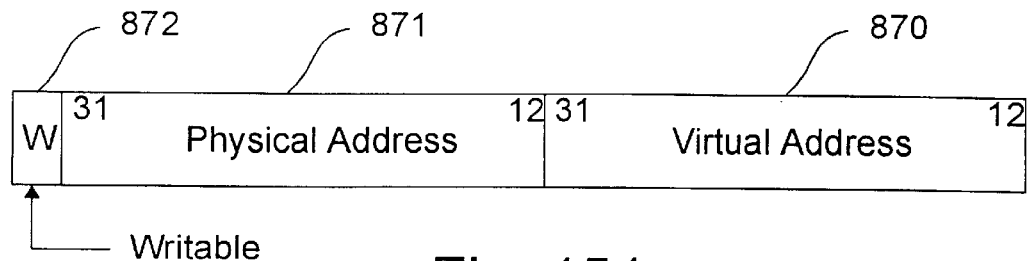

Entries within the TLB have the format shown in FIG. 151. Each valid entry consists of a 20-bit virtual address 670, a 20-bit physical address 671, and a flag which indicates whether the corresponding physical page is writable. The entries allow for page sizes as small as 4 kB. A register in the MMU can be used to mask off up to 10 bits of the addresses used in the comparison. This allows the TLB to support pages up to 4 MB. As there is only one mask register, all TLB entries refer to pages of the same size.

The TLB uses a "least-recently-used" (LRU) replacement algorithm. A new entry is written over the entry which has the longest elapsed time since it was last written or matched in a comparison operation. This applies only if there are no invalid entries; if these exist, they are written to before any valid entries are overwritten.

Figure 152:
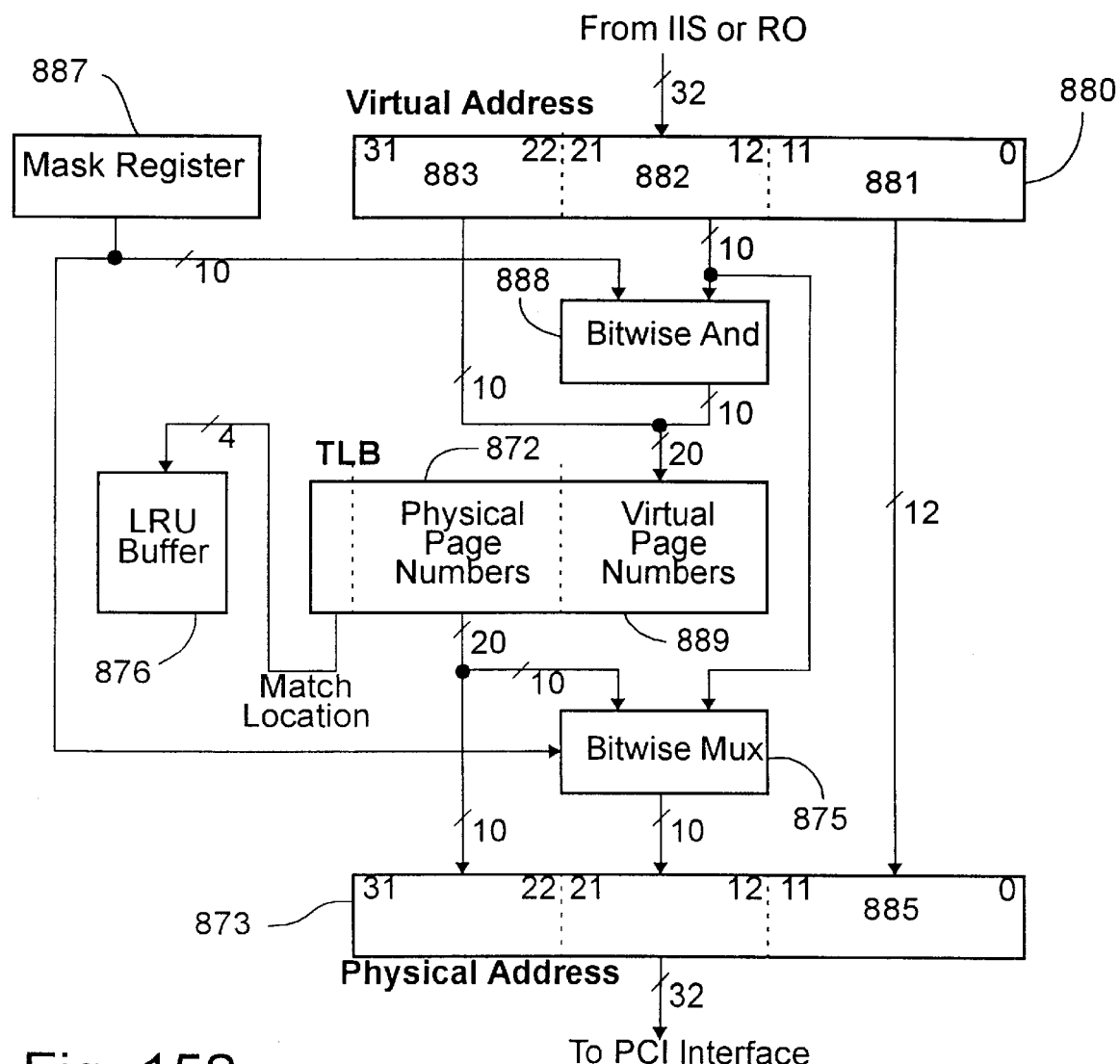

FIG. 152 shows the flow of a successful TLB compare operation. The incoming virtual address 880 is divided into 3 parts 881–883. The lower 12 bits 881 are always part of the offset inside a page and so are passed directly on to the corresponding physical address bits 885. The next 10 bits 882 are either part of the offset, or part of the page number, depending on the page size, as set by the mask bits. A zero in the mask register 887 indicates that the bit is part of the page offset, and should not be used for TLB comparisons. The 10 address bits are logically "ANDED" with the 10 mask bits to give the lower 10 bits of the virtual page number 889 for TLB lookups. The upper 10 bits 883 of the virtual address are used directly as the upper 10 bits of the virtual page number 889.

The 20-bit virtual page number thus generated is driven into the TLB. If it matches one of the entries, the TLB returns the corresponding physical page number 872, and the number of the matched location. The physical address 873 is generated from the physical page number using the mask register 887 again. The top 10 bits of physical page number 872 are used directly as the top 10 bits of the physical address 873. The next 10 bits of physical address 872 are chosen 875 from either the physical page number (if the corresponding mask bit is 1), or the virtual address (if the mask bit is 0). The lower 12 bits 885 of physical address come directly from the virtual address.

Finally, following a match, the LRU buffer 876 is updated to reflect the use of the matched address.

A TLB miss occurs when the input interface switch 252 or the results organizer 249 requests an access to a virtual address which is not in the TLB 872. In this case, the MMU must fetch the required virtual-to-physical translation from the page table in host memory 203 and write it into the TLB before proceeding with the requested access.

The page table is a hash table in the hosts main memory. Each page table entry consists of two 32-bit words, with the format shown in FIG. 153. The second word comprizes the upper 20 bits for the physical address and the lower 12 bits are reserved. The upper 20 bits of the corresponding virtual address are provided in the first word. The lower 12 bits include a valid (V) bit and writable (W) or a "read-only" bit, with the remaining 10 bits being reserved.

The page table entry contains essentially the same information as the TLB entry. Further flags in the page table are reserved. The page table itself may be, and typically is, distributed over multiple pages in main memory 203, which in general are contiguous in virtual space but not physical space.

The MMU contains a set of 16 page table pointers, setup by software, each of which is a 20-bit pointer to a 4 kB memory region containing part of the page table. This means the co-processor 224 supports a page table 64 kB in size, which holds 8 k page mappings. For systems with a 4 kB page size, this means a maximum of 32 MB of mapped virtual address space. Preferably, the page table pointers always reference a 4 kB memory region, regardless of the page size used in the TLB.

Figure 154:
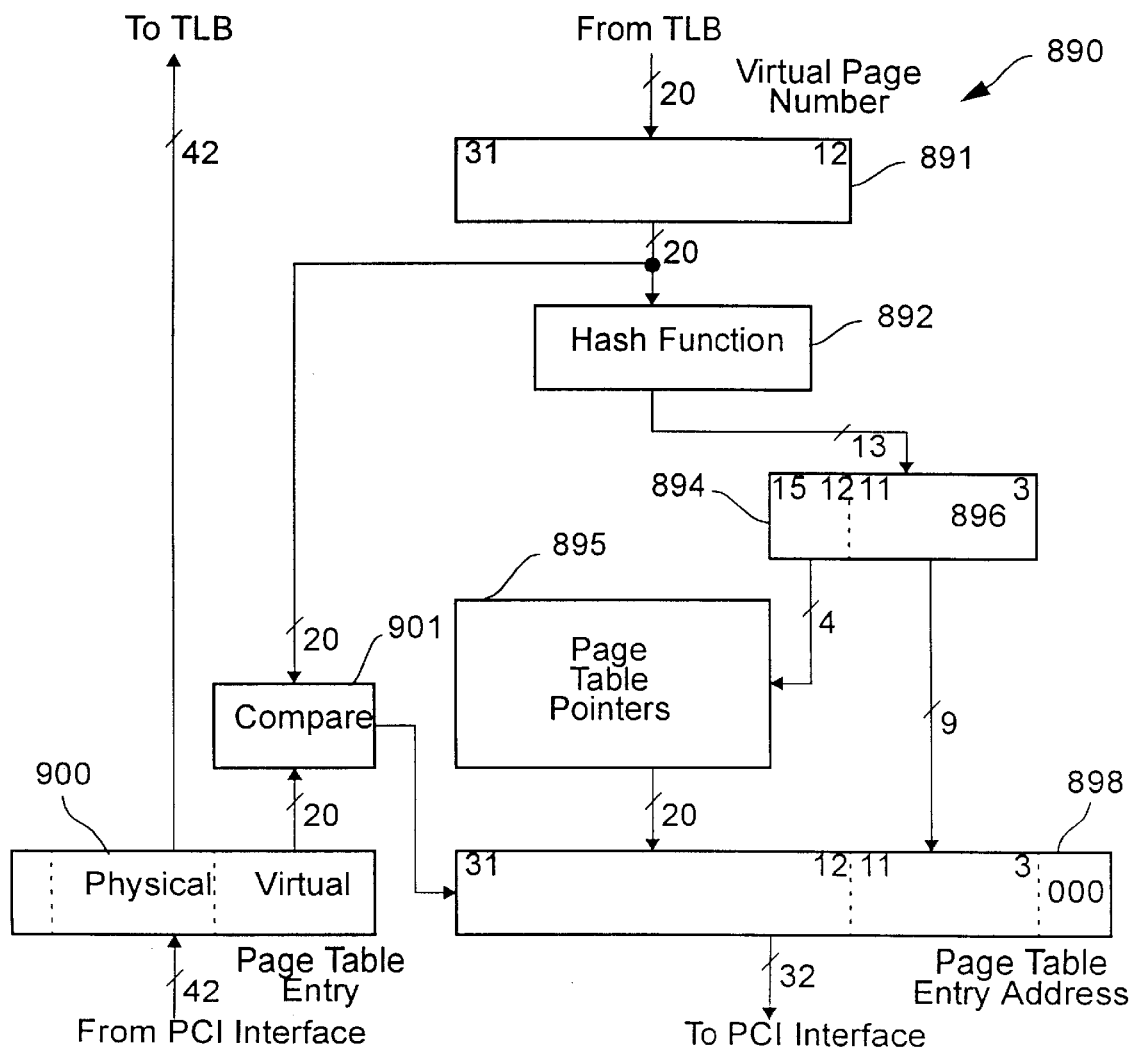

The operation of the MMU following a TLB miss is shown 690 in FIG. 154, as follows:

1. Execute the hash function 892 on the virtual page number 891 that missed in the TLB, to produce a 13-bit index into the page table.
2. Use the top 4 bits 894 of the page table index 894, 896 to select a page table pointer 895.
3. Generate the physical address 890 of the required page table entry, by concatenating the 20-bit page table pointer 895 with the lower 9 bits of the page table index 896, setting the bottom 3 bits to 000 (since page table entries occupy 8 bytes in host memory).
4. Read 8 bytes from host memory, starting at the page table entry physical address 898.
5. When the 8-byte page table entry 900 is returned over the PCI bus, the virtual page number is compared to the original virtual page number that caused the TLB miss, provided that the VALID bit is set to 1. If it does not match, the next page table entry is fetched (incrementing the physical address by 8 bytes) using the process described above. This continues until a page table entry with a matching virtual page number is found, or an invalid page table entry is found. If an invalid page table entry is found, a page fault error is signalled and processing stops.
6. When a page table entry with a matching virtual page number is found, the complete entry is written into the TLB using the replace operation. The new entry is placed in the TLB location pointed to by the LRU buffer 876.

The TLB compare operation is then retried, and will succeed, and the originally requested host memory access can proceed. The LRU buffer 876 is updated when the new entry is written into the TLB.

The hash function 892 implemented in the EIC 238 uses the following equation on the 20 bits of virtual page number (vpn):

$$\text{index} = ((\text{vpn} >> S_1) \text{XOR} (\text{vpn} >> S_2) \text{XOR} (\text{vpn} >> S_3)) \ \& \ \text{0x1fff};$$

where $S_1$, $S_2$ and $S_3$ are independently programmable shift amounts (positive or negative), each of which can take on four values.

If the linear search through the page table crosses a 4 kB boundary, the MMU automatically selects the next page table pointer to continue the search at the correct physical memory location. This includes wrapping around from the end of the page table to the start. The page table always contains at least one invalid (null) entry, so that the search always terminates.

Whenever the software replaces a page in host memory, it must add a page table entry for the new virtual page, and remove the entry corresponding to the page that has been replaced. It must also make sure that the old page table entry is not cached in the TLB on the co-processor 224. This is achieved by performing a TLB invalidation cycle in the MMU.

An invalidation cycle is performed via a register write to the MMU, specifying the virtual page number to be invalidated, along with a bit that causes the invalidation operation to be done. This register write may be performed directly by the software, or via an instruction interpreted by the Instruction Decoder. An invalidation operation is performed on the TLB for the supplied virtual page number. If it matches a TLB entry. that entry is marked invalid, and the LRU table updated so that the invalidated location is used for the next replace operation.

A pending invalidate operation has priority over any pending TLB compares. When the invalidate operation has completed, the MMU clears the invalidate bit, to signal that it can process another invalidation.

If the MMU fails to find a valid page table entry for a requested virtual address, this is termed a page fault. The MMU signals an error, and stores the virtual address that caused the fault in a software accessible register. The MMU goes to an idle state and waits until this error is cleared. When the interrupt is cleared, the MMU resumes from the next requested transaction.

A page fault is also signalled if a write operation is attempted to a page that is (not marked writable) marked read only.

The external interface controller (EIC) 238 can service transaction requests from the input interface switch 252 and the result organizer 249 that are addressed to the Generic bus. Each of the requesting modules indicates whether the current request is for the Generic Bus or the PCI bus. Apart from using common buses to communicate with the input interface switch 252 and the results organizer 249, the EIC's operation for Generic bus requests is entirely separate from its operation for PCI requests. The EIC 238 can also service CBus transaction types that address the Generic bus space directly.

FIG. 150 shows the structure of the external interface controller 238. The IBus requests pass through a multiplexer 910, which directs the requests to the appropriate internal module, based on the destination of the request (PCI or Generic Bus). Requests to the Generic bus pass on to the generic bus controller 911, which also has RBus and CBus interfaces. Generic bus and PCI bus requests on the RBus use different control signals, so no multiplexer is required on this bus.

IBus requests directed to the PCI bus are handled by an IBus Driver (IBD) 912. Similarly, an RBus Receiver (RBR) 914 handles the RBus requests to PCI. Each of the IBD 912 and RBR 914 drive virtual addresses to the memory management unit (MMU) 915, which provides physical addresses in return. The IBD, RBR and MMU can each request PCI transactions, which are generated and controlled by the PCI master mode controller (PMC) 917. The IBD and the MMU request only PCI read transactions, while the RBR requests only PCI write transactions.

A separate PCI Target Mode Controller (PTC) 918 handles all PCI transactions addressed to the co-processor as a target. This drives CBus master mode signals to the instruction controller, allowing it to access all other modules. The PTC passes returned CBus data to be driven to the PCI bus via the PMC, so that control of the PCI data bus pins comes from a single source.

CBus transactions addressed to EIC registers and module memory are dealt with by a standard CBus interface 7. All submodules receive some bits from control registers, and return some bits to status registers, which are located inside the standard CBus interface.

Parity generation and checking for PCI bus transactions is handled by the parity generate and check (PGC) module 921, which operates under the control of the PMC and PTC. Generated parity is driven onto the PCI bus, as are parity error signals. The results of parity checking are also sent to the configuration registers section of the PTC for error reporting.

FIG. 155 illustrates the structure of the IBus driver 912 of FIG. 150. Incoming IBus address and control signals are latched 930 at the start of a cycle. An or-gate 931 detects the start of the cycle and generates a start signal to control logic 932. The top address bits of the latch 930, which form the virtual page number, are loaded into a counter 935. The virtual page number is passed to the MMU 915 (FIG. 150) which returns a physical page number which is latched 936.

The physical page number and the lower virtual address bits are recombined according to the mask 937 and form the address 938 for PCI requests to the PMC 717 (FIG. 102). The burst count for the cycle is also loaded into a counter 939. Prefetch operations use another counter 941 and an address latch and compare circuit 943.

Data returned from the PMC is loaded into a FIFO 944, along with a marker which indicates whether the data is part of a prefetch. As data becomes available at the front of the FIFO 944, it is clocked out by the read logic via synchronization latches 945,946. The read logic 946 also generates the IBus acknowledge signal.

A central control block 932, including state machines, controls the sequencing of all of the address and data elements, and the interface to the PMC.

The virtual page number counter 935 is loaded at the start of an IBus transaction with the page number bits from the IBus address. The top 10 bit of this 20-bit counter always come from the incoming address. For the lower 10 bits, each bit is loaded from the incoming address if the corresponding mask bit 937 is set to 1: otherwize, the counter bit is set to 1. The 20-bit value is forwarded to the MMU interface.

In normal operation the virtual page number is not used after the initial address translation. However, if the IBD detects that the burst has crossed a page boundary, the virtual page counter is incremented, and another translation is performed. Since the low order bits that are not part of the virtual page number are set to 1 when the counter is loaded, a simple increment on the entire 20-bit value always causes the actual page number field to increment. The mask bits 937 are used again after an increment to set up the counter for any subsequent increments.

The physical address is latched 936 whenever the MMU returns a valid physical page number after translation. The mask bits are used to correctly combine the returned physical page number with the original virtual address bits.

The physical address counter 938 is loaded from the physical address latch 936. It is incremented each time a word is returned from the PMC. The count is monitored as it increments, to determine whether the transaction is about to cross a page boundary. The mask bits are used to determine which bits of the counter should be used for the comparison. When the counter detects that there are two or less words remaining in the page, it signals the control logic 932, which the terminates the current PCI request after two more data transfers, and requests a new address translation if required. The counter is reloaded after the new address translation, and PCI requests resumed.

The burst counter 939 is a 6-bit down counter which is loaded with the IBus burst value at the beginning of a transaction. It is decremented every time a word is returned from the PMC. When the counter value is two or less, it signals to the control logic 932, which can then terminate the PCI transaction correctly with two more data transfers (unless prefetching is enabled).

The prefetch address register 943 is loaded with the physical address of the first word of any prefetch. When the subsequent IBus transaction starts, and the prefetch counter indicates that at least one word was successfully prefetched, the first physical address of the transaction is compared to the value in the prefetch address latch. If it matched, the prefetch data is used to satisfy the IBus transaction, and any PCI transaction requests start at the address after the last prefetched word.

The prefetch counter 941 is a four bit counter which is incremented whenever a word is returned by the PMC during a prefetch operation, up to a maximum count equal to the depth of the input FIFO. When the subsequent IBus transaction matches the prefetch address, the prefetch count is added to the address counter, and subtracted from the burst counter, so that PCI requests can start at the required location. Alternatively. if the IBus transaction only requires some of the prefetched data, the requested burst length is subtracted from the prefetch count, and added to the latched prefetch address, and the remaining prefetch data is retained to satisfy further requests.

The Data FIFO 944 is a 8 word by 33 bit asynchronous fall through FIFO. Data from the PMC is written into the FIFO, alone with a bit indicating whether the data is part of a prefetch. Data from the front of the FIFO is read out and driven onto the IBus as soon as it becomes available. The logic that generates the data read signals operates synchronously to clk, and generates the IBus acknowledge output. If the transaction is to be satisfied using prefetched data, signals from the control logic tell the read logic how many words of prefetched data should be read out of the FIFO.

FIG. 156 illustrates the structure of the RBus Receiver 914 of FIG. 150. Control is split between two state machines 950, 951. The Write state machine 951 controls the interface to the RBus. The input address 752 is latched at the start of an RBus burst. Each data word of the burst is written in a FIFO 754, along with its byte enables. If the FIFO 954 become full r-ready is deasserted by the write logic 951 to prevent the results organiser from attempting to write any more words.

The write logic 951 notifies the main state machine 950 of the start of an RBus burst via a resynchronized start signal to prevent the results organizer from trying to write any more words. The top address bits, which form the virtual page number, are loaded into a counter 957. The virtual page number is passed to the MMU, which returns a physical page number 958. The physical page number and the lower bits of the virtual address are recombined according to the mask, and loaded into a counter 960, to provide the address for PCI requests to the PMC. Data and byte enables for each word of the PCI request are clocked out of the FIFO 954 by the main control logic 950, which also handles all PMCM interface control signals. The main state machine indicates that it is active via a busy signal, which is resynchronized and returned to the write state machine.

The write state machine 951 detects the end of an RBus burst using r-final. It stops loading data into the FIFO 954, and signals the main state machine that the RBus burst has finished. The main state machine continues the PCI requests until the Data FIFO has been emptied. It then deasserts busy, allowing the write state machine to start the next RBus burst.

Returning to FIG. 150, the memory management unit 915 is responsible for translating virtual page numbers into physical page numbers for the IBus driver (IBD) 912 and the RBus receiver (IBR) 914. Turning to FIG. 157, there is illustrated the memory management unit in further detail. A 16 entry translation lookaside buffer (TLB) 970 takes its inputs from, and drives its outputs to, the TLB address logic 971. The TLB control logic 972, which contains a state machine, receives a request, buffered in the TLB address logic, from the RBR or IBD. It selects the source of the inputs, and selects the operation to be performed by the TLB. Valid TLB operations are compare, invalidate, invalidate all, write and read. Sources of TLB input addresses are the IBD and RBR interfaces (for compare operations), the page table entry buffer 974 (for TLB miss services) or registers within the TLB address logic. The TLB returns the status of each operation to the TLB control logic. Physical page numbers from successful compare operations are driven back to the IBD and RBR. The TLB maintains a record of its least recently used (LRU) location, which is available to the TLB address logic for use as a location for write operations.

When a compare operations fails, the TLB control logic 972 signals the page table access control logic 976 to start a PCI request. The page table address generator 977 generates the PCI address based on the virtual page number, using its internal page table pointer registers. Data returned from the PCI request is latched in the page table entry buffer 974. When a page table entry that matches the required virtual address is found, the physical page number is driven to the TLB address logic 977 and the page table access control logic 976 signals that the page table access is complete. The TLB control logic 972 then writes the new entry into the TLB, and retries the compare operation.

Register signals to and from the SCI are resynchronized 980 in both directions. The signals go to and from all other submodules. A module memory interface 981 decodes access from the Standard CBus Interface to the TLB and page table pointer memory elements. TLB access are read only, and use the TLB control logic to obtain the data. The page table pointers are read/write, and are accessed directly by the module memory interface. These paths also contain synchronization circuits.

3.18.11 Peripheral Interface Controller

Turning now to FIG. 158, there is illustrated one form of peripheral interface controller (PIC) 237 of FIG. 2 in more detail. The PIC 237 works in one of a number of modes to transfer data to or from an external peripheral device. The basic modes are:

1) Video output mode. In this mode, data is transferred to a peripheral under the control of an external video clock and clock/data enables. The PIC 237 drives output clock and clock enable signs with the required timing with respect to the output data.
2) Video input mode. In this mode, data is transferred from a peripheral under the control of an external video clock and data enable.
3) Centronics mode. This mode transfers data to and from the peripheral according to the standard protocol defined in IEEE 1284 standard.

The PIC 237 decouples the protocol of the external interface from the internal data sources or destination in accordance with requirements. Internal data sources write data into a single stream of output data, which is then transferred to the external peripheral according to the selected mode. Similarly, all data from an external peripheral is written into a single input data stream, which is available to satisfy a requested transaction to either of the possible internal data destinations.

There are three possible sources of output data: the LMC 236 (which uses the ABus), the RO 249 (which uses the RBus), and the global CBus. The PIC 237 responds to transactions from these data sources one at a time—a complete transaction is completed from one source before another source is considered. In general, only one source of data should be active at any time. If more than one source is active, they are served with the following priority—CBus, then ABus, then RBus.

As usual, the module operates under the control of the standard CBus interface 990 which includes the PIC's internal registers.

Further, a CBus data interface 992 is provided for accessing and controlling peripheral devices via the co-processor 224. An ABus interface 991 is also provided for handling memory interactions with the local memory controller. Both the ABus interface 991 and CBus data interface 992 in addition to the result organizer 249 send data to an output data path 993 which includes a byte—wide FIFO. Access to the output data path is controlled by an arbiter which keeps track of which source has priority or ownership of the output stream. The output data path in turn interfaces with a video output controller 994 and centronics control 997 depending on which of these is enabled. Each of the modules 994, 997 reads one byte at a time from the output data path's internal FIFO. The centronics controller 997 implements the centronics data interfacing standard for controlling peripheral devices. The video output controller includes logic to control output pads according to the desired video output protocols. Similarly, a video input controller 998 includes logic to control any implemented video input standard. The video input controller 998 outputs to an input data path unit 999 which again comprises a byte wide input FIFO with data being written into the FIFO asynchronously, one byte at a time, by either the video input controller 998 or centronics controller 997.

A data timer 996 contains various counters utilized to monitor the current state of FIFO's within output data paths 993 and input data path 999.

It can be seen from the foregoing that the co-processor can be utilized to execute dual streams of instructions for the creation of multiple images or multiple portions of a single image simultaneously. Hence, a primary instruction stream can be utilized to derive an output image for a current page while a secondary instruction stream can be utilized, during those times when the primary instruction stream is idle, to begin the rendering of a subsequent page. Hence. in a standard mode of operation, the image for a current page is rendered and then compressed utilising the JPEG coder 241. When it is required to print out the image, the co-processor 241 decompresses the JPEG encoded image, again utilising the JPEG coder 241. During those idle times when no further portions of the JPEG decoded image are required by an output device. instructions can be carried out for the compositing of a subsequent page or band. This process generally accelerates the rate at which images are produced due to the overlap operating of the co-processor. In particular, the co-processor 224 can be utilized to substantial benefit in the speeding up of image processing operations for printing out by a printer attached to the co-processor such that rendering speeds will be substantially increased.

It will be evident from the foregoing that discussion of the preferred embodiment refers to only one form of implementation of the invention and modifications, obvious to those skilled in the art, can be made thereto without departing from the scope of the invention.

The claims defining the invention are as follows:

1. A multi-port burst dynamic random access memory (DRAM) system comprising:

a memory array;

a plurality of write ports for writing data to said memory array;

a plurality of read ports for reading data from said memory array; and a plurality of first-in-first-out (FIFO) output buffers coupled to respective ones of said plurality of read ports, wherein said FIFO output buffers are disposed between said memory array and said read ports to temporarily store data read from said memory array, and each of said read ports is de-coupled by its respective FIFO output buffer from said memory array and/or a plurality of first-in-first-out (FIFO) input buffers coupled to respective ones of said write ports, wherein said FIFO input buffers are disposed between said memory array and said write ports to temporarily store data prior to writing to said memory array, and each of said write ports is de-coupled by its respective FIFO input buffer from said memory array.

2. A multi-port burst DRAM system according to claim 1, further comprising a first multiplexer for interconnecting said plurality of FIFO input buffers with said memory array, and a controller for controlling said memory array.

3. A multi-port burst DRAM system according to claim 2, wherein said first multiplexer is controlled by said controller.

4. A multi-port burst DRAM system according to claim 1, further comprising:
   arbitration means for arbitrating access to said memory array by said read and write ports; and
   address communication means for providing address signals to said memory array, the address signals including row address and column address signals associated with data being written to or read from said memory array by said write ports or read ports, respectively.

5. A multi-port burst DRAM system according to claim 4, wherein said address communication means includes a second multiplexer for selecting an address from a plurality of addresses associated with said read and write ports, said DRAM system using the selected address to select a location within said memory array at which reading or writing is to commence.

6. A multi-port burst DRAM system according to claim 5, wherein said address communication means further includes:
   first counter means for storing and selectively outputting dynamic memory column addresses associated with low order address bits within an address selected by the second multiplexer; and
   a third multiplexer for selecting from high order address bits within the address selected by the second multiplexer and the column addresses outputted from the first counter means, thereby enabling the third multiplexer to produce a multiplexed output of row addresses and column addresses.

7. A multi-port burst DRAM system according to claim 5 or claim 6, further comprising:
   a third plurality of FIFO buffers for temporarily storing data byte write enable signals associated with the data temporarily stored in said FIFO input buffers; and
   a fourth multiplexer for selecting one of the data byte write enable signals from said third plurality of FIFO buffers.

8. A multi-port burst DRAM system according to claim 5 or claim 6, further comprising second counter means for storing and tracking dynamic memory row addresses associated with the high order address bits outputted from the second multiplexer.

9. A multi-port burst DRAM system according to claim 1, further comprising means for supplying a refresh signal to said memory array.

10. A multi-port burst DRAM system according to claim 1, wherein said FIFO buffers are greater than two entries deep.

11. A multi-port burst DRAM system according to claim 10, wherein said FIFO buffers are greater than 16 entries deep.

12. A multi-port burst DRAM system according to claim 11, wherein said FIFO buffers are about 32 entries deep.

13. A multi-port burst DRAM system according to claim 1, wherein said FIFO buffers are 32 bits wide.

14. A method of proving access latency of a multi-port burst dynamic random access memory (DRAM) arrangement, the arrangement incorporating a memory array and a memory controller, said method comprising the steps of:
   providing a plurality of write ports for writing data to the memory array;
   providing a plurality of read ports for reading data from memory array;
   providing a plurality of first-in-first-out (FIFO) output buffers coupled to respective ones of the read ports, wherein the FIFO output buffers are disposed between the memory array and the read ports and each of the read ports is de-coupled by its respective FIFO output buffer from the memory array and/or a plurality of first-in-first-out (FIFO) input buffers coupled to respective ones of the write ports, wherein the FIFO input buffers are disposed between the memory array and the write ports and each of the write ports is de-coupled by its respective FIFO input buffer from the memory array; and
   temporarily storing data in the FIFO output buffers or the FIFO input buffers.

15. A method according to claim 14, said method further comprising the steps of:
   outputting the data temporarily stored in the FIFO input buffers; and
   multiplexing the outputted data prior to writing data to the memory array.

16. A method according to claim 15, further comprising the step of controlling the multiplexing.

17. A method of improving performance of a multi-port burst dynamic random access memory (DRAM) system that includes a memory array, a controller for controlling the memory array, a plurality of write ports for writing data to the memory array and a plurality of read ports for reading data from the memory array, said method comprising the step of providing a plurality of first-in-first-out (FIFO) output buffers coupled to respective ones of the read ports, wherein the FIFO output buffers are disposed between the memory array and the read ports to temporarily store data read from the memory array and each of the read ports is de-coupled by its respective FIFO output buffer from the memory array, and/or a plurality of first-in-first-out (FIFO) input buffers coupled to respective ones of the write ports, wherein the FIFO input buffers are disposed between the memory array and the write ports to temporarily store data prior to writing to the memory array and each of the write ports is de-coupled by its respective FIFO input buffer from the memory array.

18. A multi-port burst dynamic random access memory (DRAM) arrangement comprising:
   a memory array;
   a controller for controlling said memory array;
   a plurality of write ports for writing data to said memory array;
   a plurality of read ports for reading data from said memory array;
   a plurality of first-in-first out (FIFO) output buffers for temporarily storing data read from said memory array, wherein outputs of said plurality of FIFO output buffers are connected to respective ones of said read ports, and said inputs of said plurality of FIFO output buffers are connected to said memory array;

a plurality of first-in-first output (FIFO) input buffers for temporarily storing data prior to writing to said memory array, wherein inputs of said plurality of FIFO output buffers are connected to respective ones of said write ports; and a multiplexer for connecting outputs of said plurality of FIFO input buffers with said memory array, wherein each of said read ports and said write ports is de-coupled by its respective FIFO buffer from said memory array.

19. A multi-part burst dynamic random access memory (DRAM) system comprising:

a memory array;

a controller for controlling said memory array;

a write port for writing data to said memory array;

a read port for reading data from said memory array;

a first-in-first-out (FIFO) output buffer disposed between said memory array and said read port to temporarily store data read from said memory array and/or a first-in-first out (FIFO) input buffer disposed between said memory array and said write port to temporarily store data prior to writing to said memory array;

arbitration means for arbitrating access to said memory array by said read and write ports; and address communication means for providing address signals to said memory array, the address signals including row address and column address signals associated with data being written to or read from said memory array by said write or read ports, respectively, wherein said address communication means includes:

a multiplexer for selecting an address from a plurality of addresses associated with said read and write ports, said DRAM system using the selected address to select a location within said memory array at which reading or writing is to commence.

20. A multi-port burst DRAM system according to claim 19, wherein said address communication means further includes:

first counter means for storing and selectively outputting dynamic memory column addresses associated with low order address bits within an address selected by the multiplexer; and a second multiplexer for selecting from high order address bits within the address selected by said multiplexer and the column addresses outputted from the first counter means, thereby enabling the second multiplexer to produce a multiplexed output of row addresses and column addresses.

21. A multi-port burst DRAM system according to claim 19, further including:

a third plurality of FIFO buffers for temporarily storing data byte write enable signals associated with the data temporarily stored in the FIFO input buffers; and a second multiplexer for selecting one of the data byte write enable signals from the third plurality of FIFO buffers.

22. A multi-port burst DRAM system according to claim 19, further including second counter means for storing and tracking dynamic memory row addresses associated with the high order address bits outputted from said multiplexer.

* * * * *

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Title page,
Item [73], Assignees: "Canon Kabushiki Kaisha: Canon Information Systems Research Australia, Pty. Ltd., both of Tokyo, Japan" should read -- Canon Kabushiki Kaisha, Tokyo, Japan; Canon Information Systems Research Australia Pty. Ltd., North Ryde, Australia. --.

Column 2,
Line 10, "from in" should read -- in --.

Column 3,
Line 31, "co-processor:" should read -- co-processor; --; and
Line 40, "to" should be deleted.

Column 4,
Line 11, "to" should be deleted.

Column 10,
Line 18, "Also" should read -- Also, --;
Line 31, "Therefore" should read -- Therefore, --;
Line 54, "furthers" should read -- further, --; and
Line 63, "respect." should read -- respect, --.

Column 11,
Line 17, "above described" should read -- above-described --; and
Line 32, "required." should read -- required, --.

Column 12,
Line 16, "224." should read -- 224, --; and
Line 27, "1030." should read -- 1030, --.

Column 13,
Line 55, "above described" should read -- above-described --.

Column 14,
Line 4, "otherwize" should read -- otherwise --.

Column 18,
Line 16, "ie." should read -- i.e., --.

UNITED STATES PATENT AND TRADEMARK OFFICE
CERTIFICATE OF CORRECTION

PATENT NO.    : 6,118,724
DATED         : September 12, 2000
INVENTOR(S)   : Raymond Paul Higginbottom It is certified that error appears in the above-identified patent and that said Letters Patent is hereby corrected as shown below:

Column 19,
Line 52, "ie." should read -- i.e., --; and
Line 58, "ie." should read -- i.e., --.

Column 21,
Line 3, "atomically" should read -- automatically --.

Column 24,
Line 64, "holdine" should read -- holding --.

Column 25,
Line 53, "instruction." should read -- instruction, --;
Line 58, "bt" should read -- by --;
Line 63, "atomically" should read -- automatically --; and
Line 64, "atomic" should read -- automatic --.

Column 26,
Line 32, "atomic" should read -- automatic --;
Line 33, "atomic" should read -- automatic --;
Line 49, "above mentioned" should read -- above-mentioned --.
Line 50, "atomicity" should read -- automatic access --; and
Line 60 "(ie." should read -- (i.e., --.

Column 27,
Line 3, "(ie." should read -- (i.e., --; and
Line 37, "according" should read -- according to --.

Column 28,
Line 45, "a" should read -- an --;
Line 47, "eg." should read -- e.g. --;
Line 57, "eg." should read --e.g. --; and
Line 61, "of" should be deleted.

Column 29,
Line 32, "eg." should read -- e.g. --, and "t he" should read -- the --
Line 49, "Ibus" shodul read -- Ibus --; and
Line 51, "Ibus" should read -- Ibus --.

Column 30,
Line 18, "Cbus." should read -- Cbus, --.

UNITED STATES PATENT AND TRADEMARK OFFICE
CERTIFICATE OF CORRECTION

PATENT NO.    : 6,118,724
DATED         : September 12, 2000
INVENTOR(S)   : Raymond Paul Higginbottom It is certified that error appears in the above-identified patent and that said Letters Patent is hereby corrected as shown below:

Column 31,
Line 15, ""reg"." should read -- "reg", --; and
Line 61, "eg." should read -- e.g. --.

Column 32,
Line 2, "previously." should read -- previously, --.

Column 33,
Line 58, "bit wize" should read -- bit-wise --.

Column 34,
Line 59, "type." should read -- type, --; and
Line 60, "403." should read -- 403, --.

Column 35,
Line 26, "FIG. 32." should read -- FIG. 32, --;
Line 30, "example." should read -- example, --;
Line 50, "Hence." should read -- Hence, --; and
Line 61, "eg." should read -- e.g. --;.

Column 36,
Line 2, "prizes" should read -- prises --;
Line 7, "FIG. 39." should read -- FIG. 39, --;
Line 8, "byte-wize" should read -- byte-wise --;
Line 41, "byte wize" should read -- byte-wise --;
Line 43, "stream." should read -- stream, --; and
Line 51, "eg." should read -- e.g. --.

Column 38,
Line 19, "his" should read -- this --; and
Line 31, "ie," should read -- i.e., --.

Column 40,
Line 49, "1078." should read -- 1078, --.

Column 41,
Line 9, "tifo full" should read -- fifo-full --.

Column 42,
Line 61, "bitwize" should read -- bitwise --.

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 43,
Line 22, "467." should read -- 467, --.

Column 45,
Line 27, "above mentioned" should read -- above-mentioned --.

Column 46,
Line 20, "previously." should read -- previously, --; and
Line 59, "above" should read -- above, --.

Column 47,
Line 17, "by;" should read -- by: --; and
Line 67, "ot" should read -- of --.

Column 49,
Line 14, "ie" should read -- i.e., -- and "However" should read -- However, --;
Line 16, "ie" should read -- i.e., --;
Line 43, "eg." should read -- e.g. --;
Line 44, "eg." should read -- e.g. --;
Line 47, "eg." should read -- e.g. --; and
Line 52, "eg." should read -- e.g. --.

Column 50,
Line 28, "eg." should read -- e.g. --;
Line 42, "eg." should read -- e.g. --;
Line 46, "eg" should read -- e.g. --;
Line 47, "comprizes" should read -- comprises --; and
Line 60, "Consequently" should read -- Consequently, --.

Column 51,
Line 5, "eg." should read -- e.g. --; and
Line 7, "eg." should read -- e.g. --.

Column 52,
Line 33, "case." should read -- case, --;
Line 46, "arizen" should read -- arisen --; and
Line 57, "well-known" should read -- well known.

Column 53,
Line 11, "down sampled" should read -- down-sampled --;
Line 18, "comprizes" should read -- comprises --;
Line 19, "comprizes" should read -- comprises --;

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 53, cont'd,
Line 20, "comprizes" should read -- comprises --; and
Line 63, "comprizes" should read -- comprises --.

Column 54,
Line 11, "Further." should read -- Further, --; and
Line 37, "FIG. 69." should read -- FIG. 69, --.

Column 55,
Line 10, "comprizes" should read -- comprises --.

Column 56,
Line 12, "banks" should read -- bank --;
Line 42, "by,tes" should read -- bytes --;
Line 52, "al-orithms" should read -- algorithms --; and
Line 56, "Iluff-" should read -- Huff --.

Column 57,
Line 2, "however" should read -- however, --.

Column 58,
Line 62, "681." should read -- 681, --, and "a" should read -- an --.

Column 59,
Line 5, "performed." should read -- performed, --.

Column 60,
Table 17, "four," (both occurrences) should read -- four --.

Column 61,
Line 45, "hierarchial" should read -- hierarchical --.

Column 62,
Line 46, "They" should read -- they --; and
Line 67, "transformed." should read -- transformed, --.

Column 63,
Line 6, "FIG. 80." should read -- FIG. 0, --
Line 46, "tor" should read -- for --; and "tlow" should read -- flow --; and
Line 54, "that" should read -- than --.

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 64,
Line 3, "Likewize," should read -- Likewise, --.

Column 65,
Line 9, "They" should read -- they --;
Line 17, "fields." should read -- fields, --;
Line 19, "bhte" should read -- byte --; and
Line 22, "comprizes" should read -- comprises --.

Column 66,
Line 27, "Otherwize; should read -- Otherwise, --;
Line 50, "available." should read -- available, --;
Line 54, "otherwize" should read -- otherwise --.

Column 67,
Line 23, "its" should read -- bits --;
Line 34, "comprizes" should read -- comprises --; and
Line 57, "1180." should read -- 1181, --.

Column 69,
Line 1, "of" should be deleted;
Line 24, "in" should read -- is --;
Line 41, "Hluffman" should read -- Huffman --;
Line 51, "comprizes" should read -- comprises --; and
Line 61, "however" should read -- however, --.

Column 70,
Line 56, "resolution)" should read -- resolution). --.

Column 71,
Line 2, "rev-erse" should read -- reverse --;
Line 8, "(eg. 742)" should read -- (e.g. 742);
Line 27, "Within" should read -- within --; and
Line 56, "tield" should read -- field --.

Column 72,
Line 67, "(ie." should read -- (i.e. --.

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 73,
Line 1, "ie." should read -- (i.e. --;
Line 37, "Iluffman" should read -- Huffman --;
Line 47, "hierarchial" should read -- hierarchical --;
Line 61, "bytewize" should read -- bitwise --; and
Line 66, "utilising" should read -- utilizing --.

Column 74,
Line 2, "hierarchial" should read -- hierarchical --;
Line 25, "252." should read -- 252, --; and
Line 37, "stvapping" should read -- swapping --.

Column 75,
Line 1, "given" should read -- a given --;
Line 32, "bitwize" should read -- bitwise --; and
Line 34, "bitwize" should read -- bitwise --.

Column 77,
Line 41, "barrel" should read -- barrel --; and
Line 47, "sub-sa-mpling" should read -- sub-sampling --.

Column 78,
Line 8, "v alues" should read -- values --; and
Line 42, "comprizes" should read -- comprises --.

Column 79,
Line 31, "sign" should read -- sign --;
Line 33, "comprizes" should read -- comprises --; and
Line 52, "axvailable" should read -- available --.

Column 80,
Line 4, "FIG. 2." should read -- FIG. 2, --;
Line 25, "comprize" should read -- comprise --; and
Line 29, "comprizes" should read -- comprises --.

Column 81,
Line 32, "comprizes" should read -- comprises --;
Line 35, "comprizes" should read -- comprises --;
Line 38, "comprize" should read -- comprise --;
Line 43, "prizes" should read -- prises --; and

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 81, cont'd,
Line 64, "byte-wize" should read -- byte-wise --.

Column 82,
Line 11, "byte-wize" should read -- byte-wise --;
Line 32, "byte-wize" should read -- byte-wise --;
Line 35, "version" should read -- versions --;
Line 38, "version" should read -- versions --;
Line 49, "version" should read -- versions --;
Line 58, "1299." should read -- 1299, --; and
Line 60, "1381." should read -- 1381, --.

Column 83,
Line 25, "1299." should read -- 1299, --.

Column 84,
Line 26, "comprize" should read -- "comprise" --;
Line 27, "comprizes" should read -- comprises --; and
Line 45, "comprize" should read -- "comprises" --.

Column 86,
Line 9, "comprizes" should read -- comprises --;
Line 23, "comprizes" should read -- comprises --; and
Line 54, "Additionally" should read -- Additionally, --.

Column 87,
Line 5, "in" should read -- is --; and
Line 16, "and an" should read -- another --.

Column 88,
Line 9, "hierarchial" should read -- hierarchical --; and
Line 31, "247." should read -- 247, --.

Column 90,
Line 39, "begins" should read -- begin --;
Line 67, "dividing" should read -- divide --.

Column 91,
Line 1, "eg" should read -- e.g. --; and
Line 10, "1496." should read -- 1496, --.

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 92,
Line 17, "otherwize" should read -- otherwise --; and
Line 27, "reg0," should read -- reg 070, --.

Column 93,
Line 34, "generation." should read -- generation, --.

Column 94,
Line 25, "latch the" should read -- latches --;
Line 26, "latch then" should read -- latch is then --; and
Line 62, "opacity." should read -- opacity, --.

Column 96,
Line 32, "1615" should read -- 1615. --.

Column 100,
Line 25, "piecewize" should read -- piecewise --.

Column 103,
Line 11, "ai" should read -- $a_i$ --; and
Line 58, "comprizes" should read -- comprises --.

Column 104,
Line 2, "comprizes" should read -- comprises --;
Line 40, "comprizes" should read -- comprises --; and
Line 48, "operation." should read -- operation, --.

Column 106,
Line 16, "inputs;" should read -- inputs: --;
Line 23, "comprizes" should read -- comprises --; and
Line 58, "having;" should read -- having: --.

Column 107,
Line 39, "1892." should read -- 1892, --; and
Line 51, "comprize" should read -- comprise --.

Column 108
Line 6, "asserted:" should read -- asserted; and --; and
Line 7, "230." should read -- 230, --.

UNITED STATES PATENT AND TRADEMARK OFFICE
CERTIFICATE OF CORRECTION

PATENT NO. : 6,118,724
DATED : September 12, 2000
INVENTOR(S) : Raymond Paul Higginbottom It is certified that error appears in the above-identified patent and that said Letters Patent is hereby corrected as shown below:

Column 112,
Line 13, "1948." should read -- 1948, --; and
Line 51, "fashion." should read -- fashion, --.

Column 113,
Line 2, "otherwize," should read -- otehrwise, --.

Column 115,
Line 14, "accordance" should read -- accordance with --.

Column 116,
Line 47, "comprizes" should read -- comprises --.

Column 119,
Line 14, "945,946." should read -- 945, 946. --; and
Line 48, "the" (first occurrence) should be deleted.

Column 122,
Line 18, "comprizes" should read -- comprises --;
Line 32, "Hence." should read -- Hence, --;
Line 39, "device." should read -- device, --; and
Line 43, "substantial" should read -- substantially --.

Signed and Sealed this

Nineteenth Day of February, 2002

*Attest:*

*Attesting Officer*

JAMES E. ROGAN
*Director of the United States Patent and Trademark Office*